US009753746B2

(12) United States Patent
Krzyzanowski et al.

(10) Patent No.: US 9,753,746 B2
(45) Date of Patent: Sep. 5, 2017

(54) APPLICATION STORE AND INTELLIGENCE SYSTEM FOR NETWORKED TELEPHONY AND DIGITAL MEDIA SERVICES DEVICES

(76) Inventors: Paul Krzyzanowski, Flemington, NJ (US); Glenn Harter, Wellington, FL (US); Michael Kelly, Deerfield Beach, FL (US); David Killian, Lake Worth, FL (US); Brian Woods, Hendersonville, NC (US)

( * ) Notice: Subject to any disclaimer, the term of this patent is extended or adjusted under 35 U.S.C. 154(b) by 1923 days.

(21) Appl. No.: 12/639,165

(22) Filed: Dec. 16, 2009

(65) Prior Publication Data

US 2010/0157989 A1    Jun. 24, 2010

Related U.S. Application Data

(60) Provisional application No. 61/139,090, filed on Dec. 19, 2008.

(51) Int. Cl.
*G06F 9/44*    (2006.01)
*G06F 9/445*    (2006.01)
(Continued)

(52) U.S. Cl.
CPC ......... *G06F 9/4445* (2013.01); *G01D 11/245* (2013.01); *G06F 8/60* (2013.01);
(Continued)

(58) Field of Classification Search
CPC .... G06Q 30/06; G06Q 30/0601; G06Q 30/60; H04L 2463/101; H04L 67/306;
(Continued)

(56) References Cited

U.S. PATENT DOCUMENTS 4,724,521 A *  2/1988 Carron et al. ................ 717/175
5,265,951 A    11/1993 Kumar
(Continued)

FOREIGN PATENT DOCUMENTS

EP    2051157 A1    4/2009
JP    2005129042    5/2005
(Continued)

OTHER PUBLICATIONS

International Search Report and Written Opinion for International Appl. No. PCT/US09/068475 dated Apr. 23, 2010, 17 pages.
(Continued)

*Primary Examiner* — Parth Patel
*Assistant Examiner* — Kai Chang

(57) ABSTRACT

Telephony and digital media services may be provided to a plurality of locations, such as to a plurality of homes and offices, though the deployment of telephony and digital media services devices to the locations, wherein each device is configured to function as a voice, data and media information center. A system in accordance with one embodiment of the present invention includes an application store and an application intelligence subsystem implemented on one or more computers. Each of the application store and the application intelligence subsystem is communicatively connected via a network to a plurality of such telephony and digital media services devices. The application store is operable to provide applications via the network for installation and execution on each of the plurality of devices. The application intelligence subsystem is operable to obtain and report information about applications installed and executed on each of the plurality of devices.

24 Claims, 72 Drawing Sheets

(51) Int. Cl.
*G06Q 30/06* (2012.01)
*G01D 11/24* (2006.01)

(52) U.S. Cl.
CPC .. *G06Q 30/0601* (2013.01); *H01L 2924/0002* (2013.01); *Y10T 29/49826* (2015.01)

(58) Field of Classification Search
CPC ............... H04L 67/42; H04L 2924/00; H04L 2924/0002; G06F 8/60; G06F 8/61; G06F 9/4445; H04M 1/72525; H04W 4/003; G01D 11/245; Y10T 29/49826
USPC ...... 370/352–356; 379/93.17, 93.23, 142.17, 379/201.04, 221.15, 428.03; 715/716, 715/738, 742, 748, 749, 762, 763; 717/114, 115, 120, 121, 168, 171, 172; 717/173, 174, 176, 177, 178; 709/201, 709/203, 217, 218, 219
See application file for complete search history.

(56) References Cited

U.S. PATENT DOCUMENTS

| | | |
|---|---|---|
| 5,294,782 A | 3/1994 | Kumar |
| 5,357,585 A | 10/1994 | Kumar |
| 5,381,348 A | 1/1995 | Ernst et al. |
| 5,386,106 A | 1/1995 | Kumar |
| 5,430,878 A | 7/1995 | Straub et al. |
| 5,484,989 A | 1/1996 | Kumar et al. |
| 5,489,001 A | 2/1996 | Yang |
| 5,489,773 A | 2/1996 | Kumar |
| 5,519,783 A | 5/1996 | Kumar |
| 5,521,369 A | 5/1996 | Kumar |
| 5,526,523 A | 6/1996 | Straub et al. |
| 5,548,477 A | 8/1996 | Kumar et al. |
| 5,548,478 A | 8/1996 | Kumar et al. |
| 5,616,906 A | 4/1997 | Kumar |
| 5,632,373 A | 5/1997 | Kumar et al. |
| 5,638,257 A | 6/1997 | Kumar et al. |
| 5,648,760 A | 7/1997 | Kumar |
| 5,696,496 A | 12/1997 | Kumar |
| 5,708,560 A | 1/1998 | Kumar et al. |
| 5,872,699 A | 2/1999 | Nishii et al. |
| 5,902,991 A | 5/1999 | Kumar |
| 5,925,873 A | 7/1999 | Kumar |
| 6,023,721 A | 2/2000 | Cummings |
| 6,027,021 A | 2/2000 | Kumar |
| 6,072,401 A | 6/2000 | Kumar |
| 6,084,769 A | 7/2000 | Moore et al. |
| 6,104,451 A | 8/2000 | Matsuoka et al. |
| 6,151,606 A | 11/2000 | Mendez |
| 6,181,553 B1 | 1/2001 | Cipolla et al. |
| 6,223,815 B1 | 5/2001 | Shibasaki |
| 6,266,539 B1 | 7/2001 | Pardo |
| 6,276,448 B1 | 8/2001 | Maruno |
| 6,281,894 B1 | 8/2001 | Rive |
| 6,449,149 B1 | 9/2002 | Ohashi et al. |
| 6,457,030 B1 | 9/2002 | Adams et al. |
| 6,516,427 B1 | 2/2003 | Keyes et al. |
| 6,546,554 B1* | 4/2003 | Schmidt et al. ............. 717/176 |
| 6,647,103 B2 | 11/2003 | Pinard et al. |
| 6,674,640 B2 | 1/2004 | Pokharna et al. |
| 6,708,221 B1 | 3/2004 | Mendez et al. |
| 6,868,267 B1 | 3/2005 | Briggs et al. |
| 6,952,617 B1 | 10/2005 | Kumar |
| 6,952,671 B1 | 10/2005 | Kolesnik et al. |
| 7,039,041 B2 | 5/2006 | Robohm et al. |
| 7,058,088 B2 | 6/2006 | Tomita et al. |
| 7,065,640 B2 | 6/2006 | Paul et al. |
| 7,092,987 B2 | 8/2006 | Brittingham et al. |
| 7,120,462 B2 | 10/2006 | Kumar |
| 7,130,193 B2 | 10/2006 | Hirafuji et al. |
| 7,149,543 B2 | 12/2006 | Kumar |
| 7,236,770 B2 | 6/2007 | Sankaramanchi |
| 7,243,163 B1 | 7/2007 | Friend et al. |
| 7,275,073 B2 | 9/2007 | Ganji et al. |
| 7,301,767 B2 | 11/2007 | Takenoshita et al. |
| 7,447,799 B2 | 11/2008 | Kushner |
| 7,574,177 B2 | 8/2009 | Tupman et al. |
| 7,574,200 B2 | 8/2009 | Hassan et al. |
| 7,577,462 B2 | 8/2009 | Kumar |
| 7,620,001 B2 | 11/2009 | Ganji |
| 7,620,036 B2* | 11/2009 | Kobayashi et al. .......... 370/352 |
| 7,620,392 B1 | 11/2009 | Maurya et al. |
| 7,627,343 B2 | 12/2009 | Fadell et al. |
| 7,636,782 B2* | 12/2009 | Jordan et al. ................. 709/226 |
| 7,688,952 B2 | 3/2010 | Light et al. |
| 7,702,322 B1 | 4/2010 | Maurya et al. |
| 7,774,838 B2 | 8/2010 | Haltmeyer |
| 7,778,035 B2 | 8/2010 | Huang et al. |
| 7,779,085 B2* | 8/2010 | Neil et al. ...................... 709/217 |
| 7,788,382 B1 | 8/2010 | Jones et al. |
| 7,823,214 B2 | 10/2010 | Rubinstein et al. |
| 7,869,789 B2 | 1/2011 | Hassan et al. |
| 7,885,645 B2 | 2/2011 | Postma et al. |
| 7,890,091 B2 | 2/2011 | Puskoor et al. |
| 7,970,386 B2 | 6/2011 | Bhat et al. |
| 7,974,613 B1 | 7/2011 | Shanker et al. |
| 8,000,736 B2 | 8/2011 | Forstall et al. |
| 8,010,701 B2 | 8/2011 | Wilkinson et al. |
| 8,012,219 B2 | 9/2011 | Mendez et al. |
| 8,054,211 B2 | 11/2011 | Vidal |
| 8,060,074 B2 | 11/2011 | Danford et al. |
| 8,078,157 B2 | 12/2011 | Maurya et al. |
| 8,081,954 B2 | 12/2011 | Aaltonen et al. |
| 8,081,956 B2 | 12/2011 | Aaltonen et al. |
| 8,086,332 B2 | 12/2011 | Dorogusker et al. |
| 8,099,090 B2 | 1/2012 | Postma et al. |
| 8,161,411 B2* | 4/2012 | Robbin ................. G06F 9/4443 715/727 |
| 8,180,893 B1 | 5/2012 | Spertus |
| 8,185,149 B2 | 5/2012 | Forstall et al. |
| 8,199,507 B2 | 6/2012 | Shohet et al. |
| 8,249,939 B2 | 8/2012 | Cue et al. |
| 8,307,326 B2 | 11/2012 | Kobayashi et al. |
| 8,340,633 B1 | 12/2012 | Rege et al. |
| 8,351,908 B2 | 1/2013 | Bhat et al. |
| 8,359,016 B2 | 1/2013 | Lindeman et al. |
| 8,484,100 B2 | 7/2013 | Feldman et al. |
| 8,725,124 B2 | 5/2014 | Toy et al. |
| 8,954,387 B2 | 2/2015 | Margalit et al. |
| 2001/0047363 A1 | 11/2001 | Peng |
| 2002/0013852 A1 | 1/2002 | Janik |
| 2002/0112052 A1 | 8/2002 | Brittingham et al. |
| 2002/0131404 A1 | 9/2002 | Mehta et al. |
| 2002/0133578 A1 | 9/2002 | Wu |
| 2002/0172336 A1 | 11/2002 | Postma et al. |
| 2003/0002621 A1 | 1/2003 | Miyauchi et al. |
| 2003/0026405 A1* | 2/2003 | Elsey et al. .............. 379/201.01 |
| 2003/0084165 A1* | 5/2003 | Kjellberg et al. ............. 709/227 |
| 2003/0090864 A1 | 5/2003 | Kuo |
| 2003/0115552 A1* | 6/2003 | Jahnke et al. ................. 715/536 |
| 2003/0130984 A1 | 7/2003 | Quinlan et al. |
| 2003/0236867 A1* | 12/2003 | Natsuno et al. ............... 709/220 |
| 2004/0034853 A1 | 2/2004 | Gibbons et al. |
| 2004/0052343 A1 | 3/2004 | Glaser et al. |
| 2004/0060687 A1 | 4/2004 | Moss |
| 2004/0078812 A1 | 4/2004 | Calvert |
| 2004/0098449 A1 | 5/2004 | Bar-Lavi et al. |
| 2004/0162092 A1 | 8/2004 | Marsico et al. |
| 2004/0190256 A1 | 9/2004 | Genova et al. |
| 2005/0120113 A1* | 6/2005 | Bunch et al. .................. 709/224 |
| 2005/0131885 A1* | 6/2005 | Komatsu et al. ................. 707/3 |
| 2005/0144445 A1 | 6/2005 | Yeap et al. |
| 2005/0192878 A1* | 9/2005 | Minear et al. ................... 705/34 |
| 2005/0213331 A1 | 9/2005 | Lewis |
| 2005/0262337 A1 | 11/2005 | Ziesmer et al. |
| 2006/0029045 A1 | 2/2006 | Kobayashi et al. |
| 2006/0030341 A1 | 2/2006 | Pham |
| 2006/0130054 A1 | 6/2006 | Bocking et al. |
| 2006/0200658 A1* | 9/2006 | Penkethman ...................... 713/2 |
| 2006/0230433 A1* | 10/2006 | Chang .............................. 726/3 |
| 2006/0277209 A1 | 12/2006 | Kral et al. |
| 2006/0277311 A1 | 12/2006 | Franco et al. |

(56) References Cited

U.S. PATENT DOCUMENTS

| | | |
|---|---|---|
| 2007/0080823 A1 | 4/2007 | Fu et al. |
| 2007/0093243 A1 | 4/2007 | Kapadekar et al. |
| 2007/0156870 A1 | 7/2007 | McCollum |
| 2007/0165654 A1 | 7/2007 | Chai et al. |
| 2007/0167156 A1 | 7/2007 | Hundal |
| 2007/0169105 A1* | 7/2007 | Amberny et al. ............ 717/170 |
| 2007/0183772 A1 | 8/2007 | Baldwin et al. |
| 2007/0234240 A1 | 10/2007 | Entin et al. |
| 2007/0239878 A1 | 10/2007 | Bowers et al. |
| 2007/0265972 A1 | 11/2007 | Tsutsui |
| 2007/0280252 A1 | 12/2007 | Chuang |
| 2007/0280452 A1 | 12/2007 | Bernard |
| 2007/0294380 A1 | 12/2007 | Natarajan et al. |
| 2008/0002673 A1 | 1/2008 | Smitheimer |
| 2008/0040767 A1 | 2/2008 | McCarthy et al. |
| 2008/0059630 A1 | 3/2008 | Sattler et al. |
| 2008/0070495 A1 | 3/2008 | Stricklen et al. |
| 2008/0080873 A1 | 4/2008 | Enzien |
| 2008/0109679 A1 | 5/2008 | Wright et al. |
| 2008/0115225 A1 | 5/2008 | Jogand-Coulomb et al. |
| 2008/0125079 A1 | 5/2008 | O'Neil et al. |
| 2008/0140969 A1 | 6/2008 | Lawrence |
| 2008/0201453 A1 | 8/2008 | Assenmacher |
| 2008/0209451 A1* | 8/2008 | Michels et al. ............... 719/328 |
| 2008/0214172 A1 | 9/2008 | Anwer |
| 2008/0222621 A1 | 9/2008 | Knight et al. |
| 2008/0281953 A1 | 11/2008 | Blaisdell |
| 2008/0297585 A1 | 12/2008 | Chung et al. |
| 2009/0010246 A1 | 1/2009 | Grattan et al. |
| 2009/0064056 A1* | 3/2009 | Anderson et al. ............ 715/864 |
| 2009/0150970 A1 | 6/2009 | Hinds et al. |
| 2009/0193034 A1* | 7/2009 | Hirasaki ....................... 707/100 |
| 2009/0228509 A1* | 9/2009 | McCarthy et al. ........... 707/102 |
| 2009/0241104 A1 | 9/2009 | Amiga et al. |
| 2009/0285200 A1 | 11/2009 | Dekeyser et al. |
| 2009/0303980 A1 | 12/2009 | Wang et al. |
| 2009/0307105 A1* | 12/2009 | Lemay et al. .................. 705/26 |
| 2010/0011354 A1* | 1/2010 | Gharabally et al. .......... 717/178 |
| 2010/0022237 A1 | 1/2010 | Wallis et al. |
| 2010/0056127 A1 | 3/2010 | Osborne et al. |
| 2010/0077035 A1 | 3/2010 | Li et al. |
| 2010/0157543 A1 | 6/2010 | Shohet et al. |
| 2010/0157990 A1 | 6/2010 | Krzyzanowski et al. |
| 2010/0159898 A1 | 6/2010 | Krzyzanowski et al. |
| 2010/0222097 A1 | 9/2010 | Gisby et al. |
| 2010/0251231 A1 | 9/2010 | Coussemaeker et al. |
| 2010/0262619 A1 | 10/2010 | Zargahi et al. |
| 2010/0299152 A1 | 11/2010 | Batchu et al. |
| 2010/0299376 A1 | 11/2010 | Batchu et al. |
| 2010/0318701 A1 | 12/2010 | Srinivasan et al. |
| 2010/0328064 A1 | 12/2010 | Rogel |
| 2010/0330953 A1 | 12/2010 | Rogel et al. |
| 2010/0330961 A1 | 12/2010 | Rogel |
| 2010/0332635 A1 | 12/2010 | Rogel et al. |
| 2010/0333088 A1 | 12/2010 | Rogel et al. |
| 2011/0004941 A1 | 1/2011 | Mendez et al. |
| 2011/0029881 A1 | 2/2011 | Smith et al. |
| 2011/0038120 A1 | 2/2011 | Merz et al. |
| 2011/0058052 A1 | 3/2011 | Bolton et al. |
| 2011/0082789 A1 | 4/2011 | Boyd |
| 2011/0082900 A1 | 4/2011 | Nagpal et al. |
| 2011/0093583 A1 | 4/2011 | Piemonte et al. |
| 2011/0145932 A1 | 6/2011 | Nerger et al. |
| 2011/0179483 A1 | 7/2011 | Paterson et al. |
| 2011/0225252 A1 | 9/2011 | Bhat et al. |
| 2012/0066223 A1 | 3/2012 | Schentrup et al. |
| 2012/0070017 A1 | 3/2012 | Dorogusker et al. |
| 2012/0077546 A1 | 3/2012 | Kawa et al. |
| 2012/0088481 A1 | 4/2012 | Postma et al. |
| 2012/0096364 A1 | 4/2012 | Wilkinson et al. |
| 2012/0096365 A1 | 4/2012 | Wilkinson et al. |
| 2012/0102564 A1 | 4/2012 | Schentrup et al. |
| 2012/0102574 A1 | 4/2012 | Schentrup et al. |
| 2012/0117274 A1 | 5/2012 | Lydon et al. |
| 2012/0159567 A1 | 6/2012 | Toy et al. |
| 2012/0244849 A1 | 9/2012 | Thomson |
| 2012/0296744 A1 | 11/2012 | Cue et al. |
| 2013/0007245 A1 | 1/2013 | Malik et al. |
| 2013/0018792 A1 | 1/2013 | Casey et al. |
| 2013/0041808 A1 | 2/2013 | Pham et al. |
| 2013/0111462 A1 | 5/2013 | Umansky et al. |
| 2013/0231093 A1 | 9/2013 | Toy et al. |
| 2014/0208313 A1 | 7/2014 | Toy et al. |

FOREIGN PATENT DOCUMENTS

| | | |
|---|---|---|
| JP | 8-264691 A | 10/2006 |
| KR | 20020043449 | 6/2002 |
| KR | 1020100013205 A | 2/2010 |
| KR | 1020110128072 A | 11/2011 |
| WO | 2010080498 A1 | 7/2010 |
| WO | 2010080500 A1 | 7/2010 |
| WO | 2012/024418 A1 | 2/2012 |
| WO | 2012064870 A3 | 7/2012 |

OTHER PUBLICATIONS

International Search Report and Written Opinion for International Appl. No. PCT/US09/68482 dated Feb. 23, 2010, 12 pages.

International Search Report received for International Patent Application No. PCT/US11/38184, mailed Aug. 26, 2011, 2 pages.

"A Closer Look at Horizon App Manager", webpage available at: <http://www.horizonmanager.com/?page_id=211>, retrieve date: unknown, Copyright 2011, VMware, Inc., 5 pages.

International Search Report and Written Opinion received for PCT Application No. PCT/US2011/048109, mailed on Dec. 12, 2011, 10 pages.

Fulton, "Xerox Goes Up Againast RIM in 'BYOD' Mobile Device Management", webpage available at: <http://www.readwriteweb.com/cloud/2012/02/xerox-goes-up-against-rim-in-b.php>, retrieve date: Mar. 7, 2012, published Feb. 22, 2012, 3 pages.

International Search Report and Written Opinion for International Application No. PCT/US2013/020486, mailed Apr. 30, 2013, 12 pages.

International Search Report and Written Opinion received for International Patent Application No. PCT/US2012/045923, mailed on Oct. 4, 2012, 8 pages.

International Search Report and Written Opinion for International Application No. PCT/US2011/060023, mailed on May 25, 2012, 10 pages.

International Search Report received for International Patent Application No. PCT/US2011/051302, mailed on Jan. 26, 2012, 2 pages.

Non-Final Rejection for U.S. Appl. No. 13/346,592 dated Sep. 18, 2013, 21 pages.

Steam Support, "Portal 2 and Steam on PlayStation® 3—Account Creation and Management—Knowledge Base—Steam Support", http://web.archive.org/web/20110429221457/https://support.steampowered.com/kb_article.php?ref=5477-WPJM-9388, Apr. 29, 2011, retrieved Sep. 10, 2013.

Definition of library, https///www.google.com/search?q=define:=library&aqs=chrome.0.57j58j62l3.3252&sugexp=chrome,mod%3D0&sourceid-chrome&ie-UTF-8, retrieved Sep. 11, 2013.

Steam Store, http://web.archive.org/web/2011, retrieved Sep. 11, 2013.

Final Rejection for U.S. Appl. No. 13/292,902, dated Aug. 28, 2013, 16 pages.

Microsoft Computer Dictionary, Fifth Edition pp. 346 and 508.

Verge Staff "iOS: A visual history", http://www.theverge.com/2011/12/13/2612736/ios-history-iphone-ipad, Sep. 16, 2013, retrieved Apr. 11, 2014.

Sean Captain, "Ultimate iCloud Guide: Everything You Need to Know", Laptop.com, http://blog.laptopmag.com/ultimate-icloud-guide-everything-you-need-to-know, Nov. 3, 2011, retrieve Apr. 2, 2014.

Christian Zibreg, "Tips: How to selectivly hide/unhide past iTunes purchases", 9to5.com, http://9to5mac.com/2011/10/13/tips-how-to-selectively-hideunhide-past-itunes-purchases/, Oct. 14, 2011, retrieved Apr. 3, 2014.

(56) References Cited

OTHER PUBLICATIONS

Final Office Action for U.S. Appl. No. 13/346,592, mailed Apr. 8, 2014, 15 pages.
IEEE 100 The Authoritative Dictionary of IEEE Standards Terms Seventh Edition.
Final Office Action for U.S. Appl. No. 13/292,902, mailed Apr. 9, 2014, 19 pages.
International Search Report and Written Opinion for International Application No. PCT/US2013/077750, Mailed Aug. 29, 2014, 10 pages.
Canadian Office Action for International Application No. 2,747,653, mailed Oct. 21, 2014, 4 pages.
Non-Final Office Action for Korean Patent Application No. 10-2013-7034794, dated Mar. 19, 2015, 9 pages.
Amendment and Reply for U.S. Appl. No. 13/346,593, filed Feb. 19, 2014, 16 pages.
Non-Final Office Action for U.S. Appl. No. 13/731,821, mailed Jun. 17, 2014, 21 pages.
Non-Final Office Action for U.S. Appl. No. 13/731,821, mailed Feb. 5, 2015, 34 pages.
Amendment and Reply for U.S. Appl. No. 13/731,821, filed Jan. 18, 2014, 16 pages.
International Office Action for Japanese Application No. 2014-11153 dated Dec. 4, 2014, 11 pages.
Non-Final Office Action for U.S. Appl. No. 13/906,503, mailed Jun. 4, 2015, 40 pages.
Amendment and Response to Canadian Application No. 2,747,653, filed Apr. 20, 2015, 7 pages.
Amendment and Reply for U.S. Appl. No. 13/731,821, filed Aug. 4, 20156, 12 pages.

\* cited by examiner

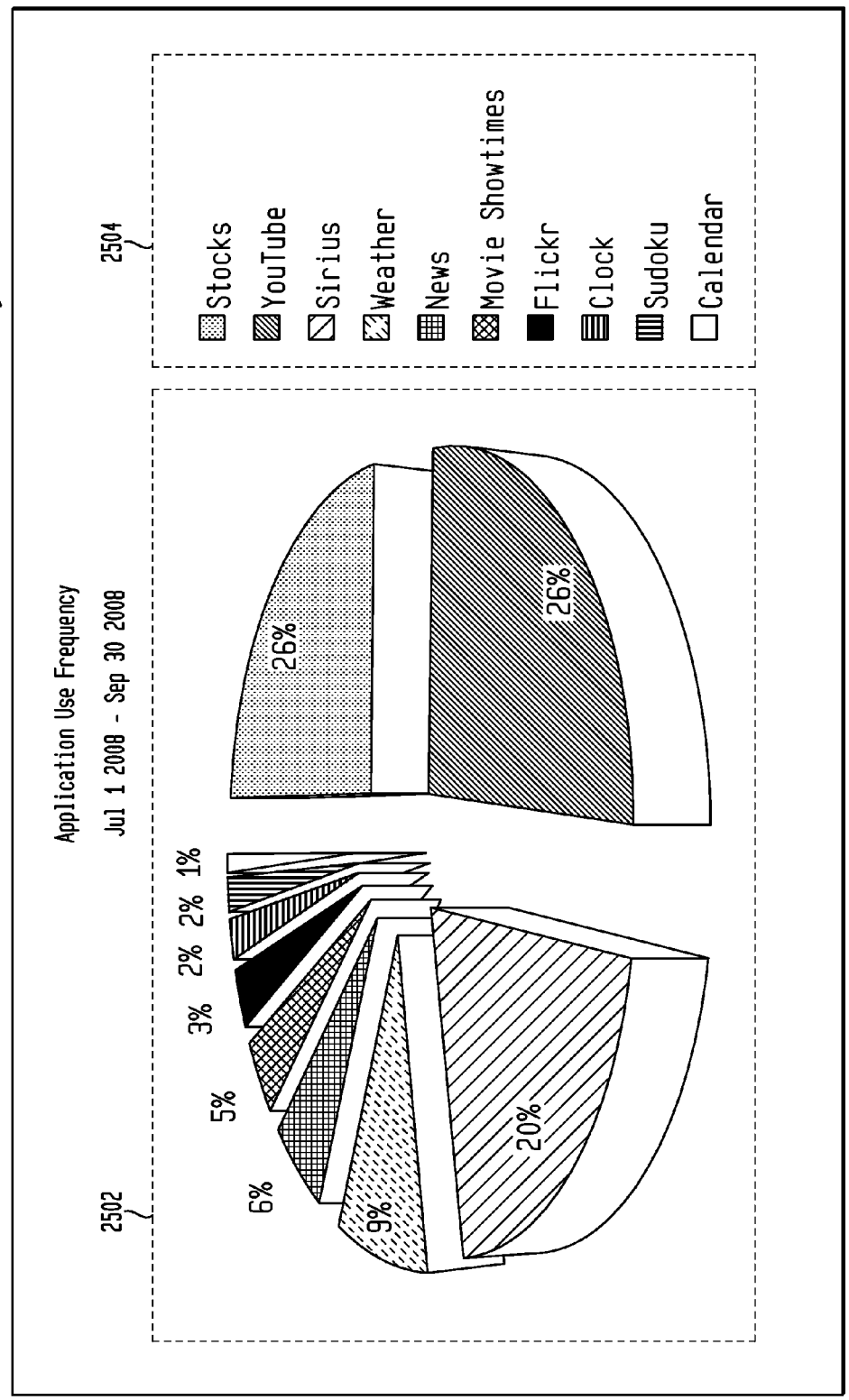

FIG. 26

OpenFrame Device Management

OPENPEAK

- Log Out
- Change Password
- Home
- Group Management
- Financial Updates
- Statistical Logs General Statistics — 2602
Total Number of Devices: 3 — 2604
Total Devices Online: 0
Most popular app today: Calculator  View more — 2606

Search Engine
Search [_____] by [MAC Address ▼] [Go] [Clear]

←Previous   Showing 1 thru 3 of 3   Next→

| MAC Address | Comment | Last Heartbeat | App Records | Phone Records | Boot Records | Applied Updates | Group Memberships | Start Date | End Date | Device Usage |
|---|---|---|---|---|---|---|---|---|---|---|
| 00:13:E0:9D:10:92 | Customer Test Unit #1 | ♡ 16 May 2008 17:34:22 | 0 | 0 | 12 | 2 | 0 | 06 May 2008 08:00:00 | N/A | View |
| 00:13:E0:9D:5C:AB | Customer Test Unit #2 | ♡ 27 Jan 2008 15:50:56 | 468 | 21 | 4 | 0 | 0 | 21 May 2008 08:00:00 | N/A | View |
| 00:13:E0:9D:5D:04 | Customer Test Unit #3 | ♡ 19 Jul 2008 17:02:49 | 0 | 0 | 135 | 1 | 0 | 01 Jul 2008 08:00:00 | 07 Jul 2008 08:00:00 | View |

2608  2610  2612  2614  2616  2618  2620  2622  2624  2626  2628

Showing 1 thru 3 of 3

—2600

APPLICATION STORE AND INTELLIGENCE SYSTEM FOR NETWORKED TELEPHONY AND DIGITAL MEDIA SERVICES DEVICES

CROSS-REFERENCE TO RELATED APPLICATIONS

This application claims priority to U.S. Provisional Patent Application No. 61/139,090, filed Dec. 19, 2008, the entirety of which is incorporated by reference herein.

BACKGROUND OF THE INVENTION

Field of the Invention

The present invention relates to systems, methods, and apparatuses that facilitate access to telephony and digital media services.

Background

The traditional home or office telephone typically provides a very limited set of functions related almost entirely related to telephony. Users wishing to perform functions that extend beyond the basic feature set of a home/office telephone are required to utilize one or more other devices or platforms. For example, users of traditional home/office telephones typically have to use a printed phonebook or a separate computer to access directory services information. Traditional home/office telephones also do not provide access to a variety of Internet Protocol (IP) network-based applications and services, advanced media applications and graphics, or standard computer-based functions such as a contacts database, directory, instant messaging, calendar, news and weather.

BRIEF SUMMARY OF THE INVENTION

As described herein, telephony and digital media services may be provided to a plurality of locations, such as to a plurality of homes and offices, though the deployment of telephony and digital media services devices to the locations, wherein each device is configured to function as a voice, data and media information center. A system in accordance with one embodiment of the present invention includes an application store and an application intelligence subsystem implemented on one or more computers. Each of the application store and the application intelligence subsystem is communicatively connected via a network to a plurality of such telephony and digital media services devices. The application store is operable to provide applications via the network for installation and execution on each of the plurality of devices. The application intelligence subsystem is operable to obtain and report information about applications installed and executed on each of the plurality of devices.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 25 depicts another example interface screen interface screen that may be presented by a system for reviewing application usage information associated with one or more telephony and digital media services devices in accordance with an embodiment of the present invention.

FIG. 26 depicts an example interface screen that may be presented by a system for reviewing application usage information, system configuration information and system health information associated with one or more telephony and digital media services devices in accordance with an embodiment of the present invention.

Figure 1:
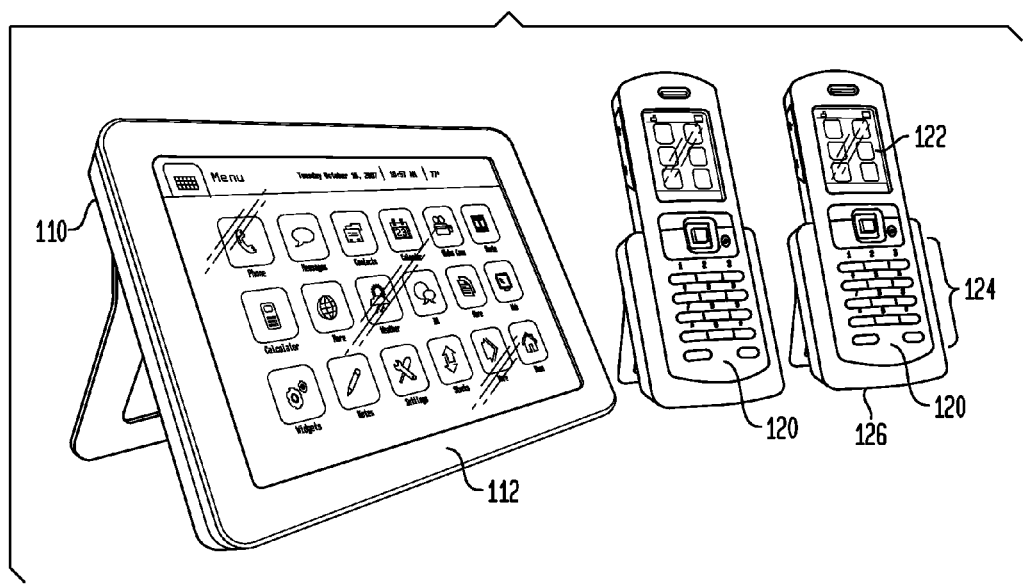
FIG. 1 depicts elements of a system for providing telephony and digital media services to a location, such as a home or office, in accordance with an embodiment of the invention.

Applicants expressly disclaim any rights to any third-party trademarks or copyrighted images included in the figures. Such marks and images have been included for illustrative purposes only and constitute the sole property of their respective owners.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

I. Introduction

The following detailed description refers to the accompanying drawings that illustrate exemplary embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the art to implement such feature, structure, or characteristic in connection with other embodiments whether or not explicitly described.

II. Example System for Providing Telephony and Digital Media Services

II.A Example System Elements

FIG. 1 depicts elements of a system 100 for providing telephony and digital media services to a location, such as a home or office, in accordance with an embodiment of the present invention. As used herein, the term "digital media services" broadly refers to any service that is based on the transfer and/or presentation of digital content to a user. As shown, in FIG. 1, system 100 includes a telephony and digital media services device ("device") 110 and associated handsets 120.

As shown in FIG. 1, device 110 includes a display 112. Display 112 is used to provide a graphical user interface (GUI) that enables a user to initiate, manage and experience telephony and digital media services provided by system 100. In one embodiment, display 112 comprises a color LCD display with a capacitive touch screen panel. In such an embodiment, a user may interact with the GUI by touching display 112 with a finger.

Handsets 120 provide a means for extending the telephony services, and optionally other services, of device 110 to other areas within a given location, such as to other areas within a home or office. As shown in FIG. 1, each handset 120 includes a user interface that comprises both a display 122, such as a color LCD display, and a keypad 124. Each handset 120 may be placed in a corresponding docking station 126. Docking station 126 provides an interface by which a battery internal to a handset may be recharged and also provides a means for supporting a handset when it is not in use.

Handsets 120 are configured to wirelessly communicate with device 110 for the purposes of providing telephony services and to optionally provide other services to a user. In one embodiment, such communications are carried out in accordance with the Digital Enhanced Cordless Telecommunications (DECT) standard published by the European Telecommunications Standards Institute (ETSI). Thus, in one embodiment, device 110 is configured to act as a DECT base station and handsets 120 are configured to act as DECT handsets. Other communication configurations will be discussed elsewhere herein.

Figure 2:
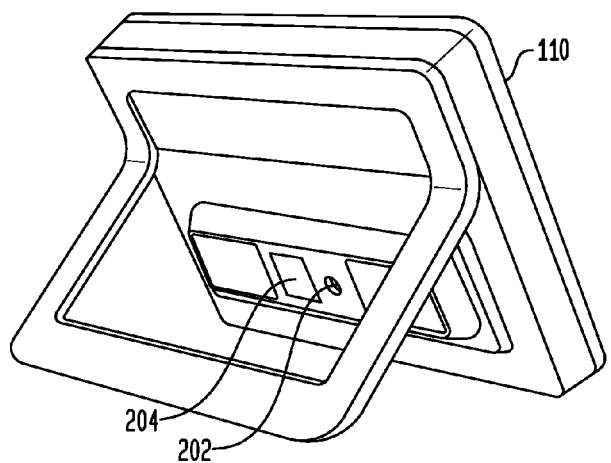
FIG. 2 is a back perspective view of a telephony and digital media services device in accordance with an embodiment of the invention.

FIG. 2 is a back perspective view of device 110. As shown in FIG. 2, device 110 includes an interface 202 for connecting to a power supply, such as an AC adapter as well as an interface 204 for connecting to a network, such as a local area network or wide area network. In one embodiment, interface 204 comprises an Ethernet interface, such as a 10/100/1000 megabit per second (Mbps) Ethernet interface. Device 110 may also include an internal wireless network adapter, such as an 802.11 wireless network adapter, for providing network connectivity. As will be described in more detail herein, such network connectivity may be utilized by device 110 for providing telephony services and/or certain digital media services to a user.

The foregoing provides by way of introduction only a brief description of certain implementations of device 110 and handsets 120 that comprise a portion of telephony and digital media service delivery system 100. Additional details concerning such implementations, as well as various alternative implementations, will be described in detail herein.

II.B System Connectivity Options

In order to provide telephony services and certain digital media services, device 110 and handsets 120 may be communicatively connected to a telecommunications carrier and/or Internet Protocol (IP) network. Various manners of implementing such connectivity will now be described with reference to FIGS. 3-8.

Figure 3:
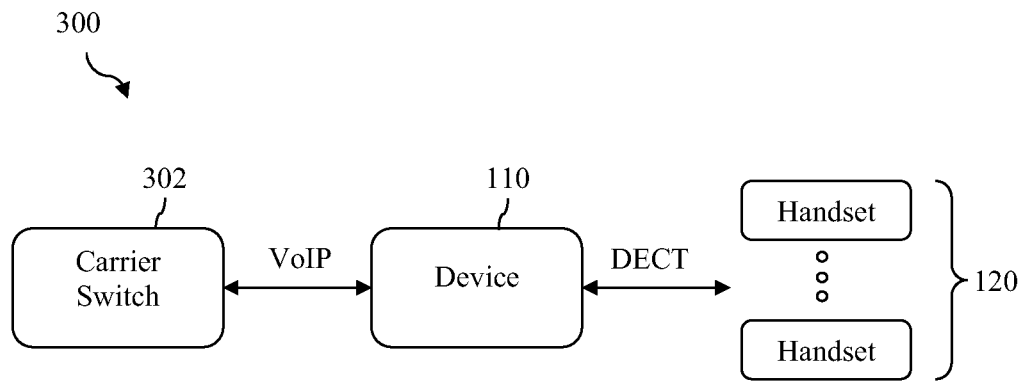
FIG. 3 is a block diagram of a system for providing telephony and digital media services in accordance with an embodiment of the invention.

FIG. 3 depicts connectivity aspects of a first example installation 300. In installation 300, device 110 is communicatively connected to a remote telecommunication carrier switch 302 and is configured to receive Voice over Internet Protocol (VoIP) telephony services therefrom via a VoIP connection. The VoIP connection may be implemented, for example, over a broadband data service such as Digital Subscriber Line (DSL), Integrated Services Digital Network (IDSN), data over cable, T1/T3, optical carrier, carrier-class Ethernet, satellite or any other suitable data service. The various physical transport media used for implementing such data services are well known. In one embodiment, device 110 connects to the appropriate data service via an Ethernet interface or WiFi interface, although these are only examples. The broadband data service may be also used by device 110 to provide other services, such as digital media services, to a user.

In one embodiment of installation 300, carrier switch 302 acts as a Session Initiation Protocol (SIP) server and device 110 acts as a SIP client for the purposes of conducting VoIP telephony services. Handsets 120 are wirelessly connected to device 110 using the well-known DECT protocol, which is used to extend telephony services to each handset.

A limitation of installation 300 is that the installation is limited to one device 110, which is configured to act as a DECT base station.

Figure 4:
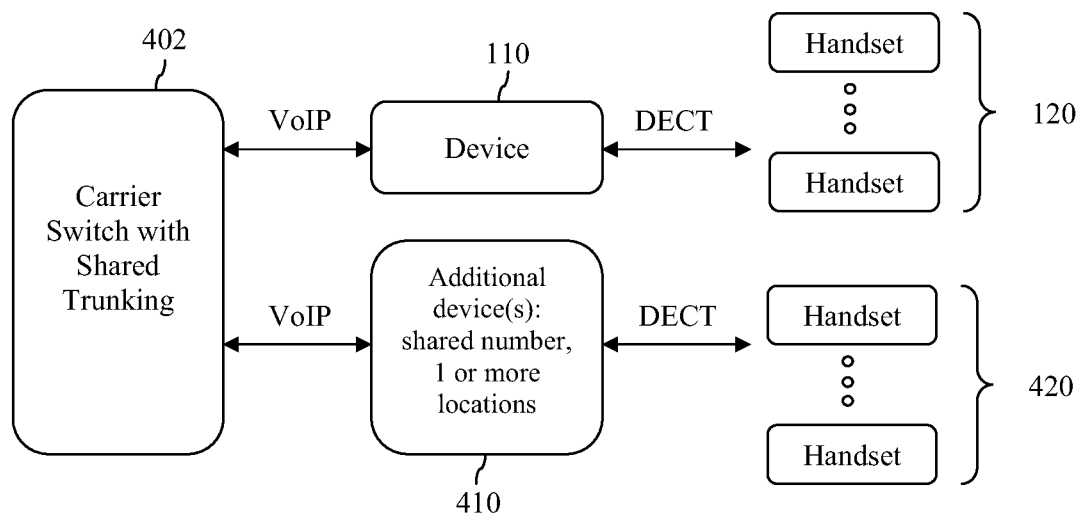
FIG. 4 is a block diagram of an alternative system for providing telephony and digital media services in accordance with an embodiment of the invention.

FIG. 4 depicts connectivity aspects of an alternative example installation 400. In installation 400, a carrier switch 402 is configured to perform shared trunking. This allows multiple devices, including device 110 and additional device(s) 410, to be associated with the same telephone number for the purposes of receiving incoming telephony calls. As shown in FIG. 4, a separate VoIP connection is maintained between carrier switch 402 and each device. Additionally, each device is associated with one or more handsets (e.g., device 110 is associated with handsets 120, each of device(s) 410 is associated with corresponding handset(s) 420) and communicates wirelessly therewith using DECT. A limitation of installation 400 is that the handsets associated with one device cannot communicate with handsets associated with another device through standard DECT intercom mechanisms because each handset is configured to communicate with a different DECT base station.

Figure 5:
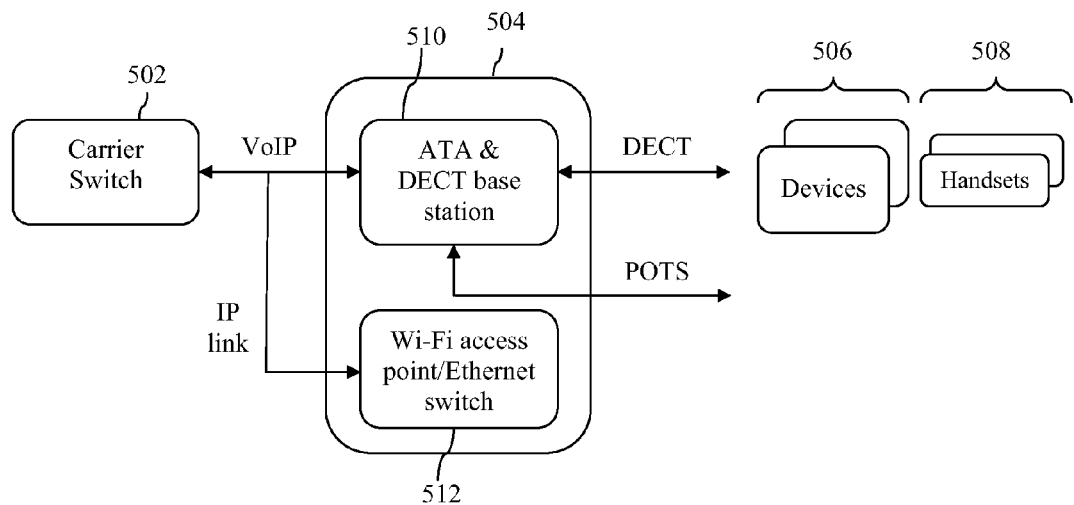
FIG. 5 is a block diagram of a system for providing telephony and digital media services in accordance with an embodiment of the invention that supports multiple devices and handsets via an adapter unit in an environment in which a telecommunication carrier provides Voice over Internet Protocol (VoIP) service.

FIG. 5 depicts an alternate installation 500 that supports multiple devices 506 and handsets 508 via an adapter unit 504 in an environment in which a telecommunication carrier provides VoIP service. In installation 500, devices 506 do not act as DECT base stations but instead are configured to operate as DECT clients in a like manner to handsets 508. Adapter unit 504 is installed on-site along with devices 506 and handsets 508 and is connected to a remote carrier switch 502. Adapter unit 504 includes an Analog Terminal Adapter (ATA) and DECT base station 510. As will be appreciated by persons skilled in the relevant art(s), an ATA comprises an adapter that allows a Plain Old Telephony System (POTS) telephone to interface to a VoIP provider.

In installation 500, devices 506 and handsets 508 perform telephony-related operations by communicating via the DECT protocol with the DECT base station within ATA and DECT base station 510. Installation 500 also advantageously supports the operation of legacy POTS equipment (such as POTS telephones, fax machines and security systems) by allowing such equipment to be connected via a POTS interface to the ATA within ATA and DECT base station 510.

Adapter unit 504 further includes a Wi-Fi access point (i.e., an IEEE 802.11 access point) and/or Ethernet switch 512. This element provides access to the Internet via an IP link. As shown in FIG. 5, the IP link may be supported by the same data service and physical transport media used to support the VoIP connection with carrier switch 502. In an embodiment, each of devices 506 is communicatively connected to Wi-Fi access point/Ethernet switch 512 for the purpose of accessing digital media that may be used to provide services to a user. In an alternate implementation, Wi-Fi access point/Ethernet switch 512 is not integrated within adapter unit 504 but instead comprises one or more separate stand-alone devices.

Figure 6:
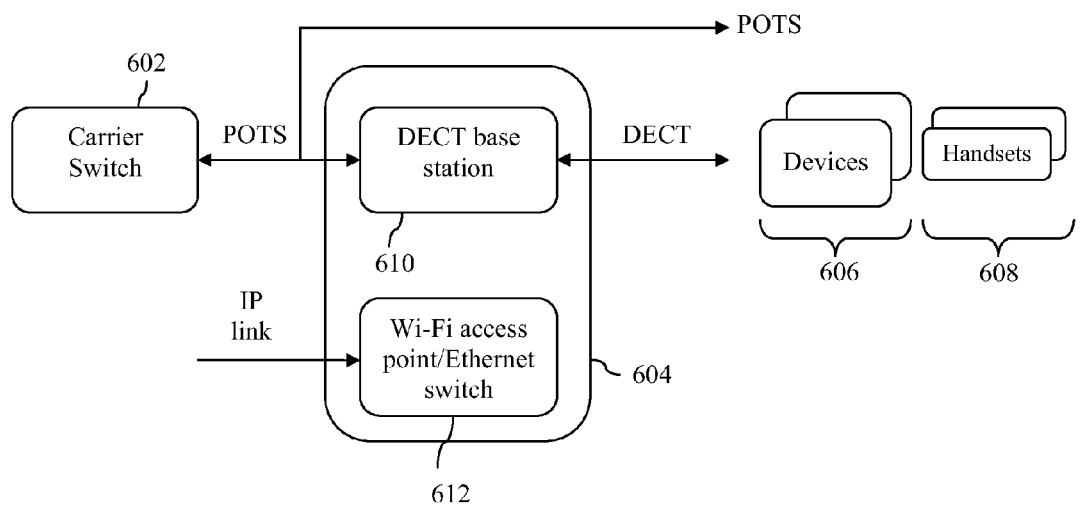
FIG. 6 is a block diagram of a system for providing telephony and digital media services in accordance with an embodiment of the invention that supports multiple devices and handsets via an adapter unit in an environment in which a telecommunications carrier provides POT service.

FIG. 6 depicts an installation 600 that supports multiple devices 606 and handsets 608 via an adapter unit 604 in an environment in which a telecommunications carrier provides POTS service. In installation 600, devices 606 do not act as DECT base stations but instead are configured to operate as DECT clients in a like manner to handsets 608. Adapter unit 604, which includes a DECT base station 610 and a Wi-Fi access point and/or Ethernet switch 612, is installed on-site along with devices 606 and handsets 608. DECT base station 610 is connected to a carrier switch 602 via a POTS interface.

Devices 606 and handsets 608 perform telephony-related operations by communicating via the DECT protocol with DECT base station 610. Legacy POTS equipment may be connected to a POTS interface to receive POTS service directly from carrier switch 602.

Wi-Fi access point/Ethernet switch 612 provides access to the Internet via an IP link that is not associated with carrier switch 602. Such IP link may be provided using any known data service/physical transport media combination. In an embodiment, each of devices 606 is communicatively connected to Wi-Fi access point/Ethernet switch 612 for the purpose of accessing digital media that may be used to provide services to a user. In an alternate implementation, Wi-Fi access point/Ethernet switch 612 is not integrated within adapter unit 604 but instead comprises one or more separate stand-alone devices.

Figure 7:
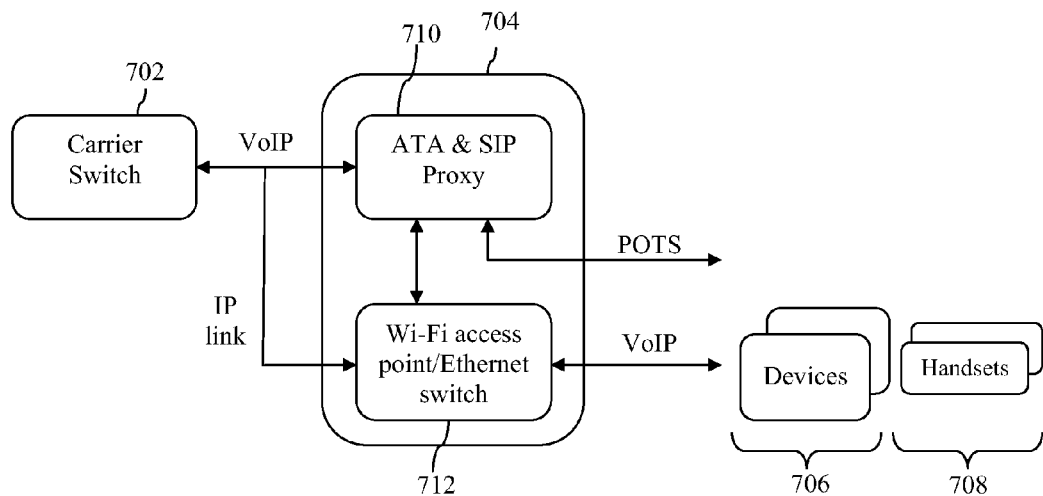
FIG. 7 is a block diagram of a system for providing telephony and digital media services in accordance with an embodiment of the present invention that supports multiple devices and handsets via an adapter unit in an environment in which a telecommunications carrier provides VoIP service.

FIG. 7 depicts an alternate installation 700 that supports multiple devices 706 and handsets 708 via an adapter unit 704 in an environment in which a telecommunications carrier provides VoIP service. In installation 700, VoIP services are provided directly to devices 706 and handsets 708. To achieve this, adapter unit 704 is installed on-site along with devices 706 and handsets 708. Adapter unit 704 includes an ATA and a Session Initiation Protocol (SIP) proxy 710 that is communicatively connected to a carrier switch 702 via a VoIP connection. Adapter unit 704 also includes a Wi-Fi access point and/or Ethernet switch 712 that is communicatively connected to carrier switch 702 via an IP link and to ATA and SIP proxy 710.

The SIP proxy within ATA and SIP proxy 710 allows devices 706 to register with it and maintains a local numbering plan. Thus, SIP proxy essentially operates as a home private branch exchange (PBX). The SIP proxy in turn registers with carrier switch 702. Communication between each device 706 and the SIP proxy is via Wi-Fi access point/Ethernet switch 712. Preferably, each handset 708 is also capable of communicating with the SIP proxy via Wi-FI or some other protocol capable of supporting SIP communication.

In installation 700, the ATA within ATA and SIP proxy 710 can provide a POTS interface for providing telephony service to legacy POTS equipment. Wi-Fi access point/Ethernet switch 712 can be used by devices 706 to access digital media for providing services to a user. Wi-Fi access point/Ethernet switch 712 may either be integrated within adapter unit 704 or comprise one or more separate stand-alone devices.

Figure 8:
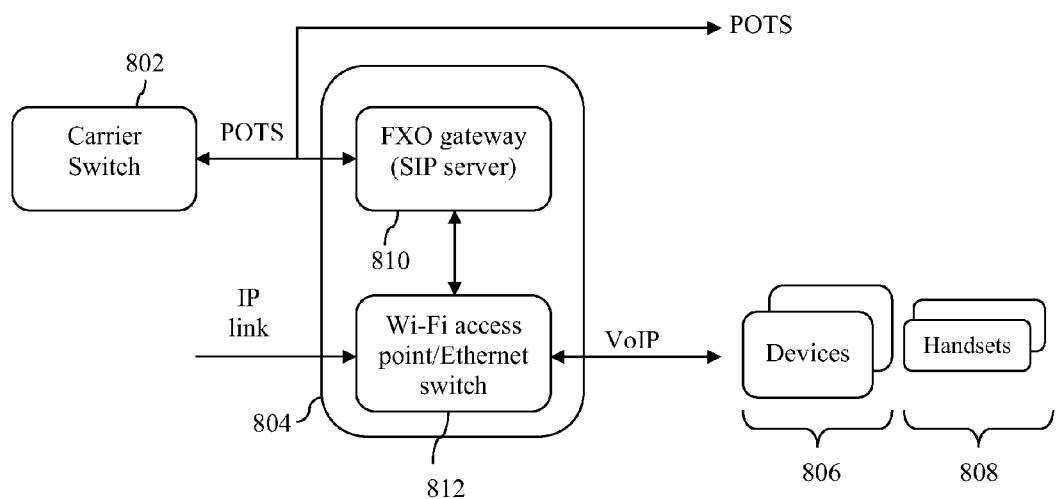
FIG. 8 is a block diagram of a system for providing telephony and digital media services in accordance with an embodiment of the invention that supports multiple devices and handsets via an adapter unit in an environment in which a telecommunications carrier provides POT service.

FIG. 8 depicts an alternate installation 800 that supports multiple devices 806 and handsets 808 via an adapter unit 804 in an environment in which a telecommunications carrier provides POTS service. In installation 800, VoIP services are provided directly to devices 806 and handsets 808. To achieve this, adapter unit 804 is installed on-site along with devices 806 and handsets 808. Adapter unit 804 includes a Foreign Exchange Office (FXO) gateway (SIP server) 810 that is connected via a POTS interface to a carrier switch 802. Adapter unit 804 further includes a Wi-Fi access point and/or Ethernet switch 812 that provides access to the Internet via an IP link and that is connected to FXO gateway 810.

FXO gateway 810 allows devices 806 to register with it and maintains a local numbering plan. Thus, FXO gateway 810 essentially operates as a home PBX. Communication between each device 806 and FXO gateway 810 is via Wi-Fi access point/Ethernet switch 812. Preferably, each handset 808 is also capable of communicating with FXO gateway 810 via Wi-Fi or some other protocol capable of supporting SIP communication. FXO gateway in turn communicates with carrier switch 802 via one or more POTS lines.

In installation 800, legacy POTS equipment may be connected to a POTS interface to receive POTS service directly from carrier switch 802. Wi-Fi access point/Ethernet switch 812 can be used by devices 806 to access digital media or other information for providing services to a user. Wi-Fi access point/Ethernet switch 812 may either be integrated within adapter unit 804 or comprise one or more separate stand-alone devices.

Figure 9:
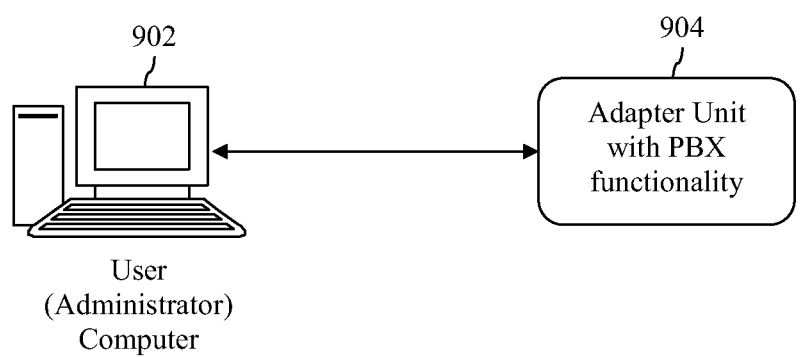
FIG. 9 depicts an embodiment of the invention in which an adapter unit within a system for providing telephony and digital media service provides PBX-like features to a user of a computer connected to the adapter unit.

Depending upon the implementation, the adapter unit described above in reference to FIG. 7 or FIG. 8 may be configured to function as a "mini-PBX," offering a variety of features to a user acting as administrator. For example, the adapter unit may be configured to present a Web page, Adobe® Flash® movie, or some other interface that provides programmatic control to a user of a computer that is connected to the adapter unit. The computer may be connected to the adapter unit via a wired interface, such as an Ethernet or Universal Serial Bus interface, or via a wireless interface, such as an 802.11 interface. Such a configuration is depicted in FIG. 9, which shows a computer 902 connected to an adapter unit 904 having PBX functionality (which may represent, for example, adapter unit 706 of FIG. 7 or adapter unit 806 of FIG. 8) for the purpose of providing a user with programmatic control over certain features implemented by adapter unit 904.

The adapter unit may be configured to discover new devices or handsets in a location such as a home. The discovery protocol may be implemented, for example, using an IP protocol or via DECT.

The adapter unit may also be configured to present a list of newly-discovered devices and handsets to the user. The adapter unit may permit a user to assign names, locations and/or extension numbers to the devices/handsets. In an implementation in which the devices and handsets are VoIP devices, the adapter unit may allow a user to define a numbering plan (e.g., 4-digit extensions) and assign numbers to the devices. If DECT is used for communication with the devices, then single-digit identifiers may instead be used due to limitations associated with that protocol. The adapter unit may also be configured to allow a user to assign an owner to a device, wherein the association of an owner with a device may cause other items of information to be associated with the device. Thus, for example, if a particular owner is associated with a device, then the device may be configured with a contact list associated with the particular owner.

The adapter unit may also be configured to allow a user to manage permissions for each connected device or handset. Such permissions may include, for example: time-of-day restrictions on calls (e.g., no calls after 10:00 PM except for 911 calls); dialing restrictions (e.g., no calls to 1-900 numbers or international numbers); call restrictions (e.g., no outgoing calls or no incoming calls); and restrictions on the ability to modify device settings or add/modify/delete contacts. This list of examples is by no means exhaustive and other types of permissions may be managed as will be appreciated by persons skilled in the relevant art(s).

The adapter unit may also be configured to present a user with status information associated with each device/handset. Such status information may include, and is not limited to, whether a device is in use, whether a device is still functioning (i.e., whether the device is "alive" or "dead"), and other properties associated with a device.

II.C Example Device Hardware Architecture

Figure 10:
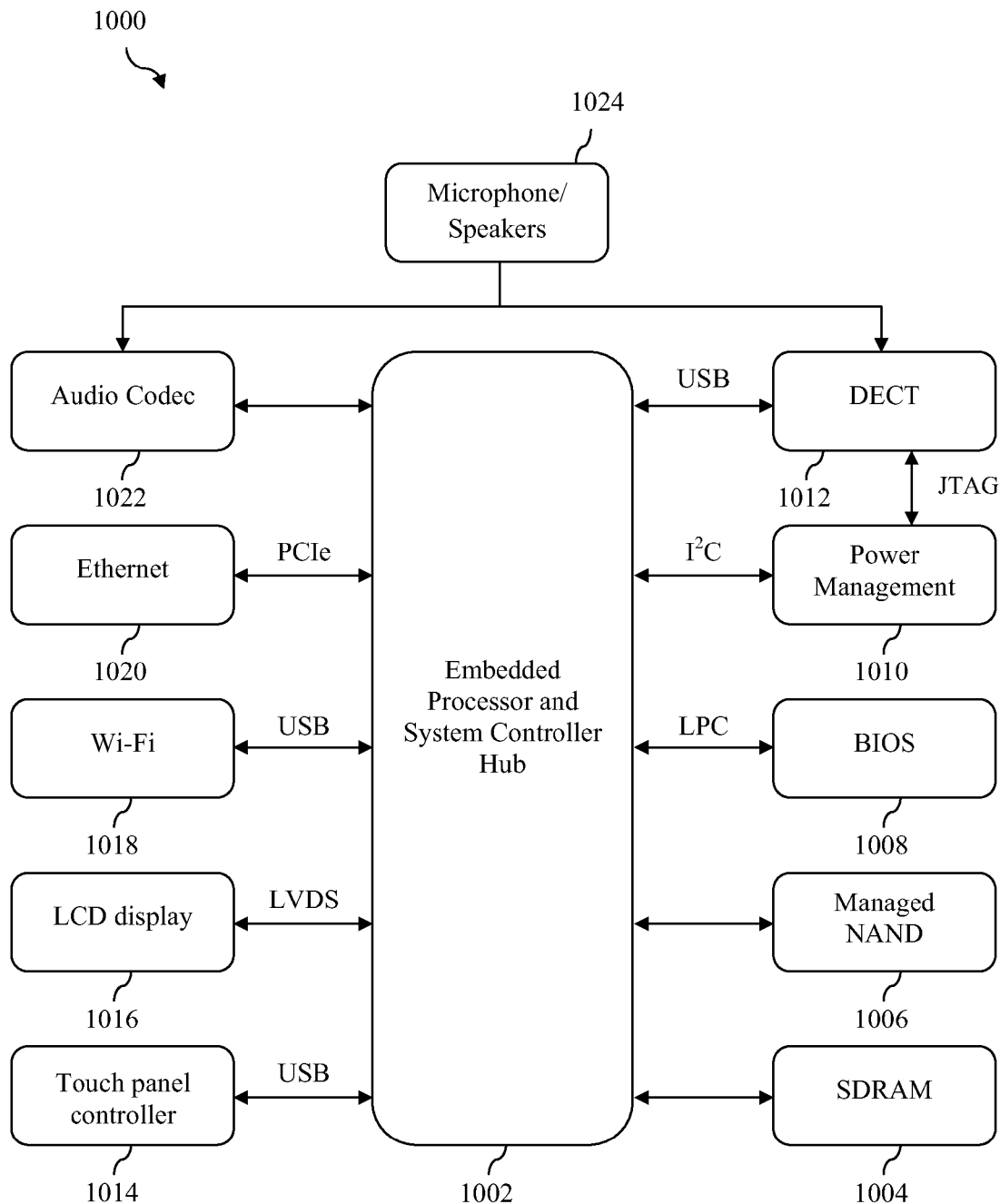
FIG. 10 is a hardware block diagram of a telephony and digital media services device in accordance with an embodiment of the invention.

FIG. 10 is a block diagram of an example hardware architecture 1000 of device 110. This hardware architecture is described by way of example only and is not intended to limit the present invention. Persons skilled in the relevant art(s) will readily appreciate that other hardware architectures may be used to implement device 110 that are within the scope and spirit of the present invention.

As shown in FIG. 10, hardware architecture 1000 includes an embedded processor and system controller hub 1002 that is connected to a plurality of peripheral devices or chips. The embedded processor is preferably one that has been designed for use in portable and low-power applications, such as Mobile Internet Devices (MIDs). The system controller hub comprises a chipset that handles peripheral input/output (I/O) and performs memory and power management functions for the embedded processor. In one embodiment, the embedded processor comprises a 1.1 Gigahertz (GHz) Intel® Atom™ processor designed and sold by Intel Corporation of Santa Clara, Calif., and the system controller hub comprises the Intel® System Controller Hub US15W Chipset, also designed and sold by Intel Corporation of Santa Clara, Calif., although this is only one example.

As shown in FIG. 10, hardware architecture 1000 includes volatile system memory in the form of SDRAM (Synchronous Dynamic Random Access Memory) 1004. In one embodiment, the embedded processor supports an integral 64-bit-wide 4-Gigabits (Gbits) of DDR2 (Double Data Rate 2) SDRAM clocked at 533 Megahertz (MHz). In such an embodiment, SDRAM 1004 may comprise four 512 Megabit (Mbit) DDR2 SDRAM 667 MHz integrated circuits (ICs) directly mounted onto a motherboard along with embedded processor and system controller hub 1002. The capacity may be increased from 512 Megabytes (MB) to 1 gigabyte (GB) by populating the board with four 1 Gbit ICs instead. However, these are only examples, and other DDR2 SDRAM configurations, other types of SDRAM, or other types of volatile memory may be used.

Hardware architecture 1000 also includes non-volatile memory in the form of a managed NAND flash memory 1006, although other forms of non-volatile memory may be used. In one embodiment, managed NAND flash memory 1006 comprises a 512 MB or 1 GB MMC NAND flash memory that is mounted on a motherboard along with embedded processor and system controller hub 1002. The use of an MMC NAND flash memory avoids the inclusion in device 110 of spinning media storage devices, such as hard disk drives or optical drives. The use of an MMC NAND flash memory also means that it is not necessary to employ wear-leveling and error correction when using a file system such as YAFFS2 and that an EXT3 file system can be used instead.

Hardware architecture 1000 further includes a chip 1008 for storing the system BIOS. In one embodiment, chip 1008 comprises an 8 Mbit NOR flash memory that is connected to the system controller hub via a Low Pin Count (LPC) bus, although this is only an example.

Power management functions are performed in hardware architecture 1000 by a power management chip 1010. In one embodiment, power management chip 1010 comprises an Intel® Mobile Voltage Positioning chip designed and sold by Intel Corporation of Santa Clara, Calif. that is connected to embedded processor and system controller hub 1002 via an Inter-Integrated Circuit ($I^2C$) bus. Power management chip 1010 is used to sequence power to embedded processor and system controller hub 1002. As a secondary function, a subset of a plurality of general purpose input/output (GPIO) connections of power management chip 1010 are used to connect to a Joint Test Action Group (JTAG) interface of a DECT processor 1012 (to be described below). This enables updating of the firmware of DECT processor 1012 in a manner that minimizes the likelihood that the firmware will be left in an unrecoverable state.

Hardware architecture 1000 also includes a DECT processor 1012. In one embodiment, DECT processor 1012 comprises a DECT base station processor that supports up to five handsets. In an implementation in which DECT processor 1012 has no explicit hardware reset input, a GPIO connection from the embedded processor may be used to reset the device by turning its power supply off and then on again.

A Universal Serial Bus (USB) is used to transfer audio (e.g., up to four channels of audio) in each direction between DECT processor 1012 and the system controller hub. DECT processor 1012 may be configured to act as the bus master and drive the USB bus. In an implementation in which the maximum speed of the USB bus is 4.096 MHz, DECT processor 1012 may drive the USB bus with a bit clock rate of 2.048 MHz.

In one embodiment, universal asynchronous receivers/transmitters (UARTS) on the system controller hub and DECT processor 1012 implement a 115200 baud channel that is used to transfer control and data packets between the two. Packets on this link are encapsulated using Serial Line IP (SLIP) (as documented in Request for Comments: 1055, published by the Internet Engineering Task Force, June 1988). Layered on top of this is a cordless telephone application programming interface (CTAPI) protocol. The CTAPI protocol comprises request, response and event message types. These message types all have a common header and, optionally, some data. Responses and events are asynchronous; each request is tagged with a sufficiently unique identifier that is copied into a header of the corresponding response. The identifier is used to match responses with their originating requests.

To perform an API operation (e.g., obtain firmware version number, go off-hook, update handset name, etc.), a main application running on the embedded processor sends a request message to DECT processor 1012 or to one of handsets 120 via DECT processor 1012. The message recipient performs the requested actions and returns a response. Additionally, a spontaneous action such as a handset going off-hook or propagating a name or address book update can generate an event message to be sent from DECT processor 1012 to the embedded processor.

In one embodiment, DECT processor 1012 is configured to execute acoustic echo cancellation (AEC) software. In accordance with such an embodiment, a microphone and speakers 1024 internal to device 110 are connected directly to DECT processor 1012 whenever speakerphone functionality of device 110 is in use. During high-fidelity audio playback, however, speaker and microphone 1024 are connected to an audio codec 1022.

As noted above, hardware architecture 1000 includes an internal microphone and speakers 1024. The microphone may comprise a mono microphone and the speakers may comprise stereo speakers with an associated stereo amplifier. The speakers may be driven by an audio codec 1022. In one embodiment, audio codec 1022 comprises a 2-channel audio codec such as the Intel® High Definition Audio (HDA) system designed and sold by Intel Corporation of Santa Clara, Calif. In such an embodiment, audio codec 1022 connects to embedded processor and system controller hub 1002 via an HDA bus.

A stereo jack may be provided on device 110 for connecting headphones or an external amplifier and speakers to audio codec 1022. In one embodiment, when a plug is inserted into this jack, the internal speakers are automatically disconnected and their amplifier is powered down. The state of this jack may be determined by software.

As described above in reference to FIG. 1, device 110 includes an LCD display 1016. As shown in FIG. 10, LCD display 1016 connects to embedded processor and system controller hub 1002 via a low-voltage differential signaling (LVDS) connection over twisted pair copper cables. In one example implementation, LCD display 1016 comprises a thin film transistor (TFT) LCD display that has a 7 inch (17.8 centimeter (cm)) wide screen and supports 24-bit color. LCD display 1016 may provide an active viewing area of 152.4 millimeters (mm)×91.4 mm, support a pixel format of 800×480 pixels, and have a pixel pitch of 0.1805 (H)× 01.905 (V). LCD display 1016 may further provide a 15:9 aspect ratio, a display mode that is normally white, LED backlighting, and a brightness of approximately 350 candelas per square meter ($cd/m^2$).

In an embodiment, LCD display 1016 may be used in both a transmissive mode and a reflective mode. In accordance with such an embodiment, a color display may be used when in the transmissive mode and a very low-power monochrome display may be used when in the reflective mode. In further accordance with such an embodiment, the LCD backlight for the transmissive mode may be provided by white light emitting diodes (LEDs). In particular, multiple LEDs may be connected in series into three chains in order to equalize their brightness. These chains may then be powered in parallel. LEDs from all three chains may be interleaved to minimize the impact of a single chain burning out. In one implementation, up to 60 milliamps (mA) of current at 25.6 Volts (V) is provided to drive the backlight. Two signals may be used to control the backlight operation. The first signal enables/disables the backlight and the second signal is pulse-width modulated to generate a voltage that varies the brightness of the backlight.

As also described above in reference to FIG. 1, a touch panel is integrated with LCD display 1016 to provide a user interface to device 110. The touch panel includes an integrated programmable system on chip (PSOC) controller 1014 that is connected to embedded processor and system controller hub 1002 via a USB bus.

In one embodiment, the touch panel comprises a 7 inch capacitive touch panel having a glass surface. As will be appreciated by persons skilled in the relevant art(s), capacitive touch panels are highly responsive to the touch of a finger, but do not respond to other types of touches. Consequently, the use of such a panel reduces the chance of false touches from jewelry, clothing or other contaminants. Furthermore, it is expected that such a glass capacitive touch panel will be more durable and last longer than other types of touch panels such as resistive touch panels. A glass capacitive touch panel will also have less of an impact on screen brightness as compared to resistive touch panels.

Hardware architecture 1000 further includes an internal Wi-Fi controller 1018 for supporting wireless networking. Wi-Fi controller 1018 is connected to embedded processor and system controller hub 1002 via a USB interface. In one embodiment, Wi-Fi controller 1018 comprises an 802.11b/g controller. In an alternative embodiment Wi-Fi controller 1018 comprises an 802.11b/g/n controller. Wi-Fi controller 1018 may include an integrated internal antenna.

Hardware architecture 1000 also includes an Ethernet chip 1020 that supports wired networking in accordance with the Ethernet protocol. In one embodiment, Ethernet chip 1020 comprises a 10/100/1000 Mbps Ethernet chip. As shown in FIG. 10, Ethernet chip 1020 is connected to embedded processor and system controller hub 1002 via a PCI Express (PCIe) bus. An external RJ45 jack is provided on device 110 to facilitate connection to Ethernet chip 1020.

Hardware architecture 1000 may further include an external USB 2.0 port (not shown in FIG. 10) that connects to embedded processor and system controller hub 1002 via a USB bus. Also not shown in FIG. 10 is a power supply that is connected to hardware architecture 1000 and supplies power thereto. In one embodiment the power supply comprises a 5V, 4A AC power supply.

Figure 11:
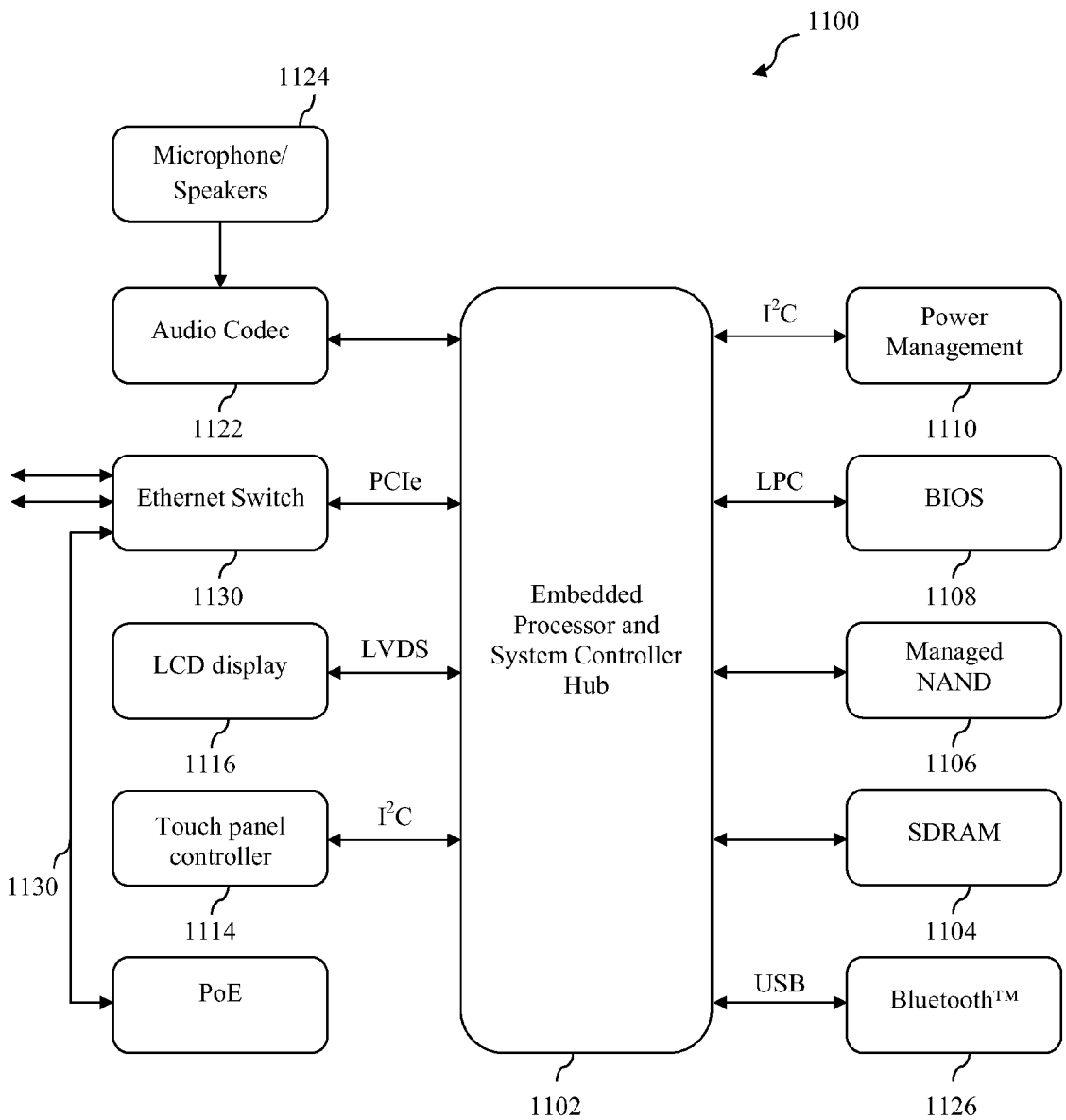
FIG. 11 is a hardware block diagram of a telephony and digital media services device designed for office environments in accordance with an alternate embodiment of the present invention.

FIG. 11 depicts an alternate hardware architecture 1100 for a device 110 that has been designed specifically for office environments. Hardware architecture 1100 may be thought of as a modified version of hardware architecture 1000 of FIG. 10, or vice versa. As shown in FIG. 11, hardware architecture 1100 does not include a DECT processor for wireless handset support or a Wi-FI controller for 802.11 wireless networking. These features may be deemed less useful or not useful in an office environment.

Hardware architecture 1100, however, does include some additional elements as compared to hardware architecture 1000. These include a Bluetooth® adapter 1126, an Ethernet switch 1130, and a Power over Ethernet (PoE) connector.

Bluetooth® adapter 1126 allows an end user to invoke the telephony features of device 110 using a Bluetooth® cordless headset or like device. Bluetooth® adapter 1126 may be connected to embedded processor and system controller hub 1102 via a USB bus. In a further embodiment, hardware architecture 1100 may also include an integrated charger that allows an end user to charge the battery or batteries of a Bluetooth® cordless headset or like device by plugging the device into a USB port, mini-USB port, or other suitable port of device 110.

Ethernet switch 1130 comprises a multi-port (e.g., two-port) Ethernet switch with an additional port host interface via PCIe. Ethernet switch 1130 provides a convenient Internet pass-through for other network-capable devices (e.g., personal computers, laptops, printers, storage devices, or the like) that might be used in an office environment. Because it is a switch, Ethernet switch 1130 allows multiple Ethernet devices to be connected to a single Ethernet connection in a non-interfering manner.

PoE connector 1130 comprises a connector that allows power to be delivered to device 110 via an Ethernet connection. In one embodiment, PoE connector 1130 comprises an eight-pin RJ-45 connector that uses two pairs for power (two for + and two for −) as well as the normal two pairs for data (1-2, 3-6). A switching regulator with good isolation (transformer and opto-coupler).

Although not shown in FIG. 11, hardware architecture 1100 may further include a fingerprint scanner that allows device 110 to be placed in a locked/unlocked state by only authorized user(s). Such protection may be deemed desirable in an office environment. In a further embodiment, the configuration of device 110 (e.g., owner, phone number, contacts, etc.) may be determined based on the fingerprint used to unlock device 110.

The other components shown in FIG. 11 (embedded processor and system controller hub 1102, SDRAM 1104, managed NAND 1106, BIOS 1108, power management 1110, touch panel controller 1114, LCD display 1116, audio codec 1122 and microphone/speakers 1124) are generally similar to like-named elements of hardware architecture 1000, although certain implementation details may vary. These components will not be described herein for the sake of brevity.

II.D Example Device Software Architecture

Figure 12:
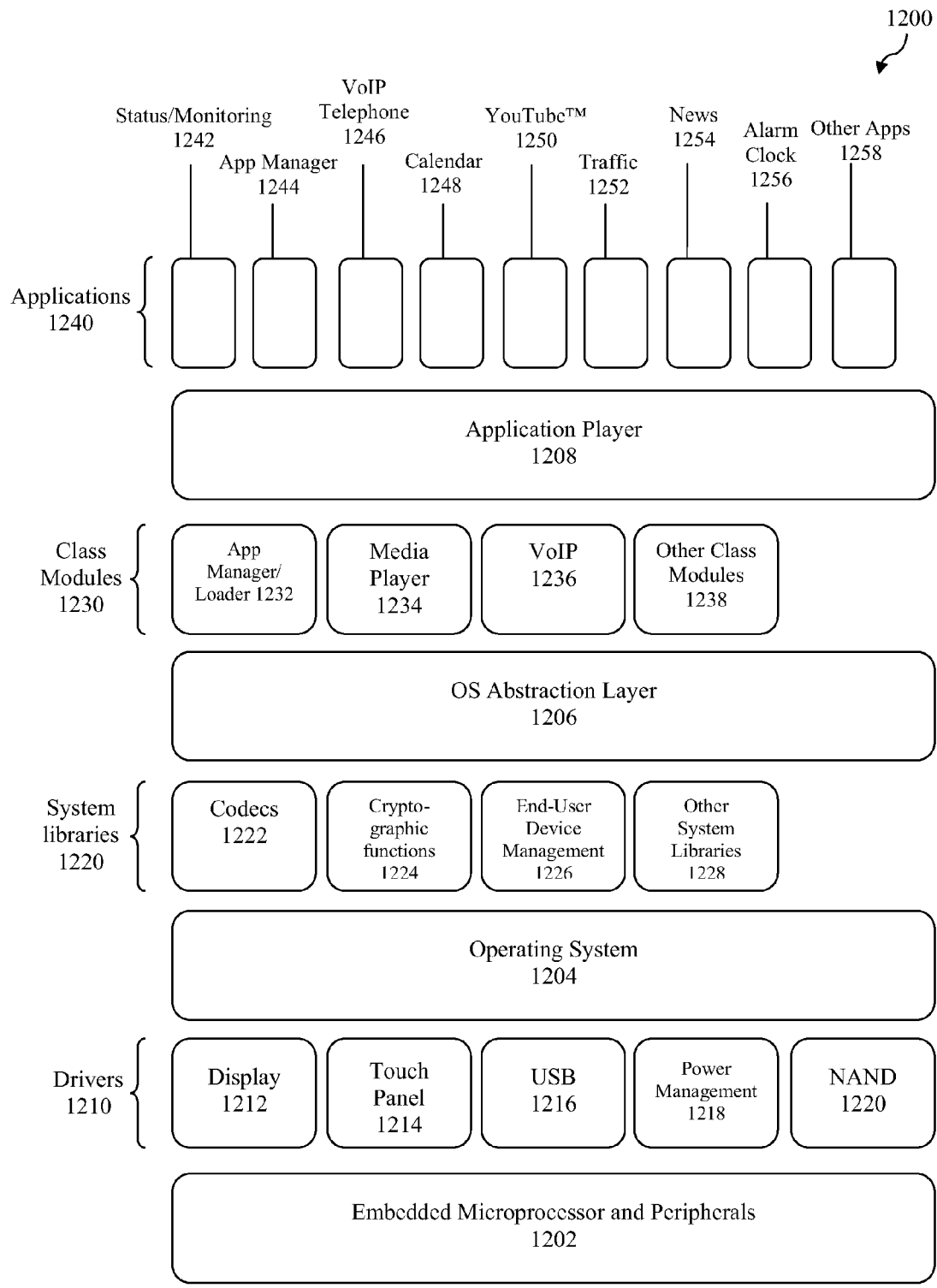
FIG. 12 is a block diagram of a software architecture of a telephony and digital media services device in accordance with an embodiment of the invention.

FIG. 12 is a block diagram of an example software architecture 1200 of device 110. As shown in FIG. 11, software architecture 1200 includes a plurality of software components running atop an embedded processor and peripherals 1202. As noted above, the embedded processor preferably comprises a processor designed for use in portable and low-power applications, such as Mobile Internet Devices (MIDs), and in one embodiment comprises an Intel® Atom™ processor designed and sold by Intel Corporation of Santa Clara, Calif.

The embedded processor executes an operating system 1204 that provides a context for the execution of system and application processes that will be described in more detail herein. In one embodiment, operating system 1204 comprises a Linux-based operating system, such as an Ubuntu® MID Edition operating system based on Linux kernel release 2.6.24, although this is only an example. In one embodiment, operating system 1204 is optimized through custom configuration for a small size and rapid startup.

Certain system and/or application processes that run in the context of operating system 1204 are designed to interact with hardware peripherals that are communicatively connected to the embedded microprocessor. To facilitate such interaction, software architecture 1200 includes a plurality of device drivers 1210, each of which provides an abstraction layer between a hardware peripheral and the system and/or application processes that use it.

As shown in FIG. 12, device drivers 1210 include a device driver 1212 for facilitating interaction with a display, a device driver 1214 for facilitating interaction with a touch panel associated with the display, a device driver 1216 for facilitating interaction with a Universal Serial Bus (USB) device or port, a device driver 1218 for facilitating interaction with a power management device, and a device driver 1220 for facilitating interaction with a managed NAND flash memory. These are only examples, and other device drivers 1210 may be used depending on the hardware peripherals present in telephony and digital media services device 110.

As further shown in FIG. 12, software architecture 1200 also includes a plurality of shared system libraries 1220 that contain code and data that may be used to provide services to independent programs running in the context of operating system 1204. System libraries 1220 include codecs 1222, cryptographic functions 1224, home device management services 1226, and other system libraries 1228.

Codecs 1222 are utilized for performing compression and decompression of multimedia content such as images, audio content and video content. Codecs 1222 may include, for example, codecs for compressing/decompressing images in accordance with one or more of the JPEG, TIFF, PNG, GIF and BMP image compression formats, codecs for compressing/decompressing audio content in accordance with one or more of the MP3, WAV, WMA and RealAudio audio compression formats, and codecs for compressing/decompressing video content in accordance with one or more of the MPEG-2, MPEG-4 part 2, MPEG-4 part 10 (H.264), WMV 9, DivX, VC1 and FLV compression formats. However, these are only examples and other types of codecs may be used.

Cryptographic functions 1224 comprises a library of cryptographic algorithms and tools that may be utilized for encrypting and decrypting data. End-user device management services 1226 include functions necessary to implement protocols for remotely managing end-user devices, such as protocols in accordance with the DSL Forum Technical Specifications TR-069/TR-111.

As shown in FIG. 12, software architecture 1200 also includes an operating system (OS) abstraction layer 1206 that runs atop operating system 1204. OS abstraction layer 1206 serves to insulate any component running above it (e.g. application player 1208 and applications 1240) from any idiosyncrasies of operating system 1204. This serves to localize the efforts of porting applications to a single component.

Software architecture 1200 further includes a plurality of class modules 1230. Class modules 1230 comprise libraries, such as C and/or C++ libraries, that may be used by certain applications to perform certain functions. In one embodiment, class modules 1230 define function calls that can be made available to one or more applications running in the context of application player 1208. For example, class modules 1230 may define ActionScript function calls that can be made available to one or more Shockwave Flash (SWF) applications that are executed by application player 1208. As will be described in more detail herein, class modules 1230 may be downloaded to telephony and digital media services device 110 along with applications that they support.

Class modules 1230 include an application (app) manager/loader 1232 which provides functionality for an application (app) manager application 1244, a media player 1234 that provides functionality for applications that play back digital media, and a VoIP module 1236 that provides functionality for a VoIP telephony application 1246. VoIP module 1236 may provide, for example, access to SIP functionality, audio engine functionality and DECT functionality used in performing VoIP telephony operations. Class modules 1230 also include additional class modules 1238 as well. Additional class modules 1238 may include, for example, APIs for sending requests to Web services made available over a Wide Area Network (WAN) such as the Internet and receiving content responsive to the requests.

Software architecture further includes an application player 1208. In one embodiment, application player 1208 comprises an Adobe® Flash® Player or an equivalent Flash® player, suitable for executing Shockwave Flash (.swf) files to display vector-based animations, to stream audio and video content, and to allow various forms of user interaction. Application player 1208 may comprise, for example, a Flash®-compatible player that has been optimized for embedded environments. In accordance with such an embodiment, application player 1208 provides support for an embedded scripting language called ActionScript, which is based on ECMAScript. Application player 1208 may provide native support for a plurality of ActionScript function calls. Furthermore, as noted above, class modules 1230 may define additional ActionScript function calls that can be used by one or more applications that are executed by application player 1208.

Software architecture 1200 further includes a plurality of applications 1240, each of which may be executed by application player 1208. Applications 1240 may comprise Flash® applications. Applications 1240 may be selectively executed by users to invoke telephony or digital media services provided by device 110. Where an application provides digital media services, such services may be provided using functionality and/or data stored locally with respect to device 110 as well as using remotely-located functionality and/or data, such as functionality and/or data obtained over a WAN such as the Internet. For example, provision of a digital media service may entail invoking a Web service via the Internet.

As shown in FIG. 12, these applications may include a status/monitoring application 1242, an application (app) manager 1244, a VoIP telephone 1246, a local or network calendar 1248, a YouTube™ application 1250, a traffic monitoring application 1252, a news application 1254, an alarm clock 1256, and other applications 1258.

Other applications 1258 may include for example, a calculator, a local or network address book, a media player, an Internet radio/video application, a weather application, a comics application, a to-do list application, a world clocks application, a countdown timer (e.g., days until Christmas), a games application (e.g., solitaire, Soduko, Tetris, etc.), a Web browser, an e-mail application, a city guide application, a wireless cameras application, a home monitoring application, a home control application (e.g. lights, audio/video (A/V) system, HVAC, UPnP), a Flickr™ photos application, a Google™ talk application, a map application, a directory services/yellow pages application, an EPG (TV Guide) application, a word of the day application, a joke of the day application, a quotations application, a dictionary application, a movie times application, a delivery services application, an RSS reader, a stock ticker, or a social networking application, such as a Ning™ or Facebook™ application. Various features associated with certain ones of these applications will be described in more detail herein.

The use of Flash® applications to implement the various GUI screens of device 110 provides distinct advantages over using more traditional programming languages such as C or C++. For example, development of GUI screens using Flash® is simpler and easier as compared to programming bit maps in C code. Furthermore, because Flash® files are small, a complex GUI screen may be rendered smoothly and at very high speeds. Also the use of Flash® applications provides a distinct separation between the implementation of a GUI screen and the underlying functionality, such that the GUI screen may be constructed, revised or upgraded without affecting underlying programs.

II.D.1 Systems Software

Figure 13:
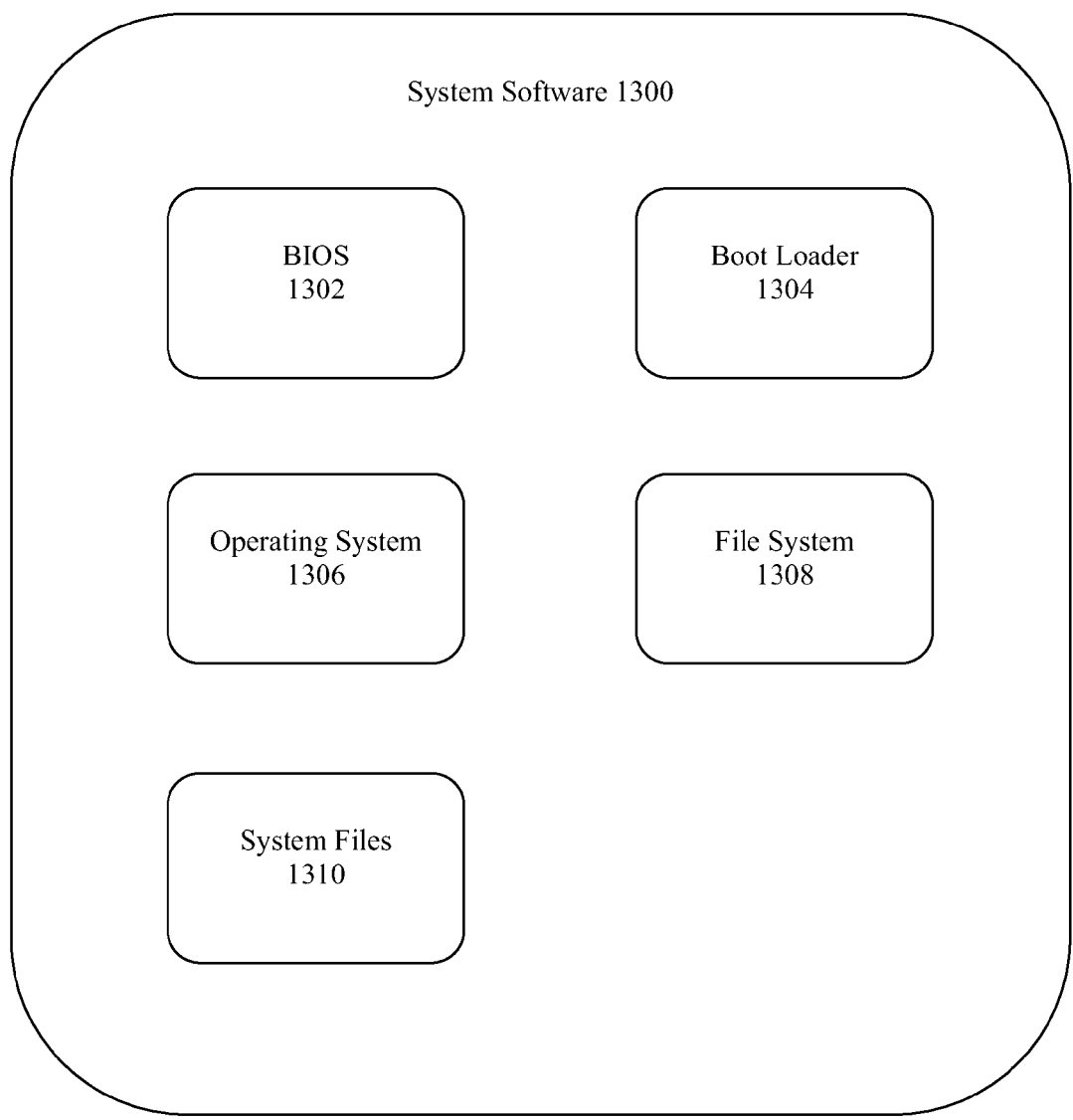
FIG. 13 is a block diagram that depicts systems software elements of a telephony and digital media services device in accordance with an embodiment of the invention.

FIG. 13 is a block diagram that depicts systems software elements 1300 of the software architecture of device 110 in accordance with an embodiment of the present invention. As shown in FIG. 13, systems software elements 1300 include a BIOS 1302, a boot loader 1304, an operating system 1306, a file system 1308, and system files 1310. Each of these elements will now be described.

BIOS 1302 defines a software interface between the operating system and the platform firmware and hardware of device 110. BIOS 1302 is stored in non-volatile memory that is connected to a system controller hub within device 110 and is executed automatically at system startup. In one embodiment, BIOS 1302 is stored in an 8 Mbit NOR flash memory that is connected to the system controller hub via an LPC bus.

In one implementation, BIOS 1302 comprises a software interface defined in accordance with the Extensible Firmware Interface (EFI) specification. As will be appreciated by persons skilled in the relevant art(s), EFI comprises an improved replacement of the legacy BIOS used by all IBM PC-compatible computers. EFI has a modular structure that provides a set of modular interfaces that replace the traditional BIOS interfaces. EFI dramatically shortens boot times and improves the reliability of the boot architecture while providing full legacy support.

In an embodiment, BIOS 1302 may also be thought of as encompassing a video BIOS. The video BIOS provides a set of video-related functions that are used by programs to access video hardware within device 110. The video BIOS may comprise for example an Intel® Embedded Graphics Driver (IEGD) video BIOS, developed and sold by Intel Corporation of Santa Clara, Calif., although this is only an example.

In one embodiment of the present invention, BIOS 1302 outputs a splash screen to the display of device 110 during system startup. In a further embodiment, system hardware allows a video feed to be overlaid upon the splash screen prior to initialization of a graphic sub-system. In such an embodiment, the video feed functionality may be used to overlay a visual progress indicator upon the splash screen during system startup. The visual progress indicator may comprise a status bar, text, or some other visual indicator of the progress of the loading of BIOS 1302 and booting of the operating system. This visual progress indicator can advantageously be used both by developers during manufacturing and end-users after deployment to monitor device performance. Such a visual progress indicator can be displayed even in an instance where initialization of the graphic sub-system has failed.

Boot loader 1304 comprises a program that is launched by BIOS 1302 during system startup and that is configured to load operating system 1306 of device 110. As noted above, in one embodiment, operating system 1306 comprises a Linux-based operating system, such as an Ubuntu® MID Edition operating system based on Linux kernel release 2.6.24, that has been optimized through custom configuration for a small size and rapid startup.

Boot loader 1304 and the files that comprise operating system 1306 are each stored within a file system 1308 implemented using non-volatile storage. In one embodiment, the non-volatile storage comprises a managed NAND flash memory that is connected to a system controller hub within device 110.

In one implementation, file system 1308 comprises two distinct file systems: a Virtual File Allocation Table (VFAT) file system that is used to store boot loader 1304 and an EXT3 file system that is used to store operating system files and application files. A VFAT file system may be required for storing boot loader 1304 in an implementation in which BIOS 1302 comprises an EFI BIOS that can only read files from a VFAT file system.

In order to ensure system operability, in a further embodiment, a fail-safe version of the operating system kernel is stored in the VFAT file system while another updateable version of the operating system kernel is stored in the EXT3 file system. The fail-safe version of the operating system and boot loader 1304 are not updateable (or are only updateable in a highly restricted manner), thereby providing a means for starting up the system even when the updateable version of the operating system kernel is corrupted (e.g., due to a failed update). In such a case, the fail-safe version of the operating system can be booted from the VFAT file system and can load its file system from VFAT into volatile memory (e.g., SDRAM) and run out of the volatile memory. This allows for files in the EXT3 file system to be repaired without fear of overwriting the kernel. This approach also allows for diagnostic testing and the establishment of a network connection to a known server to download the latest stable version of the system firmware (operating system and applications).

In one embodiment, boot loader 1304 selects the fail-safe kernel instead of the updateable kernel image based on a flag stored in non-volatile storage, which as noted above may comprise a managed NAND flash memory. This flag may be set to select the fail-safe kernel by a process monitor daemon when the process monitor daemon determines that the operating system has been in an unresponsive state for a period of time that equals or exceeds a predetermined period of time. The flag may also be set to select the fail-safe kernel when the system first boots and may be reset to select the updateable kernel upon successful startup of the operating system and process monitor daemon. If the system fails to boot, then a subsequent attempt to boot will force the fail-safe kernel image to boot.

In an embodiment in which the non-volatile memory comprises a managed NAND flash memory, certain features may be implemented to ensure that the EXT3 file system is written to as seldom as possible in order to extend the useful life of the managed NAND flash memory. These features may include, for example, configuring applications that access the EXT3 file system to ensure that such applications do not frequently write files to the file system and configuring the length of a journaling interval of the EXT3 file system so that the lifetime of the managed NAND flash memory will extend beyond the expected lifetime of device 110. Another feature that may be used to extend the life of the managed NAND flash memory comprises turning off a feature of the EXT3 file system that records the last access time of a file. These features are provided by way of example, and other features not described here may be used to extend the life of the managed NAND flash memory.

System files 1308 comprise shared libraries that contain code and data that may be used to provide services to independent programs running in the context of operating system 1306. In an embodiment, the number of system files 1308 maintained on the system is kept to a minimum to conserve system resources. Such files may be stored in an EXT3 file system as described above and updated or added to as needed to support system and application programs.

In one implementation, BIOS 1302, boot loader 1304, operating system 1306 and system files 1308 are all updateable. As noted above, restrictions may be placed on updating boot loader 1304 and a fail-safe version of operating system 1306 that reside in a VFAT filing system in order to ensure that those software modules do not become corrupted. Safe updates of BIOS 1302 may be achieved by maintaining separate version of BIOS 1302 within the same non-volatile memory, such that a first version of BIOS 1302 can be updated while a second version of BIOS 1302 may be maintained in case the update of the first version of BIOS 1302 fails, thereby resulting in the corruption of the first version.

II.D.2 Application Framework

As will be described in more detail in this section, the software architecture of device 110 provides a framework that supports a variety of applications, including applications that delivery telephony and digital media services to an end user. To ensure that device 110 may be deployed by a variety of different service providers (e.g., telecommunications companies, multi system operators, Internet Service Providers, or the like), the application framework supports multiple GUI themes and languages, proprietary protocols, and incremental deployment of applications. The application framework also provides an infrastructure within which a variety of different applications can operate and co-exist without any preconceived notion of what those applications may be. For example, although device 110 may support VoIP telephony, device 110 may nevertheless be deployed without a VoIP telephony application.

The application framework also provides a modular approach for deploying applications such that a common set of application can be deployed for different service providers. Application deployment models supported by the framework include subscription models in which a user of device 110 determines at runtime which applications are to be installed as well as a model in which a static set of applications are deployed that are updated monolithically. Because multiple applications may be deployed, each of which may generate asynchronous events, the application framework also provides a method for synchronizing applications.

Figure 14:
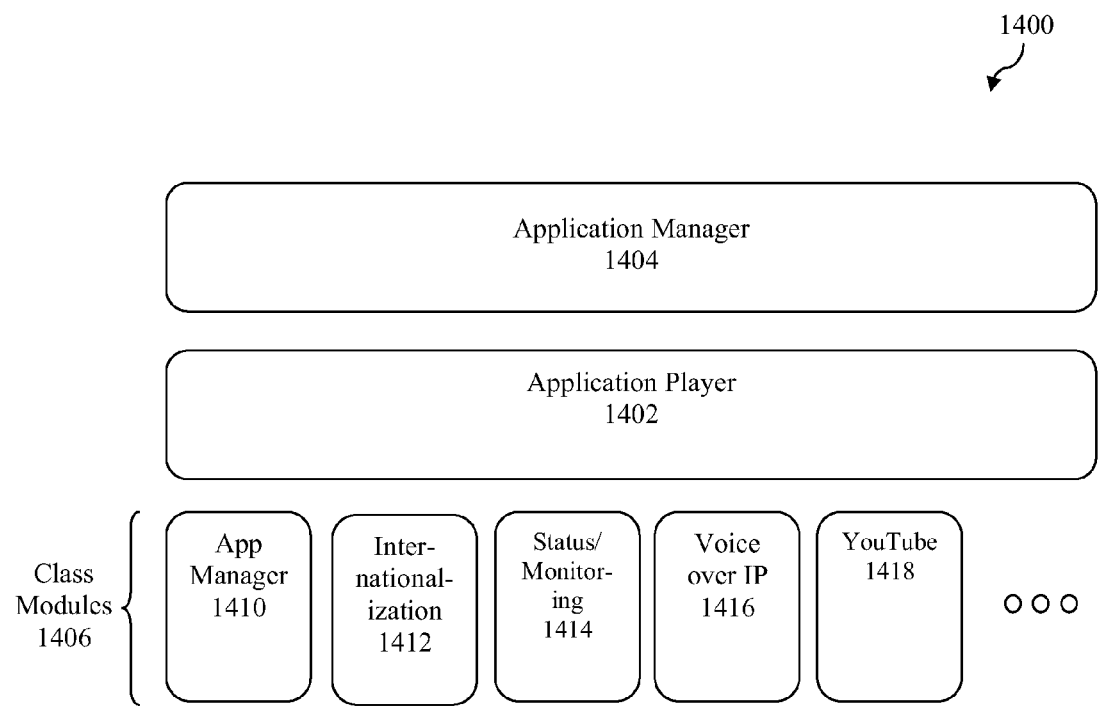
FIG. 14 is a block diagram of an application framework that may be implemented by a telephony and digital media services device in accordance with an embodiment of the invention.

FIG. 14 is a block diagram of an application framework 1400 that may be implemented by device 110. As shown in FIG. 14, application framework 1400 includes an application player 1402 that is analogous to application player 1208 described above in reference to FIG. 12. Application player 1402 provides native support for a plurality of ActionScript function calls. In the absence of desired functionality, application player 1402 may be enhanced by adding custom software libraries, such as custom C/C++ libraries, that define additional ActionScript function calls. Such libraries are denoted class modules 1406 in FIG. 14 and are analogous to class modules 1230 described above in reference to FIG. 12. A class module 1406 may be introduced in conjunction with a new application. Also, several class modules 1406 may be provided as part of an initial deployment to assist applications with common functionality such as usage monitoring and language translations.

As shown in FIG. 14, class modules 1406 may include an application manager class module 1410, an internationalization class module 1412, a status/monitoring class module 1414, a VoIP class module 1416, a YouTube™ class module 1418, as well as other class modules. YouTube™ class module 1418 is representative of a class module that provides an API for allowing an application to request and obtain digital content from a Web service such as YouTube™.

Application framework 1400 further includes an application manager 1404, which in an embodiment comprises one or more movie applications. Application manager 1404 may also be thought of as encompassing corresponding class module 1410, which serves to extend the functionality thereof. Application manager 1404 comprises the launching point for all applications on the system.

In particular, application manager 1404 is configured to interrogate corresponding class module 1410 for a list of available applications, which in one embodiment is acquired from a local XML file. In one embodiment, the list contains sets of Uniform Resource Locators (URLs) that identify an icon movie and application movie corresponding to each application. Application manager 1404 can then display each application icon accordingly via the GUI provided by touch-panel display of device 110. When a user selects an icon, application manager 1404 invokes the corresponding application URL. Because the icons are themselves small applications, they can advantageously be configured to include animations, or to include intelligence for presenting dynamically-changing data such as current weather conditions, stock prices, or time of day.

The following provides an example of an XML configuration file that lists two applications:

```
<apps>
    <app name= "Phone" version="1.0" GUID="00df-3434-cccc-3422">
        <icon url= "file://apps/phone/icon_phone.swf"/>
        <app url=file://apps/phone/app_phone.swf/>
    </app>
    <app name="YouTube" version="1.0" GUID="00df-3664-aacc-3555">
        <icon url="file://apps/youtube/icon_youtube.swf"/>
        <app url=file://apps/youtube/app_youtube.swf/>
    </app>
</apps>
```

As mentioned above, depending on the deployment model, new and updated applications may be distributed as part of a monolithic update, or incrementally on a device or subscriber basis. In one example of an incremental approach, application manager 1404 is configured to query a remotely-located application server for the latest list of available applications. A user may also optionally be allowed to select certain applications. In response, the application server returns a list that identifies an installation package for each of the various applications. The identification for each installation package may comprise a URL. The following provides an example of such a list:

```
<apps>
    <app name="App1" install= "http://www.customer.com/app1.tar"/>
    <app name="App2" install= "http://www.customer.com/app2.tar"/>
</apps>
```

In the foregoing example, each installation package comprises an archive file. Application manager 1404 may be configured to retrieve and install the applications by executing a shell script (which may be denoted, for example, "install.sh") that is contained in each installation package archive. Once the installation process is complete, application manager 1404 updates the local XML file that contains the list of all installed applications. Similarly, if a user wishes to remove an application, application manager 1404 can be invoked to execute an uninstall shell script that was provided as part of the installation package.

Figure 15:
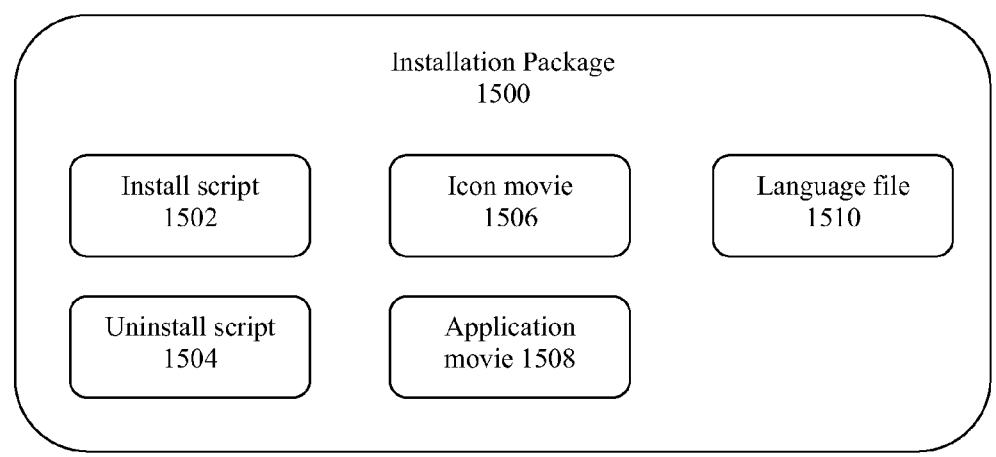
FIG. 15 depicts an example application installation package that may be provided from a remote application server to a telephony and digital media services device in accordance with one embodiment of the present invention.

FIG. 15 depicts an example installation package 1500 that may be provided from a remote application server to device 110 in accordance with one embodiment of the present invention. As shown in FIG. 15, application package 1500 includes an install script 1502 that may be executed to install an application, an uninstall script 1504 that may be executed to uninstall an application, an icon movie 1506 that may be executed to display an icon representative of the application within a GUI, an application movie 1508 that may be executed to deliver the functionality of the application to a user, and a language file 1510 that may be used to provide representations of text elements to be displayed by the application in one or more languages.

A sample directory structure of an application installed on device 110 is as follows:

```
/tango
    /apps
        /guid
            /install.sh
            /uninstall.sh
            /icon_app1.swf
            /app_app1.swf
            /language.xml
```

In the foregoing, "install.sh" is the name of an install shell script, "uninstall.sh" is the name of an uninstall shell script, "icon_app1.swf" is the name of the icon movie used to represent the application on the GUI, "app_app1.swf" is the name of the application movie, and "language.XML" is an XML file that includes representations of text elements to be displayed by the application in one or more languages.

Figure 16:
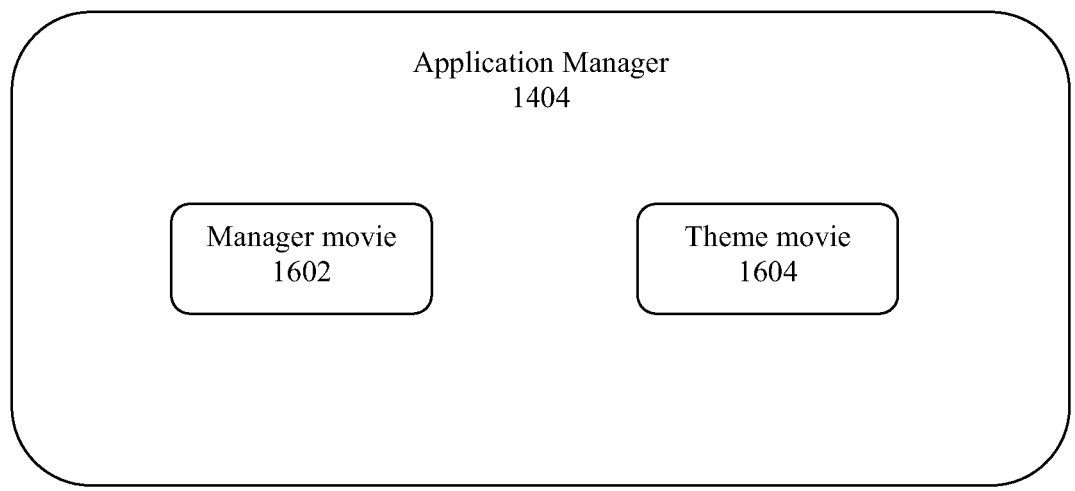
FIG. 16 depicts an application manager that comprises two movie applications in accordance with an embodiment of the present invention.

FIG. 16 depicts an embodiment of the invention in which application manager 1404 comprises two Flash® movie applications: a manager movie 1602, which may be denoted "manager.swf", and a theme movie 1604, which may be denoted "theme.swf". The prefix .swf denotes a Shockwave Flash file. This embodiment will now be described in more detail.

Figure 17:
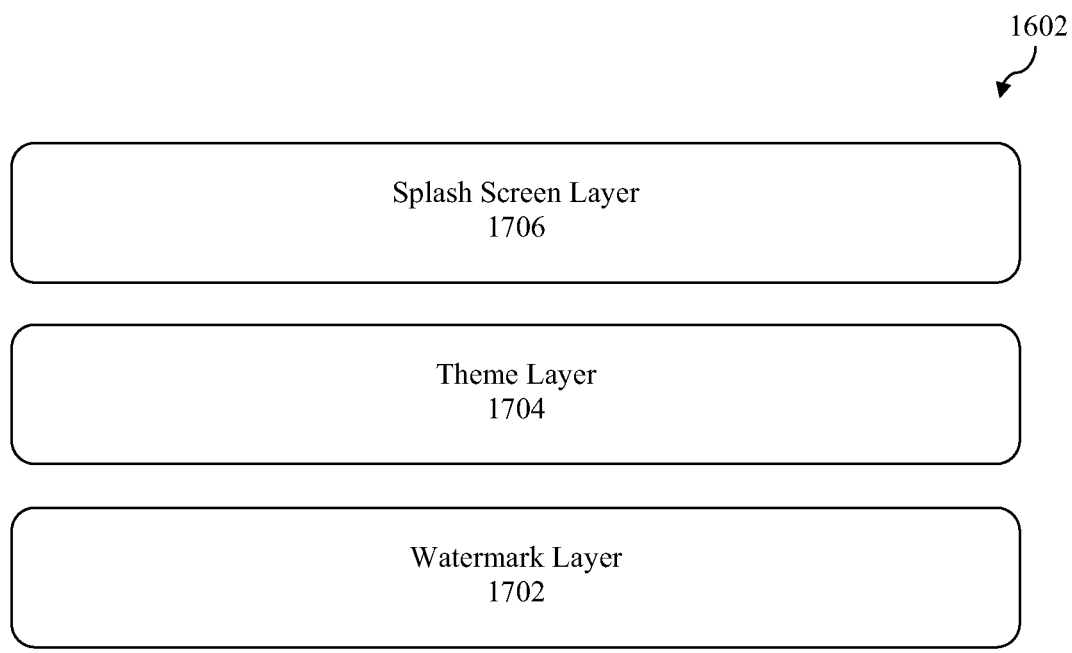
FIG. 17 depicts a manager movie portion of an application manager in accordance with an embodiment of the present invention.

Manager movie 1602 consists of three layers as illustrated in FIG. 17: a watermark layer 1702, a theme layer 1704 and a splash screen layer 1706. Watermark layer 1702 is optional and is reserved for a branding statement that is viewable via transparent application layers. Above that, theme layer 1704 serves as a container in which theme movie 1604 is loaded. Splash screen layer 1706 is visible during initialization time. Once theme movie 1604 has been loaded, splash screen layer 1706 becomes transparent. Splash screen layer 1706 may contain minimal graphical assets.

Figure 18:
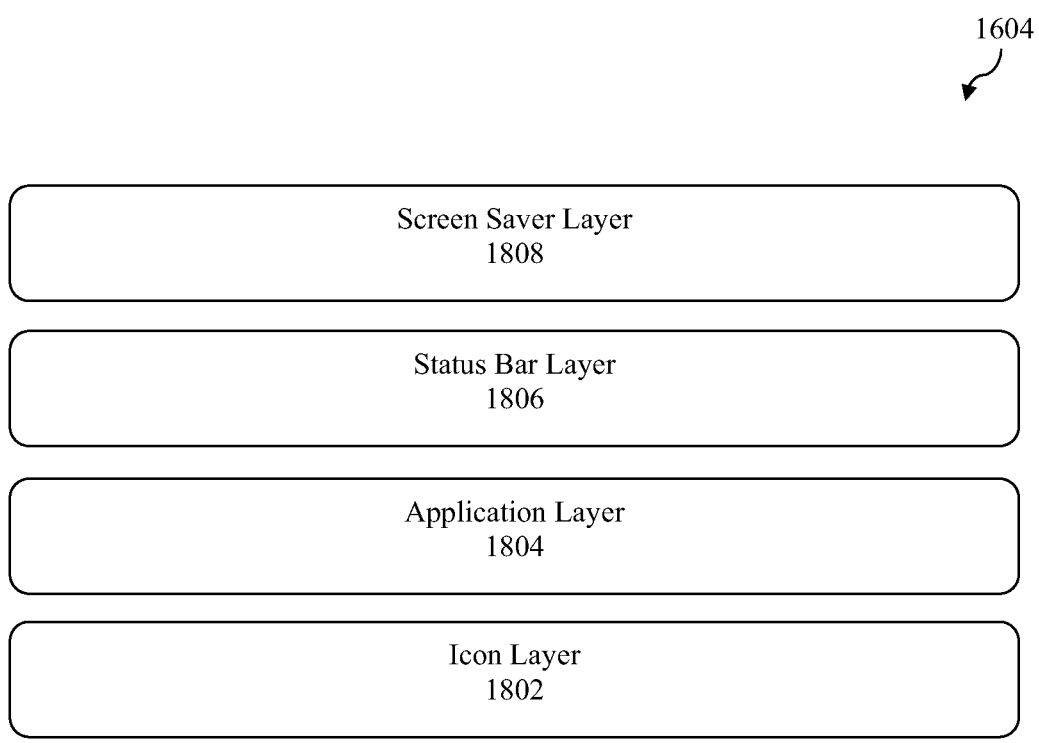
FIG. 18 depicts a theme movie portion of an application manager in accordance with an embodiment of the present invention.

One purpose of theme movie 1604 is to provide a vehicle by which a service provider deploying device 110 can customize the look and feel of the GUI of device 110. Theme movie 1604 consists of four layers as illustrated in FIG. 18: an icon layer 1802, an application layer 1804, a status bar layer 1806 and a screen saver layer 1808. Icon layer 1802 is used to present small graphic representations of the various applications that are available on device 110. Each icon presented within icon layer 1802 itself comprises a movie. Application layer 1804 is reserved for the application movies that are executed by application player 1402. Within this layer, multiple applications can be stacked. When a user selects an icon, the corresponding application is launched by pushing it onto the application layer stack, hiding icon layer 1802. When the application stack is emptied, icon layer 1802 becomes visible again. Status bar layer 1806 is used to display common information such as titles, navigational buttons and date/time. Screen saver layer 1808 may optionally be overlaid on the other three layers when device 110 has been active for some period of time. The conditions under which screen saver layer 1808 is displayed and the content of the layer may be configurable by a user.

The foregoing application framework further provides common components for alerts, keyboards, a movie player, options, and a photo viewer. Applications may interact with these components via ActionScript listener objects.

II.D.2.a Application Interaction

With continued reference to FIG. 18, when a user launches an application, the application is granted focus and is thus presented in application layer 1804 hiding the lower icon layer 1802. Thus, when an application is running, icon movies continue to run in icon layer 1802 although they are hidden. In one implementation of application framework 1400, a user must exit an active application in order to execute another application. This approach may be deemed suitable for a majority of use cases. However, there are certain scenarios that may require a different approach. For example, consider the case in which an asynchronous network event arrives at a class module 1406, but the Flash® movie corresponding to the class module is not active.

As a specific example, assume that a YouTube™ application is active at the time an incoming telephone call arrives at VoIP class module 1416. Desired behavior may be that the YouTube™ application would be paused, a VoIP telephone application would be instantiated on the GUI foreground, and a user would be allowed to answer or ignore the telephone call. If the user chose to answer the call, then the telephone application would remain active. However, if the user chose to ignore the call, then the telephone application would be dismissed and the YouTube application would regain focus and automatically resume.

To implement this behavior, an embodiment of the invention espouses a solution that allows a class module 1406 to surface an asynchronous event during a period when its corresponding application movie is not active. In accordance with this embodiment, each icon movie associated with an application is required to register an event listener with its corresponding class module. When an asynchronous event is raised by the class module, the corresponding icon movie is notified directly. Subsequently, the icon movie requests that application manager 1404 launch the application represented by the icon movie—for example, the icon movie may request that application manager 1404 launch a specified application URL. Prior to executing the URL, a function of the currently-active application is called (which may be denoted "onFocusOut") to allow the currently-active application to take action (e.g., pausing a movie). Next, application manager 1404 launches the URL and the corresponding application ("the event application") is displayed in the foreground. During initialization, the trigger event is passed to the event application as a means to communicate context. When the event application is eventually dismissed, a function associated with the underlying inactive application (which may be denoted "on FocusIn") is called to allow that application to take further action (e.g., resume playback of a movie).

Figure 19:
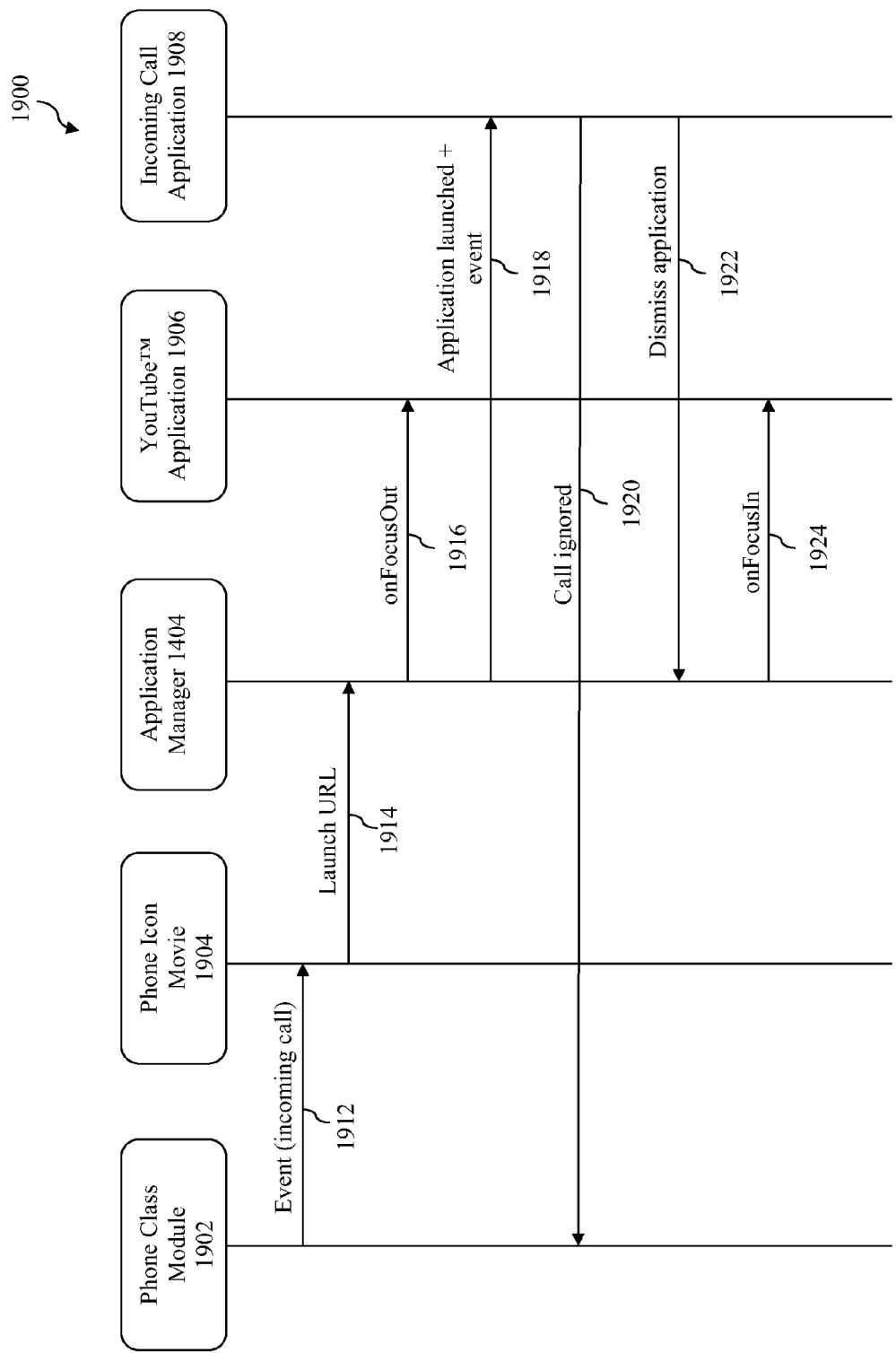
FIG. 19 is a diagram that illustrates a process for handling an asynchronous event associated with an inactive application during execution of an active application in accordance with an embodiment of the present invention.

The foregoing process will now be described in reference to a specific example process 1900 illustrated in FIG. 19. As shown in FIG. 19, the process begins at step 1912 when a phone class module 1902 notifies a corresponding phone icon movie 1904 of an asynchronous event—namely, an incoming telephone call. As discussed above, phone icon movie 1904 previously registered an event listener with phone class module 1902 that makes such notification possible.

At step 1914, responsive to being notified of the event, phone icon movie 1904 requests that application manager 1404 launch the appropriate application for handling the event, which in this case is an incoming call application 1908. Requesting that application manager 1404 launch incoming call application 1908 may comprise requesting that application manager 1404 launch a specified URL associated with incoming call application 1908.

Prior to launching incoming call application 1908, application manager 1404 places a function call to a currently-active YouTube™ application 1906 as shown at step 1916. This function call is denoted "onFocusOut" in FIG. 19. Placement of this function call allows YouTube™ application 1906 to take some action in advance of launching of incoming call application 1908. This action may comprise, for example, pausing playback of a movie or some other action.

Figure 20:
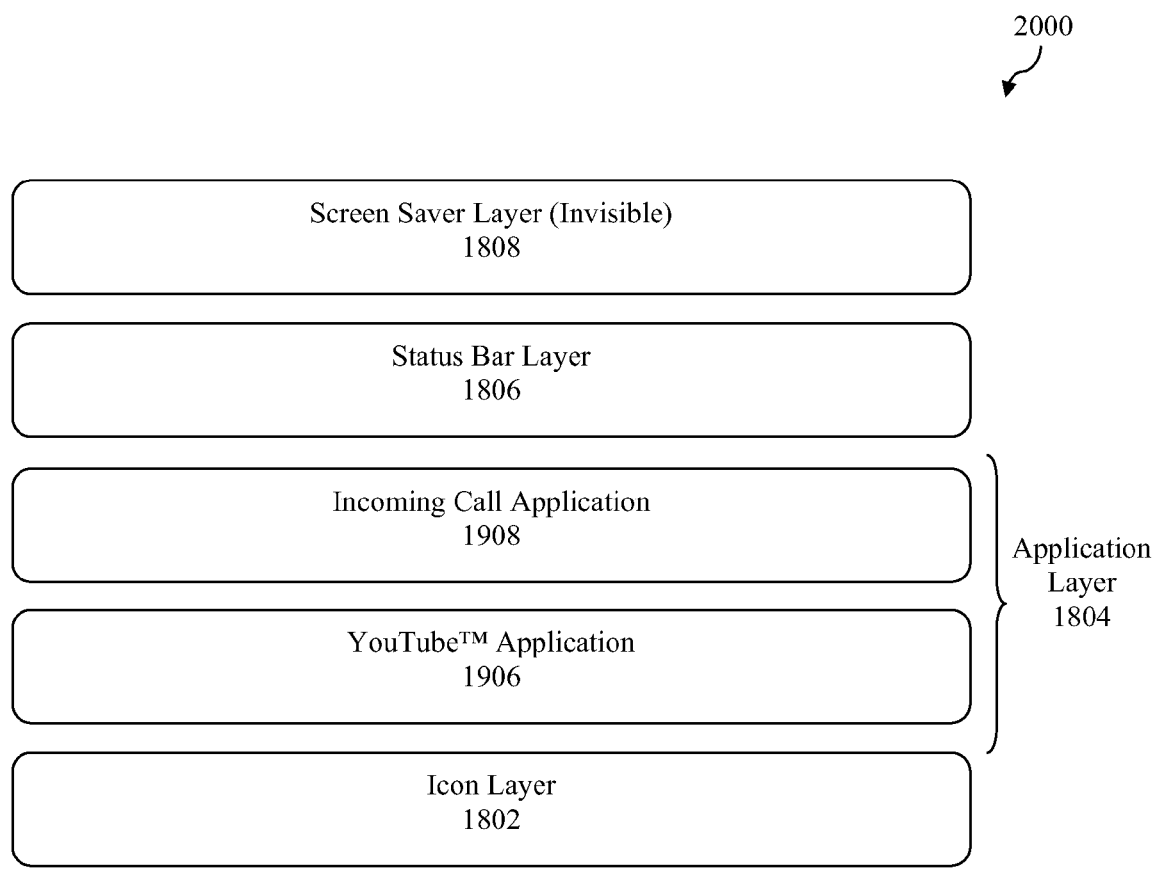
FIG. 20 is a diagram depicting the overlaying of a first application movie with a second application movie pursuant to an asynchronous event handling protocol in accordance with an embodiment of the present invention.

At step 1918, after placing the onFocusOut function call, application manager 1404 launches incoming call application 1908 (for example, by launching a specified URL associated with the application) and passes the incoming call event to application 1908 for appropriate handling. At this point, the interface for incoming call application 1908 is overlaid on top of YouTube™ application interface in application layer 1804 of theme movie 1604. This is depicted in FIG. 20, which shows incoming call application 1908 and YouTube™ application 1906 executing at different Z orders within application layer 1804. The call application 1908 interface may allow the user to perform a variety of actions, including answering the incoming call or ignoring the incoming call. Answering the call may cause yet another application to be launched to perform necessary functions or the necessary functions may be handled exclusively by incoming call application 1908 depending upon the implementation.

In process 1900, it is assumed that the user chooses to ignore the call through some form of interaction with a GUI of incoming call application 1908 or through inaction. In this case, the fact that the call was ignored 1920 is reported from incoming call application 1908 to phone class module 1902 as shown at step 1920. After the call has been ignored, incoming call application 1908 is dismissed either automatically or through some user action. The dismissal of the application is reported to application manager 1404 as shown at step 1922 at which point application manager 1404 removes incoming call application 1908 from application layer 1804.

At step 1924, after incoming call application 1908 has been dismissed, application manager 1404 places a function call to currently inactive YouTube™ application 1906 as shown at step 1924. This function call is denoted "on FocusIn" in FIG. 19. Placement of this function call allows YouTube™ application 1906 to take some action responsive to the dismissal of incoming call application 1908. This action may comprise, for example, resuming playback of a movie or some other action.

It is noted that an application can leverage multiple class modules. For example, if an address book application required support for click-to-dial, e-mail and SMS, it could leverage VoIP, e-mail and SMS class modules. This example introduces an interesting issue. If a user activated a click-to-dial function from the address book, an out-bound call would be initiated from the VoIP class module. The user would need to operate the phone. Given the event listening feature discussed above, the event associated with placing a call would surface accordingly, resulting in the phone application being launched in the foreground. The address book application need only have knowledge of the APIs exposed by the VoIP module. The application framework implements the rest.

II.D.2.b Application Watchdog Timers

In one embodiment of the present invention, software watchdog timers are used to monitor application liveliness.

Figure 21:
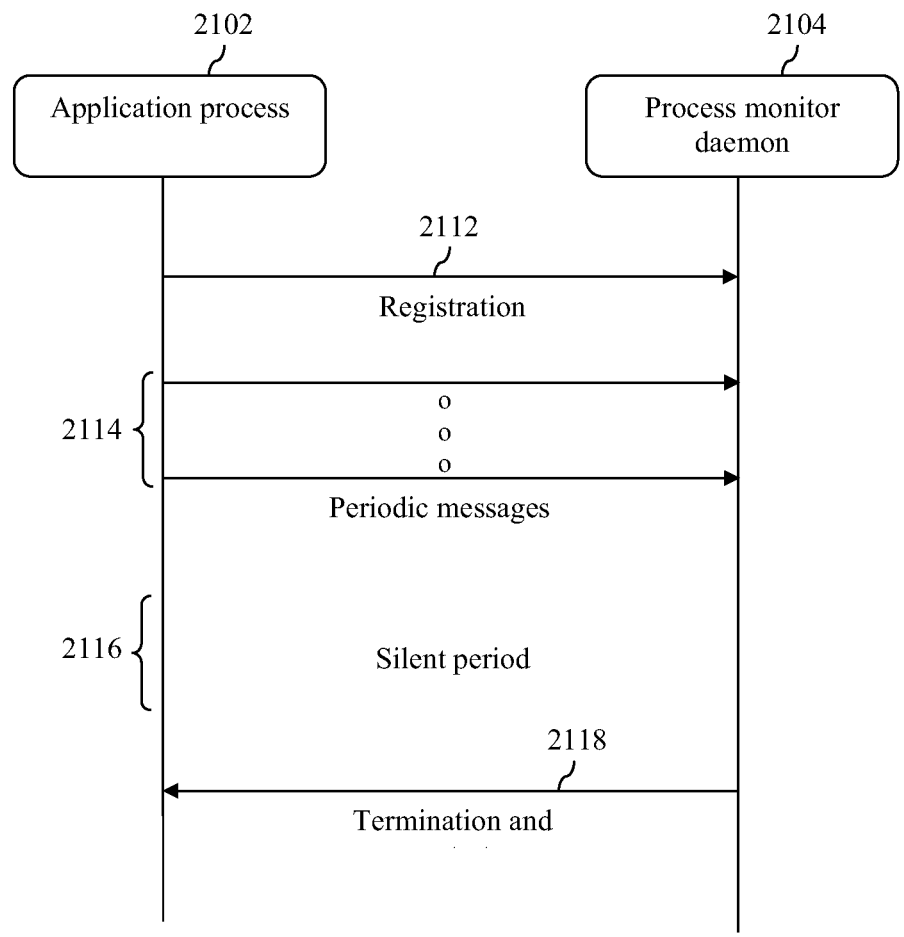
FIG. 21 is a diagram depicting the use of a software watchdog timer to monitor application liveliness in accordance with an embodiment of the present invention.

FIG. 21 provides a diagram illustrating such an approach. As shown in FIG. 21, after an application process 2102 has been launched, application process 2102 sends a registration message 2112 to register itself with a process monitor daemon 2104. After registration, application process 2102 periodically sends messages 2114 to process monitor daemon 2104 to prove that it is still operating. Upon receipt of each message 2114, process monitor daemon 2104 resets a watchdog timer. If process monitor daemon 2104 fails to receive a message from application process 2102 after a period of time that is greater than or equal to the maximum value of the watchdog timer, denoted silent period 2116 in FIG. 21, process monitor daemon 2104 assumes that application process 2102 is unresponsive, terminates application process 2102, and then restarts it as denoted by reference numeral 2118 in FIG. 21.

Application restart behavior may be configurable on a per-application basis. In one embodiment, one can define the maximum number of restarts per time before an application is considered to be in a state of perennial failure and the action to take in that case. Actions may include uninstalling the application (running an uninstall script that is associated with the application) or rebooting the entire system. The user may be presented with an on-screen dialog in either case. Also, in certain implementations, such actions will not be undertaken while a telephone call is in progress.

Process monitor daemon 2104 may also be configured to monitor the operating condition of the operating system of device 110 using a watchdog timer in a like manner to that described above in reference to FIG. 21. If the watchdog timer expires before the operating system sends a reporting message to process monitor daemon 2104, then process monitor daemon 2104 forces a reboot of the operating system.

II.D.2.c Application Portability

Figure 22:
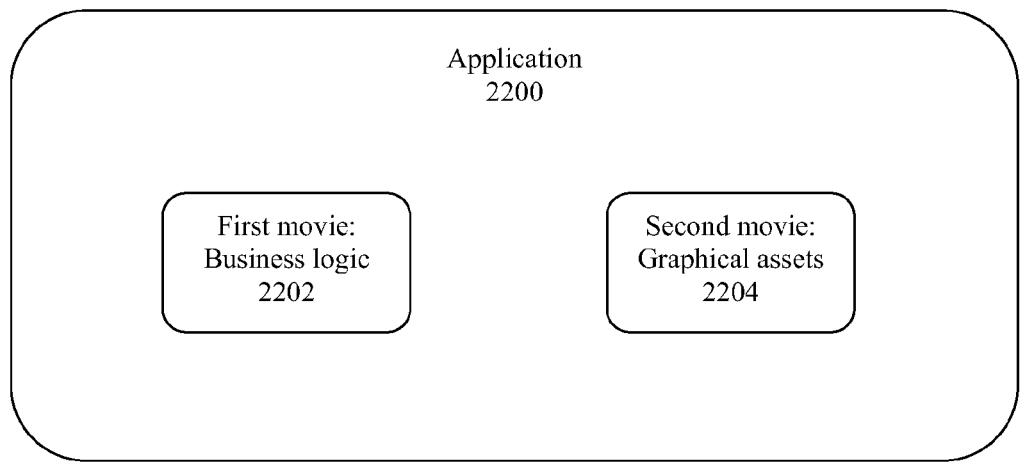
FIG. 22 illustrates an application that includes a first movie that comprises the business logic of the application and a second movie that comprises the graphical assets of the application in accordance with an embodiment of the present invention.

Different service providers may wish to deploy the same application. However, each service provider may want the application to reflect its own graphical theme. To simplify the porting effort, an embodiment of the invention implements each application as two movies. An example of this is depicted in FIG. 22, which shows an application 2200 that comprises a first movie 2202 that comprises the business logic of the application and a second movie 2204 that comprises the graphical assets of the application. This approach advantageously allows an application to be ported by simply replacing theme movie 2204, removing most of the risks of regression.

II.D.2.d Internationalization of Applications

In accordance with an embodiment of the invention, multiple language support is achieved by enabling applications to query application manager 1404 for text translation. The active language can be defined on a user or device basis. When application manager 1404 launches an application, it will pass a unique application identifier, which may be referred to as a global unique identifier (GUID), to the application using an application programming interface (API). This API may be denoted the "startApplication" API. Subsequently, the launched application passes the GUID, an identifier of the text to be translated, and optionally the language to translate to. If the language parameter is not provided, application manager 1404 uses a system default language (e.g., English). Application manager 1404 returns the corresponding text in the selected language from a language XML file associated with the application. The functions for querying for and obtaining text translation may be included within internationalization class module 1412 in FIG. 14.

II.D.2.e Activity Logging and Device Heartbeating

An embodiment of the present invention provides the ability to log application usage, system configuration and system health to a remote server. At the application level, each application notifies status/monitoring class module 1414 of page transitions and other events, such as placing a phone call, clicking a button, or entering a search term. The amount of detail reported may vary from application to application. Application manager 1404 also contacts status/monitoring class module 1414 to report application launch and exit events. In an embodiment, application launch occurs when a user activates an application icon and application exit occurs when a user returns back to the icon screen.

Figure 23:
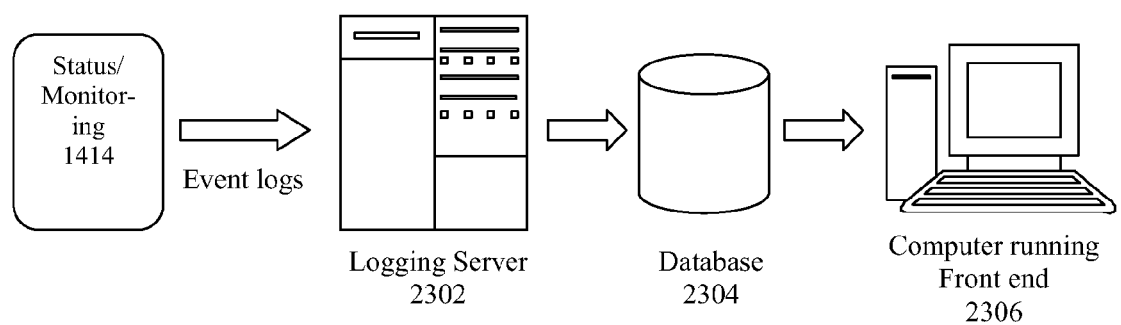
FIG. 23 is a block diagram of system for logging and reviewing application usage information, system configuration information and system health information associated with one or more telephony and digital media services devices in accordance with an embodiment of the present invention.

As represented by FIG. 23, status/monitoring class module 1414 accumulates the reported event information in event logs and periodically sends the logs to a configured remote logging server 2302. In one embodiment, status/monitoring class module 1414 will attempt to send this data every five minutes by default. If logging server 2302 is not reachable, status/monitoring class module 1414 will append new events to the log and then will attempt to send the data again. The number of events that may be added to a log may be limited to some predefined number. Events may be marked with timestamps indicative of the time at which each event occurred. In one embodiment, the timestamps are stored as relative offsets so as not to rely on the time of day setting on each specific device 110. In accordance with such an embodiment, the offsets may be converted to a time-of-day timestamp at logging server 2302.

Logging server 2302 is configured to receive a sequence of logs from a plurality of deployed devices 110 and to add each log record to a database 2304, which is shown in FIG. 23. A front end, such as a Web front end, executing on a computer 2306 may then be used to provide a human-friendly interface for viewing the data. Where a Web front end is used, the Web pages may comprise PHP programs that perform Structured Query Language (SQL) queries on the data and allow a user to examine aspects such as the top applications used by a specific group of users or the amount of time customers spend in different applications. Understanding which applications are most popular is valuable to service providers deploying applications via devices 110. Such information can be used, for example, to perform trend spotting and to drive new application development.

Figure 24:
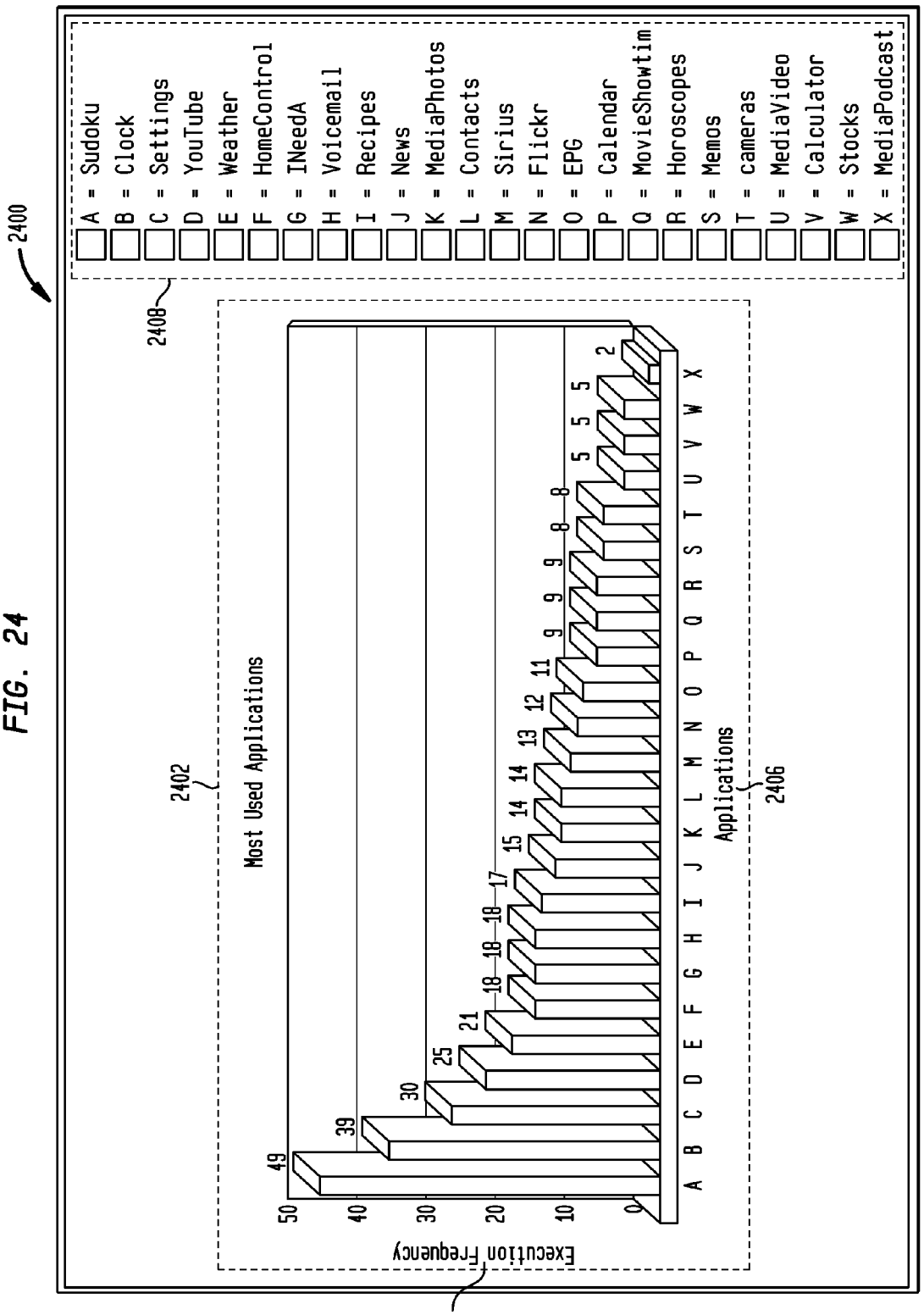
FIG. 24 depicts an example interface screen that may be presented by a system for reviewing application usage information associated with one or more telephony and digital media services devices in accordance with an embodiment of the present invention.

FIG. 24 depicts an example interface screen 2400 that may be presented by computer 2306 in accordance with an embodiment of the present invention. As shown in FIG. 24, interface screen 2400 presents a bar chart 2402 showing an execution frequency 2404 of a plurality of applications 2406 that comprise a plurality of most used applications. Each application 2406 is represented by a different colored bar, as shown by a legend 2408.

FIG. 25 depicts another example interface screen 2500 that may be presented by computer 2306 in accordance with an embodiment of the present invention. As shown in FIG. 25, interface screen 2500 presents a pie chart 2502 showing a frequency of use of a plurality of applications as a percentage of a total frequency of use over a given time period. Each application is represented by a different colored sector of the pie chart, as shown by legend 2504.

Periodic updates received by logging server 2302 may also serve as a device heartbeat, allowing logging server 2302 to present a status of active or dead devices. The front end presented by computer 2306 may include a Web interface that shows a list of devices 110 associated with a particular customer and a visual indicator of the last heartbeat status of each such device 110. An example of such an interface 2600 is shown in FIG. 26. As shown in that figure, interface 2600 includes a column 2612 that displays a last heartbeat date and time for a plurality of devices associated with a customer.

Other information that may be obtained by logging server 2602 and provided by interface 2600 includes a total number of devices associated with the customer 2602, a total number of devices associated with the customer that are currently online 2604, a most popular application for the day 2606 (based on customer usage), a MAC address for each device 2608, a comment for each device 2610, a number of application records for each device 2614 (which itself comprises a link to the application records), a number of phone records for each device 2616 (which itself comprises a link to the phone records), a number of boot records for each device 2618 (which itself comprises a link to the boot records), a number of applied updates for each device 2620 (which itself comprises a link to information about the applied updates), a number of group memberships for each device 2622 (which itself comprises a link to information about the group memberships), a start date for each device 2624, an end date for each device 2626, and a link to device usage information for each device 2628. The information collected and presented by server 2302 may be useful for performing status monitoring, troubleshooting, upgrading and service provisioning.

In an embodiment, logging server 2602, database 2304 and computer 2306 each comprise part of a device monitoring subsystem that is described in Section II.G.2 below.

II.E Example Handset Implementation Details

Example implementation details concerning handset 120 will now be provided. As discussed above in reference to FIG. 1, each handset 120 includes a user interface that comprises both a display 122 and a keypad 124. In an embodiment, display 122 comprises a 2 in. (5.1 mm) 18-bit color TFT LCD display having an active viewing area of 31.68 mm×39.6 mm, a pixel format of 176×220 pixels, a pixel size of 0.18 mm×0.18 mm, LED backlighting, and a maximum brightness of 350 cd/m$^2$. Keypad 124 comprises a standard telephone keypad including 10 numbers, "*" and "#" keys. In an embodiment, each key is implemented using a pressure membrane switch that is responsive to 180 grams of pressure.

Figure 27:
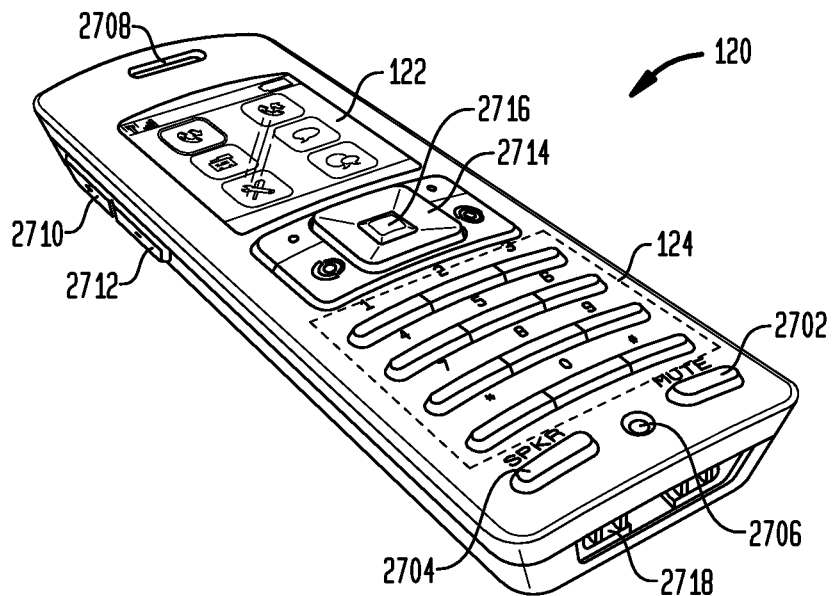
FIG. 27 is a front perspective view of a handset in accordance with an embodiment of the present invention.

As shown in FIG. 27, handset 120 further comprises user interface navigation controls in the form of a 4-way scroll pad 2714 and a selection/activation button 2716 (also referred to as an "OK" button).

Figure 28:
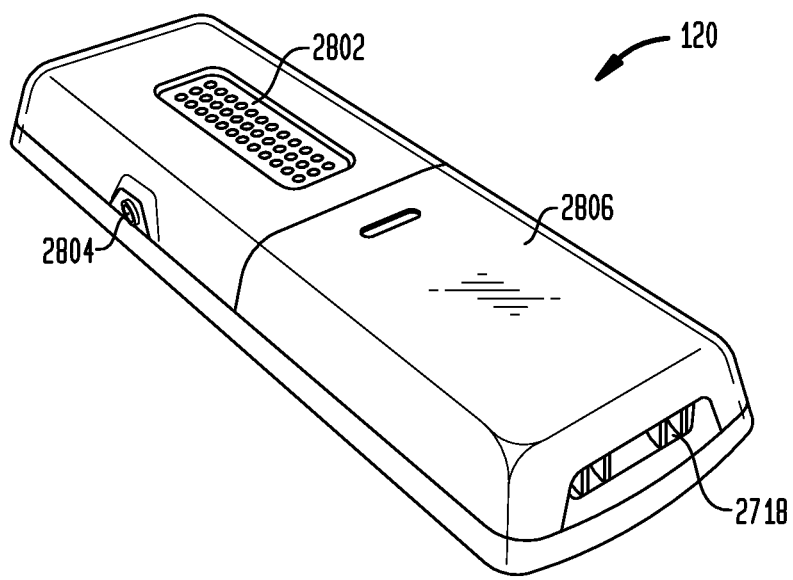
FIG. 28 is a back view of a handset in accordance with an embodiment of the present invention.

As further shown in FIG. 27, handset 120 includes a microphone 2706 and speaker 2708 for conducting a telephone call in a normal mode. As shown in FIG. 28, handset 120 also includes a rear-facing speaker 2802 for conducting a phone call in a speakerphone mode. A speakerphone button 2704 is provided for activating the speakerphone mode. An earpiece and microphone connector 2804 is provided for plugging in a wired headset. To control speaker volume, a "volume up" button 2710 and a "volume down" button 2712 are provided on one side of handset 120. A mute button 2702 is also provided to turn off microphone 2706 during a telephone call.

Figure 29:
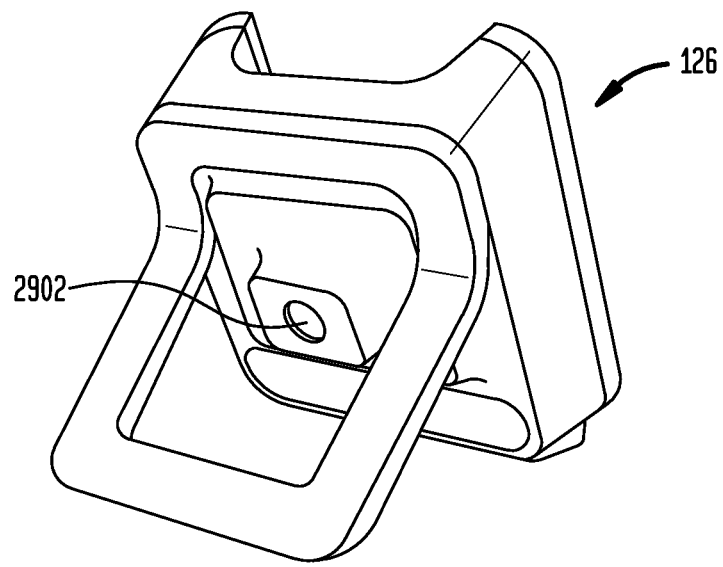
FIG. 29 is a front perspective view of a handset docking station in accordance with an embodiment of the present invention.
Figure 30:
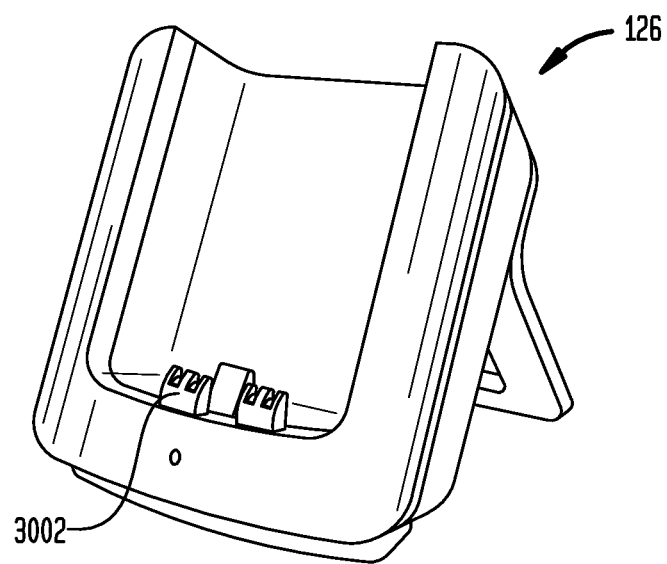
FIG. 30 is a back perspective view of a handset docking station in accordance with an embodiment of the present invention.

Handset charging contacts 2718 are provided at the bottom of handset 120. When handset 120 is placed in a corresponding docking station 126 (as shown in FIGS. 1, 29 and 30), handset charging contacts 2718 come into contact with docking station charging contacts 3002. This allows docking station 126 to charge a battery internal to handset 120. In one embodiment, the battery internal to handset 120 comprises a 550 mAh Lithium-Ion battery. The battery is accessible for replacement via a removable back plate 2806. Docking station 126 also includes a connector 2902 for receiving power via an AC adapter. In one embodiment, the AC adapter comprises a 5V/500 milliampere-hour (mAh) AC adapter.

As described above, in one embodiment, handset 120 is configured to act as a DECT client that wirelessly communicates with device 110 which acts as a DECT base station. In accordance with such an embodiment, handset 120 may include DECT firmware that supports features such as two- or three-party conferencing, an enhanced graphical user interface, uploadable ringtones (e.g., MIDI and MP3), a synchronized address book, and remotely managed firmware upgrades.

II.F Example Device Graphical User Interface Screens

As discussed above in reference to FIG. 1, a device 110 in accordance with an embodiment of the present invention includes a display 112 that is used to provide a GUI by which a user may initiate, manage and experience telephony and digital media services. Example GUI screens by which the user may perform such functions will now be described. The example GUI screens described in this section are particularly suitable for use with an embodiment of device 110 in which display 112 comprises a color LCD display and integrated capacitive touch screen panel. In accordance with such an embodiment, a user may interact with the GUI by touching display 112 with a finger. For example, a user may touch a portion of display 112 corresponding to a graphic element in order to activate or select that element. However, the GUI screens described in this section are not limited to such an implementation and other forms of interaction may be used.

Figure 31:
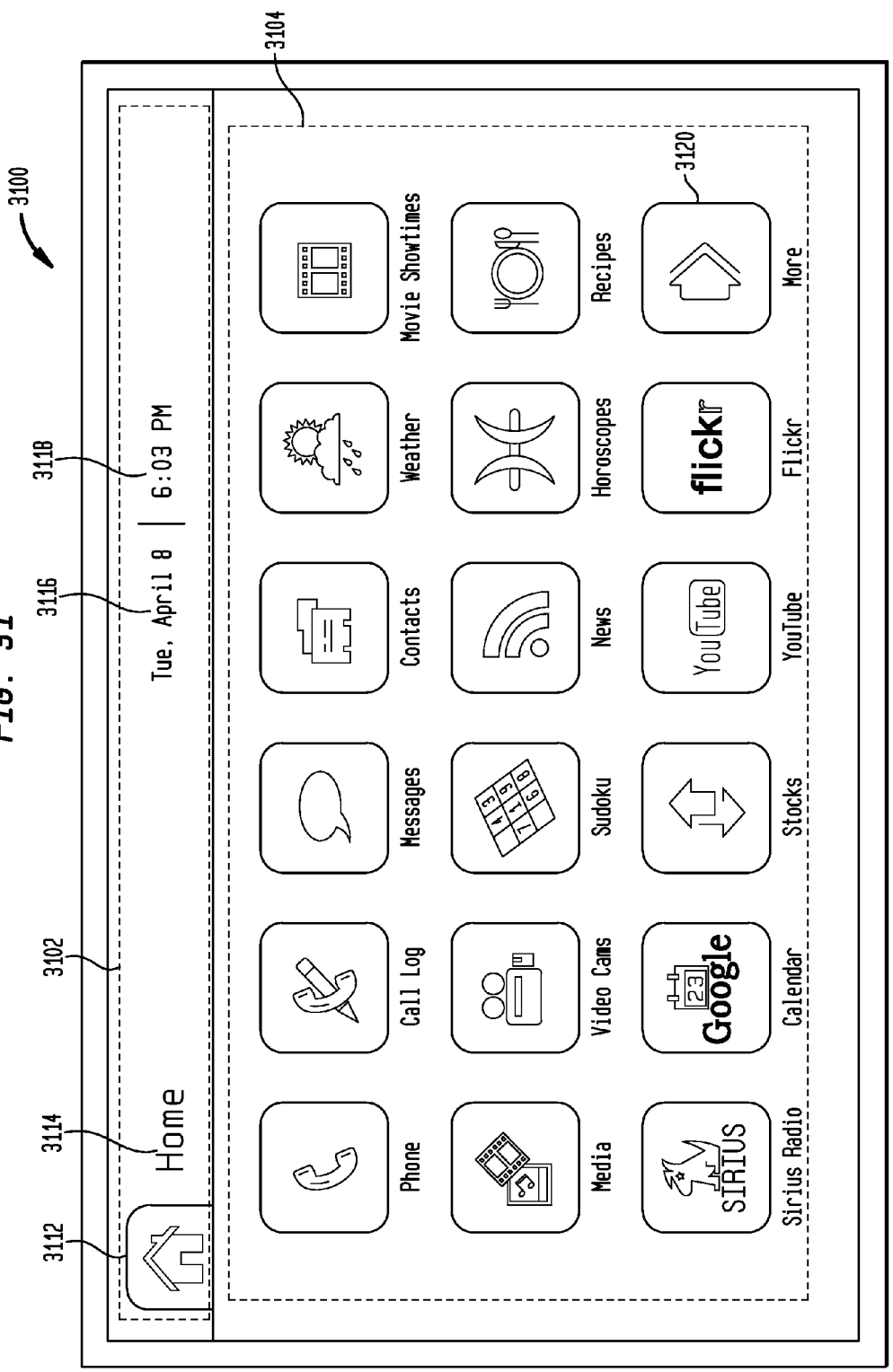
FIG. 31 depicts an example home graphical user interface (GUI) screen that may be displayed by a telephony and digital media services device in accordance with an embodiment of the present invention.

FIG. 31 depicts an example home GUI screen 3100 in accordance with an embodiment of the present invention. As shown in FIG. 31, example home GUI screen 3100 comprises a plurality of icons 3104, each of which is representative of a different application that may be executed on device 110. In an embodiment, an application is launched when a user activates an icon associated with the application. An exception to this is icon 3120 which, when activated, will display addition application icons. As noted above, in an embodiment, activation of an icon may comprise touching the icon on display 112, although other forms of activation may be used depending upon the implementation. Home GUI screen 3100 also includes a status bar 3102. Status bar 3102 includes an icon 3112 representative of home GUI screen 3100, a name 3114 ("Home") associated with home GUI screen 3100, and an indication of the current date 3116 and time 3118.

As discussed elsewhere herein, each icon on home screen 3100 may comprise a Shockwave Flash movie that is executed within an icon layer of a theme movie displayed on display 112. Likewise, status bar 3102 may comprise a Shockwave Flash movie that is executed within a status bar layer of the theme movie. Various example GUI screens described below also include a status bar that may be implemented in a like manner.

Figure 32:
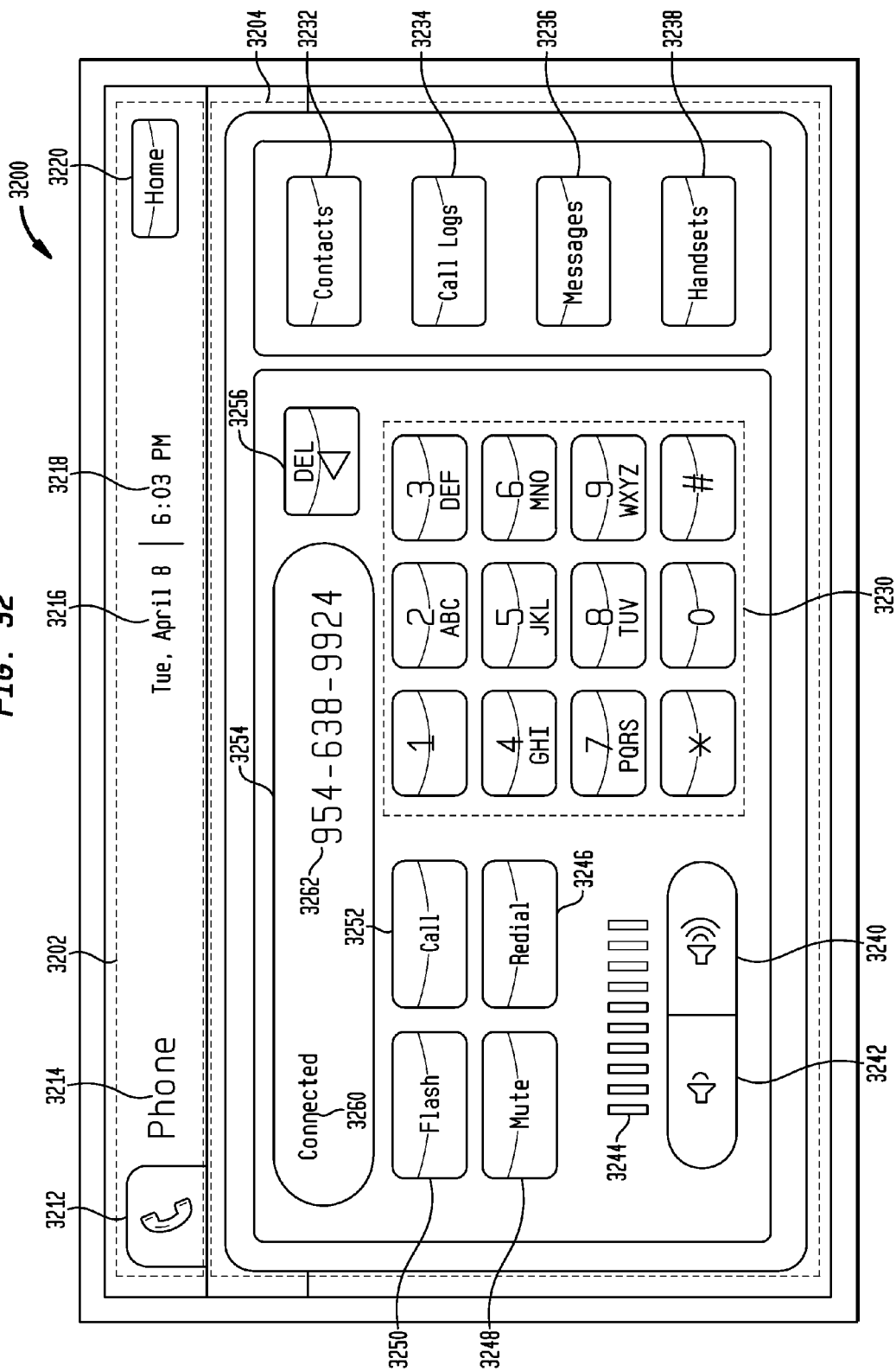
FIG. 32 depicts an example GUI screen for a telephony application in accordance with an embodiment of the present invention.

FIG. 32 depicts an example GUI screen 3200 for a telephony application in accordance with an embodiment of the present invention. As shown in FIG. 32, example GUI screen 3200 includes a status bar 3202 and a telephony application interface 3204. Telephony application interface may comprise a Shockwave Flash movie that is executed within an application layer of a theme movie displayed on display 112. Various example GUI screens described below also include application interfaces that may be implemented in a like manner.

Status bar 3202 includes an icon 3212 representative of the telephony application, a name 3214 ("Phone") associated with the telephony application, an indication of the current date 3216 and time 3218 and a "home" button 3220. When a user activates "home" button 3220, the user will be returned to home GUI screen 3100.

Telephony application interface 3204 includes a keypad 3230 that can be used to enter a telephone number 3262 which appears in a display window 3254. Any numbers entered in this fashion can be deleted using a delete button 3256. Display window 3254 also includes an indication of a call status 3260. In the example GUI depicted in FIG. 32, the call status is "connected."

Telephony application interface 3204 further includes a button 3240 for increasing the volume at which the audio content of a call will be heard and a button 3242 for decreasing the volume. A volume indicator 3244 provides a graphical indication of the current volume level. A "redial" button 3246 may be activated to automatically dial the most-recently dialed number. A "mute" button 3248 may be activated to turn off a microphone associated with device 110 during a telephone call. A "flash" button 3250 may be activated to perform special services that may be provided by the telephony application such as, for example, three-way calling, call waiting, conference calling, or call transfers. A "call" button 3252 may be activated to place a call to the number shown in display window 3254.

Telephony application interface 3204 also includes a "contacts" button 3232 that when activated causes a contacts application to be launched, a "call logs" button 3234 that when activated causes a call logs application to be launched, a "messages" button 3236 that when activated causes a voicemail application to be launched, and a "handsets" button 3238.

Figure 33:
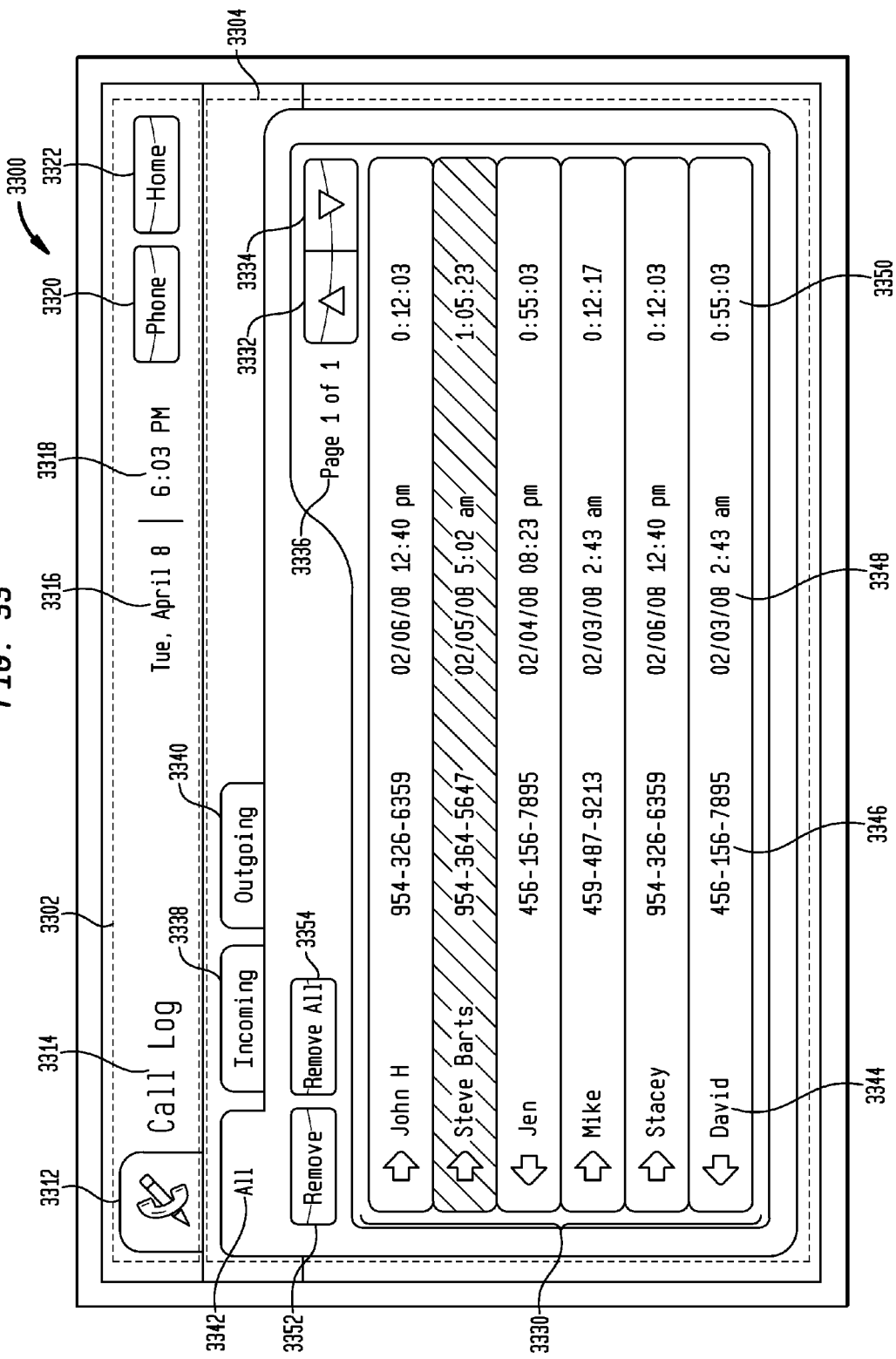
FIG. 33 depicts an example GUI screen for a call log application in accordance with an embodiment of the present invention.

FIG. 33 depicts an example GUI screen 3300 for a call log application in accordance with an embodiment of the present invention. As shown in FIG. 33, example GUI screen 3300 includes a status bar 3302 and a call log application interface 3304.

Status bar 3302 includes an icon 3312 representative of the call log application, a name 3314 ("Call Log") associated with the call log application, an indication of the current date 3316 and time 3318, a "phone" button 3320 and a "home" button 3322. When a user activates "phone" button 3320, GUI screen 3200 for a telephony application will be displayed. When a user activates "home" button 3322, the user will be returned to home GUI screen 3100.

Call log application interface 3304 displays all or a portion of a log 3330 of previously-placed outgoing and incoming telephone calls. To page up through log 3330 a "page up" button 3332 may be activated and to page down a "page down" button 3334 may be activated. A page indicator 3336 indicates which of one or more pages of log 3330 is currently being displayed. To see incoming calls only, an "incoming" tab 3338 may be activated, to see outgoing calls only an "outgoing" tab 3340 may be activated, and to return to a list of all incoming and outgoing calls an "all" tab 3342 may be activated. For each call listed in log 3330, the following information is displayed: a name of a calling/called party 3344, a phone number associated with the calling/called party 3346, a date/time of the previous call 3348 and a duration of the previous call 3350. To select a call listed in log 3330, the horizontal bar that provides information about the call may be activated. Call log application interface 3304 further includes a "remove" button 3352 that can be used to remove a selected entry from log 3330 and a "remove all" button 3354 that can be used to remove all incoming and/or outgoing entries from log 3330.

Figure 34:
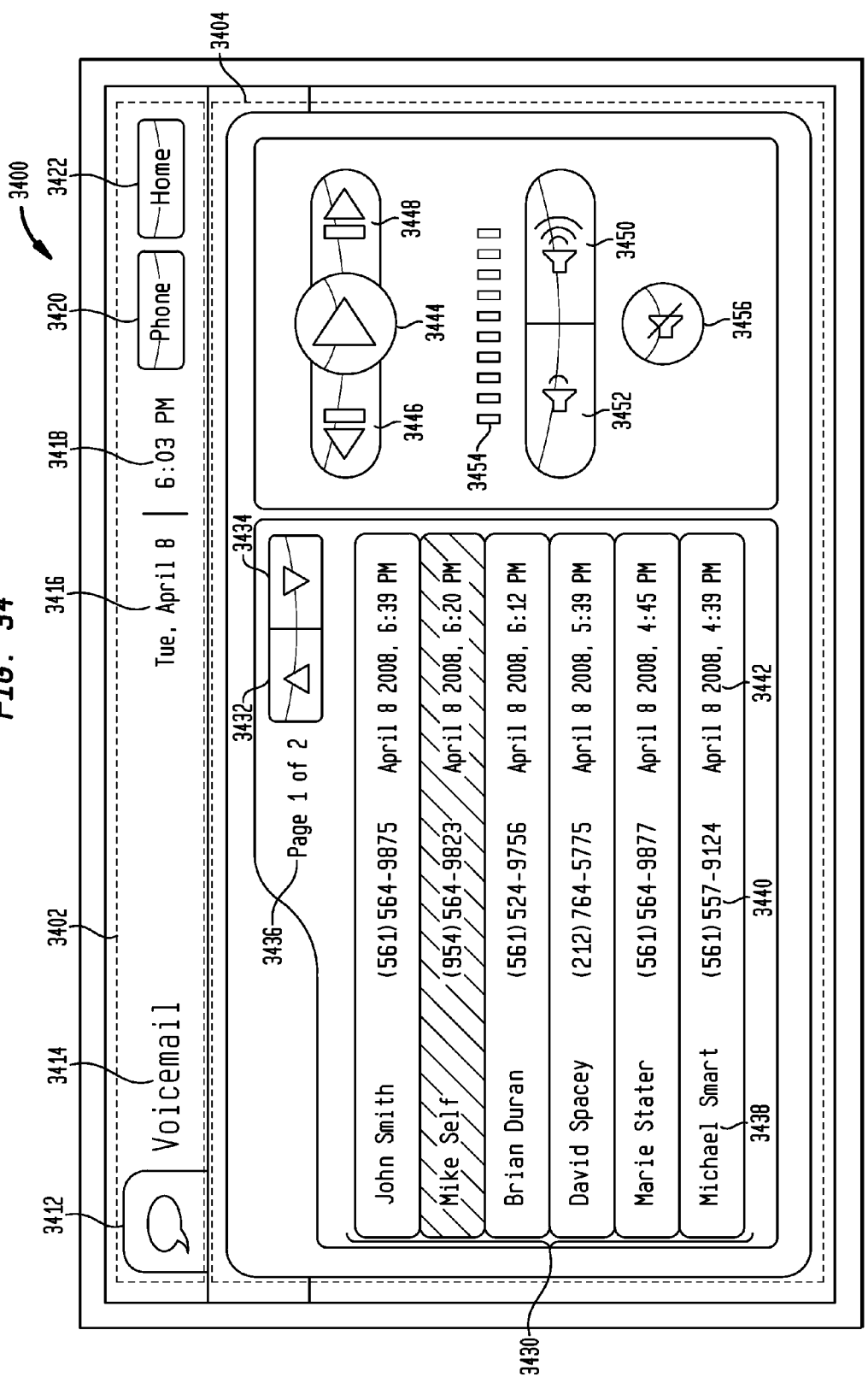
FIG. 34 depicts an example GUI screen for a voicemail application in accordance with an embodiment of the present invention.

FIG. 34 depicts an example GUI screen 3400 for a voicemail application in accordance with an embodiment of the present invention. As shown in FIG. 34, example GUI screen 3400 includes a status bar 3402 and a voicemail application interface 3404.

Status bar 3402 includes an icon 3412 representative of the voicemail application, a name 3414 ("Voicemail") associated with the voicemail application, an indication of the current date 3416 and time 3418, a "phone" button 3420 and a "home" button 3422. When a user activates "phone" button 3420, GUI screen 3200 for a telephony application will be displayed. When a user activates "home" button 3422, the user will be returned to home GUI screen 3100.

Voicemail application interface 3404 displays all or a portion of a list 3430 of saved voicemail messages. To page up through list 3430 a "page up" button 3432 may be activated and to page down a "page down" button 3434 may be activated. A page indicator 3436 indicates which of one or more pages of list 3430 is currently being displayed. For each voicemail message in list 3430, the following information is displayed: a name of a party that left the voicemail message 3438, a phone number 3440 associated with the party that left the voicemail message, and a date/time 3442 that the voicemail message was left. To select a voicemail message listed in list 3430, the horizontal bar that provides information about the voicemail may be activated.

Voicemail application interface 3404 further includes a "play" button 3444 for playing a selected voicemail message, a "rewind" button 3446 for rewinding the content of a selected voicemail message, and a "fast forward" button 3448 for fast forwarding the content of a selected voicemail message. A button 3450 is provided for increasing the volume at which the content of a voicemail message will be heard and a button 3452 is provided for decreasing the volume. A volume indicator 3454 provides a graphical indication of the current volume level. A "mute" button 3456 is also provided for turning off the audio output associated with a voicemail message.

Figure 35:
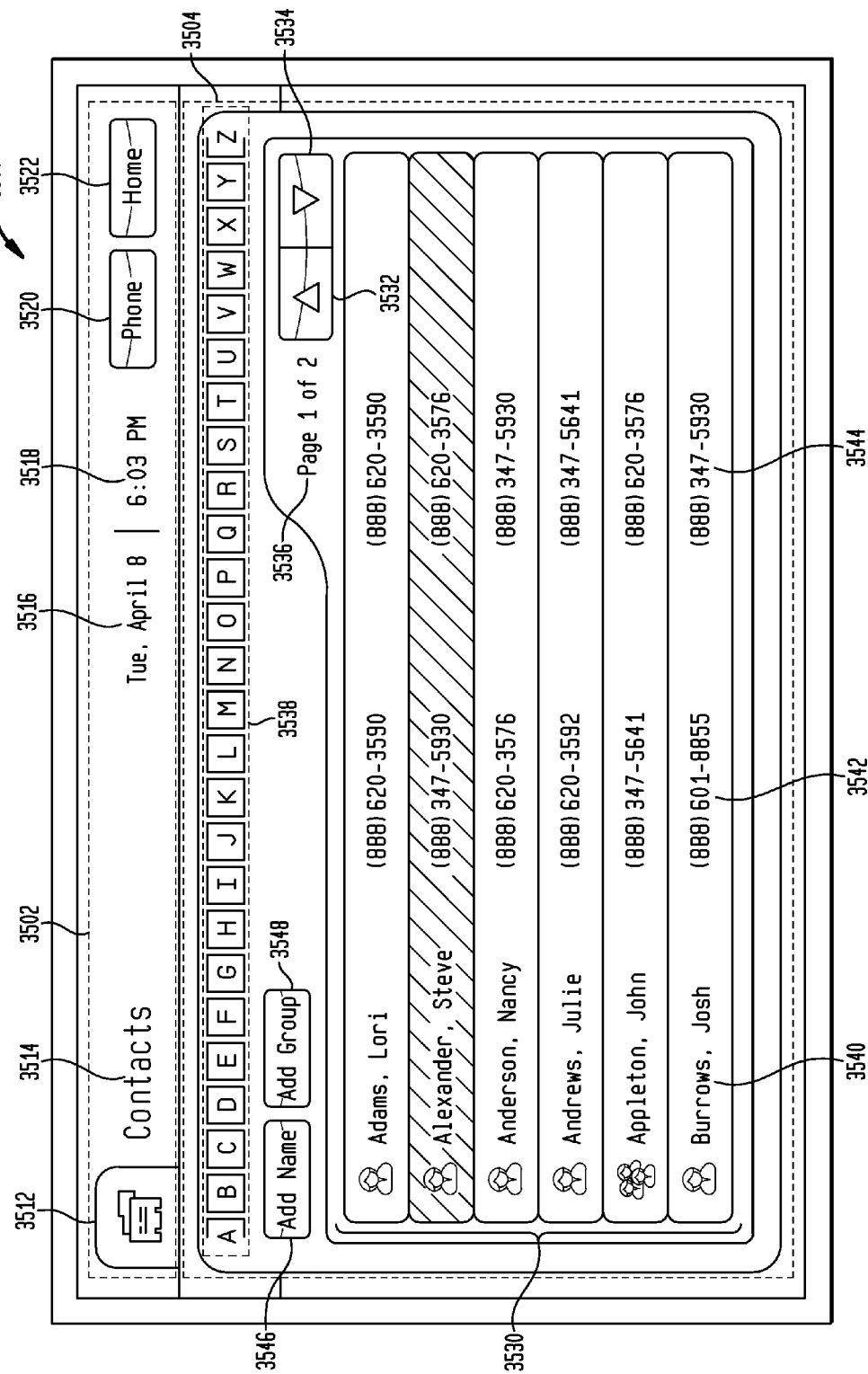
FIG. 35 depicts an example GUI screen for a contacts application in accordance with an embodiment of the present invention.

FIG. 35 depicts an example GUI screen 3500 for a contacts application in accordance with an embodiment of the present invention. As shown in FIG. 35, example GUI screen 3500 includes a status bar 3502 and a contacts application interface 3504.

Status bar 3502 includes an icon 3512 representative of the contacts application, a name 3514 ("Contacts") associated with the contacts application, an indication of the current date 3516 and time 3518, a "phone" button 3520 and a "home" button 3522. When a user activates "phone" button 3520, GUI screen 3200 for a telephony application will be displayed. When a user activates "home" button 3522, the user will be returned to home GUI screen 3100.

Contacts application interface 3504 displays all or a portion of a list 3530 of user contacts. To page up through list 3530 a "page up" button 3532 may be activated and to page down a "page down" button 3534 may be activated. A page indicator 3536 indicates which of one or more pages of list 3530 is currently being displayed. To view contacts starting with a particular letter of the alphabet, one a series of buttons 3538 corresponding to each letter of the alphabet may be activated. For each contact in list 3530, the following information is displayed: a name of the contact 3540, a first phone number 3542 associated with the contact, and a second phone number 3544 associated with the contact. To select a contact from among those in list 3530, the horizontal bar that provides information about the contact may be activated.

Contacts application interface 3504 further includes an "add name" button 3546 that when activated launches a dialog for adding a person to list 3530 and an "add group" button 3548 that when activated launches a dialog for adding a group of people to list 3530.

Figure 36:
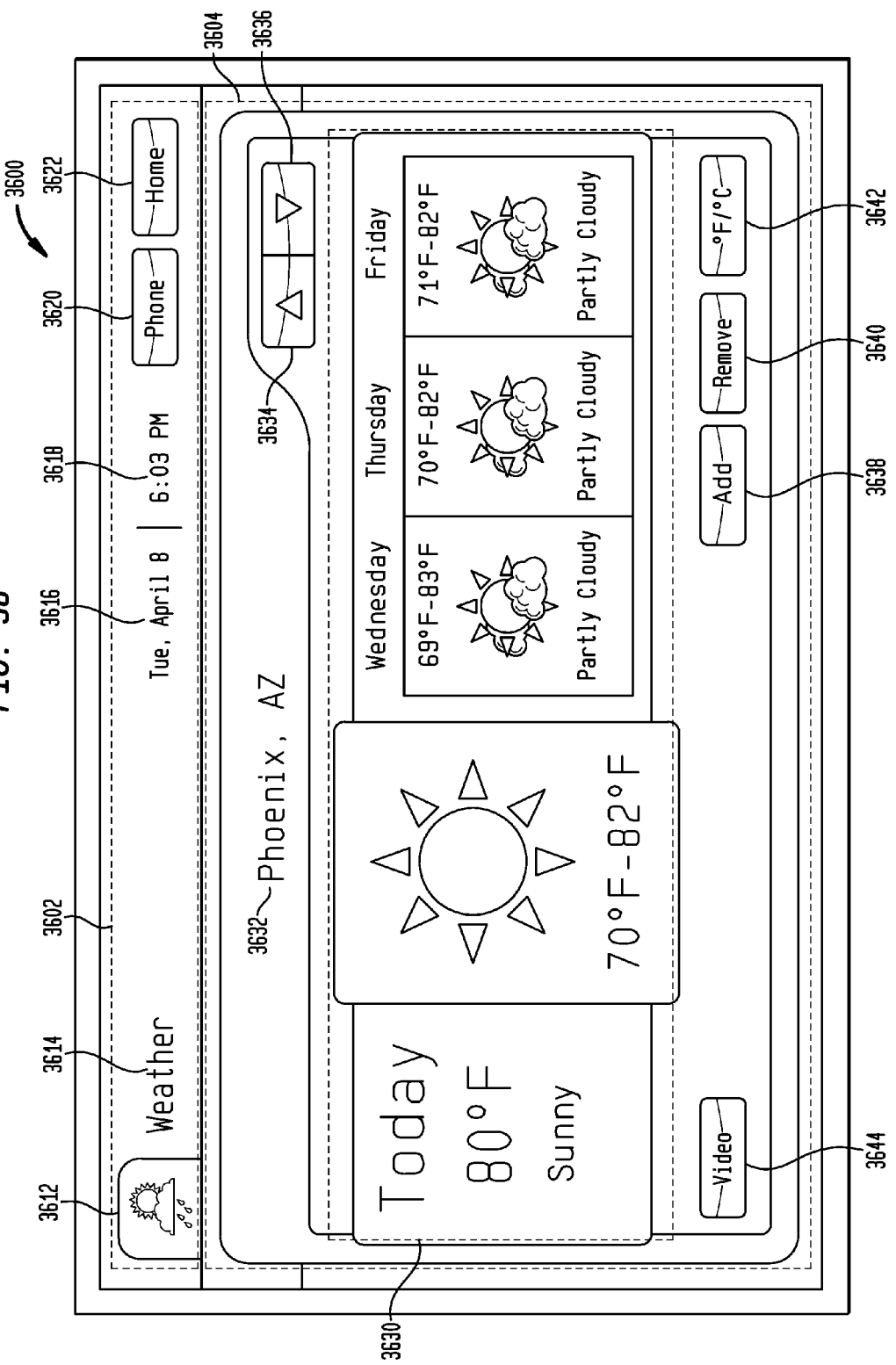
FIG. 36 depicts an example GUI screen for a weather application in accordance with an embodiment of the present invention.

FIG. 36 depicts an example GUI screen 3600 for a weather application in accordance with an embodiment of the present invention. As shown in FIG. 36, example GUI screen 3600 includes a status bar 3602 and a weather application interface 3604.

Status bar 3602 includes an icon 3612 representative of the weather application, a name 3614 ("Weather") associated with the weather application, an indication of the current date 3616 and time 3618, a "phone" button 3620 and a "home" button 3622. When a user activates "phone" button 3620, GUI screen 3200 for a telephony application will be displayed. When a user activates "home" button 3622, the user will be returned to home GUI screen 3100.

Weather application interface 3604 includes a display area 3630 that provides weather information for a particular location 3632. In the example of FIG. 36, the particular location is "Phoenix, Ariz." The particular location may be one of a series of predefined locations for which weather information is available. To view weather information for a preceding location in the series a "page up" button 3634 is provided. To view weather information for a subsequent location in the series a "page down" button 3636 is provided. An "add" button 3638 is provided that, when activated, launches a dialog by which a location may be added to the series of locations. A "remove" button 3640 is also provided that, when activated, launches a dialog by which a location may be removed from the series of locations. A button 3642 allows a user to select whether temperatures should be displayed in degrees Fahrenheit (° F.) or degrees Celsius (° C.). A "video" button 3644 is provided that allows a user to watch weather-related video content such as a video feed from a weather camera or the like.

Figure 37:
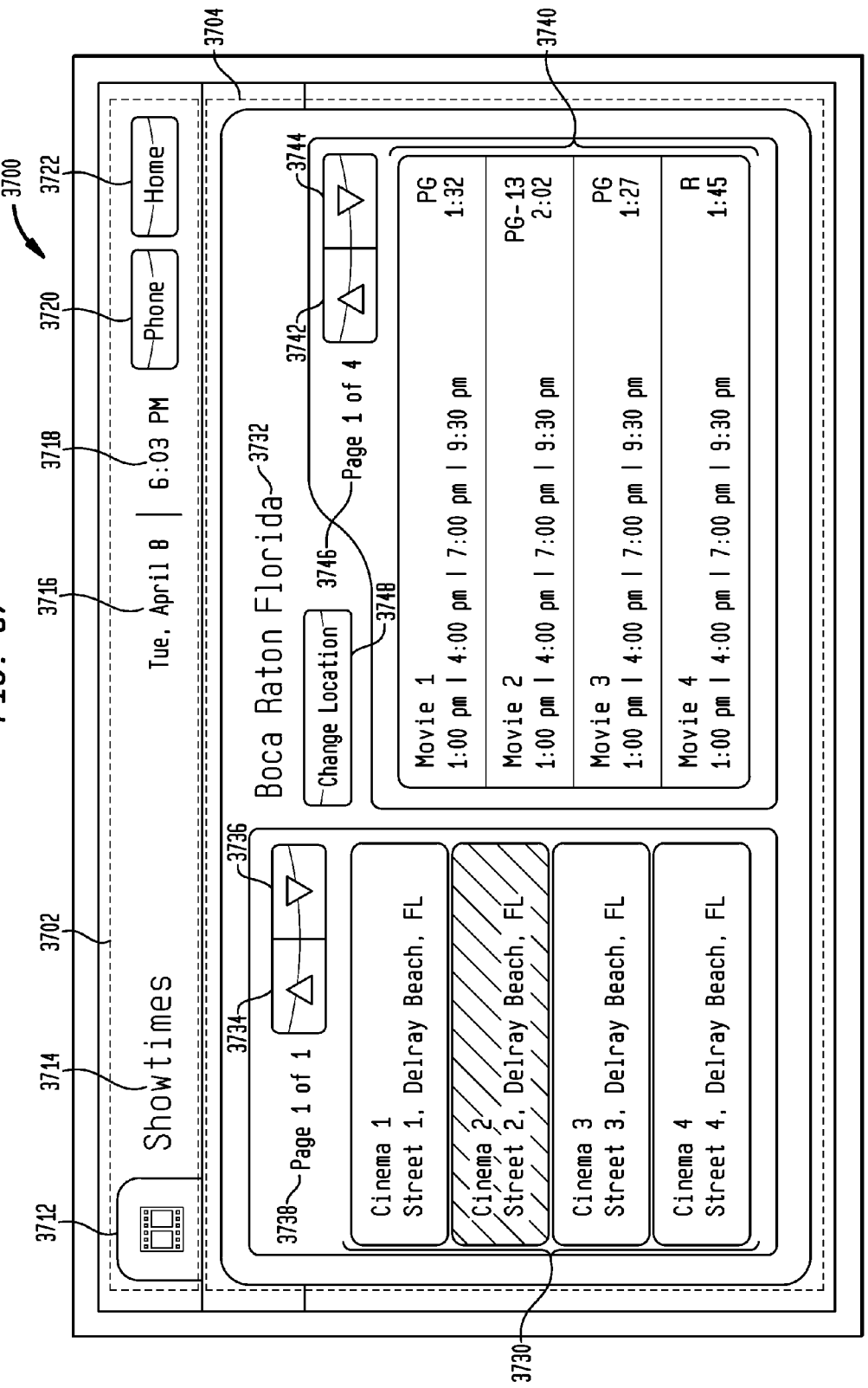
FIG. 37 depicts an example GUI screen for a movie showtimes application in accordance with an embodiment of the present invention.

FIG. 37 depicts an example GUI screen 3700 for a movie showtimes application in accordance with an embodiment of the present invention. As shown in FIG. 37, example GUI screen 3700 includes a status bar 3702 and a movie showtimes application interface 3704.

Status bar 3702 includes an icon 3712 representative of the movie showtimes application, a name 3714 ("Showtimes") associated with the movie showtimes application, an indication of the current date 3716 and time 3718, a "phone" button 3720 and a "home" button 3722. When a user activates "phone" button 3720, GUI screen 3200 for a telephony application will be displayed. When a user activates "home" button 3722, the user will be returned to home GUI screen 3100.

Movie showtimes application interface 3704 includes a first display area that displays all or a portion of a list of movie theaters 3730 associated with a particular location 3732. In the example of FIG. 37, the particular location is "Boca Raton Fla." To page up through list 3730 a "page up" button 3734 may be activated and to page down a "page down" button 3736 may be activated. A page indicator 3738 indicates which of one or more pages of list 3730 is currently being displayed. To select a movie theater from among those in list 3730, the horizontal bar that provides information about the movie theater may be activated.

Movie showtimes application interface 3704 also includes a second display area that displays all or a portion of a list of movies and associated showtimes 3740 associated with a movie theater selected in the first display area. To page up through list 3740 a "page up" button 3742 may be activated and to page down a "page down" button 3744 may be activated. A page indicator 3746 indicates which of one or more pages of list 3740 is currently being displayed.

A "change location" button 3748 is provided that, when activated, launches a dialog by which a user can select a different location for which to obtain movie showtime information.

Figure 38:
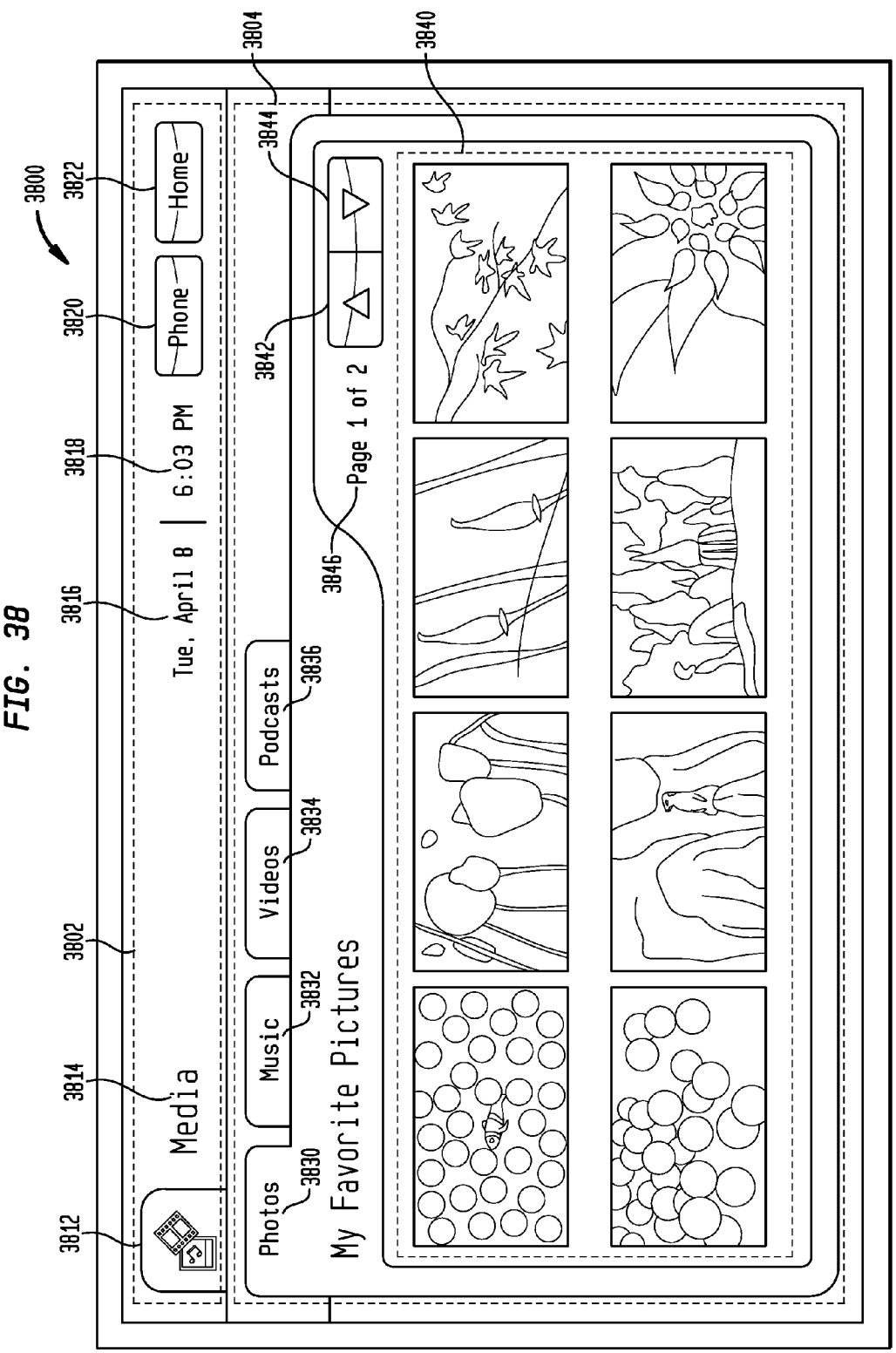
FIG. 38 depicts an example GUI screen for a media application in accordance with an embodiment of the present invention in which a photos interface is displayed.

FIG. 38 depicts an example GUI screen 3800 for a media application in accordance with an embodiment of the present invention. As shown in FIG. 38, example GUI screen 3800 includes a status bar 3802 and a media application interface 3804.

Status bar 3802 includes an icon 3812 representative of the media application, a name 3814 ("Media") associated with the media application, an indication of the current date 3816 and time 3818, a "phone" button 3820 and a "home" button 3822. When a user activates "phone" button 3820, GUI screen 3200 for a telephony application will be displayed. When a user activates "home" button 3822, the user will be returned to home GUI screen 3100.

Media application interface 3804 comprises four different interfaces, only one of which may be shown at any given time: a photos interface that may be selected by activating a "photos" tab 3830, a music interface that may be selected by activating a "music" tab 3832, a videos interface that may be selected by activating a "videos" tab 3834, and a podcasts interface that may be selected by activating a "podcasts" tab 3836. In FIG. 38, the photos interface is currently being displayed. As shown in that figure, the photos interface includes a display area 3840 within which a plurality of digital photos is displayed. The displayed photos may comprise one page in a series of pages of digital photos. To page up through the series a "page up" button 3842 may be activated and to page down a "page down" button 3844 may be activated. A page indicator 3846 indicates which of one or more pages in the series of pages is currently being displayed.

Figure 39:
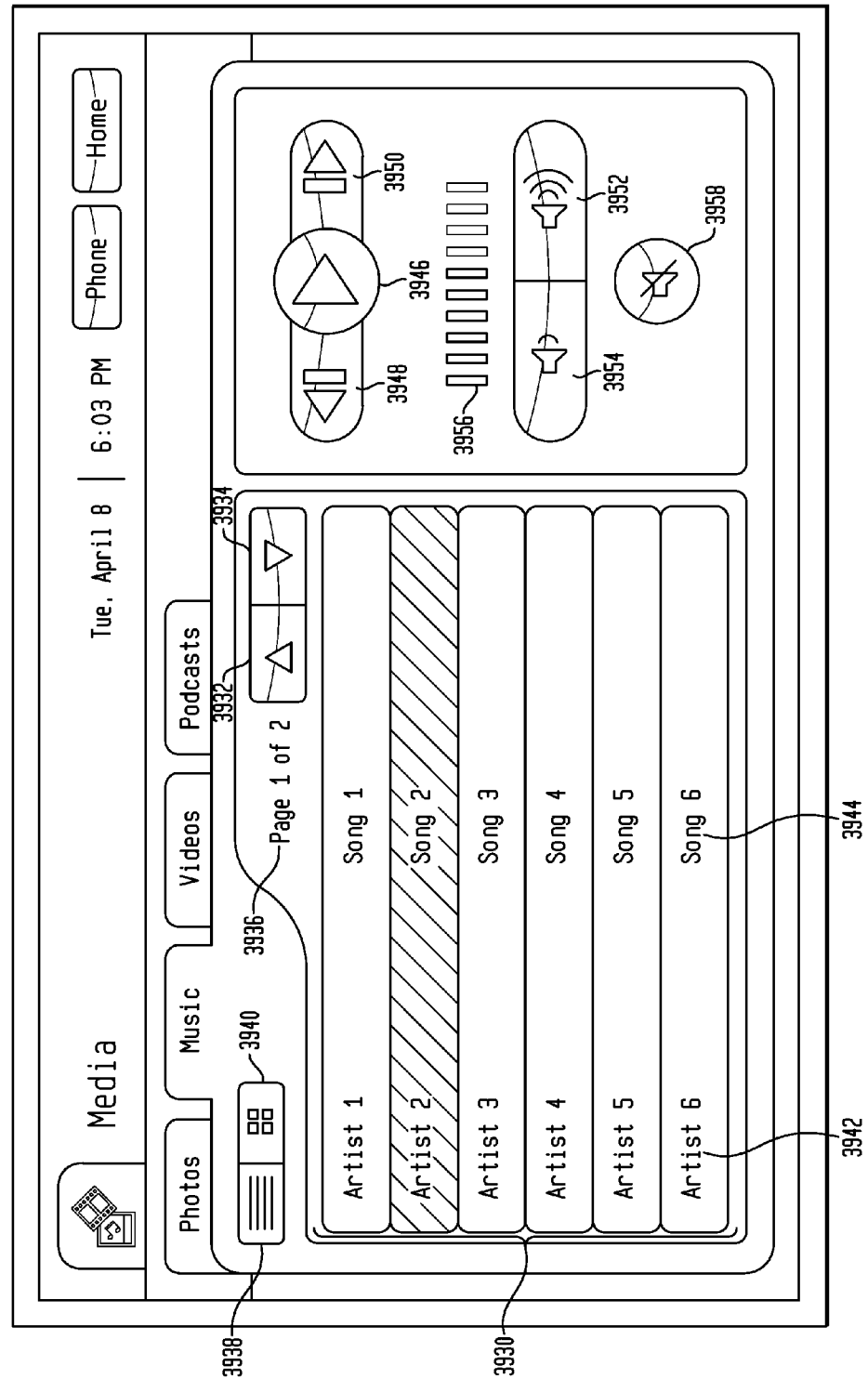
FIG. 39 depicts a GUI screen for a media application in accordance with an embodiment of the present invention in which a music interface is displayed.

FIG. 39 depicts a GUI screen 3900 for the aforementioned media application in which the music interface is displayed. As shown in FIG. 39, the music interface includes a display area that displays all or a portion of a list of songs 3930. To page up through list 3930 a "page up" button 3932 may be activated and to page down a "page down" button 3934 may be activated. A page indicator 3936 indicates which of one or more pages of list 3930 is currently being displayed. For each song in list 3930 the following information is provided: a performer of the song 3942 and the song title 3944. A song in list 3930 may be selected by activating the horizontal bar upon which the song information is provided.

The music interface further includes a "play" button 3946 for playing a selected song, a "rewind" button 3948 for rewinding the content of a selected song, and a "fast forward" button 3950 for fast forwarding the content of a selected song. A button 3952 is provided for increasing the volume at which the audio content of a song will be heard and a button 3954 is provided for decreasing the volume. A volume indicator 3956 provides a graphical indication of the current volume level. A "mute" button 3956 is also provided for turning off the audio output associated with a song.

Figure 40:
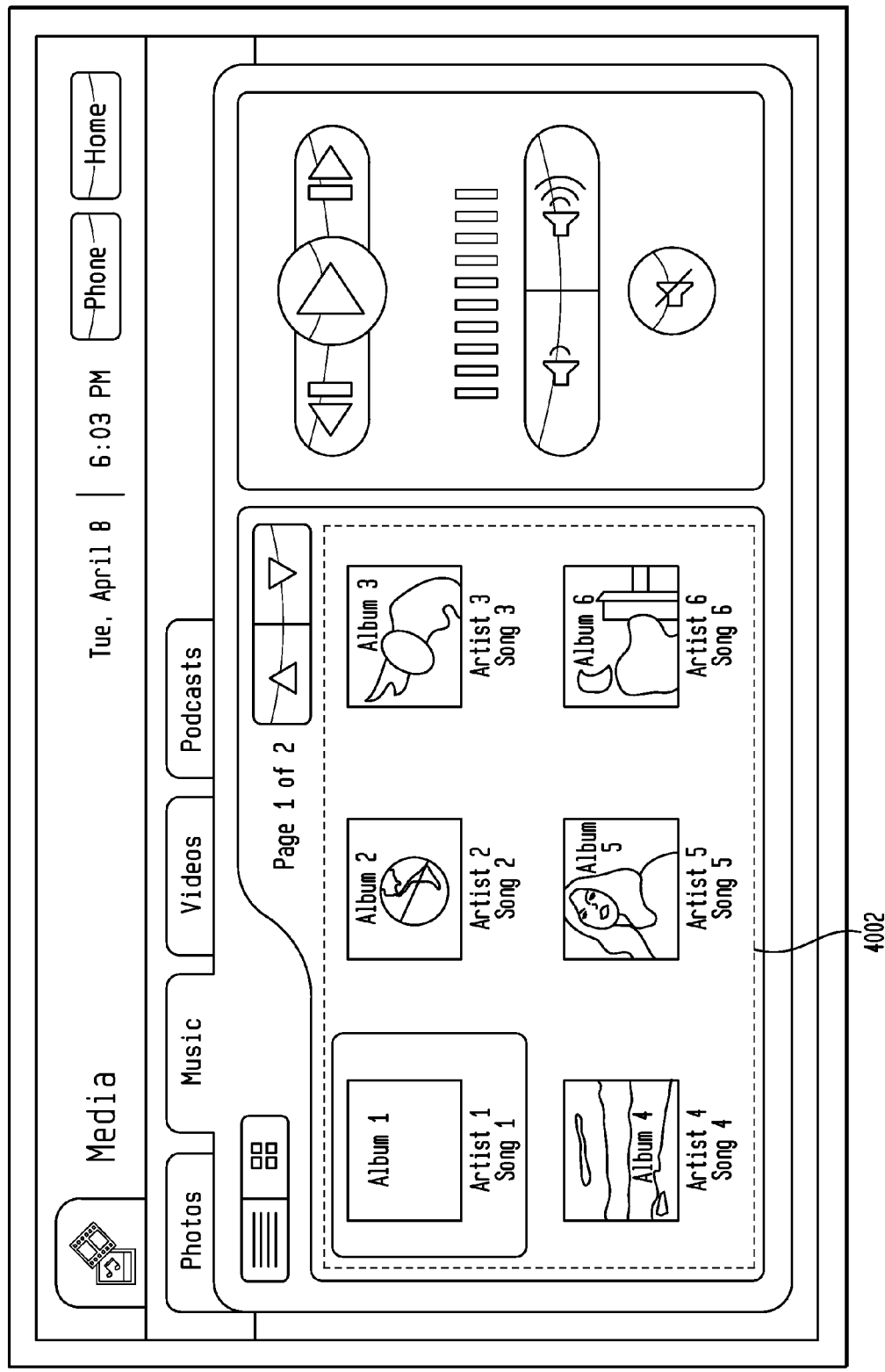
FIG. 40 depicts a further GUI screen for a media application in accordance with an embodiment of the present invention in which a music interface is displayed.

The music interface allows song information to be displayed in two formats. The list format shown in FIG. 39 may be obtained by activating a first display format button 3938. An icon format shown in GUI interface screen 4000 of FIG. 40 may be obtained by activating a second display format button 3940. As shown in FIG. 40, when the icon format is selected, a display area 4002 is presented that displays an icon associated with each song. The song performer and title is displayed below each icon.

Figure 41:
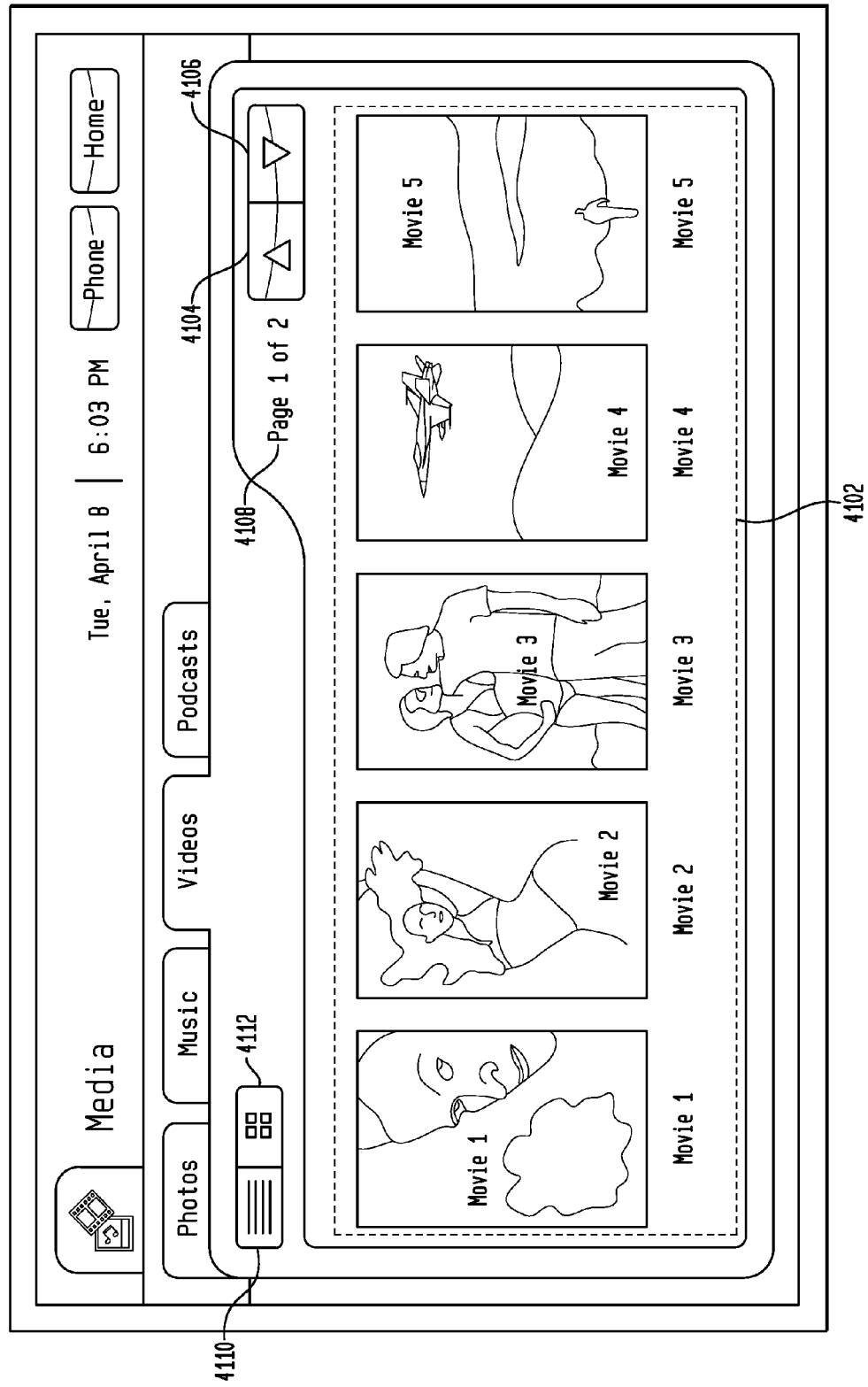
FIG. 41 depicts an example GUI screen for a media application in accordance with an embodiment of the present invention in which a videos interface is displayed.

FIG. 41 depicts a GUI screen 4100 for the aforementioned media application in which the videos interface is displayed. As shown in FIG. 41, the videos interface includes a display area that displays all or a portion of a collection of movies 4102. To page up through collection 4102 a "page up" button 4104 may be activated and to page down a "page down" button 4106 may be activated. A page indicator 4108 indicates which of one or more pages of collection 4102 is currently being displayed. For each movie in collection 4108 the following information is provided: a graphic icon representative of the movie and the name of the movie. A movie in collection 4102 may be selected by activating the icon associated with the movie.

The videos interface allows movies to be displayed in two formats. A list format in which information about each movie is provided in a horizontal bar may be obtained by activating a first display format button 4110. The icon format shown in FIG. 41 may be obtained by activating a second display format button 4112.

Figure 42:
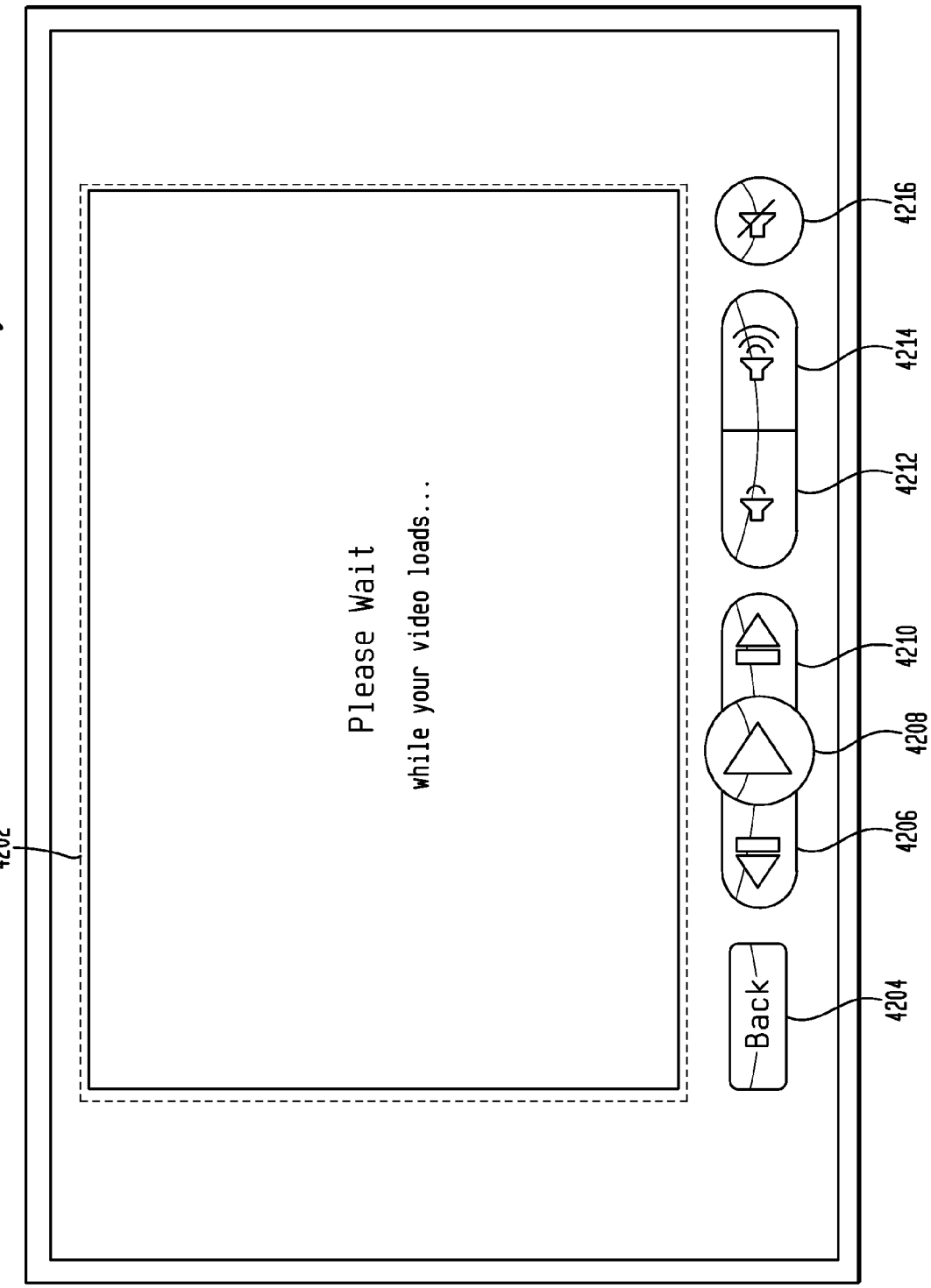
FIGS. 42 and 43 depict a GUI screen for a video player application in accordance with an embodiment of the present invention.

FIG. 42 depicts a GUI screen 4200 for a video player application in accordance with an embodiment of the present invention. In one embodiment, the video player application is launched and GUI interface screen 4200 is presented to a user when the user activates a movie in collection 4102 that is displayed within GUI screen 4100.

As shown in FIG. 42, GUI interface screen 4200 includes a display area 4202 for displaying video content such as video content associated with a movie. GUI interface screen 4200 also includes a "back" button 4204 that allows a user to terminate the playback of the video content and return to a previously-viewed GUI screen, a "play" button 4208 that allows a user to play the video content, a "rewind" button 4206 that allows a user to rewind the video content, a "fast forward" button 4210 that allows a user to fast forward the video content, a button 4214 that allows a user to increase the volume of audio content associated with the video content, a button 4212 that allows a user to decrease the volume of the audio content, and a "mute" button 4216 that allows the user to turn off the audio content entirely.

Figure 43:
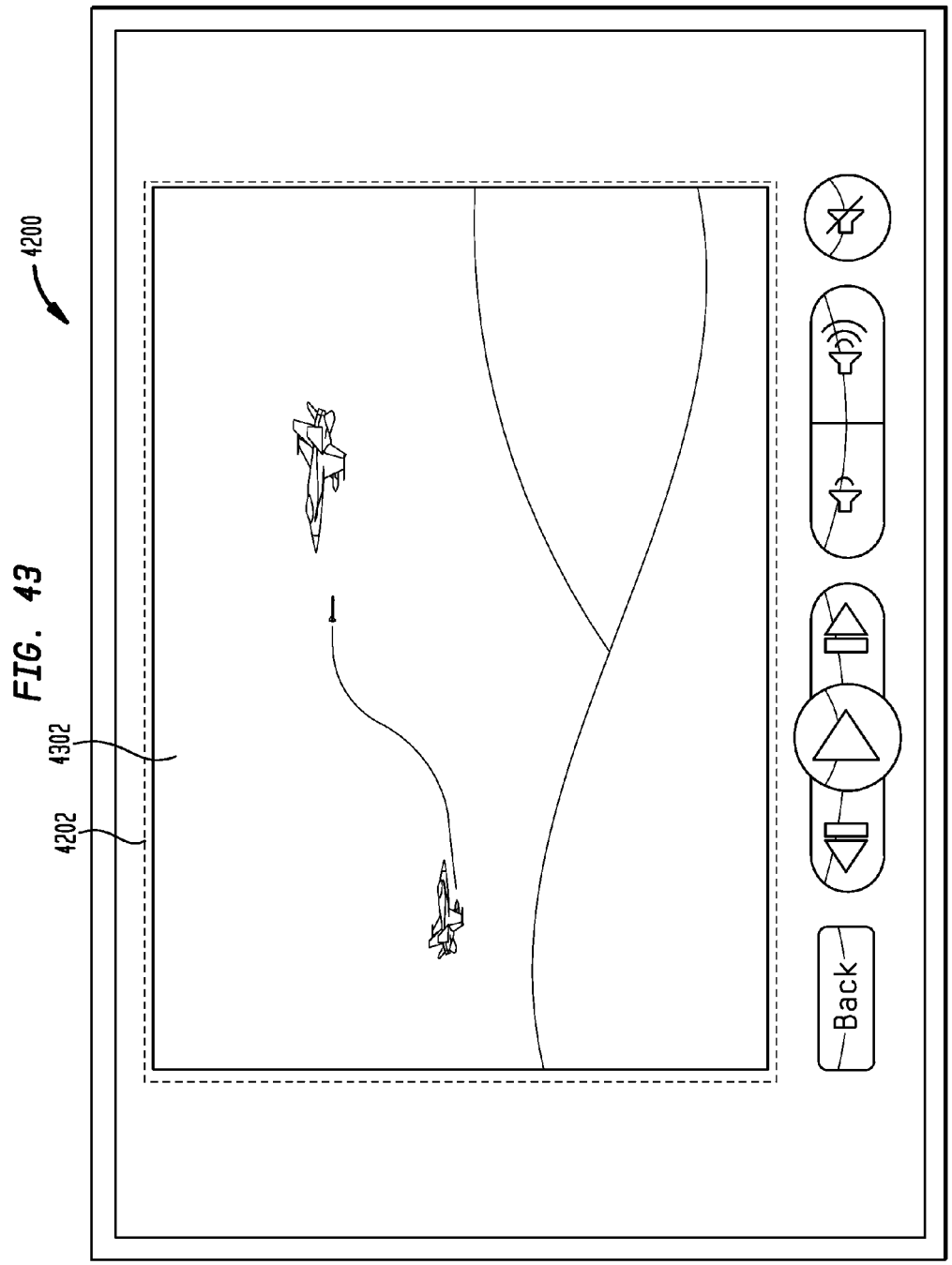

In FIG. 42, display area 4202 displays a message that indicates that video content is being loaded. FIG. 43 depicts another view of GUI interface screen 4200 in which video content 4302 associated with a movie is playing in display area 4202.

Figure 44:
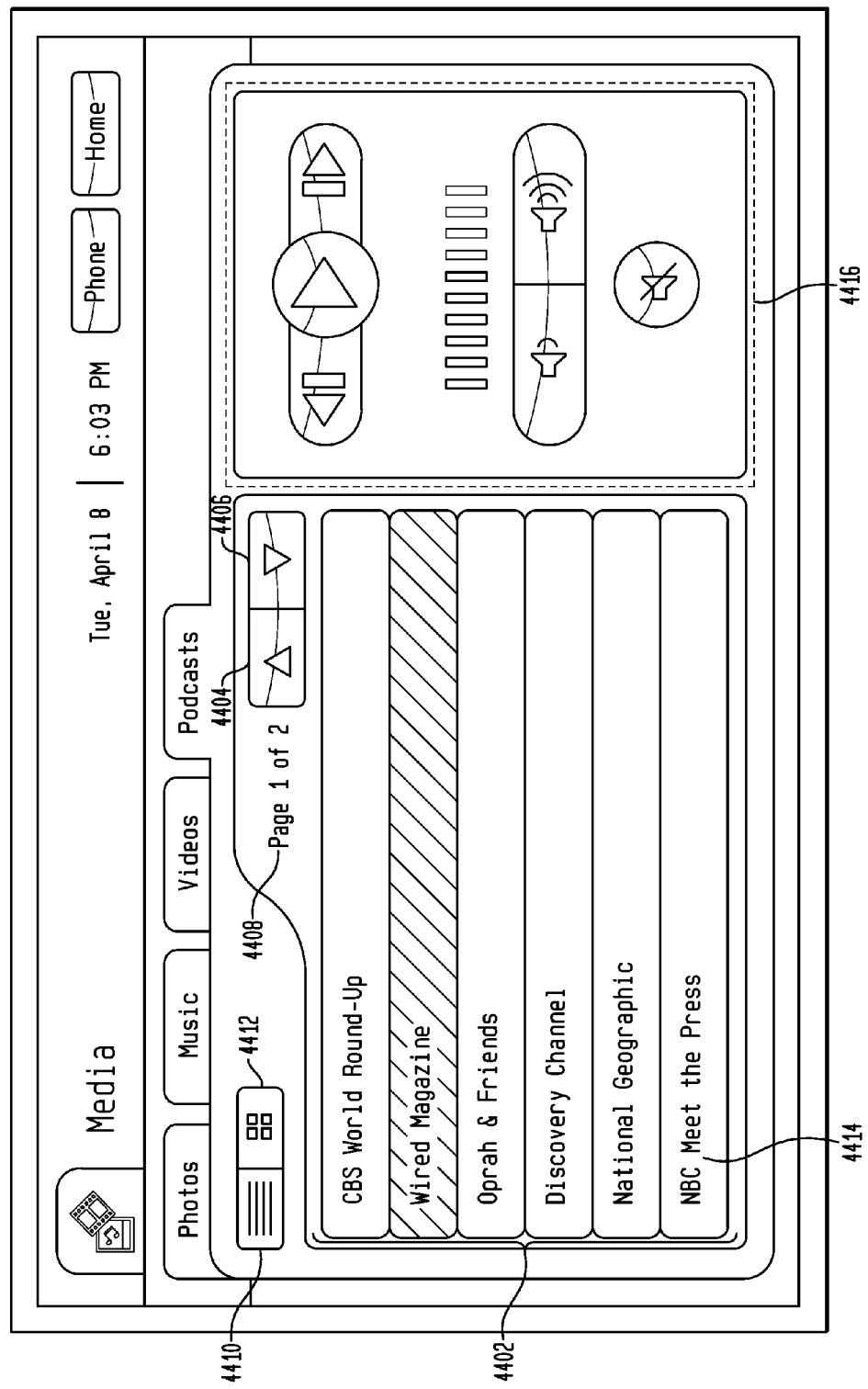
FIG. 44 depicts a GUI screen for a media application in accordance with an embodiment of the present invention in which a podcasts interface is displayed.

FIG. 44 depicts a GUI screen 4400 for the aforementioned media application in which the podcasts interface is displayed. As shown in FIG. 44, the podcasts interface includes a display area that displays all or a portion of a list of podcast providers 4402. To page up through list 4402 a "page up" button 4404 may be activated and to page down a "page down" button 4406 may be activated. A page indicator 4408 indicates which of one or more pages of list 4402 is currently being displayed. A name 4414 is provided for each podcast provider in list 4402. A podcast provider in list 4402 may be selected by activating the horizontal bar upon which the song information is provided.

Control over the playback and volume of audio content of a podcast is provided using an interface 4416 that includes elements that are substantially similar to elements described above in example GUI screen 4000 of FIG. 40.

Figure 45:
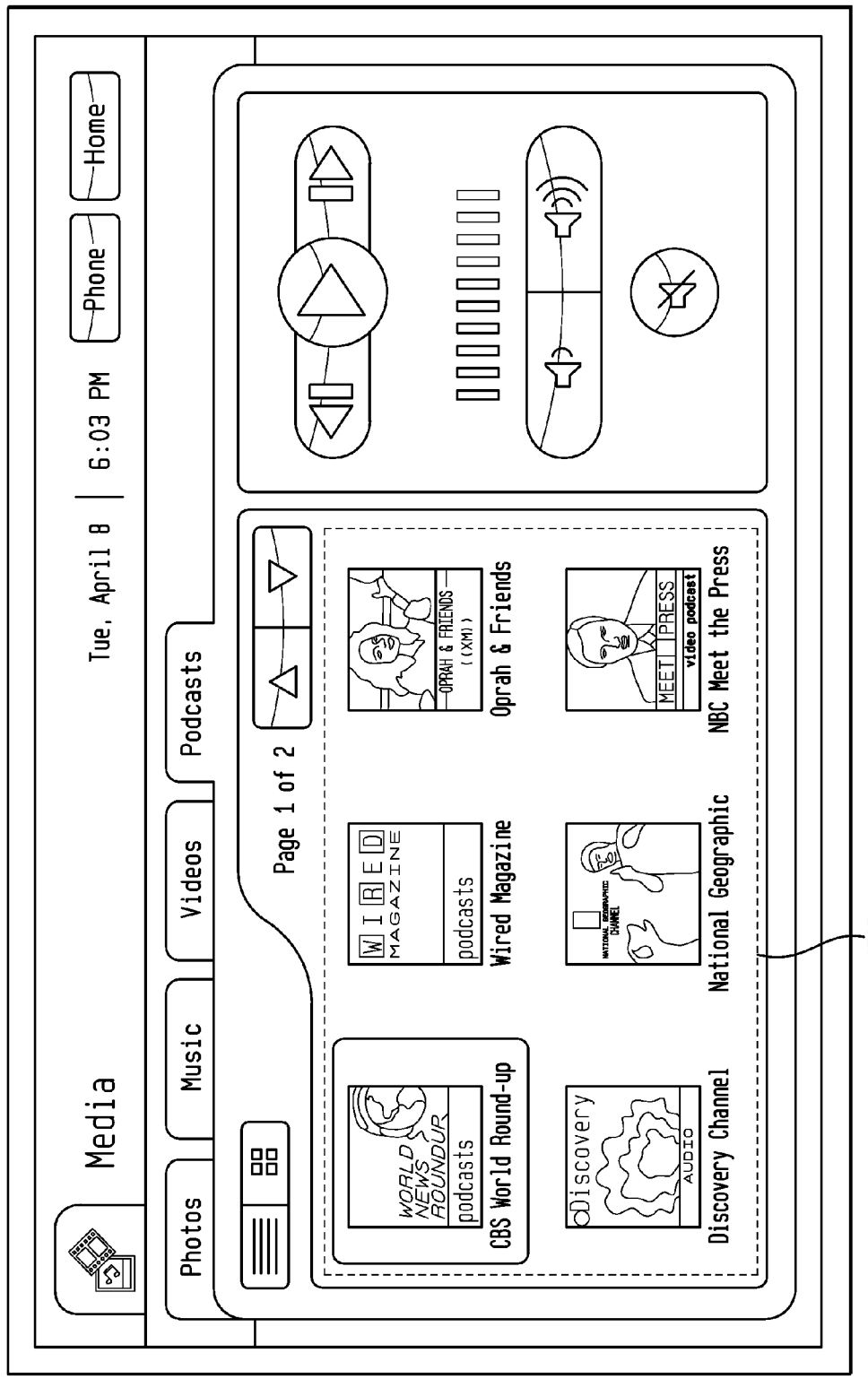
FIG. 45 depicts a further GUI screen for a media application in accordance with an embodiment of the present invention in which a podcasts interface is displayed.

The podcasts interface allows podcast provider information to be displayed in two formats. The list format shown in FIG. 44, in which information about each podcast provider is displayed in a horizontal bar, may be obtained by activating a first display format button 4410. An icon format shown in GUI interface screen 4500 of FIG. 45 may be obtained by activating a second display format button 4412. As shown in FIG. 45, when the icon format is selected, a display area 4502 is presented that displays an icon associated with each podcast provider. The name of the podcast provider is displayed below each icon.

Figure 46:
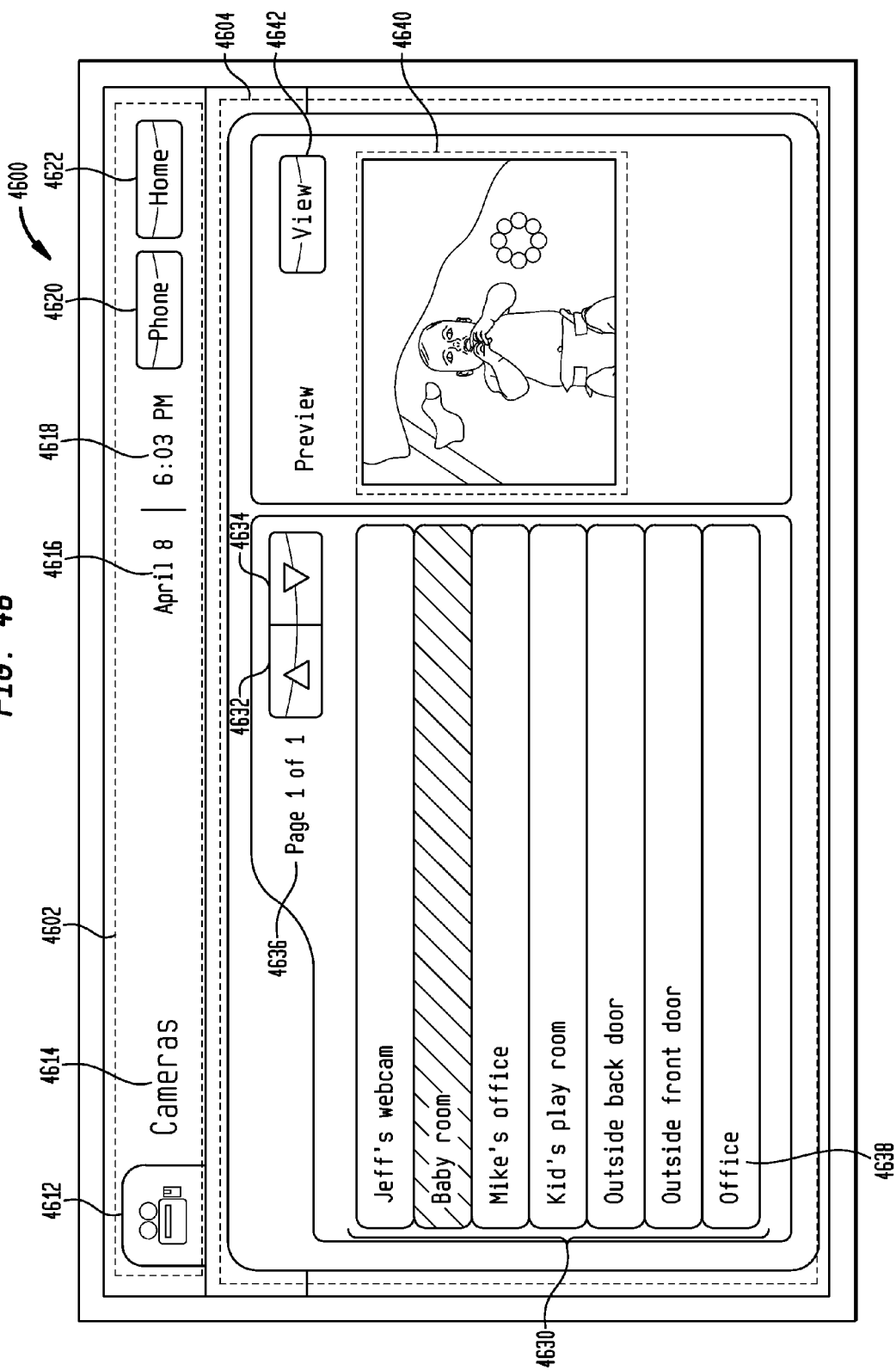
FIG. 46 depicts an example GUI screen for a cameras application in accordance with an embodiment of the present invention.

FIG. 46 depicts an example GUI screen 4600 for a cameras application in accordance with an embodiment of the present invention. As shown in FIG. 46, example GUI screen 4600 includes a status bar 4602 and a cameras application interface 4604.

Status bar 4602 includes an icon 4612 representative of the cameras application, a name 4614 ("Cameras") associated with the cameras application, an indication of the current date 4616 and time 4618, a "phone" button 4620 and a "home" button 4622. When a user activates "phone" button 4620, GUI screen 3200 for a telephony application will be displayed. When a user activates "home" button 4622, the user will be returned to home GUI screen 3100.

Cameras application interface 4604 includes a first display area that displays all or a portion of a list of cameras 4630 that are capable of providing a video feed to device 110. To page up through list 4630 a "page up" button 4632 may be activated and to page down a "page down" button 4634 may be activated. A page indicator 4636 indicates which of one or more pages of list 4630 is currently being displayed. For each camera identified in list 4630, a name 4638 is provided. To select a camera from among those in list 4630, the horizontal bar that provides the name of the camera may be activated.

Figure 47:
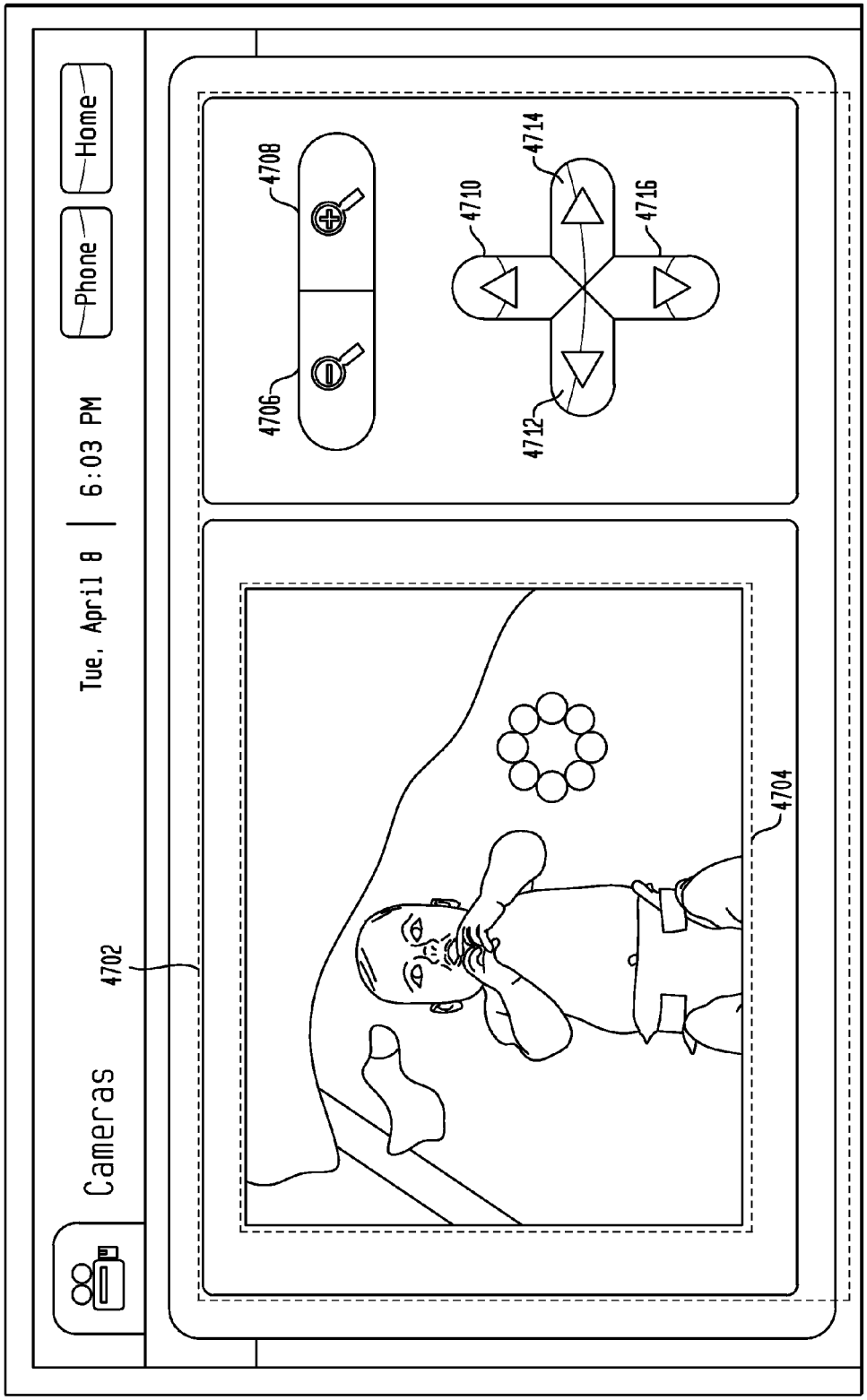
FIG. 47 depicts an additional example GUI screen for a cameras application in accordance with an embodiment of the present invention.

Cameras application interface 4604 also includes a second display area that displays video content received from a selected camera in a preview window 4640. A "view" button 4642 may be activated to allow a user to view the video content from the selected camera in a further cameras application interface 4702 which is depicted in example GUI screen 4700 of FIG. 47. As shown in FIG. 47, cameras application interface 4702 includes an expanded window 4704 in which video content from the selected camera is displayed as well as a camera control interface that includes a "zoom out" button 4706, a "zoom in" button 4708, a "pan left" button 4712, a "pan right" button 4714, a "tilt up" button 4716 and a "tilt down" button 4710. As will be appreciated by persons skilled in the relevant art(s), these buttons may be used to control pan, tilt and zoom features of cameras that support such functionality.

Figure 48:
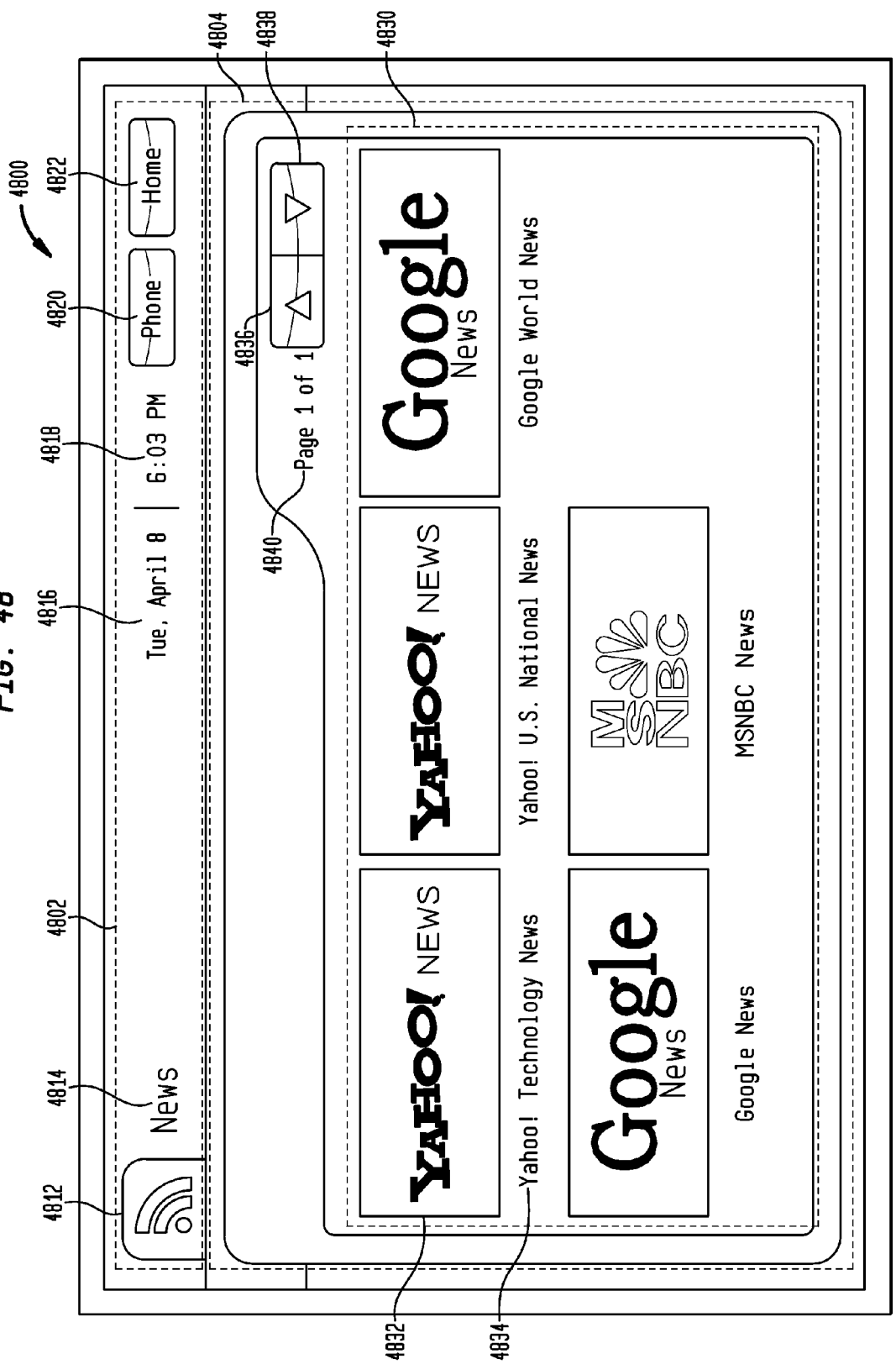
FIG. 48 depicts an example GUI screen for a news application in accordance with an embodiment of the present invention.

FIG. 48 depicts an example GUI screen 4800 for a news application in accordance with an embodiment of the present invention. As shown in FIG. 48, example GUI screen 4800 includes a status bar 4802 and a news application interface 4804.

Status bar 4802 includes an icon 4812 representative of the news application, a name 4814 ("News") associated with the news application, an indication of the current date 4816 and time 4818, a "phone" button 4820 and a "home" button 4822. When a user activates "phone" button 4820, GUI screen 3200 for a telephony application will be displayed. When a user activates "home" button 4822, the user will be returned to home GUI screen 3100.

News application interface 4804 includes a display area 4830 that displays all or a portion of a collection of news sources that are capable of feeding news articles to device 110. To page backwards through the collection of news sources a "page backward" button 4836 may be activated and to page forward a "page forward" button 4838 may be activated. A page indicator 4840 indicates which of one or more pages of the collection is currently being displayed. For each news source identified in display area 4830, a graphic icon (such as icon 4832) is provided and a name of the news source (such as name 4834) is provided. To obtain news from a news source identified in display area 4830, the icon representing the news source may be activated.

Figure 49:
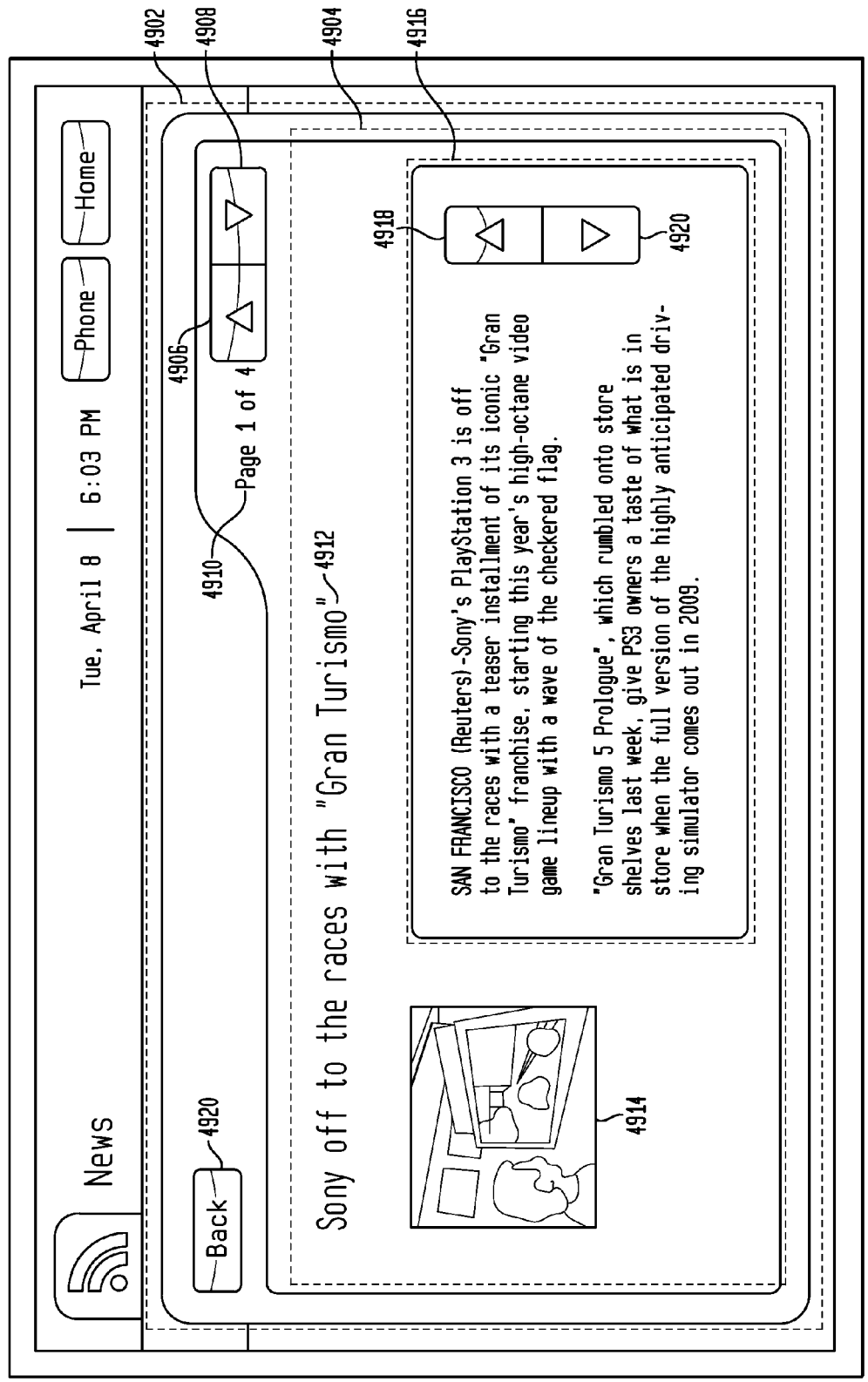
FIG. 49 depicts an additional example GUI screen for a news application in accordance with an embodiment of the present invention.

If a user activates a news source icon, a further news application interface is provided by which news articles from the selected source may be viewed. An example of such an interface 4902 is depicted in example GUI screen 4900 of FIG. 49. As shown in FIG. 49, interface 4902 includes a display area 4904 that presents content associated with a news article. Such content may include for example a title of the news article 4912, a graphic or video associated with the news article 4912, and text associated with the news article which is displayed in a text display area 4916. A user may scroll the text displayed within text display area 4916 up and down by activating a "scroll up" button 4918 and a "scroll down" button 4920 respectively.

Additional news articles from the same news source may be available on one or more preceding or subsequent pages viewable within display area 4904. To access such articles, a "page backward" button 4906 or a "page forward" button 4908 may be activated. A page indicator 4910 indicates which of one or more pages of news articles is currently being displayed. A "back" button may be activated to return to GUI screen 4800 of FIG. 48.

Figure 50:
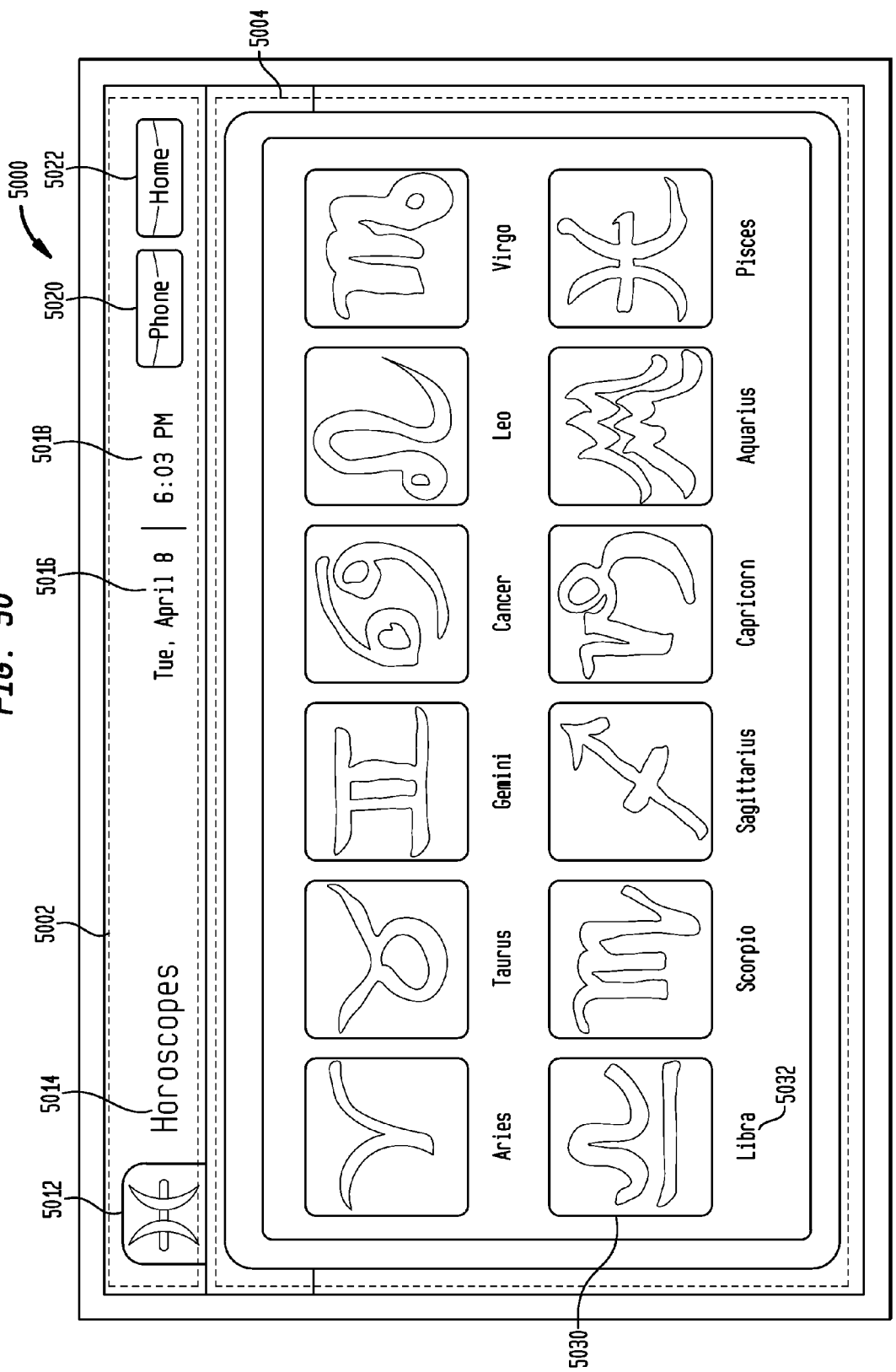
FIG. 50 depicts an example GUI screen for a horoscopes application in accordance with an embodiment of the present invention.

FIG. 50 depicts an example GUI screen 5000 for a horoscopes application in accordance with an embodiment of the present invention. As shown in FIG. 50, example GUI screen 5000 includes a status bar 5002 and a horoscopes application interface 5004.

Status bar 5002 includes an icon 5012 representative of the horoscopes application, a name 5014 ("Horoscopes") associated with the horoscopes application, an indication of the current date 5016 and time 5018, a "phone" button 5020 and a "home" button 5022. When a user activates "phone" button 5020, GUI screen 3200 for a telephony application will be displayed. When a user activates "home" button 5022, the user will be returned to home GUI screen 3100.

Horoscopes application interface 5004 includes a display area that displays a graphic icon representing each sign of the zodiac (such as icon 5030) and an associated name (such as name 5032). To obtain a current horoscope for a zodiac sign identified in horoscopes application interface 5004, the icon representing the zodiac sign may be activated.

Figure 51:
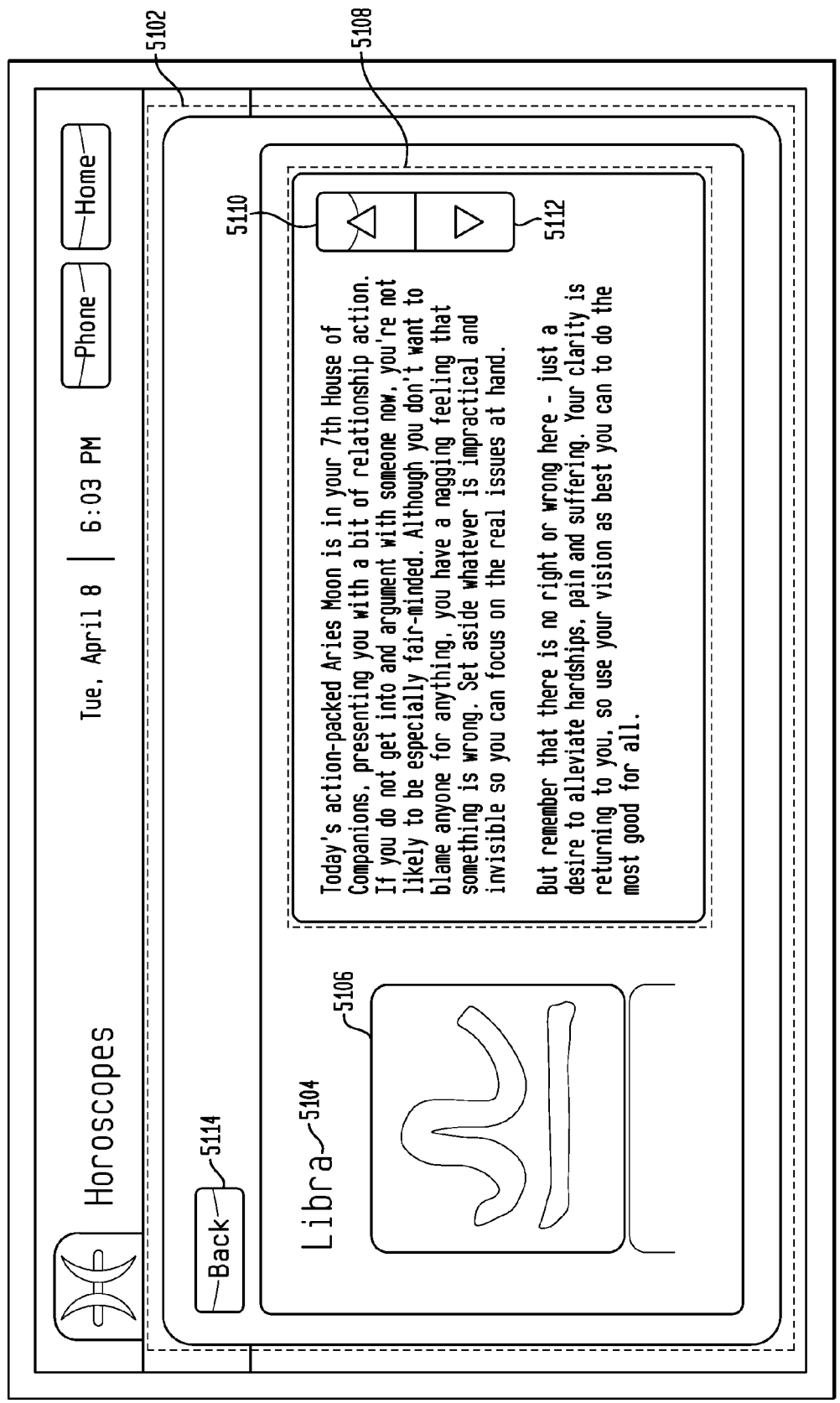
FIG. 51 depicts an additional example GUI screen for a horoscopes application in accordance with an embodiment of the present invention.

If a user activates a zodiac sign icon, a further horoscopes interface is provided in which a current horoscope for the activated zodiac sign may be viewed. An example of such an interface 5102 is depicted in example GUI screen 5100 of FIG. 51. As shown in FIG. 51, interface 5102 displays the name of the relevant zodiac sign 5104, an icon 5106 that represents the relevant zodiac sign, and a text display area 5108 in which the horoscope text for the relevant zodiac sign is displayed. A user may scroll the text displayed within text display area 5108 up and down by activating a "scroll up" button 5110 and a "scroll down" button 5112 respectively. A "back" button 5114 may be activated to return to GUI screen 5000 of FIG. 50.

Figure 52:
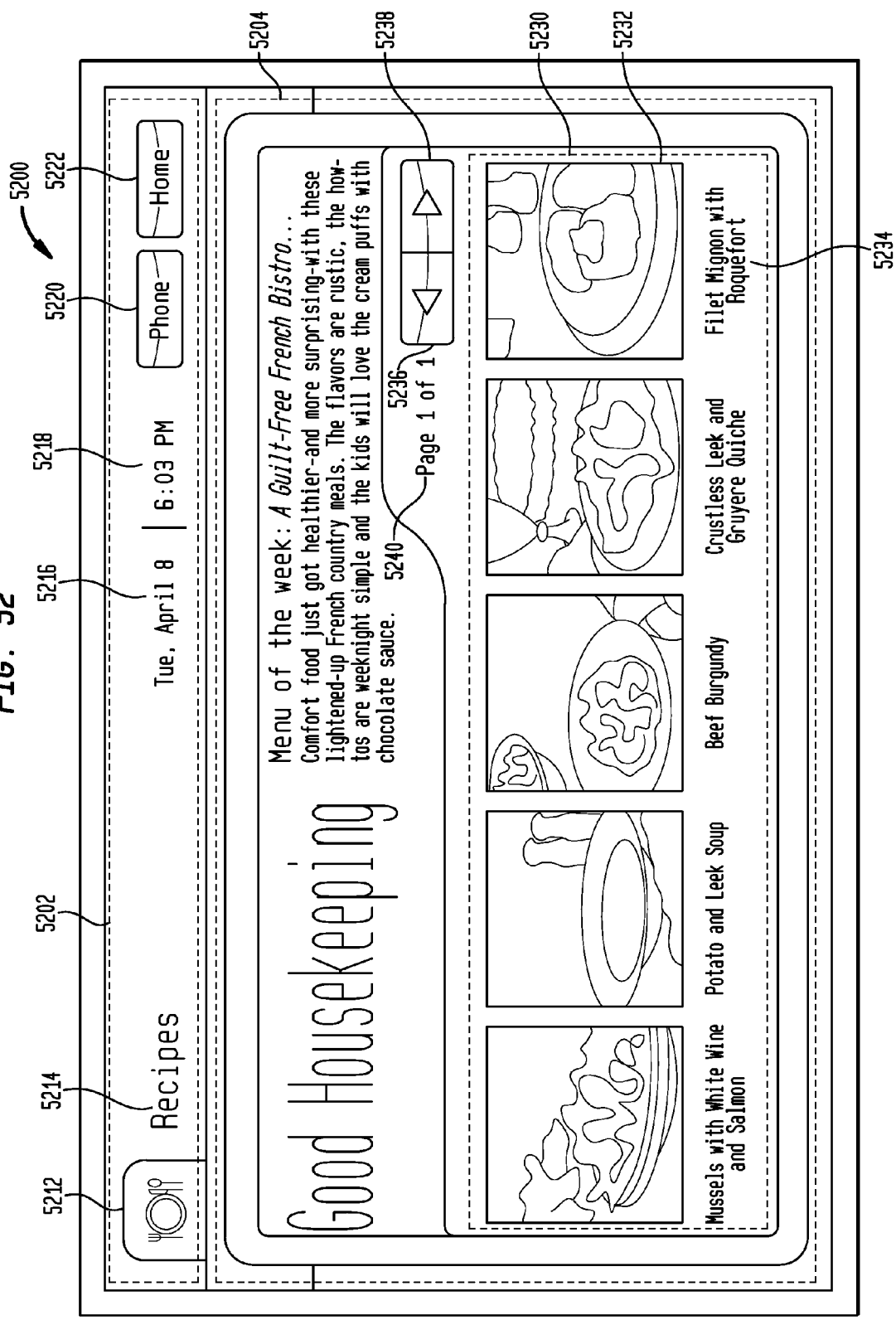
FIG. 52 depicts an example GUI screen for a recipes application in accordance with an embodiment of the present invention.

FIG. 52 depicts an example GUI screen 5200 for a recipes application in accordance with an embodiment of the present invention. As shown in FIG. 52, example GUI screen 5200 includes a status bar 5202 and a recipes application interface 5204.

Status bar 5202 includes an icon 5212 representative of the recipes application, a name 5214 ("Recipes") associated with the recipes application, an indication of the current date 5216 and time 5218, a "phone" button 5220 and a "home" button 5222. When a user activates "phone" button 5220, GUI screen 3200 for a telephony application will be displayed. When a user activates "home" button 5222, the user will be returned to home GUI screen 3100.

Recipes application interface 5204 includes a display area 5230 that displays all or a portion of a collection of recipes. To page backwards through the collection of recipes a "page backward" button 5236 may be activated and to page forward a "page forward" button 5238 may be activated. A page indicator 5240 indicates which of one or more pages of the collection is currently being displayed. For each recipe identified in display area 5230, a graphic icon (such as icon 5232) is provided and a name of the recipe (such as name 5234) is provided. To obtain details concerning a recipe identified in display area 5230, the icon representing the recipe may be activated.

Figure 53:
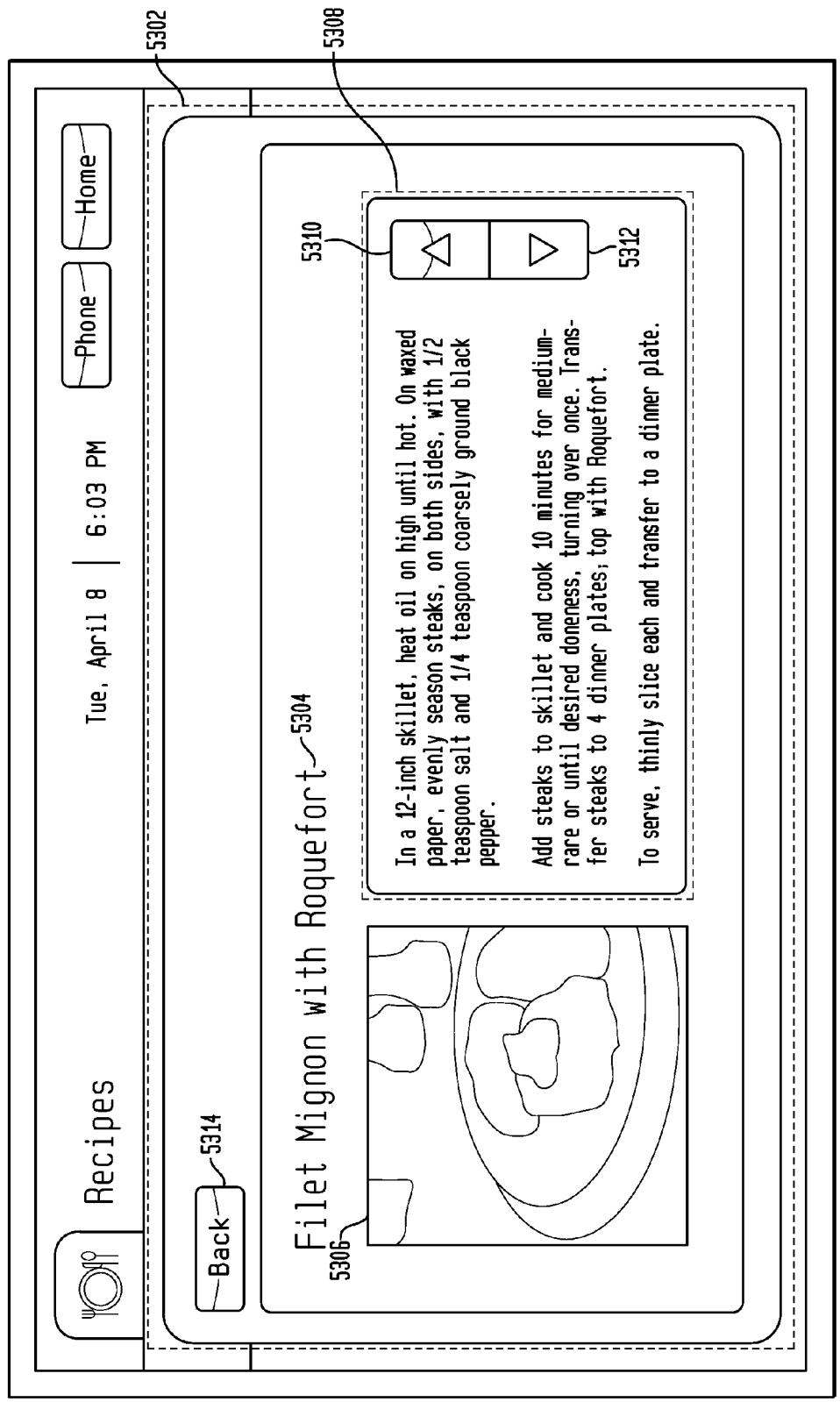
FIG. 53 depicts an additional example GUI screen for a recipes application in accordance with an embodiment of the present invention.

If a user activates a recipe icon, a further recipes interface is provided in which recipe details may be viewed. An example of such an interface 5302 is depicted in example GUI screen 5300 of FIG. 53. As shown in FIG. 53, interface 5302 displays the name of the relevant recipe 5304, a picture or graphic icon 5306 that represents the relevant recipe, and a text display area 5308 in which the recipe text for the relevant recipe is displayed. A user may scroll the text displayed within text display area 5308 up and down by activating a "scroll up" button 5310 and a "scroll down" button 5312 respectively. A "back" button 5314 may be activated to return to GUI screen 5300 of FIG. 53.

Figure 54:
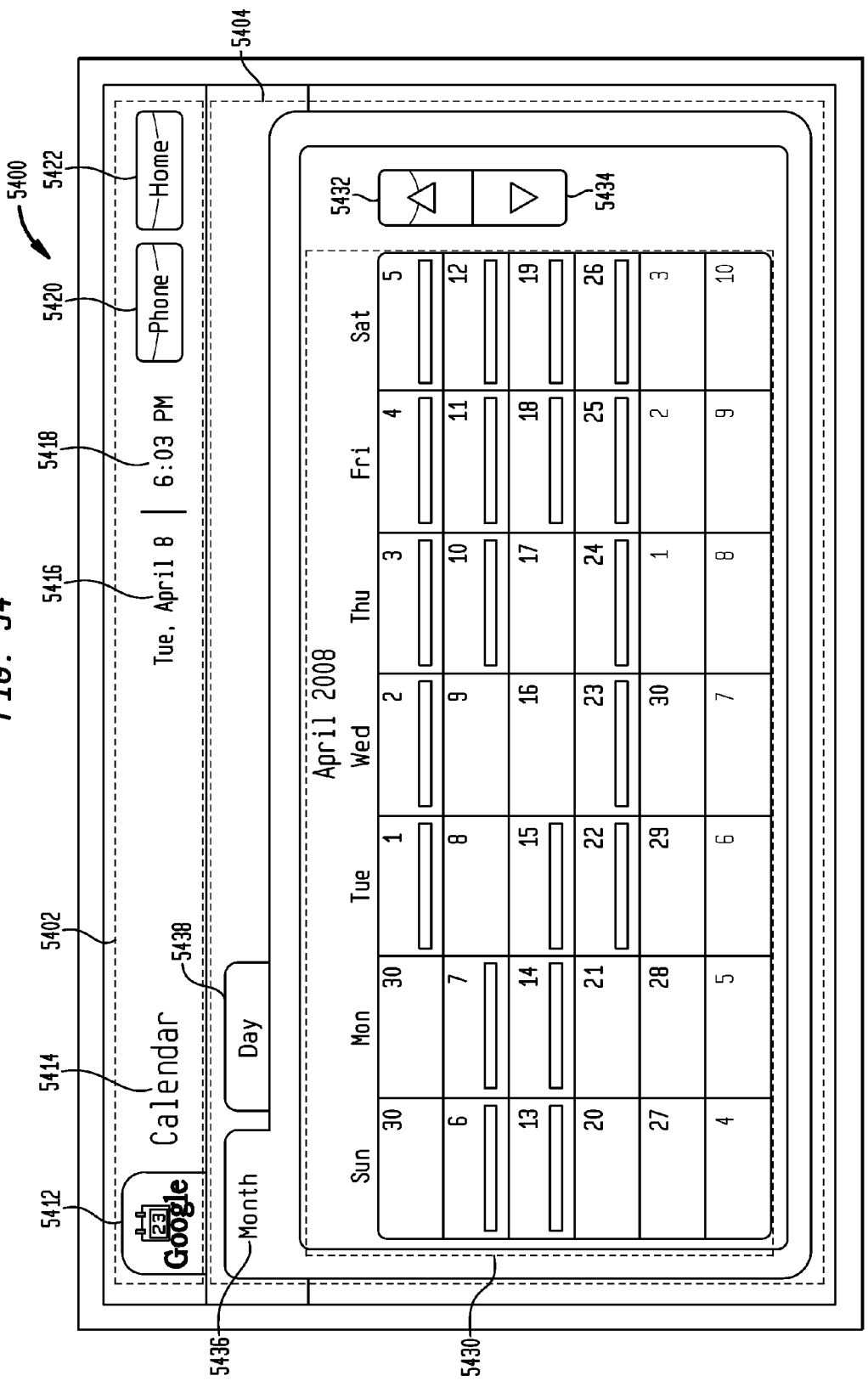
FIG. 54 depicts an example GUI screen for a calendar application in accordance with an embodiment of the present invention.

FIG. 54 depicts an example GUI screen 5400 for a calendar application in accordance with an embodiment of the present invention. As shown in FIG. 54, example GUI screen 5400 includes a status bar 5402 and a calendar application interface 5404.

Status bar 5402 includes an icon 5412 representative of the news application, a name 5414 ("News") associated with the news application, an indication of the current date 5416 and time 5418, a "phone" button 5420 and a "home" button 5422. When a user activates "phone" button 5420, GUI screen 3200 for a telephony application will be displayed. When a user activates "home" button 5422, the user will be returned to home GUI screen 3100.

Calendar application interface 5404 comprises two different interfaces, only one of which may be shown at any given time: a monthly calendar interface that may be selected by activating a "month" tab 5436 and a daily calendar interface that may be selected by activating a "day" tab 5438. In FIG. 54, the monthly calendar interface is currently being displayed. As shown in that figure, the monthly calendar interface includes a display area 5430 within which a monthly calendar is displayed. Activating a particular date within the monthly calendar will cause the daily calendar interface to be displayed for that date. An "up arrow" button 5432 allows a user to display a previous month within display area 5430 and a "down arrow" button 5434 allows a user to display a subsequent month within display area 5430.

Figure 55:
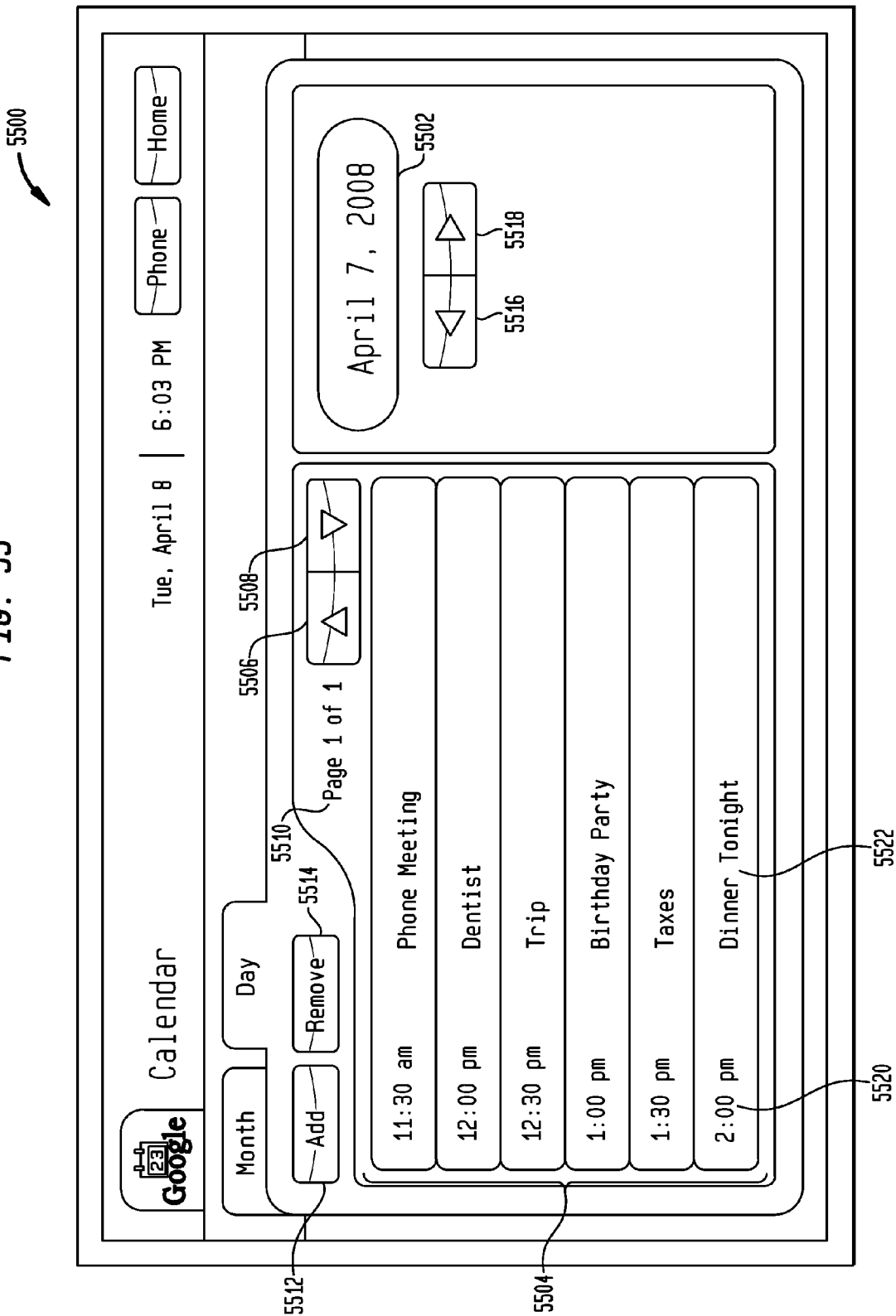
FIG. 55 depicts an additional example GUI screen for a calendar application in accordance with an embodiment of the present invention.

FIG. 55 depicts a GUI screen 5500 for the aforementioned calendar application in which the daily calendar interface is displayed. As shown in FIG. 55, the daily calendar interface includes a temporally-ordered list of scheduled daily activities or appointments 5504 corresponding to a particular date which is displayed in a window 5502. To page up through list 5504 a "page up" button 5506 may be activated and to page down a "page down" button 5508 may be activated. A page indicator 5510 indicates which of one or more pages of list 5504 is currently being displayed. For each scheduled appointment or activity scheduled in list 5504 an appointment/activity time 5520 and descriptor 5522 is displayed. An "add" button 5512 may be activated to launch a dialog by which a new appointment or activity may be added to list 5504. A "remove" button 5514 may be activated to remove a selected appointment or activity from list 5504. To change the date for which calendar information is being displayed to a previous date a "backward arrow" button 5516 may be activated and to change the date to a subsequent date a "forward arrow" 5518 button may be activated.

Figure 56:
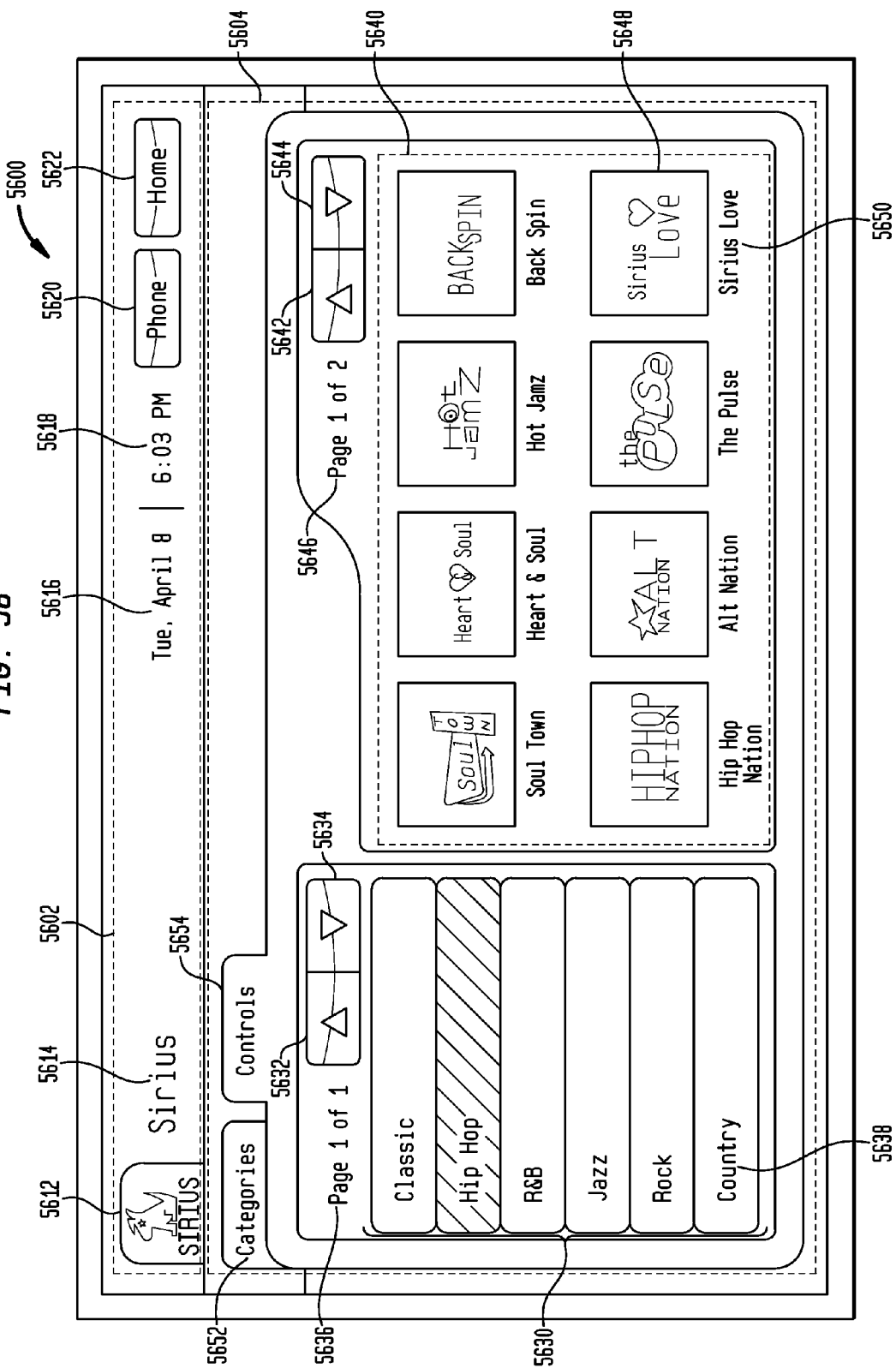
FIG. 56 depicts an example GUI screen for an Internet radio application in accordance with an embodiment of the present invention.

FIG. 56 depicts an example GUI screen 5600 for an Internet radio application in accordance with an embodiment of the present invention. In an embodiment, the Internet radio application comprises an application premised on SIRIUS® Internet radio service offered by SIRIUS XM Radio of New York, N.Y. As shown in FIG. 56, example GUI screen 5600 includes a status bar 5602 and a calendar application interface 5604.

Status bar 5602 includes an icon 5612 representative of the Internet radio application, a name 5614 ("Sirius") associated with the Internet radio application, an indication of the current date 5616 and time 5618, a "phone" button 5620 and a "home" button 5622. When a user activates "phone" button 5620, GUI screen 3200 for a telephony application will be displayed. When a user activates "home" button 5622, the user will be returned to home GUI screen 3100.

Internet radio application interface 5604 comprises two different interfaces, only one of which may be shown at any given time: a categories interface that may be selected by activating a "categories" tab 5652 and a controls interface that may be selected by activating a "controls" tab 5654. In FIG. 56, the categories interface is currently being displayed. As shown in that figure, the categories interface includes a first display area that displays all or a portion of a list of radio categories 5630. To page up through list 5630 a "page up" button 5632 may be activated and to page down a "page down" button 5634 may be activated. A page indicator 5636 indicates which of one or more pages of category list 5630 is currently being displayed. A name 5638 is provided for each category in list 5630. A category in list 5630 may be selected by activating the horizontal bar upon which the category name is provided.

As further shown in FIG. 56, the categories interface further includes a second display area that displays all or a portion of a collection of radio channels 5640 corresponding to a selected radio category in list 5630. To page up through collection 5640 a "page up" button 5642 may be activated and to page down a "page down" button 5644 may be activated. A page indicator 5646 indicates which of one or more pages of collection 5640 is currently being displayed. For each channel displayed in collection 5640, a graphic icon 5648 representing the channel and a name 5650 of the channel is displayed. A channel in collection 5640 may be selected for listening by activating the icon associated with the channel.

Figure 57:
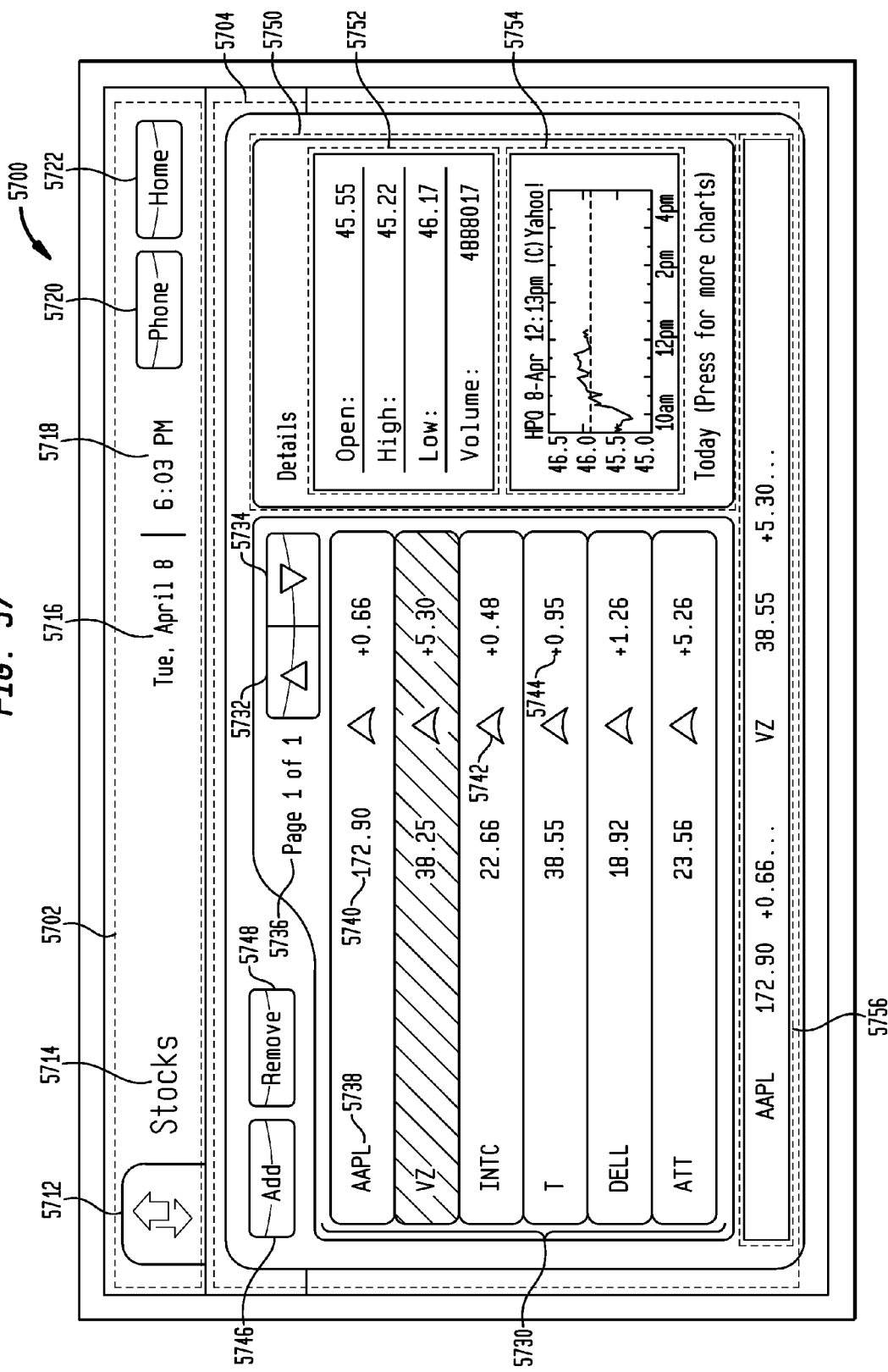
FIG. 57 depicts an example GUI screen for a stocks application in accordance with an embodiment of the present invention.

FIG. 57 depicts an example GUI screen 5700 for a stocks application in accordance with an embodiment of the present invention. As shown in FIG. 57, example GUI screen 5700 includes a status bar 5702 and a stocks application interface 5704.

Status bar 5702 includes an icon 5712 representative of the stocks application, a name 5714 ("Stocks") associated with the stocks application, an indication of the current date 5716 and time 5718, a "phone" button 5720 and a "home" button 5722. When a user activates "phone" button 5720, GUI screen 3200 for a telephony application will be displayed. When a user activates "home" button 5722, the user will be returned to home GUI screen 3100.

Stocks application interface 5704 includes a first display area that displays all or a portion of a list of stocks 5730. To page up through list 5730 a "page up" button 5732 may be activated and to page down a "page down" button 5734 may be activated. A page indicator 5736 indicates which of one or more pages of list 5730 is currently being displayed. For each stock identified in list 5730 the following information is provided: a stock symbol 5738, a current share price 5740, a visual indicator 5742 of whether the current share price is up or down for the day, and an amount 5744 by which the current share price is up or down for the day. A stock in list 5730 may be selected by activating the horizontal bar upon which the stock symbol is provided. A user may activate an "add" button 5746 to launch a dialog by which a stock may be added to list 5730. A user may also activate a "remove" button 5748 to remove a selected stock from list 5730.

Stocks application interface 5704 further includes a second display area 5750 that provides details about a stock selected from list 5730. As shown in FIG. 57, second display area 5750 includes a window 5752 that displays textual information about the relevant stock such as opening price, high price, low price and volume for the current day. As further shown in FIG. 57, second display area 5750 further includes a stock chart 5754 that graphically depicts the performance of the relevant stock for the current day. By activating stock chart 5754 a user may access additional charts associated with the relevant stock.

Stock application interface 5704 also includes a dynamically-updated stock ticker 5756 which displays stock symbols and associated share prices for a variety of stocks in a scrolling fashion.

Figure 58:
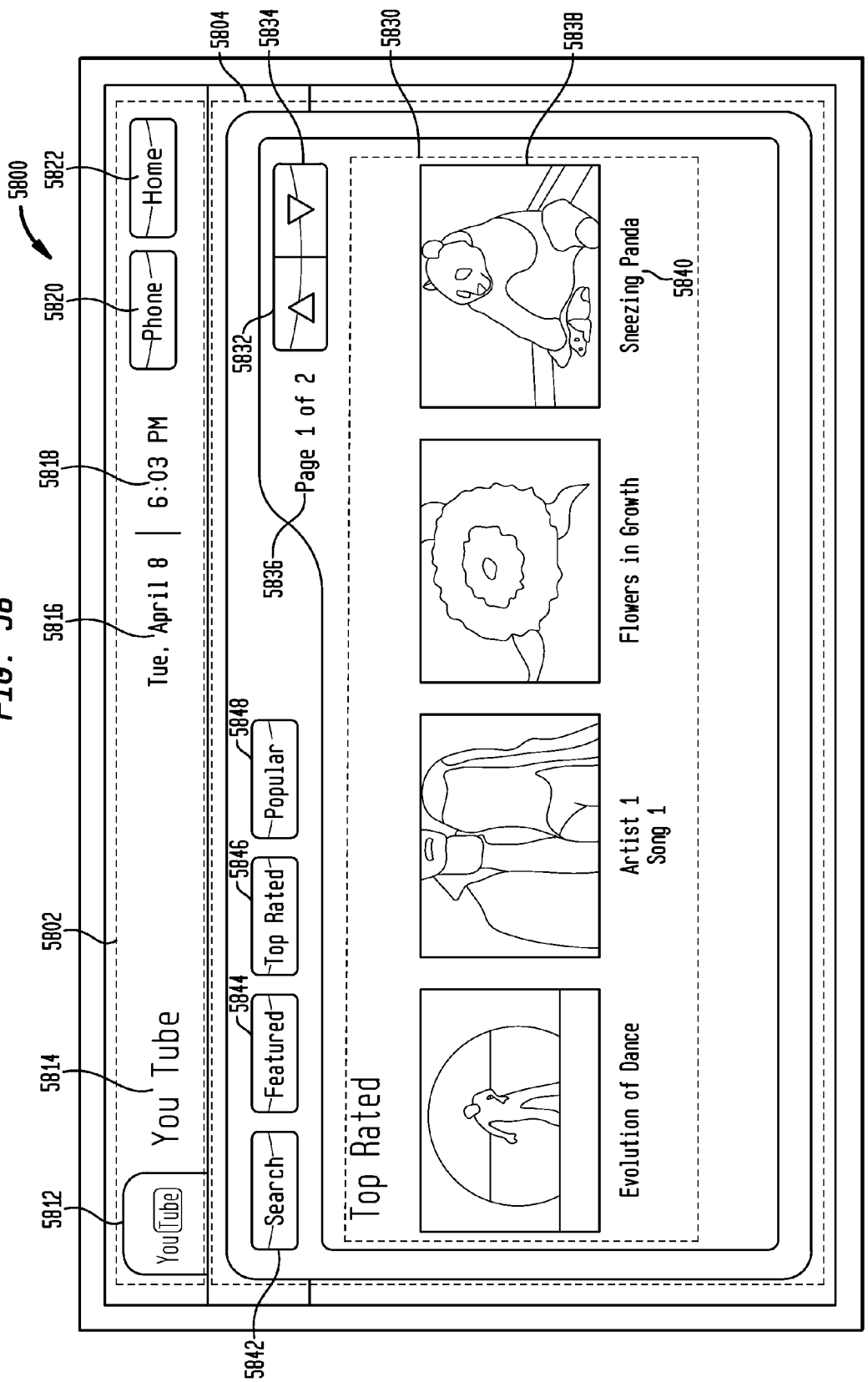
FIG. 58 depicts an example GUI screen for an Internet video application in accordance with an embodiment of the present invention.

FIG. 58 depicts an example GUI screen 5800 for an Internet video application in accordance with an embodiment of the present invention. In an embodiment, the Internet video application comprises an application premised on a YouTube™ Web service offered by YouTube LLC of San Bruno, Calif. As shown in FIG. 58, example GUI screen 5800 includes a status bar 5802 and an Internet video application interface 5804.

Status bar 5802 includes an icon 5812 representative of the Internet video application, a name 5814 ("You Tube") associated with the Internet video application, an indication of the current date 5816 and time 5818, a "phone" button 5820 and a "home" button 5822. When a user activates "phone" button 5820, GUI screen 3200 for a telephony application will be displayed. When a user activates "home" button 5822, the user will be returned to home GUI screen 3100.

Internet video application interface 5804 comprises four different interfaces, only one of which may be shown at any given time: a video search interface that may be selected by activating a "search" button 5842, a featured videos interface that may be selected by activating a "featured" button 5844, a top-rated videos interface that may be selected by activating a "top rated" button 5846 and a popular videos interface that may be selected by activating a "popular" button 5848. In FIG. 58, the top-rated videos interface is currently being displayed. As shown in that figure, the top-rated videos interface includes a display area 5830 that displays all or a portion of a collection of top-rated videos 5830. To page up through the collection a "page up" button 5832 may be activated and to page down a "page down" button 5834 may be activated. A page indicator 5836 indicates which of one or more pages of the collection is currently being displayed. For each video identified in the collection, an icon 5838 and a name 5840 is displayed. A video in collection 5830 may be selected for playback by activating the icon associated with the video.

Figure 59:
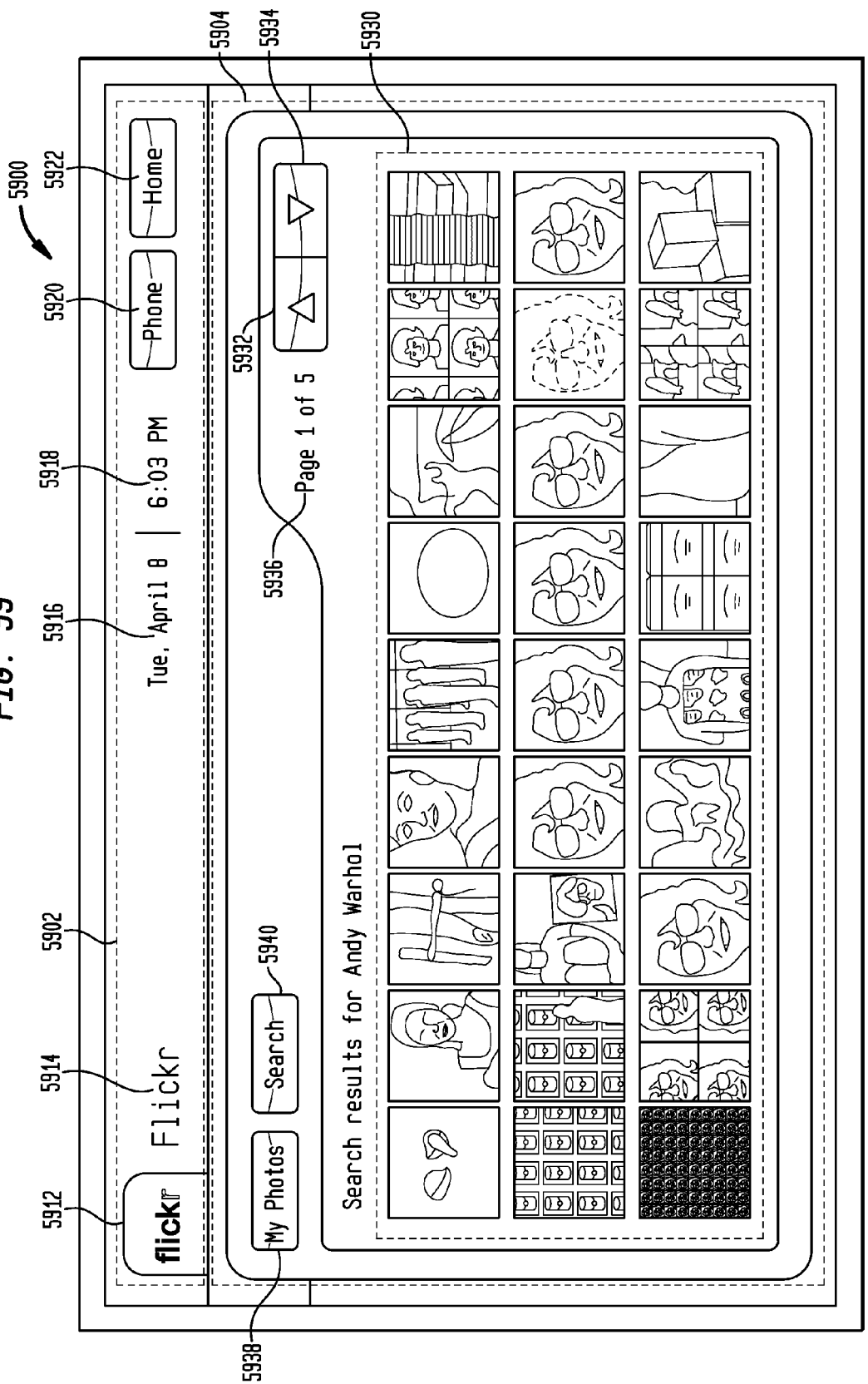
FIG. 59 depicts an example GUI screen for an Internet-based photo application in accordance with an embodiment of the present invention.

FIG. 59 depicts an example GUI screen 5900 for an Internet-based photo application in accordance with an embodiment of the present invention. In an embodiment, the Internet-based photo application comprises an application premised on a Flickr™ Web service offered by Yahoo! Inc. of Sunnyvale, Calif. As shown in FIG. 59, example GUI screen 5900 includes a status bar 5902 and an Internet-based photo application interface 5904.

Status bar 5902 includes an icon 5912 representative of the Internet-based photo application, a name 5914 ("Flickr") associated with the Internet-based photo application, an indication of the current date 5916 and time 5918, a "phone" button 5920 and a "home" button 5922. When a user activates "phone" button 5920, GUI screen 3200 for a telephony application will be displayed. When a user activates "home" button 5922, the user will be returned to home GUI screen 3100.

Internet-based photo application interface 5904 comprises two different interfaces, only one of which may be shown at any given time: a personal photos interface that may be selected by activating a "my photos" button 5938 and a search interface that may be selected by activating a "search" button 5940. In FIG. 59, the search interface is currently being displayed. As shown in that figure, the results from a search premised on the query terms "Andy Warhol" has returned a collection of photos 5930. To page up through the collection a "page up" button 5932 may be activated and to page down a "page down" button 5934 may be activated. A page indicator 5936 indicates which of one or more pages of the collection is currently being displayed. A photo in collection 5930 may be selected for viewing in a larger window by activating the photo.

Figure 60:
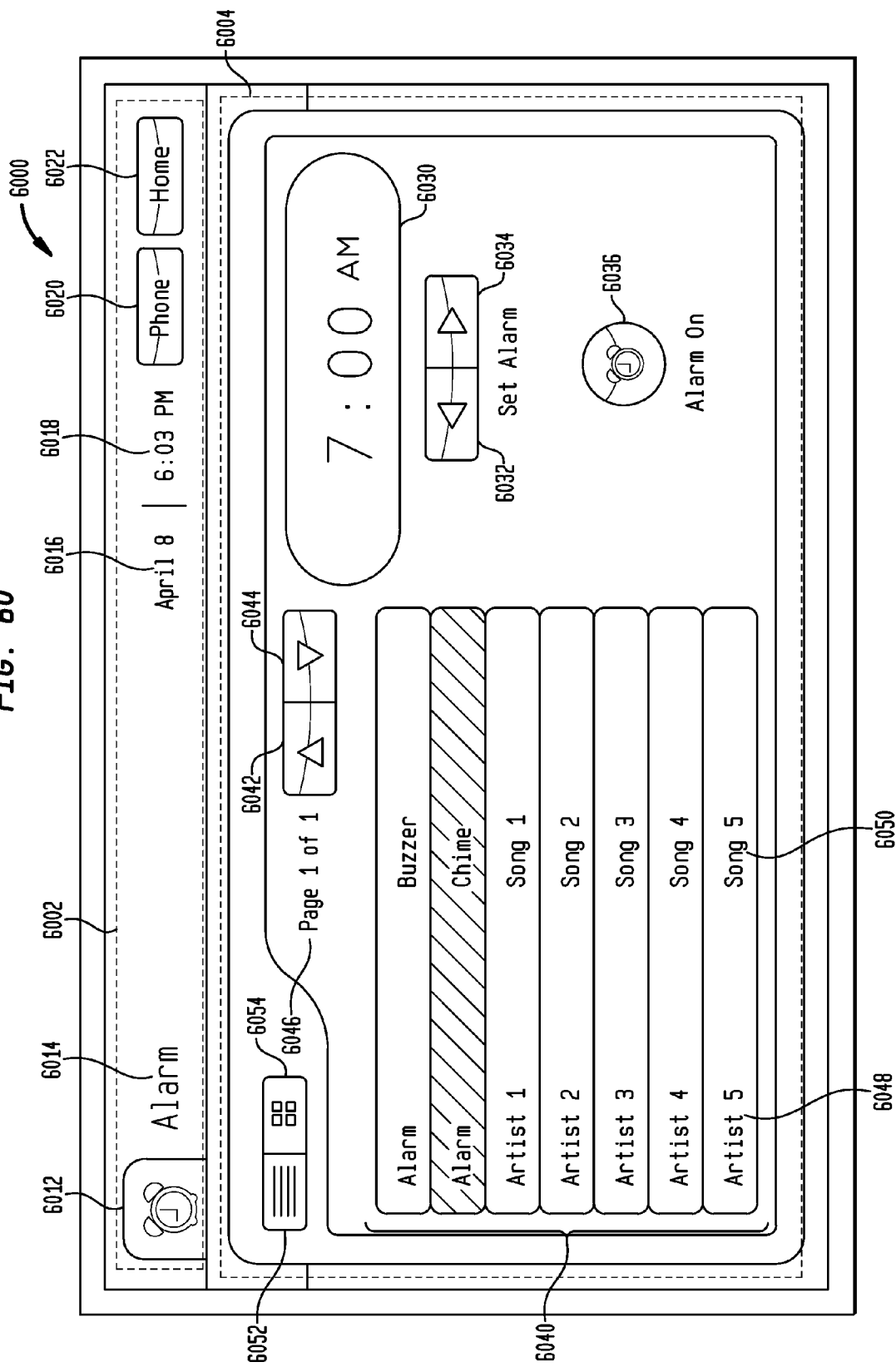
FIG. 60 depicts an example GUI screen for an alarm application in accordance with an embodiment of the present invention.

FIG. 60 depicts an example GUI screen 6000 for an alarm application in accordance with an embodiment of the present invention. As shown in FIG. 60, example GUI screen 6000 includes a status bar 6002 and an alarm application interface 6004.

Status bar 6002 includes an icon 6012 representative of the alarm application, a name 6014 ("Alarm") associated with the alarm application, an indication of the current date 6016 and time 6018, a "phone" button 6020 and a "home" button 6022. When a user activates "phone" button 6020, GUI screen 3200 for a telephony application will be displayed. When a user activates "home" button 6022, the user will be returned to home GUI screen 3100.

Alarm application interface 6004 includes an alarm on/off button 6036 that a user may activate to turn on or off an alarm. A window 6030 displays a time at which the alarm will sound. A "backward arrow" button may be activated to select a previous time while a "forward arrow" button may be activated to select a subsequent time.

Alarm application interface 6004 further includes all or a portion of a list 6040 of audio files that may be used as an alarm. To page backward through list 6040 a "page backward" button 6042 may be activated and to page forward a "page forward" button 6044 may be activated. A page indicator 6044 indicates which of one or more pages of list 6040 is currently being displayed. For each audio file identified in list 6040, an audio source 6048 and a descriptor associated with the audio file 6050 is displayed. System-provided alarms as well as digital music files may be used as the alarm. For system-provided alarms, the audio source is listed as "alarm" and the descriptor of the audio file denotes the alarm type. For digital music files, the audio source is the performer of the digital music and the descriptor provides a name of the song. To select an audio file displayed in list 6040 as the alarm, the horizontal bar that provides information about the audio file may be activated.

Figure 61:
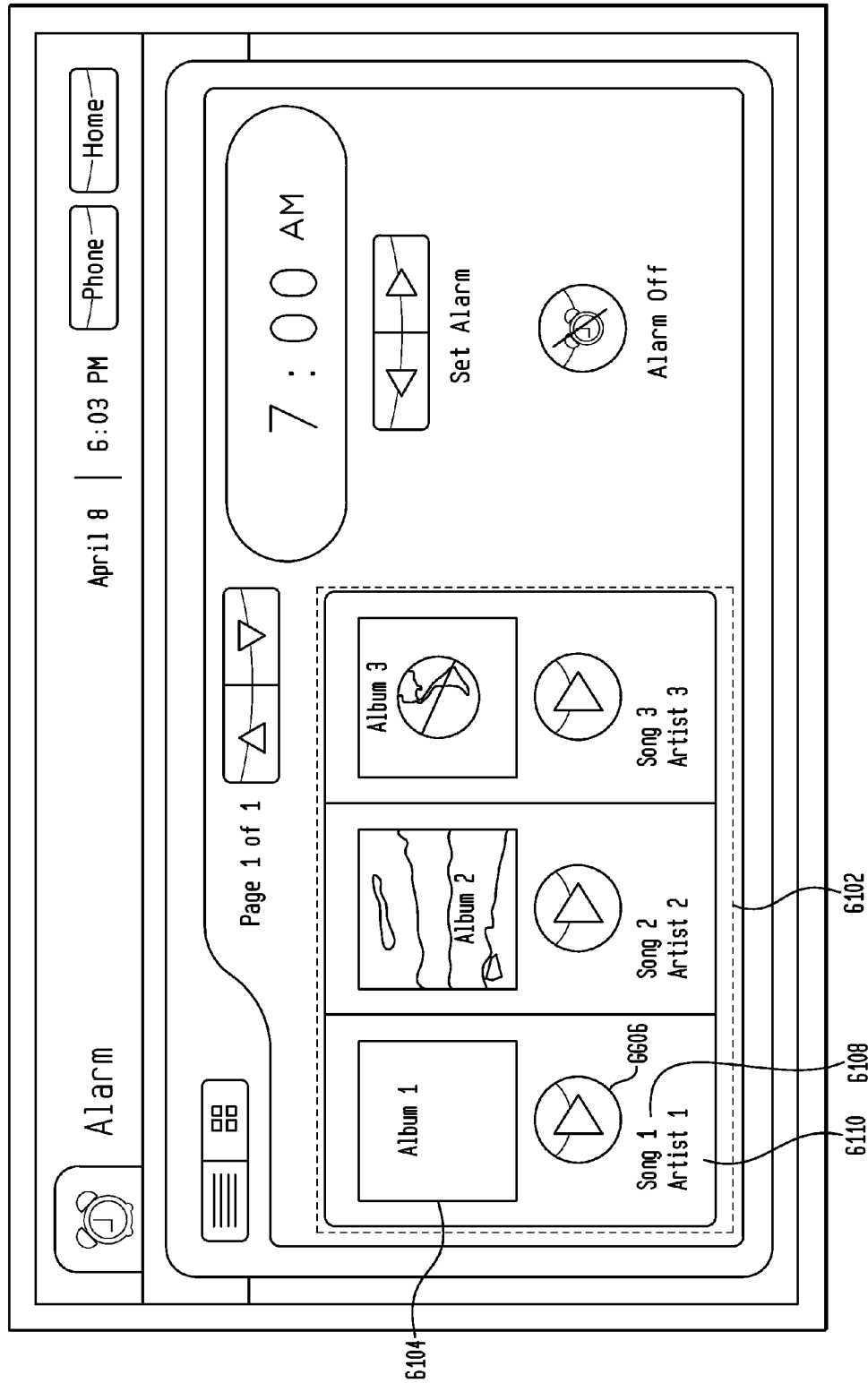
FIG. 61 depicts an additional example GUI screen for an alarm application in accordance with an embodiment of the present invention.

Alarm application interface 6004 allows audio file information to be displayed in two formats. The list format shown in FIG. 60 may be obtained by activating a first display format button 6052. An icon format shown in GUI interface screen 6100 of FIG. 61 may be obtained by activating a second display format button 6054. As shown in FIG. 61, when the icon format is selected, a display area 6102 is presented that displays an icon 6104 associated with each audio file. A playback button 6106, a title 6108 and performer 6110 may be displayed below each icon.

Figure 62:
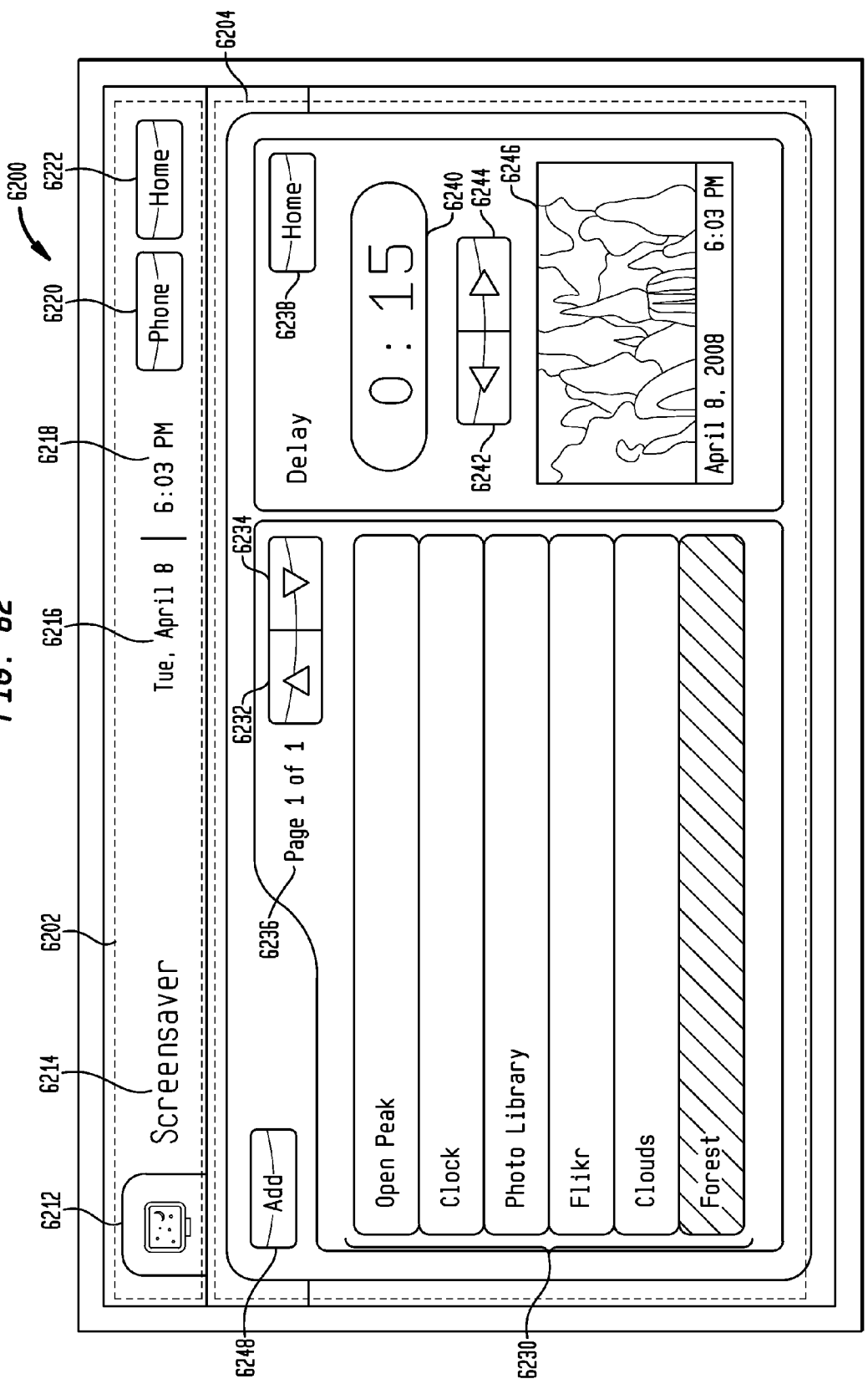
FIG. 62 depicts an example GUI screen for a screensaver application in accordance with an embodiment of the present invention.

FIG. 62 depicts an example GUI screen 6200 for a screensaver application in accordance with an embodiment of the present invention. As shown in FIG. 62, example GUI screen 6200 includes a status bar 6202 and a screensaver application interface 6204.

Status bar 6202 includes an icon 6212 representative of the screensaver application, a name 6214 ("Screensaver") associated with the screensaver application, an indication of the current date 6216 and time 6218, a "phone" button 6220 and a "home" button 6222. When a user activates "phone" button 6220, GUI screen 3200 for a telephony application will be displayed. When a user activates "home" button 6222, the user will be returned to home GUI screen 3100.

Screensaver application interface 6204 includes all or a portion of a list screensavers 6230 that may be activated by a user for display after a predetermined period of device inactivity. To page up through list 6230 a "page up" button 6232 may be activated and to page down a "page down" button 6234 may be activated. A page indicator 6236 indicates which of one or more pages of list 6230 is currently being displayed. To select a screensaver, a user may activate one of the screensavers displayed in list 6230.

Screensaver application interface 6204 further includes a window 6240 that displays the current amount of delay (i.e., time of device inactivity) that must occur before a selected screensaver will be displayed. The amount of delay may be decreased by activating a "left arrow" button 6242 or increased by activating a "right arrow" button 6244. A window 6246 displays a preview of a currently selected screensaver. A screensaver configuration may be saved by activating a "save" button 6238. A "back" button 6248 is also provided on screensaver application interface 6204 that, when activated, causes a previously-displayed GUI screen to be displayed.

Figure 63:
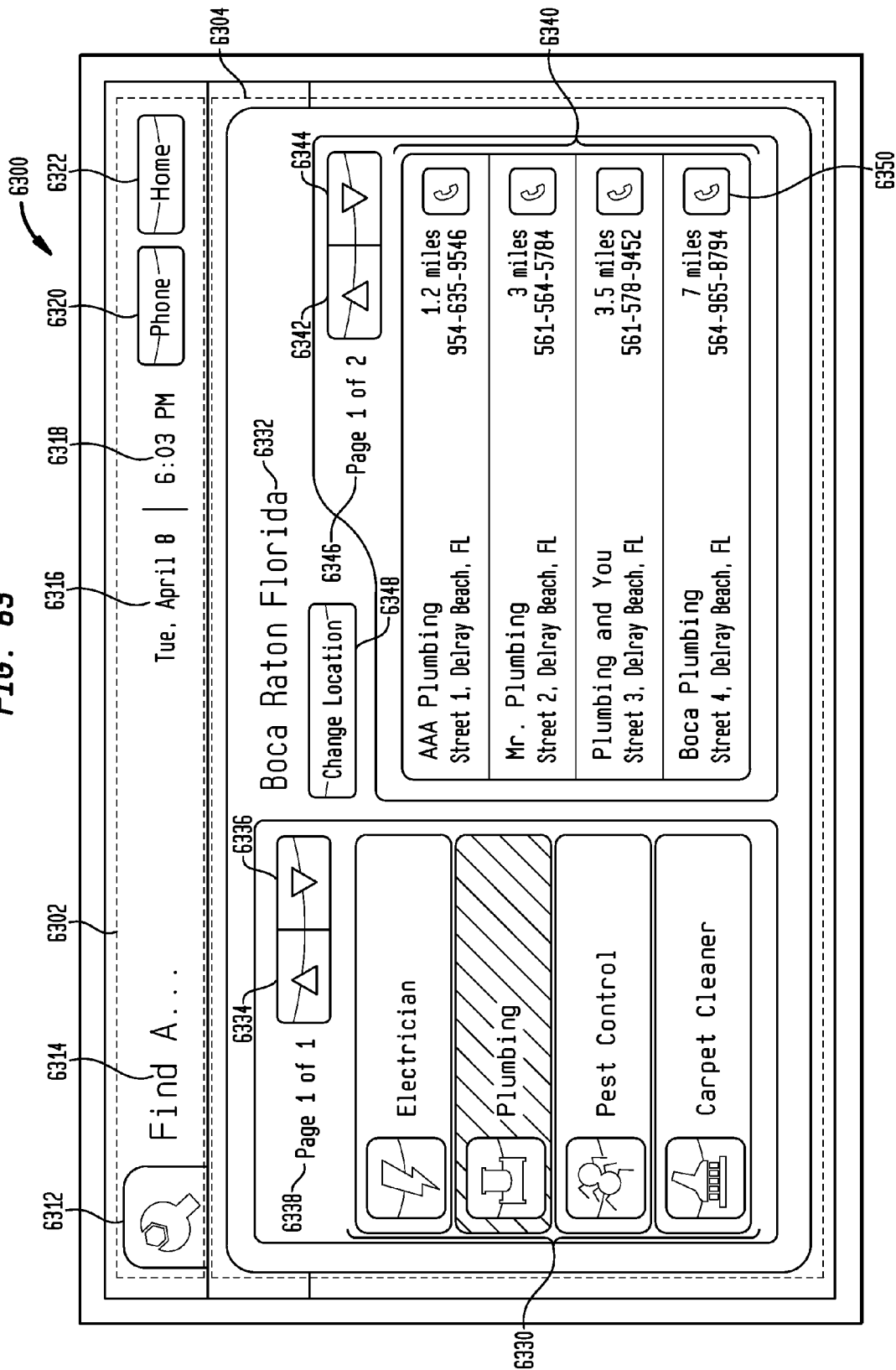
FIG. 63 depicts an example GUI screen for a directory services application in accordance with an embodiment of the present invention.

FIG. 63 depicts an example GUI screen 6300 for a directory services application in accordance with an embodiment of the present invention. As shown in FIG. 63, example GUI screen 6300 includes a status bar 6302 and a directory services application interface 6304.

Status bar 6302 includes an icon 6312 representative of the directory services application, a name 6314 ("Find A . . . ") associated with the directory services application, an indication of the current date 6316 and time 6318, a "phone" button 6320 and a "home" button 6322. When a user activates "phone" button 6320, GUI screen 3200 for a telephony application will be displayed. When a user activates "home" button 6322, the user will be returned to home GUI screen 3100.

Directory services application interface 6304 includes a first display area that displays all or a portion of a list of business categories 6330. To page up through list 6330 a "page up" button 6334 may be activated and to page down a "page down" button 6336 may be activated. A page indicator 6338 indicates which of one or more pages of list 6330 is currently being displayed. To select a business category from among those in list 6330, the horizontal bar that provides information about the business category may be activated.

Directory services application interface 6304 further includes a second display area that displays all or a portion of a list of businesses 6340 of the type currently selected in list 6330. The businesses are selected based on proximity to a particular location 6332. In the example of FIG. 63, the particular location is "Boca Raton Fla." To page up through list 6340 a "page up" button 6342 may be activated and to page down a "page down" button 6344 may be activated. A page indicator 6346 indicates which of one or more pages of list 6340 is currently being displayed. For each business identified in list 6340, a name, address and phone number is provided. A "telephone" button 6350 associated with each business may be activated to place a telephone call to the business via device 110.

A "change location" button 6348 is provided that, when activated, launches a dialog by which a user can select a different location for which to obtain directory services information.

Figure 64:
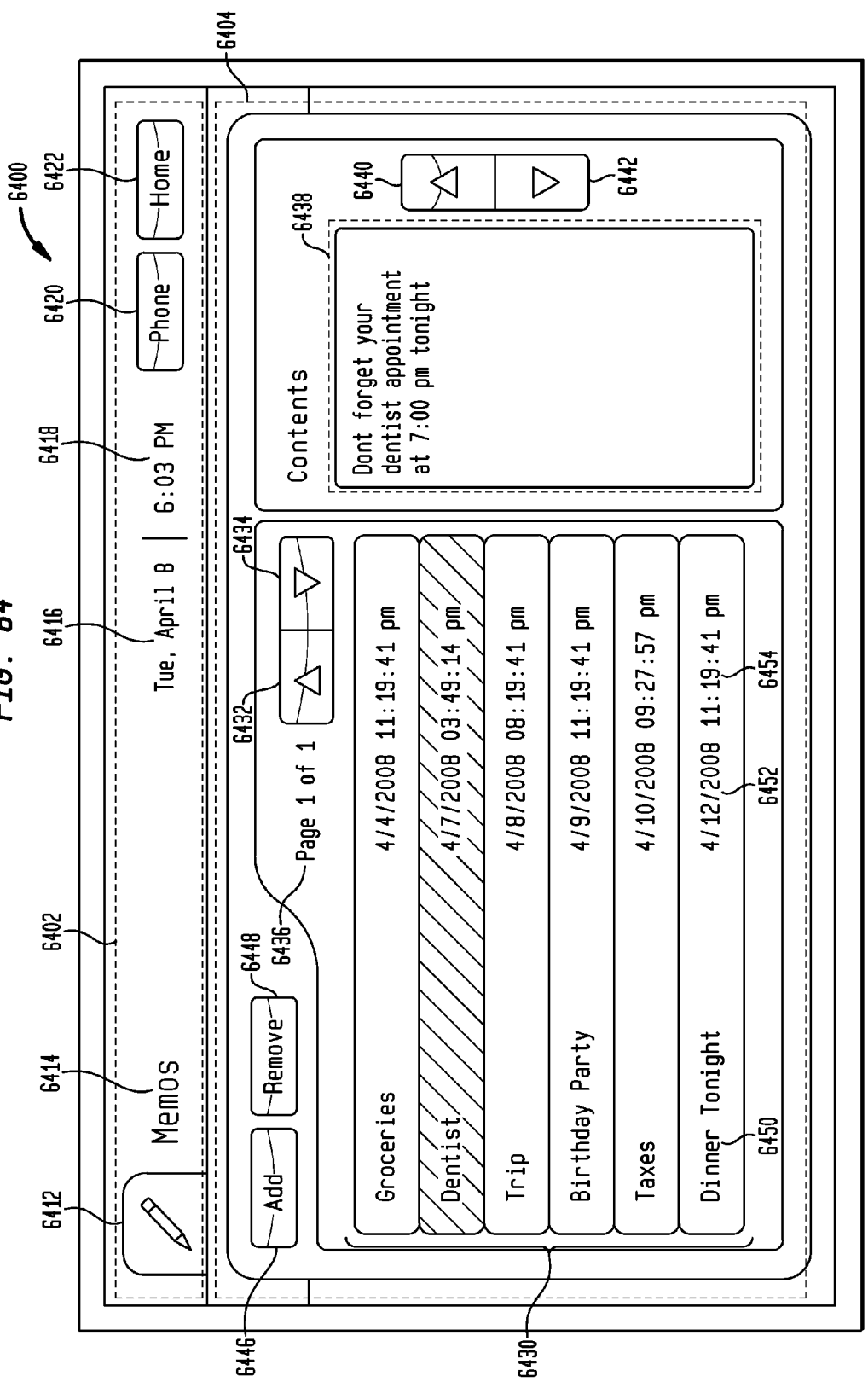
FIG. 64 depicts an example GUI screen for a memos application in accordance with an embodiment of the present invention.

FIG. 64 depicts an example GUI screen 6400 for a memos application in accordance with an embodiment of the present invention. As shown in FIG. 64, example GUI screen 6400 includes a status bar 6402 and a memos application interface 6404.

Status bar 6402 includes an icon 6412 representative of the memos application, a name 6414 ("Memos") associated with the memos application, an indication of the current date 6416 and time 6418, a "phone" button 6420 and a "home" button 6422. When a user activates "phone" button 6420, GUI screen 3200 for a telephony application will be displayed. When a user activates "home" button 6422, the user will be returned to home GUI screen 3100.

Memos application interface 6404 includes a first display area that displays all or a portion of a list of memos 6430. Each memo may comprise a task, appointment or reminder that a user might wish to make note of. To page up through list 6430 a "page up" button 6432 may be activated and to page down a "page down" button 6434 may be activated. A page indicator 6436 indicates which of one or more pages of list 6430 is currently being displayed. For each memo identified in list 6430 the following information is provided: a text descriptor 6450 of the subject matter of the memo and a date 6452 and time 6454 associated with the memo (such as the date and time the memo was created). List 6430 may be temporally-ordered. A memo in list 6430 may be selected for viewing by activating the horizontal bar upon which the memo information is provided. A user may activate an "add" button 6446 to launch a dialog by which a memo may be added to list 6430. A user may also activate a "remove" button 6448 to remove a selected memo from list 6430.

Memos application interface 6404 further includes a window 6438 that displays the text content of a memo selected from list 6430. A user may scroll the text displayed within window 6438 up and down by activating a "scroll up" button 6440 and a "scroll down" button 6442 respectively.

Figure 65:
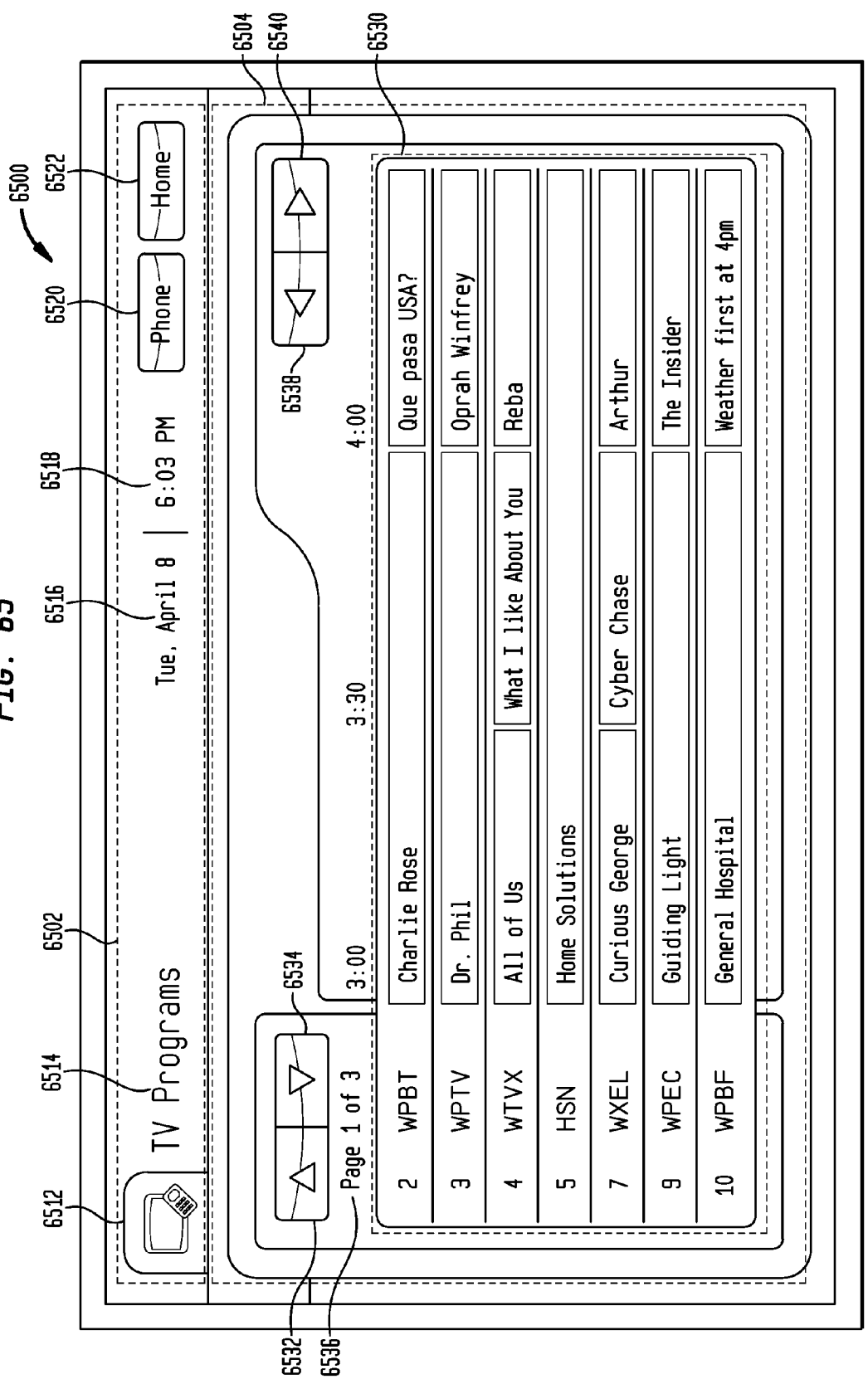
FIG. 65 depicts an example GUI screen for a television (TV) programming guide application in accordance with an embodiment of the present invention.

FIG. 65 depicts an example GUI screen 6500 for a television (TV) programming guide application in accordance with an embodiment of the present invention. As shown in FIG. 65, example GUI screen 6500 includes a status bar 6502 and a TV programming guide application interface 6504.

Status bar 6502 includes an icon 6512 representative of the TV programming guide application, a name 6514 ("TV Programs") associated with the TV programming guide application, an indication of the current date 6516 and time 6518, a "phone" button 6520 and a "home" button 6522. When a user activates "phone" button 6520, GUI screen 3200 for a telephony application will be displayed. When a user activates "home" button 6522, the user will be returned to home GUI screen 3100.

TV programming guide application interface 6504 includes a display area 6530 that provides TV programming information for a plurality of TV channels across a plurality of time slots. To view information about other channels than those currently shown in display area 6530 a user may activate either a "page up" button 6532 or a "page down" button 6534. A page indicator 6536 indicates which of one or more pages of channel information is currently being displayed. To view programming information for previous time slots a user may activate a "backward" button 6538 and to view programming information for subsequent time slots a user may activate a "forward" button 6540.

Figure 66:
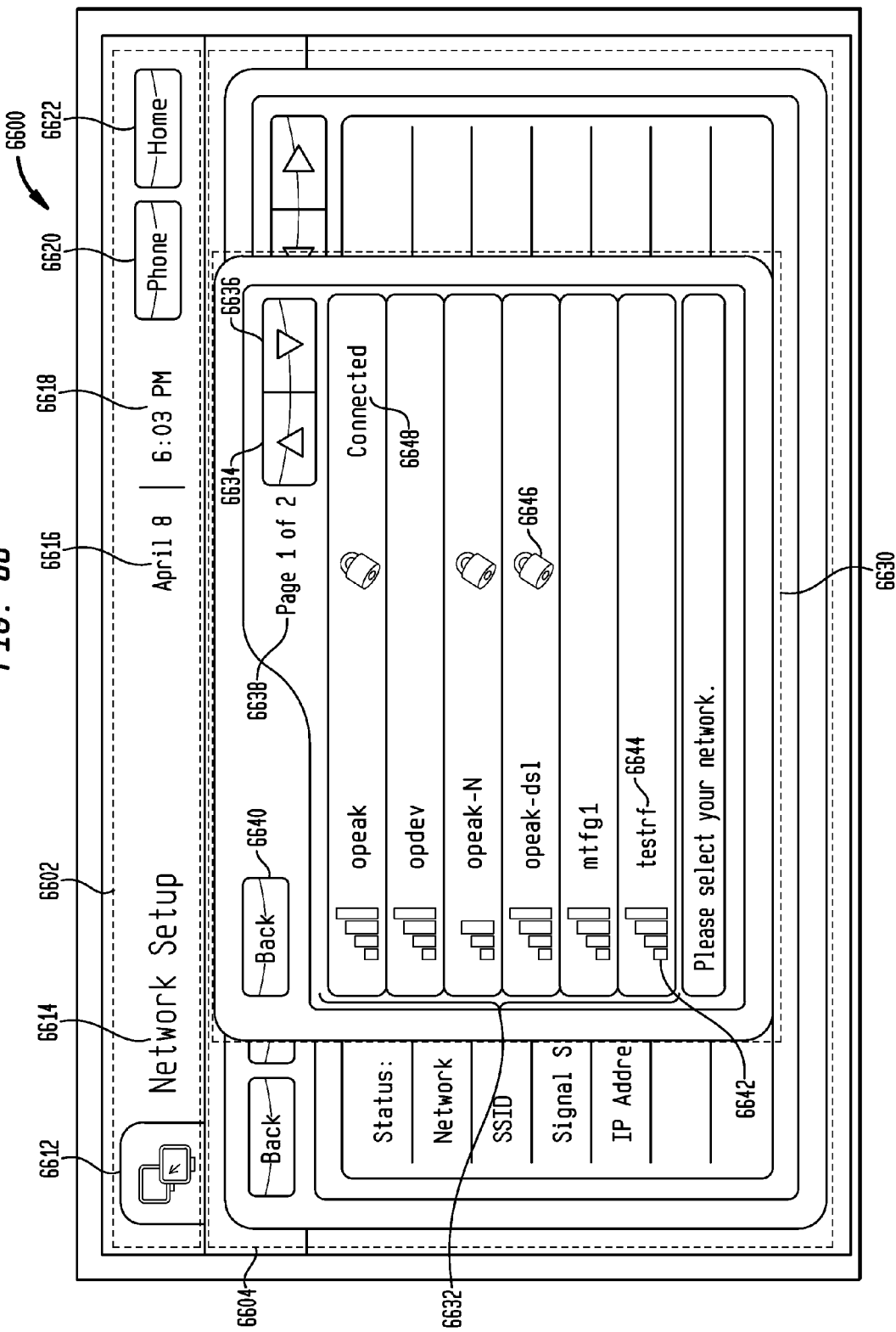
FIG. 66 depicts an example GUI screen for a network setup application in accordance with an embodiment of the present invention.

FIG. 66 depicts an example GUI screen 6600 for a network setup application in accordance with an embodiment of the present invention. As shown in FIG. 66, example GUI screen 6600 includes a status bar 6602 and a network setup application interface 6604.

Status bar 6602 includes an icon 6612 representative of the network setup application, a name 6614 ("Network Setup") associated with the network setup application, an indication of the current date 6616 and time 6618, a "phone" button 6620 and a "home" button 6622. When a user activates "phone" button 6620, GUI screen 3200 for a telephony application will be displayed. When a user activates "home" button 6622, the user will be returned to home GUI screen 3100.

In FIG. 66, network setup application interface 6604 is overlaid by a network selection interface 6630 that allows a user to select a wireless network to which device 110 may attempt to connect. As further shown in that figure, network selection interface 6630 displays all or a portion of a list 6632 of detected wireless networks. To page up through list 6632 a "page up" button 6634 may be activated and to page down a "page down" button 6636 may be activated. A page indicator 6638 indicates which of one or more pages of list 6632 is currently being displayed. For each wireless network identified in list 6632, a visual indicator 6642 of the strength of the wireless signal and a name 6644 of the wireless network is provided. Optionally, a visual indicator 6646 of whether the network is encrypted and a connection status 6648 may also be provided. A "back" button 6640 is also provided in network selection interface 6630 to allow a user to return to network setup application interface 6604.

Figure 67:
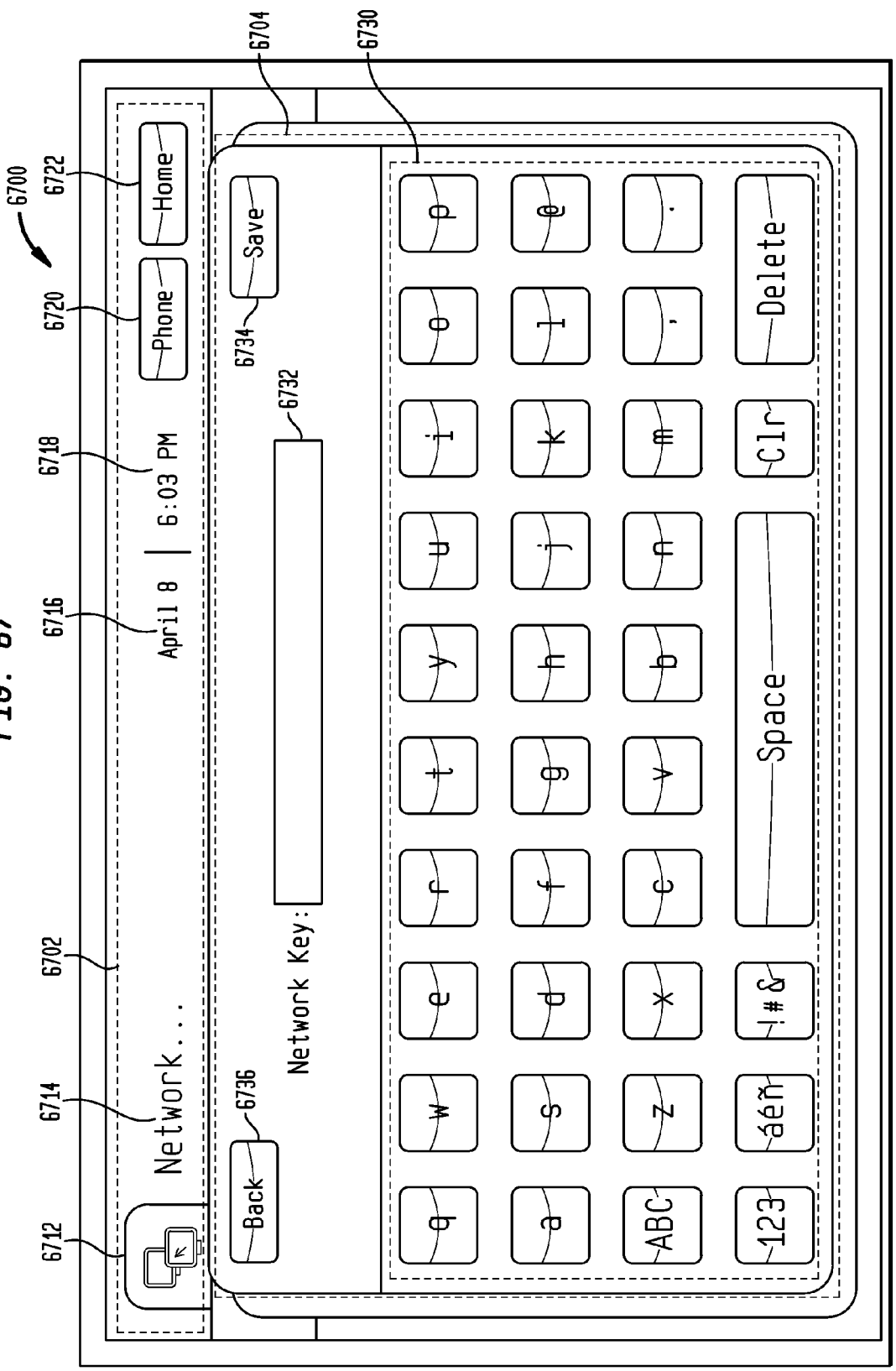
FIG. 67 depicts an additional example GUI screen for a network setup application in accordance with an embodiment of the present invention.

FIG. 67 depicts an additional example GUI screen 6700 for a network setup application in accordance with an embodiment of the present invention. As shown in FIG. 67, example GUI screen 6700 includes a status bar 6702 and a network setup application interface.

Status bar 6702 includes an icon 6712 representative of the network setup application, a name 6714 ("Network . . . ") associated with the network setup application, an indication of the current date 6716 and time 6718, a "phone" button 6720 and a "home" button 6722. When a user activates "phone" button 6720, GUI screen 3200 for a telephony application will be displayed. When a user activates "home" button 6722, the user will be returned to home GUI screen 3100.

In FIG. 67, the network setup application interface is overlaid by an encrypted network interface 6704 that allows a user to enter an encryption key for setting up or logging into an encrypted wireless network. As further shown in that figure, encrypted network setup interface 6704 displays a keyboard 6730 that may be used to type an encryption key that appears in a window 6732. The user may save the key by activating a "save" button 6734. A "back" button 6740 is also provided to allow a user to return to the normal network setup application interface.

Figure 68:
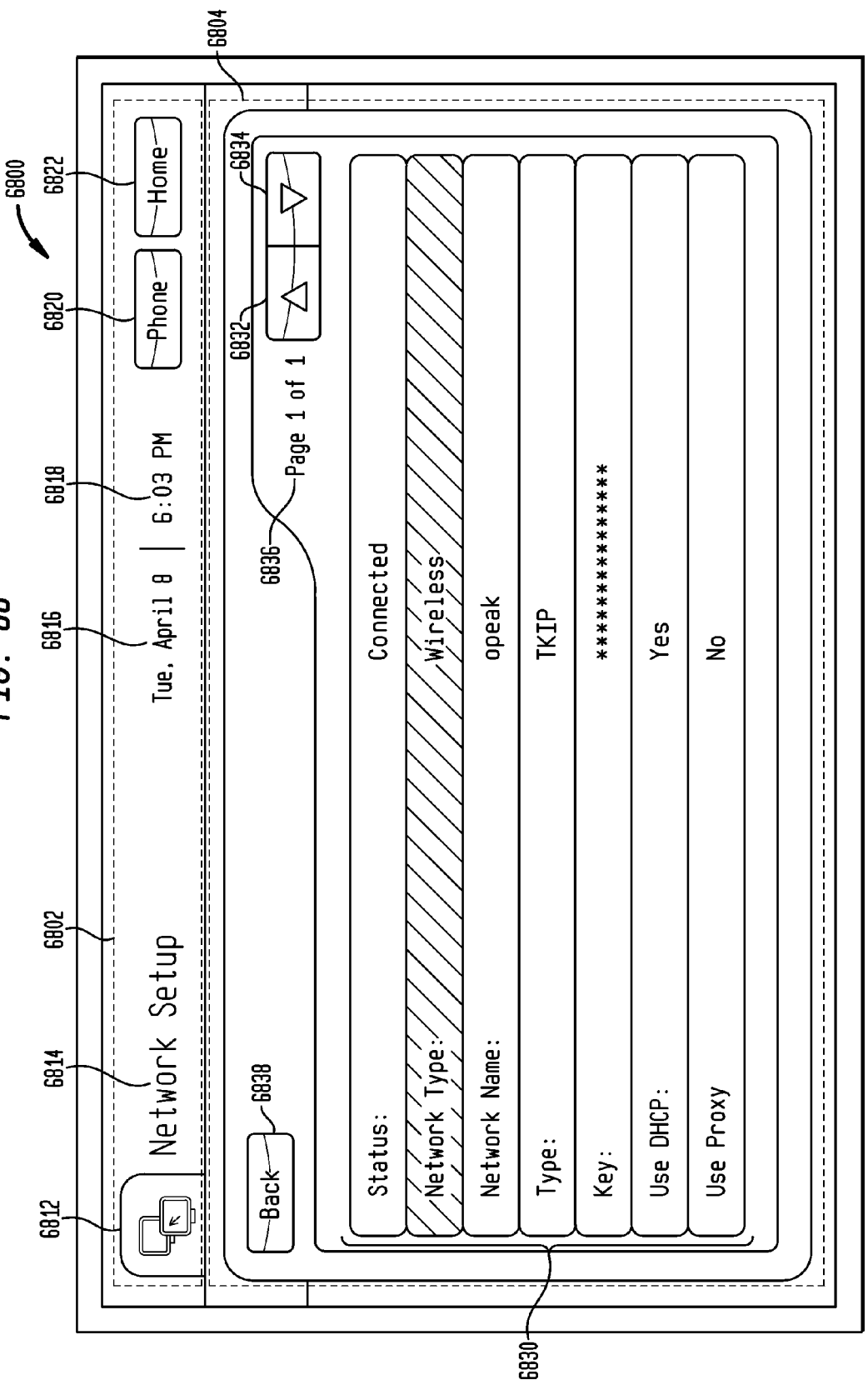
FIG. 68 depicts an example GUI screen for an advanced network setup application in accordance with an embodiment of the present invention.

FIG. 68 depicts an example GUI screen 6800 for an advanced network setup application in accordance with an embodiment of the present invention. As shown in FIG. 68, example GUI screen 6800 includes a status bar 6802 and an advanced network setup application interface 6804.

Status bar 6802 includes an icon 6812 representative of the advanced network setup application, a name 6814 ("Network Setup") associated with the advanced network setup application, an indication of the current date 6816 and time 6818, a "phone" button 6820 and a "home" button 6822. When a user activates "phone" button 6820, GUI screen 3200 for a telephony application will be displayed. When a user activates "home" button 6822, the user will be returned to home GUI screen 3100.

Advanced network setup application interface 6804 displays all or a portion of a list 6830 of network-related information and parameters, some of which may be configurable. To page up through list 6830 a "page up" button 6832 may be activated and to page down a "page down" button 6834 may be activated. A page indicator 6836 indicates which of one or more pages of list 6830 is currently being displayed. As shown in FIG. 68, information/parameters provided within list 6830 include a connection status, a network type, a network name, a security protocol type, an encryption key, whether Dynamic Host Configuration Protocol (DHCP) is used and whether proxy is used. A "back" button 6838 is provided to allow a user to return to the normal network setup application interface.

Figure 69:
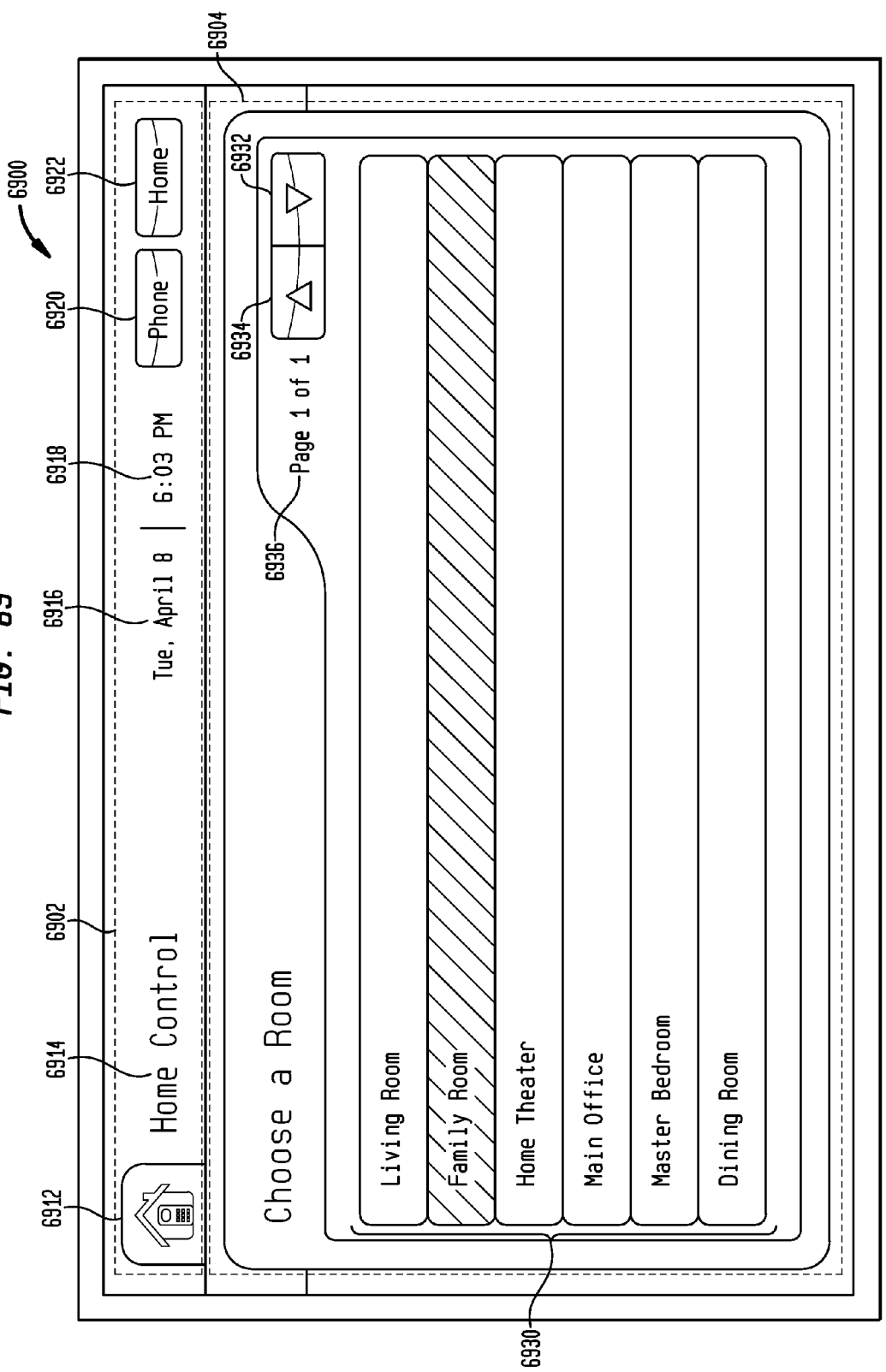
FIG. 69 depicts an example GUI screen for a home control application in accordance with an embodiment of the present invention.

FIG. 69 depicts an example GUI screen 6900 for a home control application in accordance with an embodiment of the present invention. As shown in FIG. 69, example GUI screen 6900 includes a status bar 6902 and a home control application interface 6904.

Status bar 6902 includes an icon 6912 representative of the home control application, a name 6914 ("Home Control") associated with the home control application, an indication of the current date 6916 and time 6918, a "phone" button 6920 and a "home" button 6922. When a user activates "phone" button 6920, GUI screen 3200 for a telephony application will be displayed. When a user activates "home" button 6922, the user will be returned to home GUI screen 3100.

Home control application interface 6904 displays all or a portion of a list 6930 of rooms for which home control functionality may be provided. To page up through list 6930 a "page up" button 6932 may be activated and to page down a "page down" button 6934 may be activated. A page indicator 6936 indicates which of one or more pages of list 6930 is currently being displayed. As shown in FIG. 69, such rooms may include, for example, a living room, a family room, a home theater, a main office, a master bedroom and a dining room. A room may be selected by activating the horizontal bar upon which the room name is displayed.

Figure 70:
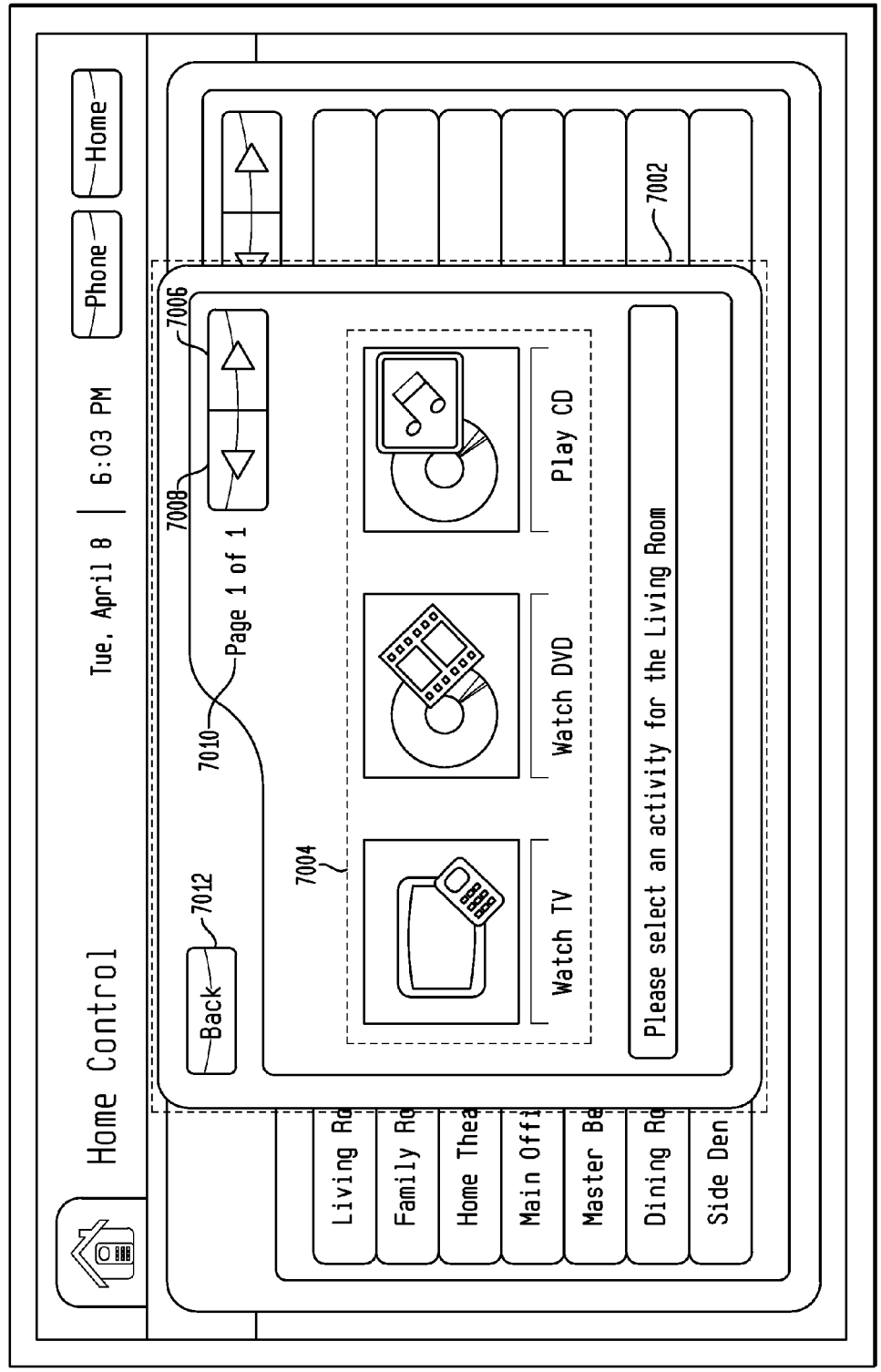
FIG. 70 depicts an overlay interface for performing home control functions associated with a selected room that may be displayed over the GUI screen of FIG. 69 in accordance with an embodiment of the present invention.

Once a room has been selected an overlay interface for performing home control functions associated with the selected room may be displayed. Example GUI screen 7000 of FIG. 70 shows such an overlay interface 7002. As shown in that figure, overlay interface 7002 displays all or a portion of a collection 7004 of home control functions for a living room. To page forward through collection 7004 a "page forward" button 7006 may be activated and to page backward a "page backward" button 7008 may be activated. A page indicator 7010 indicates which of one or more pages of collection 7004 is currently being displayed. Each home control function in collection 7004 is represented by an associated icon and text. The home control functions shown in FIG. 70 include "Watch TV," "Watch DVD" and "Play CD." A user may select a home control function by activating the icon associated with the function. A "back" button 7012 is provided to return to the original home control application interface.

Figure 71:
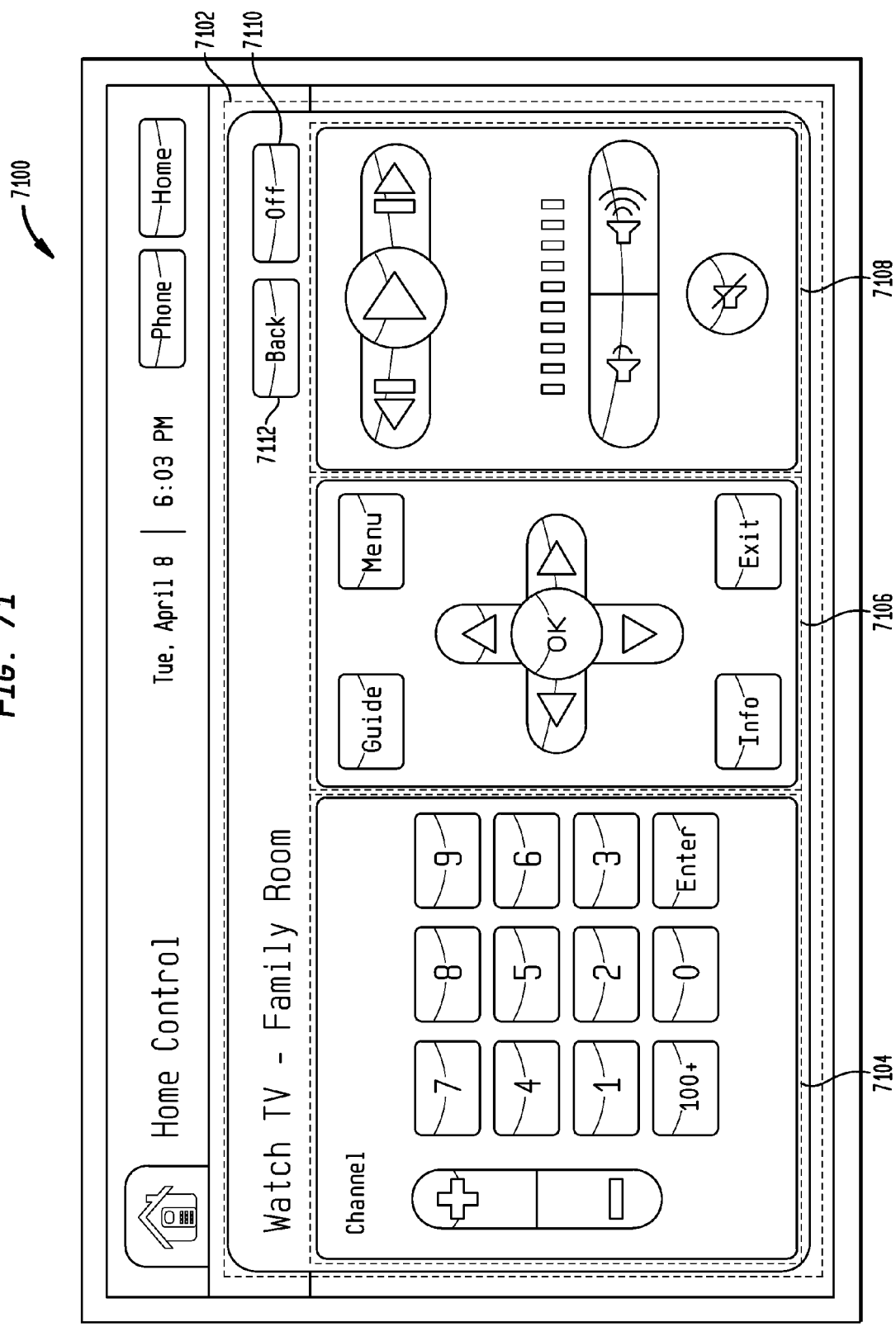
FIG. 71 depicts a further overlay interface for performing a selected home control function that may be displayed over the GUI screen of FIG. 69 in accordance with an embodiment of the present invention.

Once a home control function for a room has been selected a further overlay interface for performing the selected function may be displayed. Example GUI screen 7100 of FIG. 71 shows such an overlay interface which is configured to control a TV. As shown in that figure, overlay interface 7102 includes a channel selection interface 7104, a function navigation interface 7106 and an audio/video control interface 7108 for a TV. An on/off button 7110 is provided for powering the TV on and off and a "back" button 7112 is provided to return to the previous overlay interface.

II.G Example Services Platform

Figure 72:
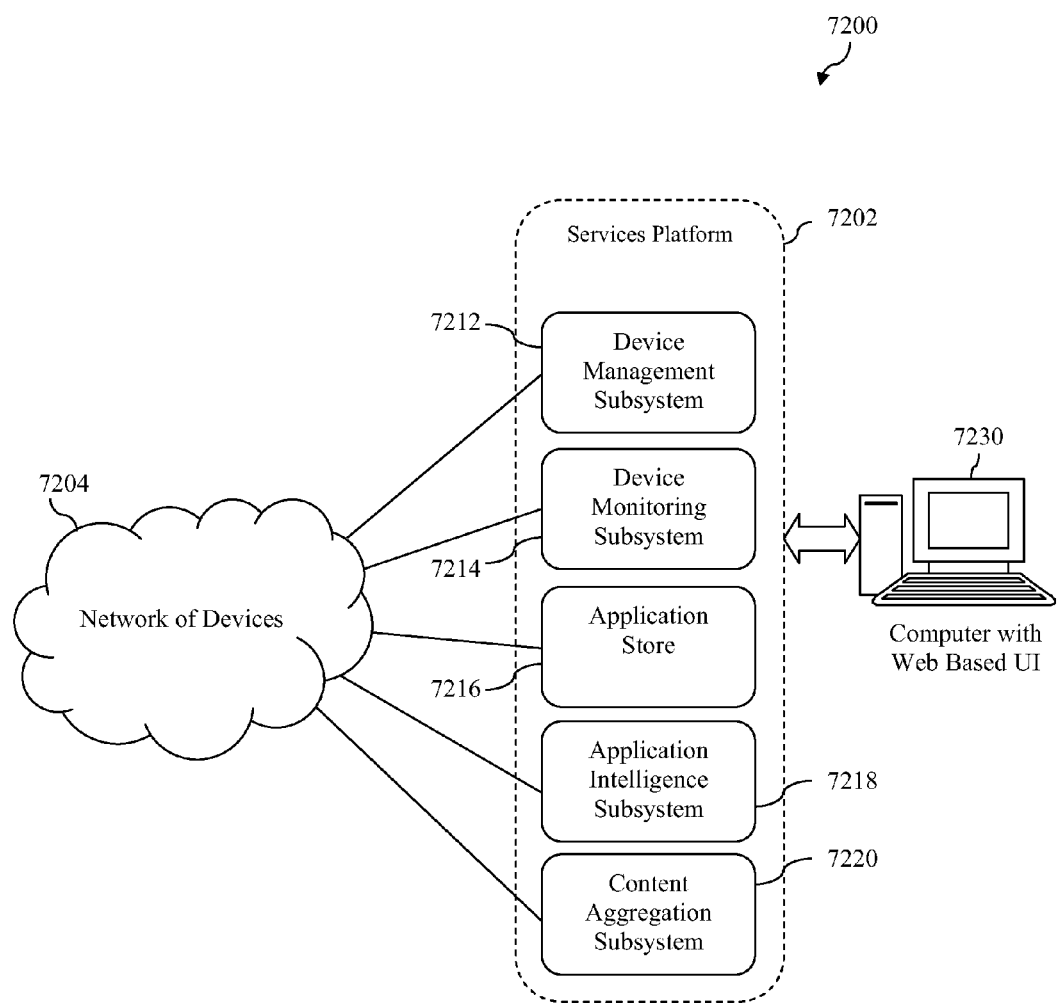
FIG. 72 is a block diagram of a system in accordance with an embodiment of the present invention that includes a services platform for enabling entities to deploy, manage optimize and monitor a network of telephony and multimedia services devices.

FIG. 72 depicts a system 7200 in accordance with an embodiment of the present invention that includes a services platform 7202 for enabling entities to deploy, manage optimize and monitor a network of devices 7204 (such as a network of devices 110) in a turnkey fashion. As shown in FIG. 72, services platform 7202 includes a device management subsystem 7212, a device monitoring subsystem 7214, an application store 7216, an application intelligence subsystem 7218 and a content aggregation subsystem 7220.

System 7200 further includes a computer 7230 that provides a Web-based user interface for easy access to the functionality provided by services platform 7202. Such a Web-based user interface may include, for example, a control panel for user access assignment and administration. Although only a single computer 7230 is shown in FIG. 72, any number of such computers may be provided to access services platform 7202.

Depending upon the implementation, services platform 7202 may include less than all of subsystems 7212, 7214, 7216, 7218 and 7220. Furthermore, an integrated user interface may be provided for accessing all of the included subsystems or, alternatively, separate user interfaces may be provided for each subsystem. Each of the various subsystems will now be described.

II.G.1 Device Management Subsystem

Device management subsystem 7212 is responsible for reliably communicating updated firmware and device configuration to deployed devices. These types of operations may be focused on a single device, various sub-sets of devices, or applied to all devices on network 7204. For example, a firmware update may be applied to a small community of devices as a test prior to updating the entire network 7204 of devices. This is critical to prevent a network of end users from having a negative experience.

Device configuration information may include but is not limited to GUI configuration, brand information, applications, or the like.

The ability to provision the network of devices is a critical component, especially when telephony is involved. Depending upon the implementation, this may involve integration with an existing telephony infrastructure. An embodiment of the present invention provides a "faceless" Web service that enables customers to populate a device configuration database. Device management subsystem 7212 then communicates those parameters to devices in network 7204. An embodiment of the invention also provides a provisioning application to administrators so as to support provisioning of small trials as a sales tool.

II.G.1.a Updates

A firmware image for a particular deployment may comprise a boot loader, kernel, file system, a branded framework application, and optionally DECT firmware for both a device and associated handsets. In one embodiment, these images are provided from device management subsystem 7212 to end user devices via File Transfer Protocol (FTP). Device management subsystem 7212 may include an import mechanism that maps the firmware images to particular device product line. Once a firmware image has been imported, an administrator may then explicitly instruct that the image be deployed to a specific group of devices on network 7204. This could equate to single device or tens of thousands. As devices complete the upgrade process, they will register the firmware update with device monitoring subsystem 7214.

In an embodiment, device management subsystem 7212 provides a unique deployment process for each of four categories of firmware updates: (1) new device initial start-up; (2) new application; (3) software version updates; and (4) fixes.

The process for new device initial start-up occurs automatically and no scheduling is required. Between the time of manufacture to end user activation, software upgrades may have occurred. Upon initial start-up, a set-up wizard executing on a device 110 automatically "checks in" with device management sub-system 7212 to pull down the latest version of the code.

The deployment of new applications is scheduled by a telecommunications carrier or other entity that administers network 7204 and pushed. Such applications may be communicated to end users via proactive promotion, and deployment may include post-delivery notification.

Software version updates may be dependent upon expansion of a feature set or technology progression (e.g., a new version of a video codec). Such updates may not be urgent in nature any may not produce a visible difference to an end user. In an embodiment, such updates are communicated from device management subsystem 7212 to a device using a non-intrusive awareness notification, such as a simple update in a settings screen of the device.

Fixes may be required as determined via support teams. Fixes may be global or individual in nature. Depending upon the severity and impact to the user, it may be desirable for the implementation of such fixes to be as "invisible" to an end user as possible. Different types of fixes include scheduled global fixes, immediate global fixes and individual fixes Scheduled global fixes may be planned and pushed from device management subsystem 7212 to devices on network 7204. Such fixes may be non-interruptive in nature.

In the event a global fix must be immediately deployed (e.g., the severity of the problem is high), device management subsystem 7212 may cause a device to display an interruptive, non-dismissable dialog box with messaging that an important download is in progress and apologizing for any inconvenience.

Support representatives may be required to update an individual device to implement a fix. This may occur, for example, when a support representative is troubleshooting with an end user. To facilitate this, device management subsystem 7212 is configured to allow a release to be pushed to a device on demand. Also, devices may be configured to automatically check for the latest firmware upon re-boot. In this case, a support representative may request that an end user reboot his/her device. Devices may also provide an automatic update tool as part of a device settings application and may be directed to utilize the tool by a support representative to pull the latest update.

In an embodiment, device management subsystem 7212 is configured to minimize device interruption and required end-user activity while keeping end users appropriately notified. To this end, device management subsystem 7212 may be configured to perform one or more of the following functions: (1) confirm prior to download that a target device is currently inactive; (2) not disrupt any customer-initiated activity in progress; (3) wait for a target device to return to an idle state before deployment; (4) display to the user a notification message such as "update in progress, please wait"; (5) cause a device "version number" to be updated on a settings screen of a device when all updates have been deployed; (6) after delivery of a new application update, deliver a notification message to the user (such as "Congratulations, you have new features to enjoy from . . . ") that can be deleted or saved by the user.

Device management subsystem 7212 may also be configured to obtain necessary end user permissions prior to delivery of new applications or firmware updates. For example, a global permission may be obtained via a general notification during new device initial start-up. Alternatively or additionally, individual permissions may be obtained for each download. For example, device management subsystem 7212 may be configured to display a message on a device requesting permission to deliver a firmware update and provide an interface by which an end user can provide a yes or no decision. Device management system 7212 will take the appropriate action based on the end user decision.

Device management subsystem 7212 may deploy a firmware update automatically in certain instances. For example, this may occur at new device initial start-up as mentioned above. In an embodiment, logic that automatically checks for the most recent software version is embedded in a set-up wizard that is executed by a device during initial start-up. This ensures that each new end user has the latest approved software and application set in the event devices have been shelved for periods of time prior to purchase/deployment.

A firmware update may also be automatically triggered in the event that a periodic check function implemented by device monitoring subsystem 7214 (described below) determines that a device does not have the latest firmware code.

An automatic firmware update may also be triggered upon device re-boot in an embodiment in which devices are configured to automatically check for the latest firmware upon re-boot.

Ideally, service providers will deploy firmware updates when devices are least likely to be in use (e.g., 1 A.M.-4 A.M.). Accordingly, in one implementation, device management subsystem 7212 allows an approved firmware update to be deployed immediately (upon command execution) or at a future set time via pre-programming.

II.G.1.b Provisioning

Preferably, every application is responsible for implementing its own provisioning solution. To simplify field trials of a telephony application and customer deployments, an embodiment of the invention implements this support as part of the solution. A provision database exposes a Web service that enables a customer's existing telephony infrastructure to populate a device's telephony parameters. A change in configuration triggers notification of the device. The device will in turn retrieve the latest configurations via Hypertext Transfer Protocol (HTTP). This does not suggest that a physical file needs to be created on the file system of the provisioning server. Again, the device contacts device monitoring subsystem 7214 to log the event.

II.G.1.c Administration

The Web-based user interface provided on computer 7230 provides administrative functions required for device management. In an embodiment, it allows assignment of view, approval and update authorization and implements a hierarchy for various levels of access. Example access levels may include: (1) view only (for tier 1 support representatives; the platform may be able to manage potentially hundreds or thousands of view access grants); (2) view and individual device deployment (for tier 2 support representatives, allowing them to proactively push the latest software version to an individual device at a time); (3) view and global device deployment (for managers that have access and authority to push a global or group targeted update); (4) view and release approval; (5) product managers (required to approve any new application global updates prior to such updates being made available for deployment); (6) technical managers (required to approve any software upgrades or fixes prior to such upgrades/fixes being made available for deployment); and (7) system administration (employees with access to assign and manage the above access).

II.G.1.d Web-Based Interface

In an embodiment, the Web-based interface implemented on computer 7230 is uncluttered and simple by design. It easily accommodates a change of look and feel (e.g., logo and brand color palette) so that it may be tailored for individual service providers. The user interface may also be configured to take into consideration scalability by providing easy search functionality to locate an individual device, or subsets of devices, among many thousands. Such device searching may permit devices to be searched for based on MAC ID, customer name, billing telephone number, zip code, etc.

Main sections of the user interface may include administration, device monitoring (as will be described in more detail below) and device management. In an embodiment, the device management interface allows for selection, approvals, push and monitoring of all upgrades. It may further include firmware history that provides a reference guide to version control. The firmware history may indicate when an update occurred, what was updated, why it was updated, who approved the update, and when the most recent update occurred. The device management interface may further include the ability to manage (view, create, add, change, delete) assigned groups of devices. The user interface may further include an "about device upgrades" section that comprises a central source for device management policies, procedures and frequently asked questions (FAQs). This section may be customizable by a service provider for their internal use.

FIG. 26, described above in reference to the application framework of device 110 provides an example of a Web-based user interface screen for interacting with device management subsystem 7212/device monitoring subsystem 7214.

II.G.2 Device Monitoring Subsystem

Device monitoring subsystem 7214 is configured to perform functions such as identifying a device's firmware version, installed applications, and activity. These functions may be important in providing customer support. Device monitoring subsystem 7214 also provides a reporting interface that allows near real time data to be presented to accurately understand device state, health and performance. Such reports may be provided for an individual device or for large groups of devices to provide global, visual views for executive management reporting.

By allowing a network of devices (such as network 7204) to be surveyed, device monitoring subsystem 7214 allows administrators as well as customer support representatives to determine what firmware a device is executing, the health of that device, as well as the frequency and the manner in which the device is used. Such information may be used for individual device insight and action as well as to monitor and report on devices on an aggregated basis.

II.G.2.a Customer Support

In an embodiment, device monitoring subsystem 7214 is configured to report the following information about a device: connection state, if in active or fail-safe mode, current firmware version, information on when historical updates were applied and frequency of usage (daily, weekly, etc.). This information may be made available to customer support representatives so that they can take appropriate action in the event of a customer issue.

II.G.2.b Reporting

In an embodiment, device monitoring subsystem 7214 is configured to allow an administrator to query near real time statistics of deployed device and applications. For example, an administrator may determine what percentage of all registered devices is actively connected. The aggregate number may be used as a metric of overall performance and also as an important tool for customer retention teams. For example, such data can provide such teams with the ability to proactively contact those customers that have purchased and registered a device but for some reason are not currently connected. Additionally, device monitoring subsystem 7214 may be queried to identify any devices not currently using the most current firmware version and to initiate an investigation as to why such devices are not accepting pushed updates.

II.G.2.c Administration

In one implementation, the Web-based user interface to device monitoring subsystem 7214 provides administrative functions necessary for device monitoring. It may implement a set of access levels such as was previously described in reference to device management subsystem 7212. However, it may expand functionality to allow authorization to specified tiers to run subset or global reports.

II.G.2.d Web-Based Interface

In an embodiment, the Web-based interface to device monitoring subsystem 7214 is configured to take into consideration scalability by providing easy search functionality to locate an individual device, or subsets of devices, among many thousands. Such device searching may permit devices to be searched for based on MAC ID, customer name, billing telephone number, zip code, etc. Additionally, the Web-based interface to device monitoring subsystem 7214 may provide the capability to generate predetermined queries and to display query results in various manners (text or visual).

FIG. 26, described above in reference to the application framework of device 110 provides an example of a Web-based user interface screen for interacting with device management subsystem 7212/device monitoring subsystem 7214.

II.G.3 Application Store

Application store 7216 comprises a portal that promotes application development in a managed subscription-based model. New applications are developed by authorized developers, verified by a regional organization, and subsequently released to the public via this platform. Revenue sharing is supported.

In one implementation, application store 7216 comprises a repository of Flash applications that device 110 and like devices can subscribe to, which may be offered for free, or at a nominal fee to an end user.

Figure 73:
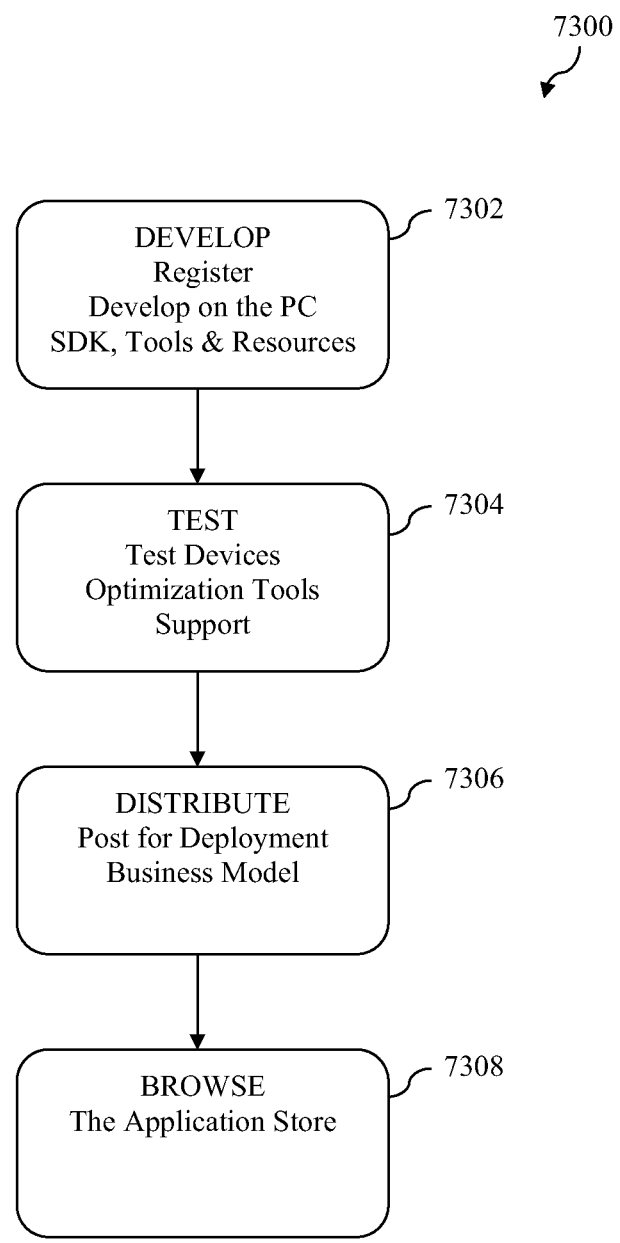
FIG. 73 depicts four main areas of an application store life cycle in accordance with an embodiment of the present invention.

FIG. 73 depicts four main areas of the application store life cycle 7300. As shown in FIG. 73, the life cycle begins with the development 7302 of the applications. Applications may be developed by any number of entities including a developer of device 110, service providers that provide services via device 110, and independent developers. Such applications are tested 7304 and uploaded to a services database. Once applications have been validated, they can then be distributed 7306 to selected (or global) devices by an administrator. At this point, the selected devices in the field would now be capable of browsing 7308 and subscribing to the new application.

II.G.3.a Develop

As shown in FIG. 73, application store life cycle begins with development 7302.

II.G.3.a.i Developer Registration

In one embodiment, before a developer is eligible to submit applications, they must first register. This may involve creating a profile consisting of contact information, technical experience and account information for revenue sharing purposes. Once registered, a developer may become a Beta tester of his/her own applications. In addition, necessary terms and conditions may be required for developers to view and accept.

II.G.3.a.ii Application Development—SDK, Tools and Resources

In an embodiment, application development involves working within predefined guidelines. By conforming to such guidelines, a developer may ensure that the application will behave correctly on all devices 110.

To assist the development community, encourage their interest in creating new applications, and provide them with the aforementioned guidelines, a Web-based developers program may be made available under an appropriate license. The Web-based developers program may comprise a Software Development Kit (SDK) and additional tools and resources.

In an embodiment, the Web-based developers program includes but is not limited to: (1) an introduction and overview; (2) a getting started guide for development on a personal computer (PC) and installing the SDK; (3) a programming guide for a Flash player used by device 110; (4) a description of how applications work within the application framework of device 110; (5) a "Hello World" program; (6) additional sample code via simple program examples; (7) user interface and design information, including guidelines and Actionscript code for common design elements and components; (8) an emulator that allows the application to be developed and tested on a PC prior to migrating the application to device 110; (9) go-to-market insight, including information about target audiences, most popular categories and the like; (10) application lifecycle information, including information about managing updates and changes; and (11) frequently asked questions.

The resource pool for developers may also include an Internet-based developers' blog or community forum.

II.G.3.b Test

Developers may be provided with development devices and software that allow them to test and optimize their applications prior to submission. Some means of support for questions and assistance may further be provided.

A service provider may require that an approved ITL (Independent Test Lab) certify an application at the developer's expense before it will be accepted for publishing.

II.G.3.c Distribute

Once an application has been created and tested by a developer, it may be packaged for distribution, approved and published. Life cycle management may also be accommodated for.

II.G.3.c.i Packaging Applications for Distribution

Once various application components have been developed and tested to run on a device such as device 110, they may be packaged as defined for a target platform and uploaded accordingly. The upload process may be configured to identify the application as vendor specific or generic.

The developer may be required to package up several resources to satisfy deployment requirements. For example, the developer may be required to supply an application store icon and information movie. These two movies can then be utilized by application store 7216 when a user is browsing for applications to install. Once an application has been selected to be installed, the runtime requirements may require an icon movie and application movie. Optionally, a supporting native library and language file may also be provided. There may be instances when an application requires additional files. In addition, pricing requirements may need to be specified and included with the submitted package.

II.G.3.c.ii Upload to the Application Store

At this point in time, the developer can test the application through application store 7216 and seek any necessary approvals from a developer of device 110 or a service provider based upon agreed upon terms and conditions. For example, if a service provider positions device 110 as a family device, a term and condition may state that explicit content is not permitted.

Once approved, the application package may be uploaded and published as generally available, or to a certain device platform, and possibly vendor. Global or specified users would now have access to the application.

II.G.3.c.iii Lifecycle Management

Application store 7216 may enable independent developers, developers of device 110, or service providers (as appropriate) to post updated versions of an application, as well as the ability to delete.

Depending upon the implementation, update and delete capabilities may apply to applications available on application store 7216, applications already deployed to devices, or both. In certain situations, a published application may be revoked. Such revocation may result in a notification being sent to all subscribed devices and an automatic uninstall of the application. Alternatively, a developer may elect to allow existing users to keep the current application and simply decide to remove the offering from further availability.

Application store 7216 may also be configured to provide developers with a summary of customer reviews on a per-application basis to promote improvements in future releases.

II.G.3.d Browse—The Application Store

Application store 7216 is an application storefront that is executed on the display/touch panel of device 110. Its purpose is to present a list of authorized applications from which the user can optionally install, wherein the list of authorized applications may be a subset of all the applications stored in an application repository. Whether an application is authorized for a particular user may depend upon the identity of the user, upon which vendor is offering the application, and/or upon other alternative or additional factors. Depending upon the implementation, access to application store may be via devices 110 only or also via an Internet-based customer portal accessible to any browser-enabled system or device.

Certain applications may have associated costs to the end user. When these applications are purchased, a charge is processed to the appropriate subscriber account. To facilitate this, application store 7216 may be integrated with a billing system administered by a service provider.

Research has validated that consumers want to be able to choose from a range of applications and services, and then tailor them to their individual needs. Since device 110 may be accessible to various family members in a home, it may be configured to distinguish between individual users. A device so configured may present a list of applications to all users and then allow for presentation of a particular application within a single active user's profile.

Figure 85:
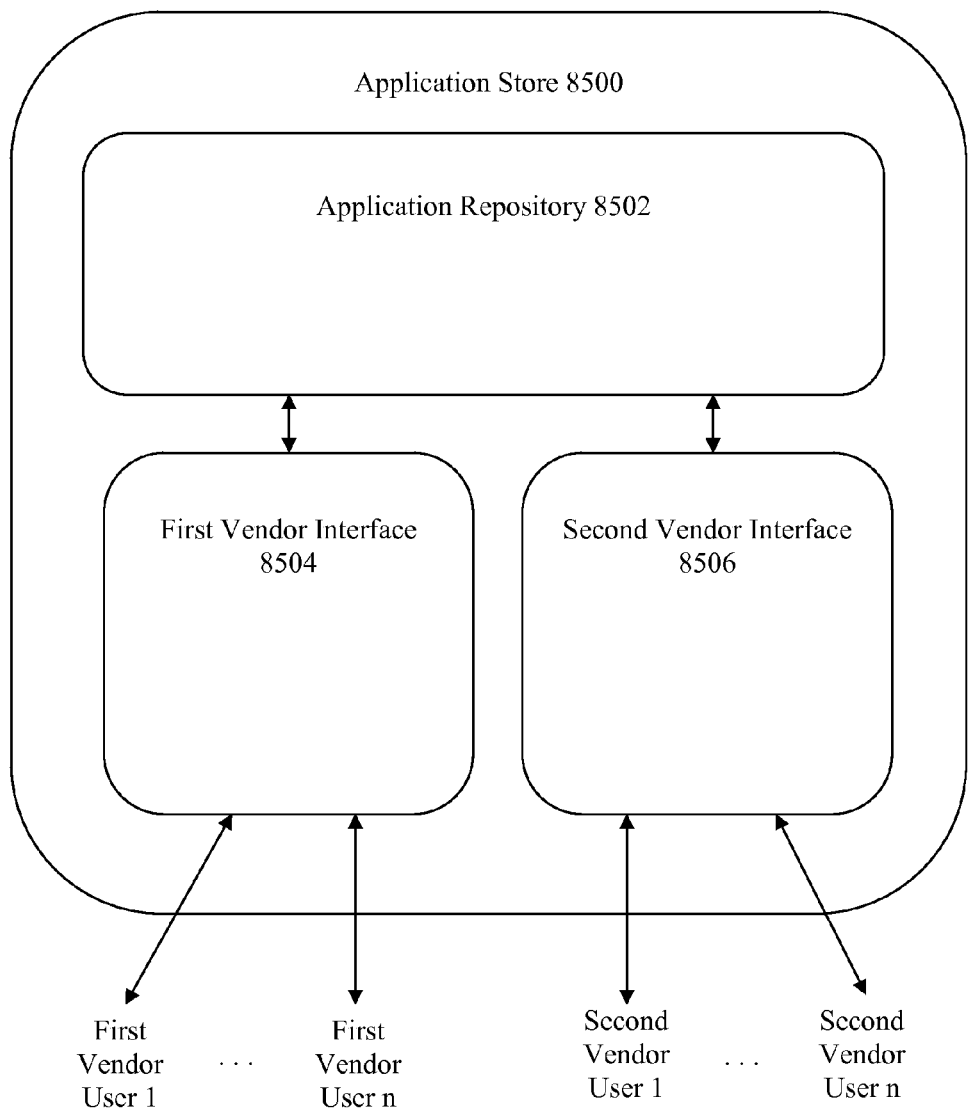
FIG. 85 is a block diagram of an example application store in accordance with an embodiment of the present invention.

FIG. 85 is a block diagram of an exemplary application store 8500 in accordance with one embodiment of the present invention. As shown in FIG. 85, application store 8500 includes a repository of applications 8502 that are suitable for downloading to and installation and execution upon one or more networked telephony and digital media devices such as those described elsewhere herein. Each application stored in repository 8502 may comprise an application package such as was described elsewhere herein that includes: (1) an application movie that is executable by an application player installed on each of the network devices; (2) an install script that, when executed by a networked device, installs the application movie on the device; (3) an uninstall script that, when executed by a networked device, uninstalls the application movie from the device, and (4) an icon movie that, when executed by an application player installed on a networked device, presents a graphical representation of the application movie to a GUI of the device and that is operable to invoke the application movie after installation thereof on the device.

As further shown in FIG. 85, application store 8500 further includes at least a first vendor interface 8504 and a second vendor interface 8506. First vendor interface 8504 is associated with a first vendor (e.g., a telecommunications company, multi system operator, Internet Service Provider, or the like) and is operable to provide access to a first subset of the applications stored in application repository 8502 for downloading to and installation and execution upon a first plurality of networked devices. The first plurality of networked devices are associated with one or more customers or subscribers of the first vendor, denoted first vendor users 1-n in FIG. 85.

Second vendor interface 8506 is associated with a second vendor that is different than the first vendor and is operable to provide access to a second subset of the applications stored in application repository 8502 for downloading to and installation and execution upon a second plurality of networked devices. The second plurality of networked devices are associated with one or more customers or subscribers of the second vendor, denoted second vendor users 1-n in FIG. 85.

Although only two vendor interfaces 8504 and 8506 are shown in FIG. 85, it is to be understood that any number of vendor interfaces may be used in accordance with an embodiment of the present invention.

First and second vendor interfaces 8504 and 8506 may each comprise an application storefront that is executed on a display/touch panel of device 110. The storefront may comprise, for example, a GUI such as that described above in reference to FIG. 74. Because application store 8500 includes a different interface for each vendor, each vendor may advantageously customize the "look and feel" of its associated interface. For example, each vendor may include vendor-specific branding or other user-viewable content within its associated interface. As another example, each vendor may include vendor-specific functionality or features within its associated interface.

The subset of applications made available via first vendor interface 8504 may be entirely different from that made available via second vendor interface 8506. Alternatively, the subsets of applications made available via each vendor interface may be overlapping or even identical. The system shown in FIG. 85 advantageously enables each vendor to selectively determine which applications will be made available to its customers and/or subscribers. Applications may also be customized to include functionality or user-viewable information uniquely associated with a particular vendor.

II.G.3.d.i Device User Interface

In view of the breadth of potential application additions and limited screen real estate of certain implementations of device 110 in comparison to a PC, a user interface to application store 7216 may be designed for convenience and simplicity while planning for expansion in navigation and caring for complexities. For example, categorization of applications may be used to assist a user in searching for applications. Example categories include genre, paid vs. free, most popular, highest rated, or newest.

Additionally, as device 110 may comprise a device that is accessible to an entire family, it may be configured to require a password before providing access to application store 7216. This feature may be used, for example, by parents to prevent unauthorized application purchases by their children.

Figure 74:
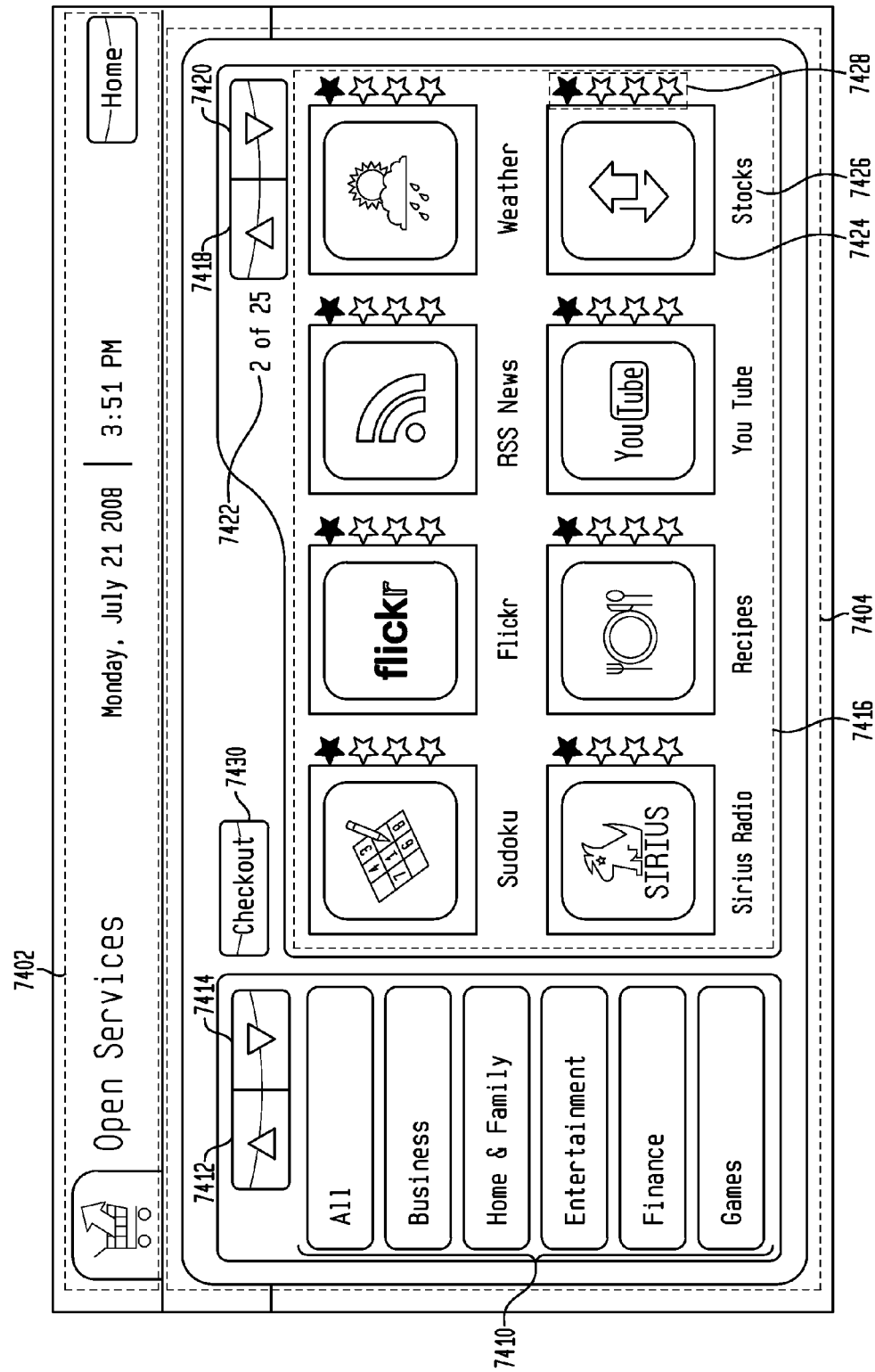
FIG. 74 depicts an example GUI screen that may be used to provide an interface to application store in accordance with an embodiment of the present invention.

FIG. 74 depicts one example GUI screen 7400 that may be used to provide an interface to application store 7216 in accordance with an embodiment of the present invention. As shown in FIG. 74, example GUI screen 7400 includes a status bar 7402 and an application store interface 7404.

Application store interface 7404 includes a first display area that displays all or a portion of a list of application categories 7410. To page up through list 7410 a "page up" button 7412 may be activated and to page down a "page down" button 7414 may be activated. To select an application category from among those in list 7410, the horizontal bar that displays the title of the application category may be activated.

Application store interface 7404 further includes a second display area that displays all or a portion of a collection of applications 7416 that fall within the category currently selected in list 7410. To page up through collection 7416 a "page up" button 7418 may be activated and to page down a "page down" button 7420 may be activated. A page indicator 7422 indicates which of one or more pages of collection 7416 is currently being displayed. For each application identified in collection 7416, an icon 7424, a name 7426 and a rating 7428 (which may be based on end user feedback and/or some other source) is provided. To select an application from among those in collection 7416, the icon associated with the application may be activated. A "checkout" button 7430 may be activated to launch a dialog by which a selected application may be purchased for download and installation to a device 110.

II.G.3.e Administration

As developers submit applications, a formal process may be used to validate the applications before releasing them to the general public. This process may include provisioning devices that will participate in a Beta program. Any Beta device may be able to install newly uploaded applications for early review. The goal is to protect the public from any rough applications that introduce a negative experience.

The network administrator may manage the various users on the platform including subscribers, developers, managers, and customer support representatives.

The network administrator may be able to provision groups of devices. These groups can be assigned various rights that determine their role on the network. To be subjected to early application access, the Beta permission would be granted.

II.G.3.f Web-Based Interface

A Web-based interface for the developers program and application store 7216 provides a face of the platform and may facilitate its successful implementation. In one embodiment, the Web-based interface includes four areas that correspond to the four stages of the application store life cycle—namely, develop, test, deploy and browse. Such a Web-base interface may be simple in design and easy to navigate.

II.G.4 Application Intelligence Subsystem

Application intelligence subsystem 7218 is configured to provide application usage analysis by tracking specific application metrics. Such functionality advantageously enables valuable trend spotting for end-user-driven, new application development.

II.G.4.a Usage Analysis

Application intelligence subsystem 7218 may be configured to deliver vital usage analysis by tracking specific application metrics. Such metrics may be of value to marketing teams, product management teams, customer retention teams and developers. In one embodiment, application intelligence subsystem 7218 enables a user to view a ranking of most frequently used/least used applications for all end users in the aggregate or for some subset of end users. Application intelligence subsystem 7218 may also provide statistics on day of week/time of day usage behavior.

In addition to the benefits offered to the service providers and developers, the data may be extended to end users. For example, end users may be notified which applications are the most popular applications.

Application intelligence subsystem 7218 may also be configured to permit end users to rate applications and to share such ratings information in the aggregate with other end users.

II.G.4.b Administration

A system administrator may have the ability to grant or deny entities the ability to generate and view application intelligence reports. Given customer proprietary information policies, the usage behavior of individual devices is securely protected.

II.G.4.c Web-Based Interface

In an embodiment, a Web-based interface to application intelligence subsystem 7218 is visual in nature, and has the capability to produce executive level reports. Such reports may be transferable to standard Microsoft® PowerPoint® (developed and sold by Microsoft Corporation of Redmond, Wash.) presentations. FIGS. 24 and 25, described elsewhere herein, depict example Web-based interface screens that may be used to report application intelligence information in accordance with various implementations.

II.G.5 Content Aggregation Subsystem

Content aggregation subsystem 7220 is configured to remove the burden on service providers of individually having to manage delivery of content to devices within network 7204 from multiple content providers. Content aggregation subsystem 7220 provides a pre-packaged content solution with personalization, recurring revenue, ad insertion and aggregated billing opportunities. By managing content processing/transcoding, caching and user preferences, content aggregation subsystem 7220 can optimize the performance of a device within network 7204 by alleviating the content processing needs of the device.

Figure 75:
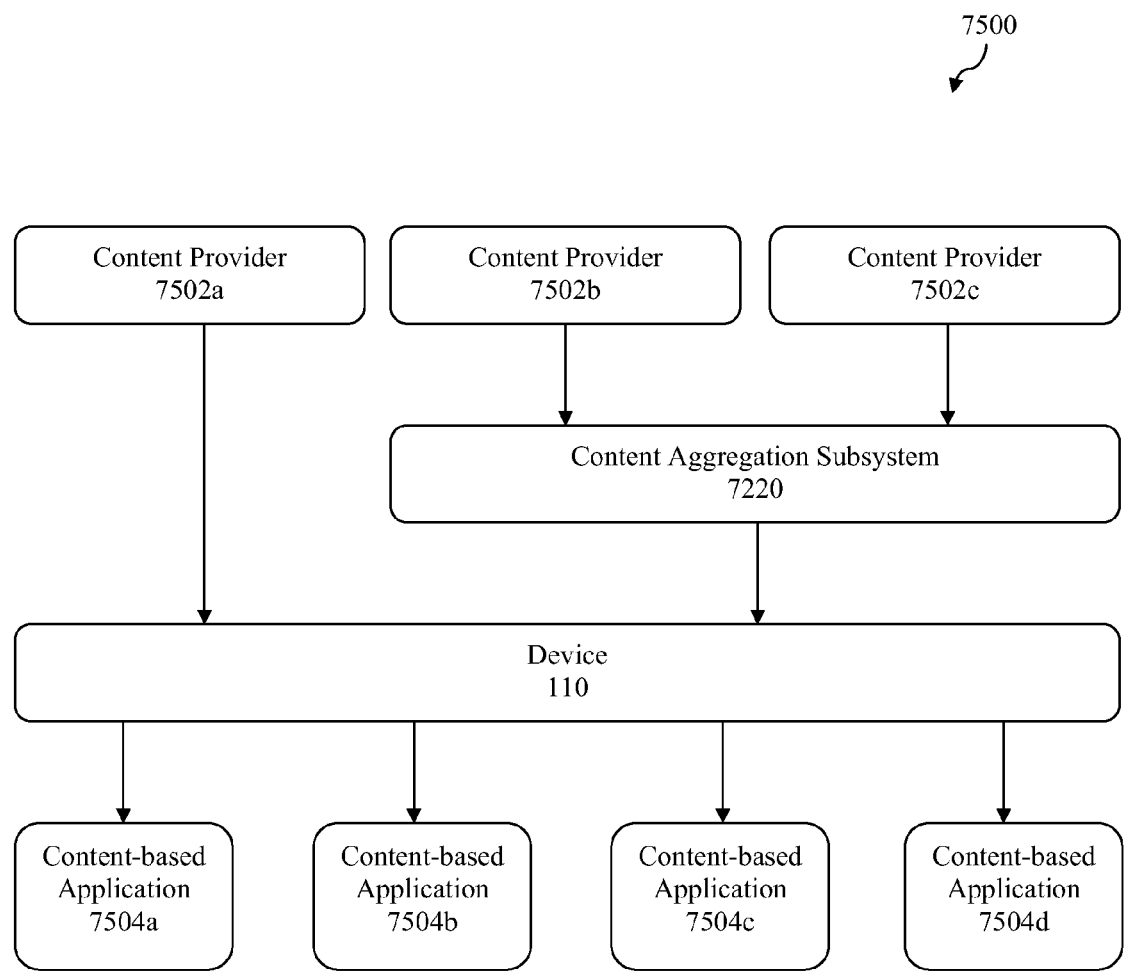
FIG. 75 is a block diagram that shows how a content aggregation subsystem may be used to aggregate content from multiple content providers in accordance with an embodiment of the present invention.

FIG. 75 is a block diagram 7500 that shows how content aggregation subsystem 7220 may be used to aggregate content from multiple content providers in accordance with an embodiment of the present invention. As shown in that figure, a plurality of content providers—namely, content providers 7502*a*, 7502*b* and 7502*c*, are configured to provide content for delivery to device 110. Such content may include for example video content, audio content, graphic content, text content, or any other form of content that can be delivered over a network. Device 110 uses such content to a plurality of content-based applications—namely content-based applications 7504*a*, 7504*b*, 7504*c* and 7504*d*.

Content provided to device 110 by content provider 7502*a* is processed entirely by device 110. Such processing may include content processing via ActionScript functionality of a Flash player executing on device 110, via a dedicated C/C++ class module which is a part of a software architecture of device 110, or via various codecs for audio, video and images that also form a part of the software architecture of device 110.

In contrast, content provided to device 110 by content providers 7502*b* and 7502*c* is first received and processed by content aggregation subsystem 7220. Such processing may include, for example, audio or video transcoding. Content aggregation subsystem 7220 may also cache content so that it need not be retrieved by subsystem 7220 each time it is requested by a device. Any of a variety of caching protocols may be used. Content aggregation subsystem 7220 may also filter or modify content based on user preferences. Processed content is then provided from content aggregation subsystem 7220 to device 110 for use in supporting content-based applications 7504*a*-7504*d*. Since a certain amount of content processing has already been performed by content aggregation subsystem 7220, the amount of processing that must be performed by device 110 is reduced. This helps improve performance by device 110.

Content aggregation subsystem 7220 may perform additional functions such as the insertion of ads into content prior to delivery to device 110. Content aggregation subsystem 7220 can advantageously provide a source of recurring revenue to an administrator of the subsystem. The subsystem can also aggregate services provided by multiple content providers to a single bill.

II.H Directory Services and Click-to-Call

As discussed above with respect to FIG. 63, device 110 may include a directory services application that allows a user to search for businesses within various service categories. Businesses may be selected based on geographic proximity to a particular location. Once a business has been found, the user can activate a telephone button icon associated with the business to place a telephone call directly from the directory services application interface (also referred to herein as "click-to-call"). In an embodiment, the directory services application also supports text messaging to a business in accordance with a Short Message Service (SMS) protocol.

Figure 76:
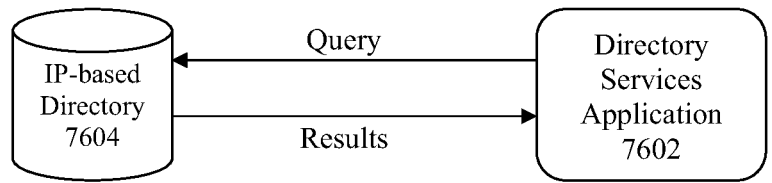
FIG. 76 is a block diagram of a system in accordance with an embodiment of the present invention that obtains directory services information from a single IP-based directory for presentation on a telephony and digital media services device.

As shown in FIG. 76, a directory services application 7602 executing on device 110 may obtain directory services information in real-time from a single IP-based directory 7604. In particular, directory services application 7602 sends a query via the Internet to IP-based directory 7604.

The query may specify, for example, a name of a business, a category of businesses, or one or more search keywords. The query may also include geographic information, such as city, state or zip code in order to obtain location-specific results. Based on the query, the IP-based directory will return one or more results in the form of business names, addresses and telephone numbers. IP-based directory 7604 may comprise a directory provided by any of a wide variety of IP-based directory service providers.

Figure 77:
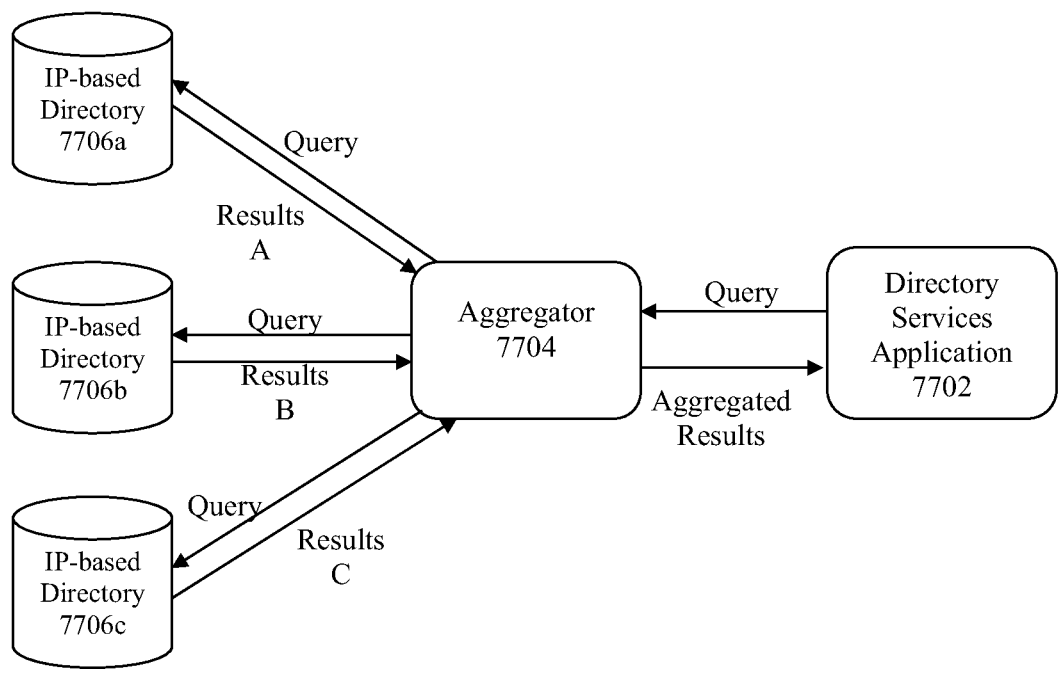
FIG. 77 is a block diagram of a system in accordance with an embodiment of the present invention that obtains directory services information from multiple IP-based directories for presentation on a telephony and digital media services device.

As shown in FIG. 77, a directory services application 7702 executing on device 110 may also obtain directory services information in real-time from multiple IP-based directories, such as directories 7706a, 7706b and 7706c. In this case, directory services application 7702 sends a query to an aggregator 7704 that is configured to distribute the query to each of the multiple directories. The query may be formulated in the manner described above in regard to FIG. 76. Aggregator 7704 then receives query results A, query results B and query results C from IP-based directories 7706a, 7706b and 7706c, respectively, and aggregates the results for delivery to directory services application 7702. Aggregating directory information in this fashion may be beneficial in that it may provide an end user with access to more comprehensive directory information. Certain IP-based directories may also provide certain types of information that other IP-based directories don't. Furthermore, if a first IP-based directory is currently being built, a second IP-based directory may also be used as a fallback directory in case the first IP-based directory is not capable of delivering adequate results.

In either of the scenarios depicted in FIGS. 76 and 77, query results may be ordered for presentation to an end user. Depending upon the implementation, results may be ordered by the IP-based directory, the aggregator, and/or the directory services application executing on device 110. Such results may be ordered, for example, alphabetically or by geographic proximity to a specified location.

Figure 78:
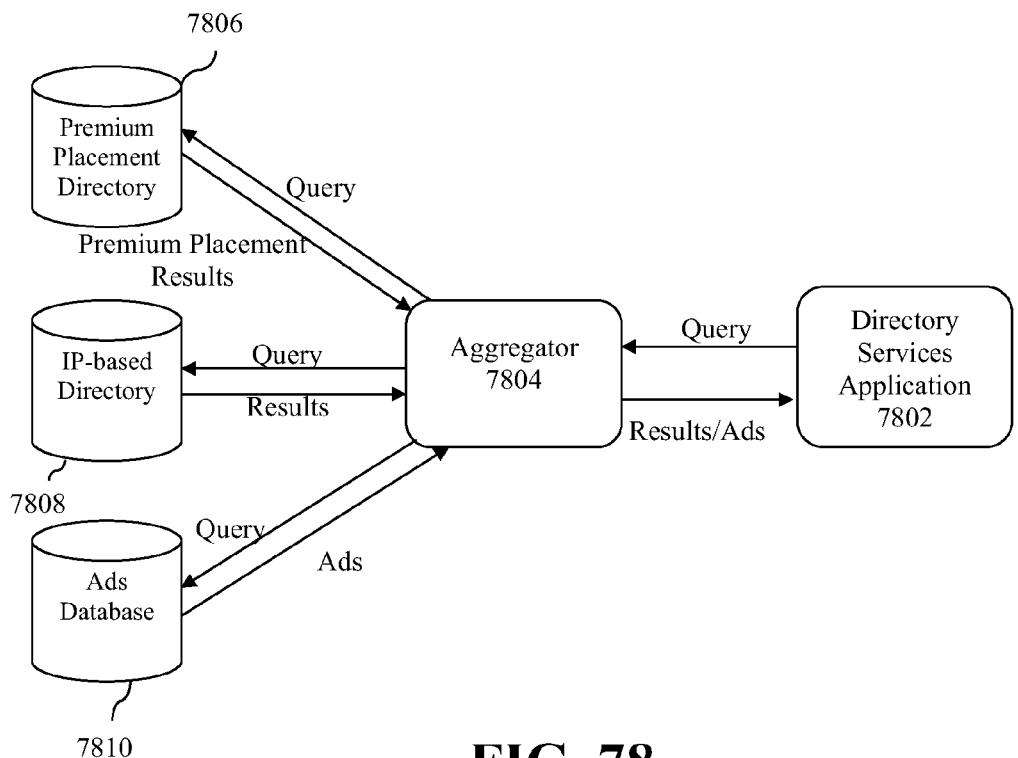
FIG. 78 is a block diagram of a system in accordance with an embodiment of the present invention that obtains premium placement directory services information, standard directory services information and advertisements for presentation on a telephony and digital media services device.

In one embodiment, results are ordered in accordance with a "premium placement" scheme in which businesses can pay to have their information appear at the top of the query results or highlighted in some other fashion intended to garner the attention of an end user. Such highlighting techniques may include, for example, providing a larger listing or using bold text, background highlighting, animations or the like. As shown in FIG. 78, an aggregator 7804 may be configured to obtain such "premium placement" results from a premium placement directory 7806 based on a query received from a directory services application 7802, while also obtaining standard directory results from at least one IP-based directory 7808. The query information may also be used to obtain ads from an ads database 7810 for display within the directory services application interface on device 110. This provides yet another revenue opportunity for a proprietor of aggregator 7804. Premium placement directory information, standard directory information and ads may all be returned from aggregator 7804 to directory services application 7802.

Payment for "premium placement" may be based on the display of the premium placement directory information by directory services application 7802 and/or upon the use of directory services application 7802 to place a telephone call to a premium placement business. For example, a payment may be due each time premium placement directory information is displayed or each time a phone call is placed that is attributable to a premium placement entry. The latter payment method is easily implemented because directory services application 7802 is capable of attributing the placement of a call to a particular business entry and can be configured to instantaneously report such information.

A directory services application in accordance with an embodiment of the present invention may also permit a user to click on or otherwise activate a directory entry to access additional information or functionality associated with a particular business. Additional information may be in the form of graphic, audio (e.g., voice) and/or video content that is displayed or played back by device 110. Additional functionality may be in the form of an application interface that allows an end user to place an order or otherwise acquire products or services from the business (e.g., an interface that allows a user to place an order for pizza from a restaurant). A business may pay a fee in order to have such information or functionality associated with its entry and/or may pay a separate fee each time such information or functionality is accessed or used.

Information aggregated from multiple devices 110 can be used to generate valuable reports regarding what types of products and services end users are looking for and which businesses have actually been contacted using the click-to-dial feature. A directory services application or other application operating on device 110 may also solicit ratings or rankings information from end users about businesses that they have called via device 110. Such information may advantageously be used to answer community-based queries such as "What electrician do most people in my neighborhood call?" or "What is the favorite pizza place in my area?"

One implementation of the present invention that uses click-to-dial reporting to provide community-based popularity information will now be described in reference to FIG. 79. As shown in that figure, a directory services application 7902 executing on device 110 provides click-to-dial reporting information to a dialed calls database 7908 each time an end user uses the click-to-dial feature of application 7902. Database 7908 acquires such information from multiple devices 110 to generate accumulated information regarding which businesses have been dialed using the click-to-dial feature and how many times such businesses have been dialed. Dialed calls database 7908 may maintain such information for each of a plurality of geographic locations.

When an end user solicits directory information from directory services application 7902, directory services application 7902 sends a query to an aggregator 7904. Aggregator 7904 distributes the query to multiple directories 7906, which may include both a premium placement directory 7910 and a standard IP-based directory 7912 as discussed above, and obtains corresponding results in the form of business names, addresses and telephone numbers. Such results may be limited to a particular geographic area. Aggregator 7904 then queries dialed calls database 7908 with the returned telephone numbers to determine the popularity of each business based on click-to-call volume. Aggregator 7904 then returns the results along with the popularity information returned from dialed calls database 7908 to directory services application 7902. Directory services application 7902 then presents the results to the end user. For example, directory services application 79Y02 may present all results sorted from most popular to least popular. As another example, directory services application 7902 may present premium placement results followed by ordinary results, wherein the premium placement results and the ordinary results are each sorted by popularity. Still other sorting approaches may be used.

Figure 79:
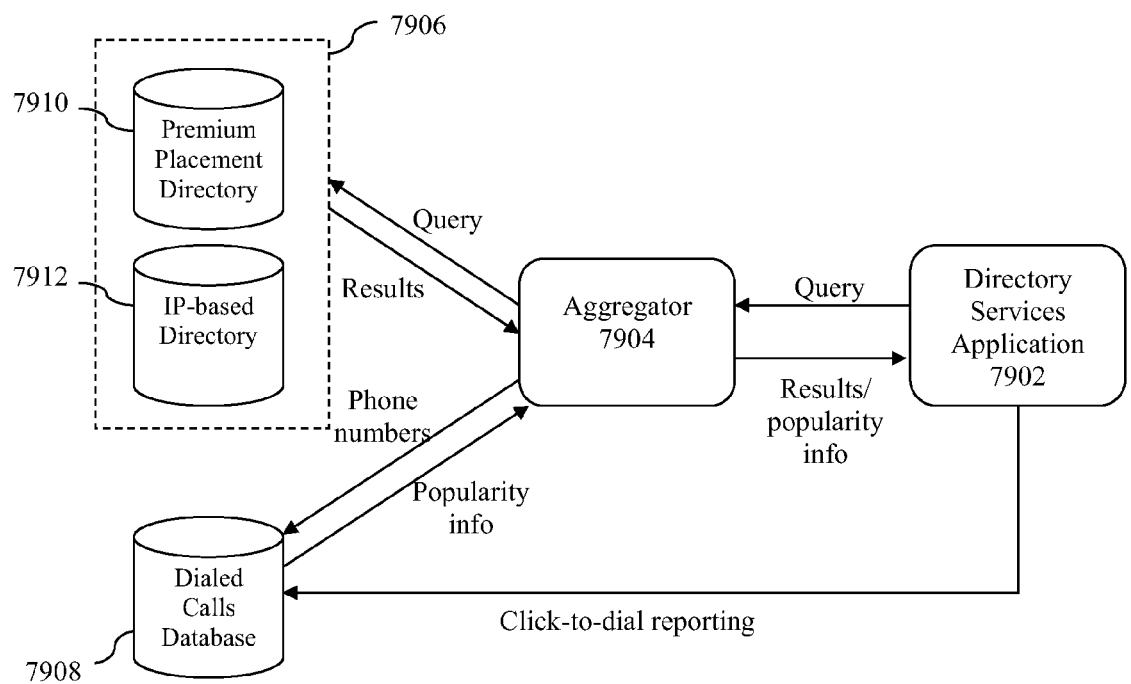
FIG. 79 is a block diagram of a system in accordance with an embodiment of the present invention that uses click-to-dial reporting to provide community-based popularity information for presentation on a telephony and digital media services device.

In the foregoing example of FIG. 79, the popularity of a business is determined based on reported click-to-call volume alone. In additional embodiments, end user feedback such as end user rating or ranking information may additionally or alternatively be solicited via device 110 and used to determine the popularity of a business. Directory services application 7902 may also be configured to display end user comments about particular businesses.

Figure 80:
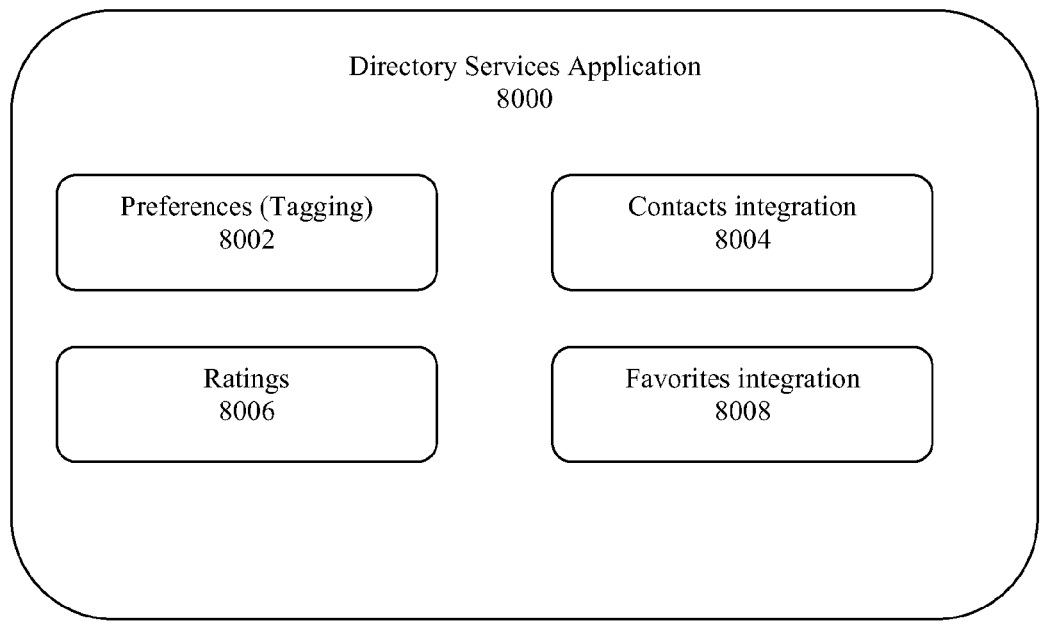
FIG. 80 depicts various components of a directory services application in accordance with an embodiment of the present invention.

FIG. 80 depicts an embodiment 8000 of a directory services application in accordance with an embodiment of the present invention that includes preferences logic 8002, contacts integration logic 8004, ratings logic 8006 and favorites integration logic 8008. Each of these elements will now be described.

Preferences logic 8002 allows an end user to "tag" an entry for a business that is listed in the application interface of directory services application 8000. The method by which an entry is tagged may vary depending upon the implementation. Once an entry has been tagged it will subsequently be presented at the top of the list for the relevant business category. Thus, for example, if an end user tags a particular movie theater, that movie theater will appear at the top of the list the next time the movie theater category is selected. If multiple businesses within the same category have been tagged, a sorting algorithm may be used to determine the order in which the tagged businesses appear. For example, a most-recently-used sorting algorithm may be used. Preferences logic 8002 thus allows a user to easily access directory information for a preferred business without having to actually create, maintain or find contact information for the business.

Contacts integration logic 8004 is configured to allow an end user to add contact information associated with a business identified in the application interface of directory services application 8000 to an address book maintained by a contacts application resident on device 110.

Ratings logic 8006 is configured to permit a user to submit ratings information about a particular business identified in the application interface of directory service application 8000. Such ratings information can then be aggregated by a service provider and used by directory services application 8000 to display community-based ratings for businesses, or to sort business entries by ratings.

Favorites integration logic 8008 is configured to enable a user to add a business identified in the application interface of directory services application 8000 to a favorites list that may be maintained by directory services application 8000 or a separate application resident on device 110. Activating an entry in the favorites list will invoke a speed-dial feature that will cause the business to be called.

Figure 81:
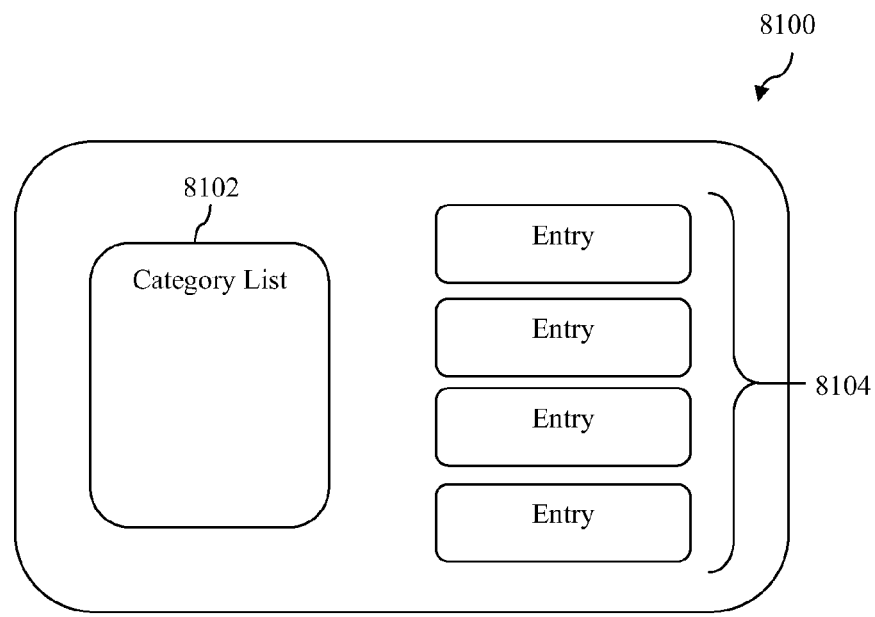
FIGS. 81-83 depict example GUI screens of a directory services application in accordance with an embodiment of the present invention.

One implementation of a click-to-call user interface flow in accordance with an embodiment of the present invention will now be described with reference to FIGS. 81, 82 and 83. As shown in FIG. 81, the flow begins with the presentation of a GUI screen 8100 associated with a directory services application to an end user. GUI screen 8100 includes a list of business categories 8102 and a plurality of entries 8104 corresponding to a selected category within category list 8102.

In an embodiment, category list 8102 represents a sub-category within a hierarchical list of business categories. Thus, for example, category list 8102 may represent the category of "pizza restaurants" which itself is a sub-category of the category "restaurants". In one implementation, the directory services application associated with GUI screen 8100 allows a user to navigate among a hierarchical list of business categories and sub-categories in order to find a desired list of businesses.

In one embodiment, category list 8102 represents a "quick access" list of categories that are deemed most useful to a user. The quick access list may be automatically compiled based on historical information relating to which categories are most often accessed by an end user. Alternatively or additionally, the quick access list may be manually compiled based on express designation of categories by the end user. The use of a quick access list helps ensure that end users are not presented with categories that they do not often use. Category list 8102 may also represent categories that have most recently been accessed by an end user.

Depending upon the implementation, category list 8102 may be sorted alphabetically, by frequency of use, or based on some other sorting algorithm. For manageability, category list 8102 may be limited to some maximum number of entries. End users may be given the option to delete a category from category list 8102.

In a further embodiment, category list 8102 may represent the results of a category search executed by an end user via another GUI screen of the directory services application.

Figure 82:
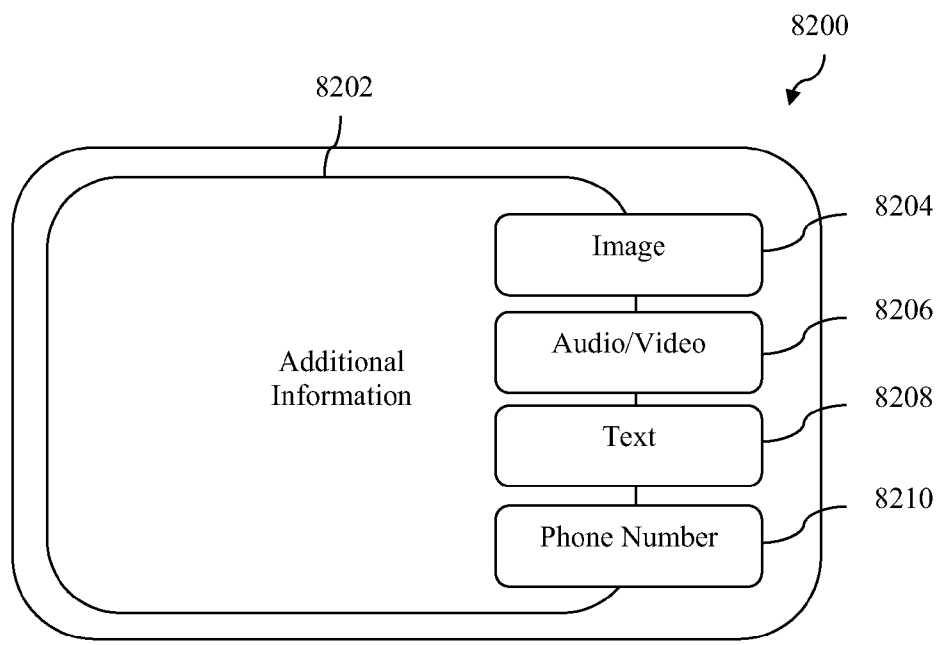

Once an end user has activated one of entries 8104 shown in GUI screen 8100, a GUI screen 8200 depicted in FIG. 82 will be displayed. GUI screen 8200 provides additional information 8202 about the selected business. Such information may include an image 8204, audio and/or video content 8206, and text 8208. Such information also includes a telephone number 8210.

The information presented in GUI screen 8200 may be provided from the business itself or from some third party information provider, such as a third party IP-based directory service. The information may be provided in a very simple format or may be provided in an elaborate format, using animation, streaming audio/video content, or the like.

Figure 83:
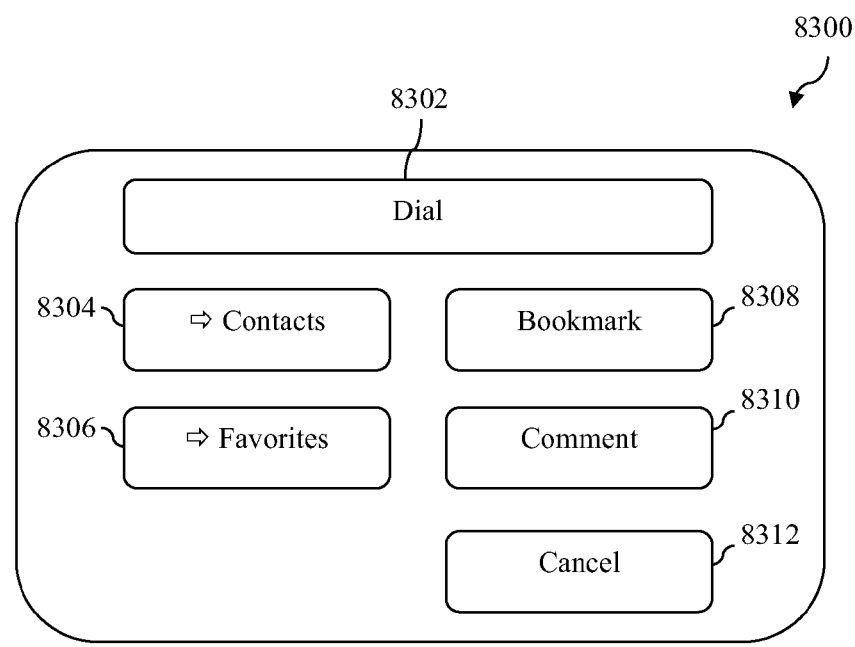

Upon activation of telephone number 8210 by an end user, a GUI screen 8300 depicted in FIG. 83 will be displayed. As shown in FIG. 83, GUI screen 8300 includes a dial button 8302, a contacts button 8304, a favorites button 8306, a bookmark button 8308, a comment button 8310 and a cancel button 8312.

When an end user presses dial button 8302, the click-to-dial functionality of the directory services application will be invoked and a telephone call will be placed from device 110 to the selected business. As noted above, the placement of the call via this interface may be reported to an external entity for tracking business popularity or other statistics.

When an end user activates contacts button 8304, information about the selected business will be imported into an address book maintained by a contacts application resident on device 110. Depending upon the implementation, this process may involve launching an interactive dialog in which the end user must engage.

When an end user activates favorites button 8306, the selected business will be tagged such that it will subsequently be presented at the top of the list for the relevant business category. Thus, for example, if an end user activates favorites button 8306 for a particular movie theater, that movie theater will appear at the top of the list the next time the movie theater category is selected. If multiple businesses within the same category have been selected as favorites, a sorting algorithm may be used to determine the order in which the businesses appear.

When an end user activates bookmark button 8308, the selected business will be saved to a "bookmarked" business category for easy access during subsequent use of the directory services application.

When an end user activates comment button 8310, the user is presented with an interface by which the end user can submit feedback about the selected business. Depending upon the implementation, such feedback may be submitted in the form of a rating (e.g., a certain number of stars out of 5 stars, a "thumbs up" or "thumbs down", etc.) and/or as text comments. Such feedback can then be aggregated by a service provider and then used by the directory services application to display community-based ratings or comments for businesses or to sort business entries by ratings.

When an end user activates cancel button 8312, the end user terminates the transaction and may be returned, for example, to GUI screen 8100.

It should be noted that depending upon the implementation, either or both of GUI screens 8200 and 8300 need not be used. For example, activating an entry within GUI screen 8100 may automatically place a phone call to the selected business. Also, activating phone number 8210 within GUI screen 8200 may automatically place a phone call to the selected business.

Click-to-call records generated by a directory services application in accordance with an embodiment of the present invention may be used to generate a variety of valuable business reports. Such reports may provide a volume of calls per time period, busy hours, a number of entries viewed without calls/skips, a number of hang-ups or unanswered calls or a number of favorite registrations for a particular business.

III. Example Computer System

Figure 84:
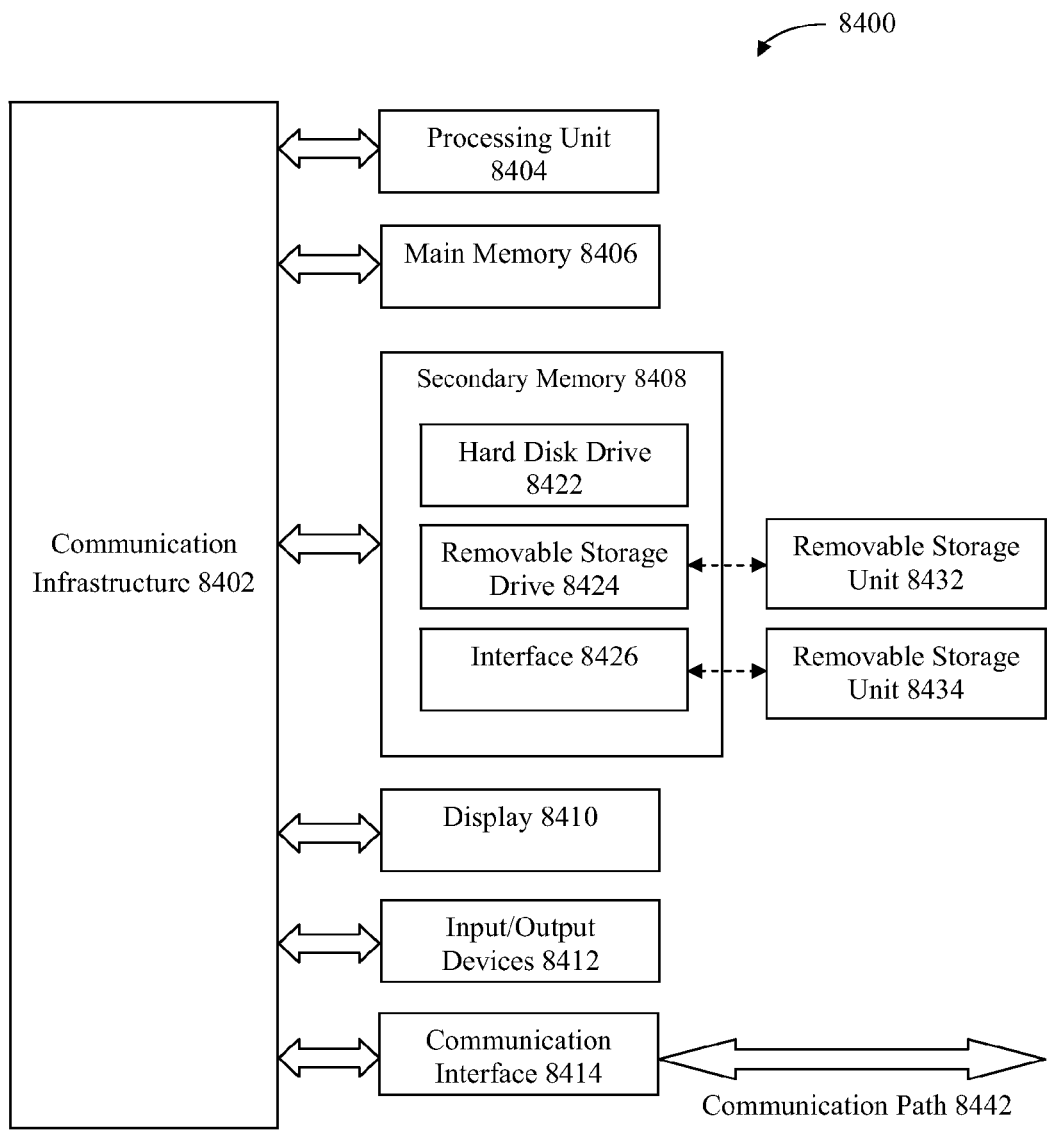
FIG. 84 depicts an example computer system that may be used to implement various features of the present invention.

Embodiments of the present invention described herein, including systems, methods/processes, and/or apparatuses, may be implemented using one or more processor-based computer systems, such as computer system 8400 shown in FIG. 84. As shown in FIG. 84, computer system 8400 includes a processing unit 8404 that includes one or more processors or processor cores. Processor unit 8404 is connected to a communication infrastructure 8402, which may comprise, for example, a bus or a network.

Computer system 8400 also includes a main memory 8406, preferably random access memory (RAM), and may also include a secondary memory 8408. Secondary memory 8408 may include, for example, a hard disk drive 8422 and/or a removable storage drive 8424. Removable storage drive 8424 may comprise a floppy disk drive, a magnetic tape drive, an optical disk drive, a tape backup, or the like. Removable storage drive 8424 reads from and/or writes to a removable storage unit 8432 in a well-known manner. Removable storage unit 8432 may comprise a floppy disk, magnetic tape, optical disk, or the like, which is read by and written to by removable storage drive 8424. As will be appreciated by persons skilled in the relevant art(s), removable storage unit 8432 includes a computer-readable storage medium having stored therein computer software and/or data.

In alternative implementations, secondary memory 8408 may include other similar means for allowing computer programs or other instructions to be loaded into computer system 8400. Such means may include, for example, a removable storage unit 8434 and an interface 8426. Examples of such means may include a memory stick and an industry standard interface (such as a universal serial bus (USB) interface) suitable for interfacing with the memory stick, a memory card and associated card reader, a removable memory chip (such as an EPROM or PROM) and associated socket, a program cartridge and cartridge interface (such as that found in video game devices), and other removable storage units 8434 and interfaces 8426 that allow software and data to be transferred from removable storage unit 8434 to computer system 8400.

Computer system 8400 may further include a display 8410 for presenting user-viewable content rendered by processing unit 8404 and/or optional display interface hardware (not shown in FIG. 84) as well as one or more input/output (I/O) devices 8412 for receiving input from or producing output to a user. Exemplary input devices include a keyboard, mouse, keypad, touch screen, or the like. Exemplary output devices include audio devices such as speakers. Display 8410 may also be considered an output device.

Computer system 8400 may also include a communication interface 8414. Communication interface 8414 allows software and data to be transferred between computer system 8400 and external devices. Examples of communication interface 8414 may include a modem, a network interface (such as an Ethernet card), a communications port, a PCMCIA slot and card, or the like. Software and data transferred via communication interface 8414 are in the form of signals which may be electronic, electromagnetic, optical, or other signals capable of being received by communication interface 8414. These signals are provided to communication interface 8414 via a communication path 8442. Communications path 8442 carries signals and may be implemented using wired communication media such as a phone line, coaxial cable or fiber optic cable, as well as wireless communication media such as radio frequency (RF) or infrared communication channels.

As used herein, the terms "computer program medium" and "computer readable medium" are used to generally refer to media such as removable storage unit 8432, removable storage unit 8434 and a hard disk installed in hard disk drive 8422. Computer program medium and computer readable medium can also refer to memories, such as main memory 8406 and secondary memory 8408, which can be semiconductor devices (e.g., DRAMs, etc.). These computer program products are means for providing software to computer system 8400.

Computer programs (also called computer control logic, programming logic, or logic) are stored in main memory 8406 and/or secondary memory 8408. Computer programs may also be received via communication interface 8414. Such computer programs, when executed, enable computer system 8400 to implement features of the present invention as discussed herein. Accordingly, such computer programs represent controllers of the computer system 8400. Where the invention is implemented using software, the software may be stored in a computer program product and loaded into computer system 8400 using removable storage drive 8424, interface 8426, or communication interface 8414.

The invention is also directed to computer program products comprising software stored on any computer readable medium. Such software, when executed in one or more data processing devices, causes a data processing device(s) to operate as described herein. Embodiments of the present invention employ any computer readable medium, known now or in the future. Examples of computer readable mediums include, but are not limited to, primary storage devices (e.g., any type of random access memory) and secondary storage devices (e.g., hard drives, floppy disks, CD ROMS, zip disks, tapes, magnetic storage devices, optical storage devices, MEMs, nanotechnology-based storage device, etc.).

IV. Conclusion

While various embodiments of the present invention have been described above, it should be understood that they have been presented by way of example only, and not limitation. It will be understood by those skilled in the relevant art(s) that various changes in form and details may be made therein without departing from the spirit and scope of the invention as defined in the appended claims. Accordingly, the breadth and scope of the present invention should not be limited by any of the above-described exemplary embodiments, but should be defined only in accordance with the following claims and their equivalents.

What is claimed is:

1. A computer-implemented services system, comprising:
one or more processors;
an application store, at least partially implemented by at least one of the one or more processors, communicatively connected via a network to a plurality of devices that provide both telephony and digital media services to one or more end users, the application store operable to provide applications via the network for installation and execution on each of the plurality of devices; and
an application intelligence subsystem, at least partially implemented by at least one of the one or more processors, communicatively connected via the network to the plurality of devices, the application intelligence subsystem operable to obtain and report information about applications that are provided via the network by the application store and are installed and executed on each of the plurality of devices;
wherein the application store comprises:
a repository of applications; and
a first interface operable to permit an end user to download an application from the repository of applications for installation and execution on one of the plurality of devices;
wherein the first interface is operable to present for installation only a subset of the applications in the repository of applications to the end user, wherein the subset is selected for presentation based at least on the identity of the end user.

2. The computer-implemented services system of claim 1, further comprising a user interface communicatively connected to the application intelligence subsystem and operable to provide access to the functionality thereof.

3. The computer-implemented services system of claim 2, wherein the user interface comprises a Web-based user interface.

4. The computer-implemented services system of claim 2, wherein the user interface provides access to different levels of functionality based on an authorization level of a user.

5. The computer-implemented services system of claim 2, wherein the user interface includes search functionality for selectively retrieving information about one or more of the plurality of devices.

6. The computer-implemented services system of claim 5, wherein the search functionality is operable to selectively retrieve information about one or more of the plurality of devices based on one or more of: a media access control (MAC) address, end user name, end user telephone number and end user zip code.

7. The computer-implemented services system of claim 1, wherein the first interface is operable to permit the end user to download the application from the repository of applications for installation and execution on the one of the plurality of devices responsive to the processing of a charge to an account associated with the end user.

8. The computer-implemented services system of claim 1, wherein at least one application in the repository of applications is developed using a Software Development Kit (SDK).

9. The computer-implemented services system of claim 1, wherein at least one application in the repository of applications is certified by a test laboratory.

10. The computer-implemented services system of claim 1, wherein each application in the repository of applications comprises an application movie that is executable by an application player installed on each device in the plurality of devices to deliver features of the application.

11. The computer-implemented services system of claim 1, wherein each application in the repository of applications comprises a part of an application package that is downloadable to each device in the plurality of devices and that also includes at least:
an install script that, when executed by a device in the plurality of devices, installs the application on the device;
an uninstall script that, when executed by a device in the plurality of devices, uninstalls the application from the device; and
an icon movie that, when be executed by an application player installed on a device, presents a graphical representation of the application to a graphical user interface (GUI) of the device and that is operable to invoke the application after installation thereof on the device.

12. The computer-implemented services system of claim 1, wherein the application package further includes:
one or more software libraries that are required to execute the application.

13. The computer-implemented services system of claim 1, wherein the application package further includes:
a language file that provides representations of text elements to be displayed by the application in one or more languages.

14. The computer-implemented services system of claim 1, wherein the first interface is operable to present only a subset of the applications in the repository of applications to the end user, wherein the subset is selected based at least on the identity of a vendor.

15. The computer-implemented services system of claim 1, wherein the first interface is operable to report rating information about each application in the repository of applications.

16. The computer-implemented services system of claim 1, wherein the application store further comprises a second interface configured to permit an application developer to upload an application to the repository.

17. The computer-implemented services system of claim 16, wherein the second interface is further configured to permit the application developer to upload an icon movie and an information movie to the repository, wherein the icon movie is executable by an application player installed on each device in the plurality of devices to display an icon representative of the application in a graphical user interface (GUI) of each device, and wherein the information movie is executable by the application player installed on each device in the plurality of devices to display information about the application in the GUI of each device.

18. The computer-implemented services system of claim 1, wherein the application intelligence subsystem is further operable to obtain and report information about applications installed and executed on a selected subset of the plurality of devices.

19. The computer-implemented services system of claim 1, wherein the application intelligence subsystem is operable to obtain and report frequency of usage information about applications installed and executed on each of the plurality of devices.

20. The computer-implemented services system of claim 1, wherein the application intelligence subsystem is operable to obtain and report information concerning day of week and/or time of day usage of applications installed and executed on each of the plurality of devices.

21. The computer-implemented services system of claim 1, wherein the application intelligence subsystem is operable to obtain end user feedback concerning applications installed and executed on each of the plurality of devices and to report rating information about the applications based on the user feedback.

22. A computer-implemented method comprising:
providing an application store communicatively connected via a network to a plurality of devices that provide both telephony and digital media services to one or more end users, the application store operable to provide a plurality of applications via the network for installation and execution on each of the plurality of devices;
providing an application intelligence subsystem communicatively connected via the network to the plurality of devices, the application intelligence subsystem operable to obtain and report information about applications that are provided via the network by the application store and are installed and executed on each of the plurality of devices; and
through the application store, presenting only a subset of the applications provided by the application store for installation and execution on one of the devices assigned to one of the end users, wherein the subset is selected for presentation based at least on the identity of the end user.

23. A system, comprising:
one or more processors;
an application store, at least partially implemented by at least one of the one or more processors, communicatively connected via a network to a plurality of devices that provide telephony and digital media services to one or more end users, the application store operable to provide applications via the network for installation and execution on each of the plurality of devices; and
an application intelligence subsystem, at least partially implemented by at least one of the one or more processors, communicatively connected via the network to the plurality of devices, the application intelligence subsystem operable to obtain and report information about applications that are provided via the network by the application store and are installed and executed on each of the plurality of devices;
wherein the application store comprises a repository of applications and is operable to permit an end user to download an application from the repository of applications for installation and execution on one of the plurality of devices;
wherein the application store is further operable to present for installation only a subset of the applications in the repository of applications to the end user, wherein the subset is selected for presentation based at least on the identity of the end user.

24. A computer-implemented services system, comprising:
one or more processors;
an application store, at least partially implemented by at least one of the one or more processors, communicatively connected via a network to a plurality of devices that provide a plurality of digital media services to one or more end users, the application store operable to provide applications via the network for installation and execution on each of the plurality of devices; and
an application intelligence subsystem, at least partially implemented by at least one of the one or more processors, communicatively connected via the network to the plurality of devices, the application intelligence subsystem operable to obtain and report information about applications that are provided via the network by the application store and are installed and executed on each of the plurality of devices;
wherein the application store comprises:
a repository of applications; and
a first interface operable to permit an end user to download an application from the repository of applications for installation and execution on one of the plurality of devices;
wherein the first interface is operable to present for installation only a subset of the applications in the repository of applications to the end user, wherein the subset is selected for presentation based at least on the identity of the end user.

\* \* \* \* \*

UNITED STATES PATENT AND TRADEMARK OFFICE
CERTIFICATE OF CORRECTION

| | |
|---|---|
| PATENT NO. | : 9,753,746 B2 |
| APPLICATION NO. | : 12/639165 |
| DATED | : September 5, 2017 |
| INVENTOR(S) | : Paul Krzyzanowski et al. |

It is certified that error appears in the above-identified patent and that said Letters Patent is hereby corrected as shown below:

In the Claims

Claim 11 at Line 17 on Column 62 recites "when be executed" and should read –when executed–

Signed and Sealed this
Thirty-first Day of July, 2018

Andrei Iancu
*Director of the United States Patent and Trademark Office*